US010700212B2

(12) United States Patent
Sawai et al.

(10) Patent No.: US 10,700,212 B2
(45) Date of Patent: Jun. 30, 2020

(54) SEMICONDUCTOR DEVICE, SEMICONDUCTOR WAFER, MODULE, ELECTRONIC DEVICE, AND MANUFACTURING METHOD THEREOF

(71) Applicant: Semiconductor Energy Laboratory Co., Ltd., Atsugi-shi, Kanagawa-ken (JP)

(72) Inventors: Hiromi Sawai, Atsugi (JP); Akihisa Shimomura, Atsugi (JP)

(73) Assignee: Semiconductor Energy Laboratory Co., Ltd., Kanagawa-ken (JP)

(*) Notice: Subject to any disclaimer, the term of this patent is extended or adjusted under 35 U.S.C. 154(b) by 25 days.

(21) Appl. No.: 15/416,112

(22) Filed: Jan. 26, 2017

(65) Prior Publication Data

US 2017/0222056 A1 Aug. 3, 2017

(30) Foreign Application Priority Data

Jan. 28, 2016 (JP) .................. 2016-013926

(51) Int. Cl.
*H01L 29/10* (2006.01)
*H01L 29/786* (2006.01)
(Continued)

(52) U.S. Cl.
CPC ...... *H01L 29/7869* (2013.01); *H01L 21/0228* (2013.01); *H01L 21/8258* (2013.01);
(Continued)

(58) Field of Classification Search
CPC ............. H01L 29/7869; H01L 27/1248; H01L 27/1203; H01L 29/78648; H01L 23/544;
(Continued)

(56) References Cited

U.S. PATENT DOCUMENTS 5,731,856 A 3/1998 Kim et al.
5,744,864 A 4/1998 Cillessen et al.
(Continued)

FOREIGN PATENT DOCUMENTS

EP 1737044 A 12/2006
EP 2226847 A 9/2010
(Continued)

OTHER PUBLICATIONS

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

(Continued)

*Primary Examiner* — Stephen M Bradley
*Assistant Examiner* — Wasiul Haider
(74) *Attorney, Agent, or Firm* — Robinson Intellectual Property Law Office, P.C.; Eric J. Robinson

(57) ABSTRACT

A semiconductor device includes a first insulator, a transistor over the first insulator, a second insulator over the transistor, and a third insulator over the second insulator. The transistor includes an oxide semiconductor. The amount of oxygen released from the second insulator when converted into oxygen molecules is larger than or equal to $1\times10^{14}$ molecules/cm$^2$ and smaller than $1\times10^{16}$ molecules/cm$^2$ in thermal desorption spectroscopy at a surface temperature of a film of the second insulator of higher than or equal to 50° C. and lower than or equal to 500° C. The second insulator includes oxygen, nitrogen, and silicon.

10 Claims, 63 Drawing Sheets

(51) Int. Cl.

| | |
|---|---|
| *H01L 27/06* | (2006.01) |
| *H01L 21/84* | (2006.01) |
| *H01L 21/8258* | (2006.01) |
| *H01L 27/088* | (2006.01) |
| *H01L 27/12* | (2006.01) |
| *H01L 21/02* | (2006.01) |
| *H01L 23/522* | (2006.01) |
| *H01L 23/528* | (2006.01) |
| *H01L 23/544* | (2006.01) |
| *H01L 27/32* | (2006.01) |
| *H01L 29/66* | (2006.01) |
| *H01L 27/092* | (2006.01) |

(52) U.S. Cl.
CPC ............ *H01L 21/84* (2013.01); *H01L 21/845* (2013.01); *H01L 23/5226* (2013.01); *H01L 23/5283* (2013.01); *H01L 23/544* (2013.01); *H01L 27/0688* (2013.01); *H01L 27/088* (2013.01); *H01L 27/1203* (2013.01); *H01L 27/1211* (2013.01); *H01L 27/1225* (2013.01); *H01L 27/1248* (2013.01); *H01L 27/3258* (2013.01); *H01L 27/3262* (2013.01); *H01L 29/66969* (2013.01); *H01L 29/78648* (2013.01); *H01L 21/022* (2013.01); *H01L 21/0214* (2013.01); *H01L 21/0234* (2013.01); *H01L 21/02178* (2013.01); *H01L 21/02323* (2013.01); *H01L 27/0629* (2013.01); *H01L 27/092* (2013.01); *H01L 2223/54453* (2013.01); *H01L 2224/05* (2013.01); *H01L 2224/48463* (2013.01)

(58) Field of Classification Search
CPC ............... H01L 27/088; H01L 27/0688; H01L 23/5283; H01L 21/845; H01L 21/84; H01L 21/8258; H01L 23/5226; H01L 21/0228; H01L 21/0234
See application file for complete search history.

(56) References Cited

U.S. PATENT DOCUMENTS

| | | | |
|---|---|---|---|
| 6,294,274 | B1 | 9/2001 | Kawazoe et al. |
| 6,563,174 | B2 | 5/2003 | Kawasaki et al. |
| 6,727,522 | B1 | 4/2004 | Kawasaki et al. |
| 7,049,190 | B2 | 5/2006 | Takeda et al. |
| 7,061,014 | B2 | 6/2006 | Hosono et al. |
| 7,064,346 | B2 | 6/2006 | Kawasaki et al. |
| 7,105,868 | B2 | 9/2006 | Nause et al. |
| 7,211,825 | B2 | 5/2007 | Shih et al. |
| 7,282,782 | B2 | 10/2007 | Hoffman et al. |
| 7,297,977 | B2 | 11/2007 | Hoffman et al. |
| 7,323,356 | B2 | 1/2008 | Hosono et al. |
| 7,385,224 | B2 | 6/2008 | Ishii et al. |
| 7,402,506 | B2 | 7/2008 | Levy et al. |
| 7,411,209 | B2 | 8/2008 | Endo et al. |
| 7,453,065 | B2 | 11/2008 | Saito et al. |
| 7,453,087 | B2 | 11/2008 | Iwasaki |
| 7,462,862 | B2 | 12/2008 | Hoffman et al. |
| 7,468,304 | B2 | 12/2008 | Kaji et al. |
| 7,501,293 | B2 | 3/2009 | Ito et al. |
| 7,674,650 | B2 | 3/2010 | Akimoto et al. |
| 7,732,819 | B2 | 6/2010 | Akimoto et al. |
| 8,547,771 | B2 | 10/2013 | Koyama |
| 8,723,176 | B2 | 5/2014 | Yamazaki |
| 8,916,424 | B2 | 12/2014 | Isobe et al. |
| 8,927,351 | B2 | 1/2015 | Ichijo et al. |
| 8,946,704 | B2 | 2/2015 | Yamazaki |
| 8,956,912 | B2 | 2/2015 | Yamazaki |
| 8,995,174 | B2 | 3/2015 | Koyama |
| 9,006,733 | B2 | 4/2015 | Yamazaki |
| 9,117,662 | B2 | 8/2015 | Isobe et al. |
| 9,214,566 | B2 | 12/2015 | Yamazaki |
| 9,276,121 | B2 | 3/2016 | Yamazaki |
| 9,281,410 | B2 | 3/2016 | Okazaki et al. |
| 9,384,976 | B2 | 7/2016 | Ichijo et al. |
| 2001/0046027 | A1 | 11/2001 | Tai et al. |
| 2002/0056838 | A1 | 5/2002 | Ogawa |
| 2002/0132454 | A1 | 9/2002 | Ohtsu et al. |
| 2003/0189401 | A1 | 10/2003 | Kido et al. |
| 2003/0218222 | A1 | 11/2003 | Wager, III et al. |
| 2004/1003844 | | 2/2004 | Takeda et al. |
| 2004/0127038 | A1 | 7/2004 | Carcia et al. |
| 2005/0017302 | A1 | 1/2005 | Hoffman |
| 2005/0199959 | A1 | 9/2005 | Chiang et al. |
| 2006/0035452 | A1 | 2/2006 | Carcia et al. |
| 2006/0043377 | A1 | 3/2006 | Hoffman et al. |
| 2006/0091793 | A1 | 5/2006 | Baude et al. |
| 2006/0108529 | A1 | 5/2006 | Saito et al. |
| 2006/0108636 | A1 | 5/2006 | Sano et al. |
| 2006/0110867 | A1 | 5/2006 | Yabuta et al. |
| 2006/0113536 | A1 | 6/2006 | Kumomi et al. |
| 2006/0113539 | A1 | 6/2006 | Sano et al. |
| 2006/0113549 | A1 | 6/2006 | Den et al. |
| 2006/0113565 | A1 | 6/2006 | Abe et al. |
| 2006/0169973 | A1 | 8/2006 | Isa et al. |
| 2006/0170111 | A1 | 8/2006 | Isa et al. |
| 2006/0197092 | A1 | 9/2006 | Hoffman et al. |
| 2006/0208977 | A1 | 9/2006 | Kimura |
| 2006/0228974 | A1 | 10/2006 | Thelss et al. |
| 2006/0231882 | A1 | 10/2006 | Kim et al. |
| 2006/0238135 | A1 | 10/2006 | Kimura |
| 2006/0244107 | A1 | 11/2006 | Sugihara et al. |
| 2006/0284171 | A1 | 12/2006 | Levy et al. |
| 2006/0284172 | A1 | 12/2006 | Ishii |
| 2006/0292777 | A1 | 12/2006 | Dunbar |
| 2007/0024187 | A1 | 2/2007 | Shin et al. |
| 2007/0046191 | A1 | 3/2007 | Saito |
| 2007/0052025 | A1 | 3/2007 | Yabuta |
| 2007/0054507 | A1 | 3/2007 | Kaji et al. |
| 2007/0090365 | A1 | 4/2007 | Hayashi et al. |
| 2007/0108446 | A1 | 5/2007 | Akimoto |
| 2007/0152217 | A1 | 7/2007 | Lai et al. |
| 2007/0172591 | A1 | 7/2007 | Seo et al. |
| 2007/0187678 | A1 | 8/2007 | Hirao et al. |
| 2007/0187760 | A1 | 8/2007 | Furuta et al. |
| 2007/0194379 | A1 | 8/2007 | Hosono et al. |
| 2007/0252928 | A1 | 11/2007 | Ito et al. |
| 2007/0272922 | A1 | 11/2007 | Kim et al. |
| 2007/0287296 | A1 | 12/2007 | Chang |
| 2008/0006877 | A1 | 1/2008 | Mardilovich et al. |
| 2008/0038882 | A1 | 2/2008 | Takechi et al. |
| 2008/0038929 | A1 | 2/2008 | Chang |
| 2008/0050595 | A1 | 2/2008 | Nakagawara et al. |
| 2008/0073653 | A1 | 3/2008 | Iwasaki |
| 2008/0083950 | A1 | 4/2008 | Pan et al. |
| 2008/0106191 | A1 | 5/2008 | Kawase |
| 2008/0128689 | A1 | 6/2008 | Lee et al. |
| 2008/0129195 | A1 | 6/2008 | Ishizaki et al. |
| 2008/0166834 | A1 | 7/2008 | Kim et al. |
| 2008/0182358 | A1 | 7/2008 | Cowdery-Corvan et al. |
| 2008/0224133 | A1 | 9/2008 | Park et al. |
| 2008/0254569 | A1 | 10/2008 | Hoffman et al. |
| 2008/0258139 | A1 | 10/2008 | Ito et al. |
| 2008/0258140 | A1 | 10/2008 | Lee et al. |
| 2008/0258141 | A1 | 10/2008 | Park et al. |
| 2008/0258143 | A1 | 10/2008 | Kim et al. |
| 2008/0296568 | A1 | 12/2008 | Ryu et al. |
| 2009/0068773 | A1 | 3/2009 | Lai et al. |
| 2009/0073325 | A1 | 3/2009 | Kuwabara et al. |
| 2009/0114910 | A1 | 5/2009 | Chang |
| 2009/0134399 | A1 | 5/2009 | Sakakura et al. |
| 2009/0152506 | A1 | 6/2009 | Umeda et al. |
| 2009/0152541 | A1 | 6/2009 | Maekawa et al. |
| 2009/0278122 | A1 | 11/2009 | Hosono et al. |
| 2009/0280600 | A1 | 11/2009 | Hosono et al. |
| 2010/0065844 | A1 | 3/2010 | Tokunaga |
| 2010/0092800 | A1 | 4/2010 | Itagaki et al. |
| 2010/0109002 | A1 | 5/2010 | Itagaki et al. |
| 2013/0200375 | A1 | 8/2013 | Yamazaki |

(56) References Cited

U.S. PATENT DOCUMENTS

| | | | |
|---|---|---|---|
| 2013/0203214 A1* | 8/2013 | Isobe | H01L 21/0237 438/104 |
| 2013/0334533 A1* | 12/2013 | Yamazaki | H01L 29/7869 257/57 |
| 2015/0014681 A1* | 1/2015 | Yamazaki | H01L 27/1218 257/43 |
| 2015/0187775 A1* | 7/2015 | Yamamoto | H01L 27/10897 365/203 |
| 2015/0263141 A1 | 9/2015 | Yamazaki et al. | |
| 2016/0001556 A1* | 1/2016 | Masuda | B41J 2/14201 347/71 |
| 2016/0218123 A1* | 7/2016 | Moon | H01L 27/1262 |
| 2016/0276487 A1 | 9/2016 | Yamazaki et al. | |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2012-257187 | 12/2012 |
| WO | WO-2004/114391 | 12/2004 |

OTHER PUBLICATIONS

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Clark.S et al., "First Principles Methods Using CASTEP", Zeitschrift fur Kristallographie, 2005, vol. 220, pp. 567-570.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Costello.M et al., "Electron Microscopy of a Cholesteric Liquid Crystal and Its Blue Phase,", Phys. Rev. A (Physical Review. A), May 1, 1984, vol. 29, No. 5, pp. 2957-2959.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Fortunato.E et al., "Wide-Bandgap High-Mobility ZnO Thin-Film Transistors Produced at Room Temperature", Appl. Phys. Lett. (Applied Physics Letters) , Sep. 27, 2004, vol. 85, No. 13, pp. 2541-2543.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.

Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Hirao.T et al., "Novel Top-Gate Zinc Oxide Thin-Film Transistors (ZnO TFTs) for AMLCDs", J. Soc. Inf. Display (Journal of The Society for Information Display), 2007, vol. 15, No. 1, pp. 17-22.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Janotti.A et al., "Native Point Defects in ZnO", Phys. Rev. B (Physical Review. B), Oct. 4, 2007, vol. 76, No. 16, pp. 165202-1-165202-22.

Janotti.A et al., "Oxygen Vacancies in ZnO", Appl. Phys. Lett. (Applied Physics Letters) , 2005, vol. 87, pp. 122102-1-122102-3.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

Jin.D et al., "65.2:Distinguished Paper:World-Largest (6.5") Flexible Full Color Top Emmission AMOLED Display on Plastic Film and Its Bending Properties", SID Digest '09 : SID International Symposium Digest of Technical Papers, May 31, 2009, pp. 983-985.

Kanno.H et al., "White Stacked Electrophosphorecent Organic Light-Emitting Devices Employing MOO3 as a Charge-Generation Layer", Adv. Mater. (Advance Materials), 2006, vol. 18, No. 3, pp. 339-342.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Kikuchi.H et al., "Polymer-Stabilized Liquid Crystal Blue Phases", Nature Materials, Sep. 2, 2002, vol. 1, pp. 64-68.

Kim.S et al., "High-Performance oxide thin film transistors passivated by various gas plasmas", 214th ECS Meeting, 2008, No. 2317, ECS.

Kimizuka.N et al., "Spinel,YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu,or Zn] at Temperatures Over 1000° C.", Journal of Solid State Chemistry, 1985, vol. 60, pp. 382-384.

Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) inthe In2O3—ZnGa2O4—ZnO System", Journal of Solid State Chemistry, Apr. 1, 1995, vol. 116, No. 1, pp. 170-178.

Kitzerow.H et al., "Observation of Blue Phases in Chiral Networks", Liquid Crystals, 1993, vol. 14, No. 3, pp. 911-916.

(56) References Cited

OTHER PUBLICATIONS

Kurokawa.Y et al., "UHF RFCPUS on Flexible and Glass Substrates for Secure RFID Systems", Journal of Solid-State Circuits, 2008, vol. 43, No. 1, pp. 292-299.
Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.
Lee.H et al., "Current Status of, Challenges to, and Perspective View of AM-OLED", IDW '06 : Proceedings of the 13th International Display Workshops, Dec. 7, 2006, pp. 663-666.
Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.
Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.
Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.
Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.
Meiboom.S et al., "Theory of the Blue Phase of Cholesteric Liquid Crystals", Phys. Rev. Lett. (Physical Review Letters), May 4, 1981, vol. 46, No. 18, pp. 1216-1219.
Miyasaka.M, "SUFTLA Flexible Microelectronics on Their Way to Business", SID Digest '07 : SID International Symposium Digest of Technical Papers, 2007, vol. 38, pp. 1673-1676.
Mo.Y et al., "Amorphous Oxide TFT Backplanes for Large Size AMOLED Displays", IDW '08 : Proceedings of the 6th International Display Workshops, Dec. 3, 2008, pp. 581-584.
Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.
Nakamura.M, "Synthesis of Homologous Compound with New Long-Period Structure", NIRIM Newsletter, Mar. 1, 1995, vol. 150, pp. 1-4.
Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.
Nomura.K et al., "Carrier transport in transparent oxide semiconductor with intrinsic structural randomness probed using single-crystalline InGO3(ZnO)5 films", Appl. Phys. Lett. (Applied Physics Letters) , Sep. 13, 2004, vol. 85, No. 11, pp. 1993-1995.
Nomura.K et al., "Room-Temperature Fabrication of Transparent Flexible Thin-Film Transistors Using Amorphous Oxide Semiconductors", Nature, Nov. 25, 2004, vol. 432, pp. 488-492.
Nomura.K et al., "Thin-Film Transistor Fabricated in Single-Crystalline Transparent Oxide Semiconductor", Science, May 23, 2003, vol. 300, No. 5623, pp. 1269-1272.
Nowatari.H et al., "60.2: Intermediate Connector With Suppressed Voltage Loss for White TANDEM OLEDs", SID Digest '09 : SID International Symposium Digest of Technical Papers, May 31, 2009, vol. 40, pp. 899-902.
Oba.F et al., "Defect energetics in ZnO: A hybrid Hartree-Fock density functional study", Phys. Rev, B. (Physical Review. B), 2008, vol. 77, pp. 245202-1-245202-6.
Oh.M et al., "Improving the Gate Stability of ZnO Thin-Film Transistors With Aluminum Oxide Dielectric Layers", J. Electrochem. Soc. (Journal of The Electrochemical Society), 2008, vol. 155, No. 12, pp. H1009-H1014.
Ohara.H et al., "21.3:4.0 In. QVGA AMOLED Display Using In—Ga—Zn-Oxide TFTs With a Novel Passivation Layer", SID Digest '09 : SID International Symposium Digest of Technical Papers, May 31, 2009, pp. 284-287.
Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.
Orita.M et al., "Amorphous transparent conductive oxide InGaO3(ZnO)m (m<4):a Zn4s conductor", Philosophical Magazine, 2001, vol. 81, No. 5, pp. 501-515.
Orita.M et al., "Mechanism of Electrical Conductivity of Transparent InGaZnO4", Phys. Rev. B (Physical Review. B), Jan. 15, 2000, vol. 61, No. 3, pp. 1811-1816.
Osada.T et al., "15.2: Development of Driver-Integrated Panel using Amorphous In—Ga—Zn-Oxide TFT", SID Digest '09 : SID International Symposium Digest of Technical Papers, May 31, 2009, vol. 40, pp. 184-187.
Osada.T et al., "Development of Driver-Integrated Panel Using Amorphous In—Ga—Zn-Oxide TFT", AM-FPD '09 Digest of Technical Papers, Jul. 1, 2009, pp. 33-36.
Park.J et al., "Amorphous Indium-Gallium-Zinc Oxide TFTs and Their Application for Large Size AMOLED", AM-FPD '08 Digest of Technical Papers, Jul. 2, 2008, pp. 275-278.
Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.
Park.J et al., "Electronic Transport Properties of Amorphous Indium-Gallium-Zinc Oxide Semicondutor Upon Exposure to Water", Appl. Phys. Lett. (Applied Physics Letters) , 2008, vol. 92, pp. 072104-1-072104-3.
Park.J et al., "High performance amorphous oxide thin film transistors with self-aligned top-gate structure", IEDM 09: Technical Digest of International Electron Devices Meeting, Dec. 7, 2009, pp. 191-194.
Park.J et al., "Improvements in the Device Characteristics of Amorphous Indium Gallium Zinc Oxide Thin-Film Transistors by Ar Plasma Treatment", Appl. Phys. Lett. (Applied Physics Letters) , Jun. 26, 2007, vol. 90, No. 26, pp. 262106-1-262106-3.
Park.S et al., "Challenge to Future Displays: Transparent AM-OLED Driven by PEALD Grown ZnO TFT", IMID '07 Digest, 2007, pp. 1249-1252.
Park.S et al., "42.3: Transparent ZnO Thin Film Transistor for the Application of High Aperture Ratio Bottom Emmission AM-OLED Display", SID Digest '08 : SID International Symposium Digest of Technical Papers, May 20, 2008, vol. 39, pp. 629-632.
Prins.M et al., "A Ferroelectric Transparent Thin-Film Transistor", Appl. Phys. Lett. (Applied Physics Letters) , Jun. 17, 1996, vol. 68, No. 25, pp. 3650-3652.
Sakata.J et al., "Development of 4.0-in. AMOLED Display With Driver Circuit Using Amorphous In—Ga—Zn-Oxide TFTs", IDW '09 : Proceedings of the 16th International Display Workshops, 2009, pp. 689-692.
Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 395-398.
Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.
Tsuda.K et al., "Ultra Low Power Consumption Technologies for Mobile TFT-LCDs ", IDW '02 : Proceeddings of the 9th International Display Workshops, Dec. 4, 2002, pp. 295-298.
Ueno.K et al., "Field-Effect Transistor on SrTiO3 With Sputtered Al2O3 Gate Insulator", Appl. Phys. Lett. (Applied Physics Letters) , Sep. 1, 2003, vol. 83, No. 9, pp. 1755-1757.
Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

* cited by examiner

FIG. 4A
FIG. 4B
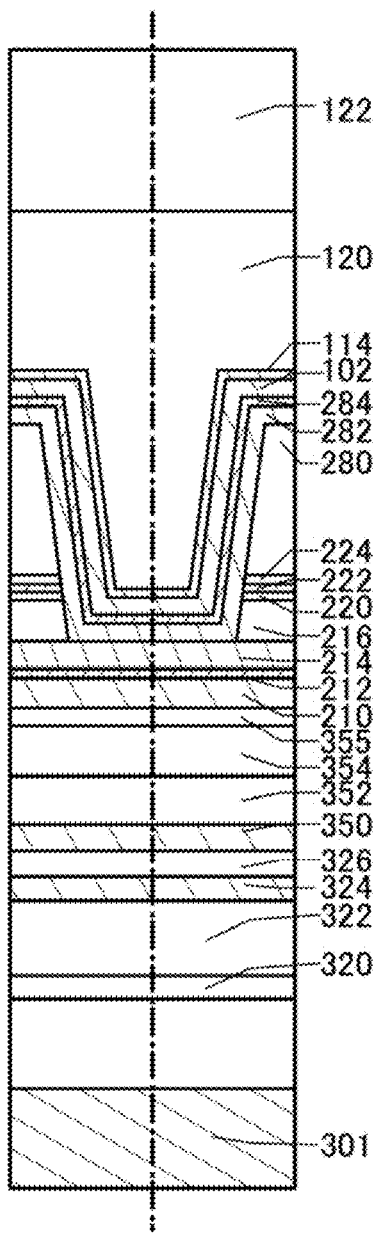
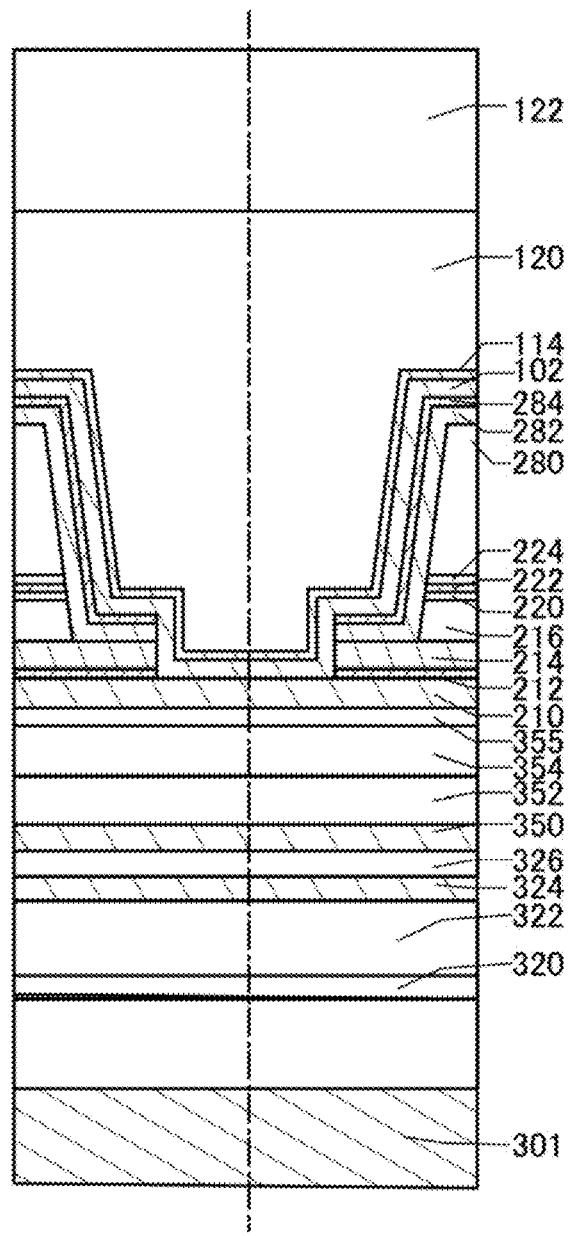

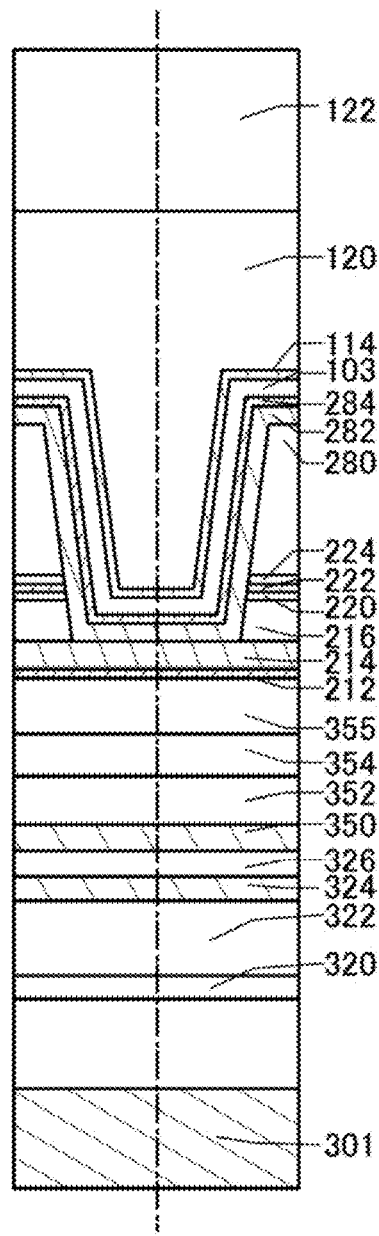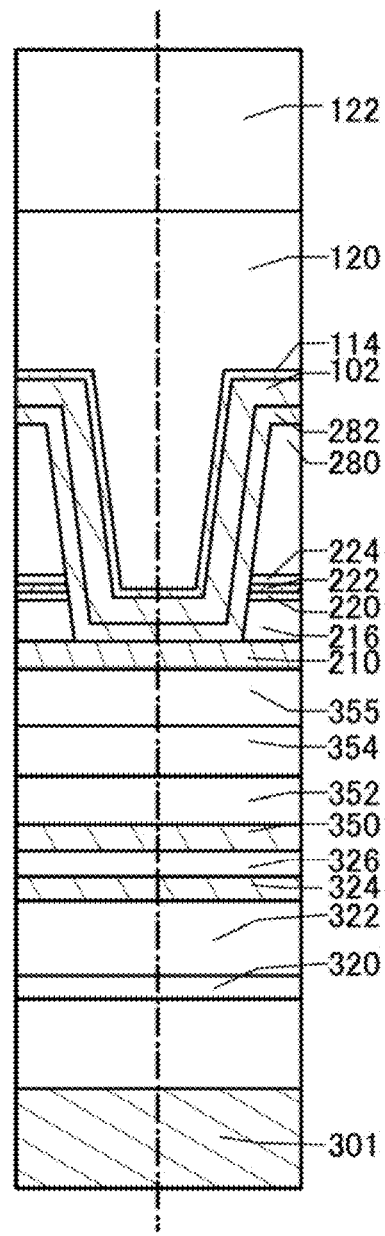

FIG. 7A
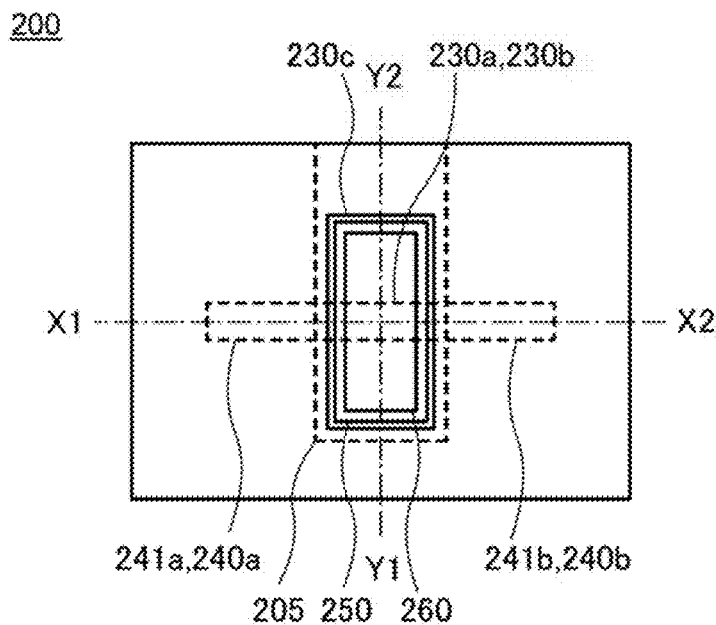
FIG. 7B
FIG. 7C
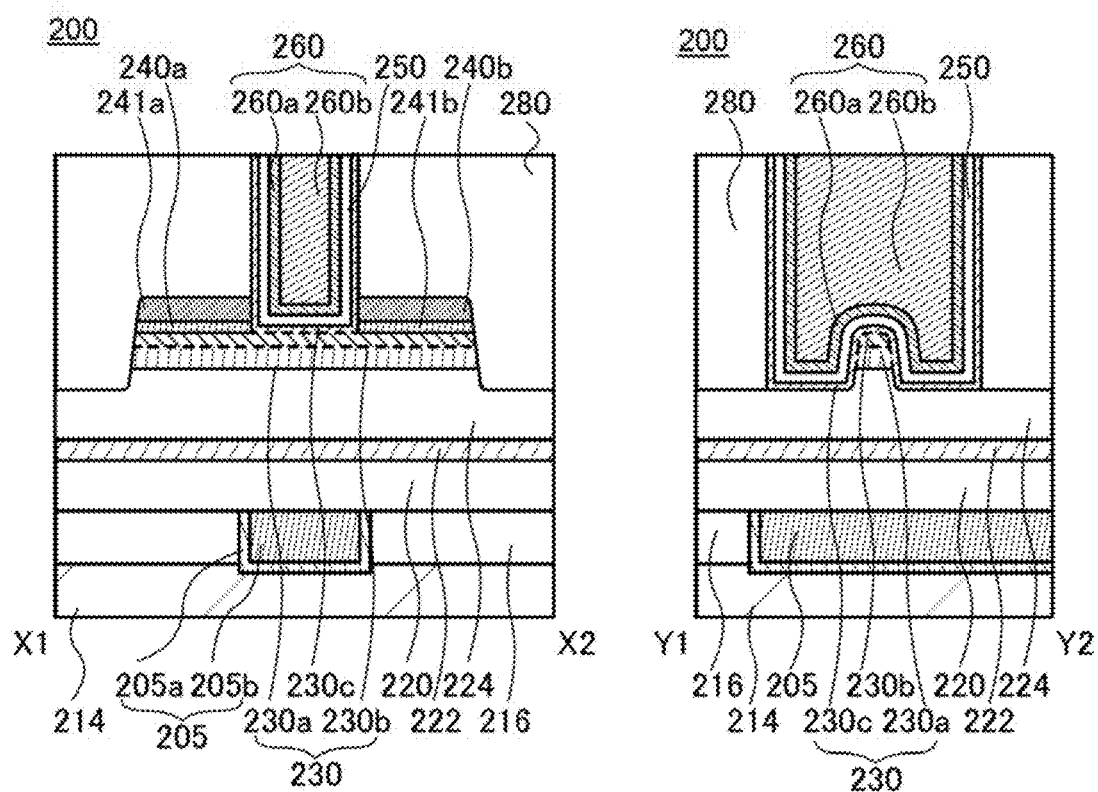

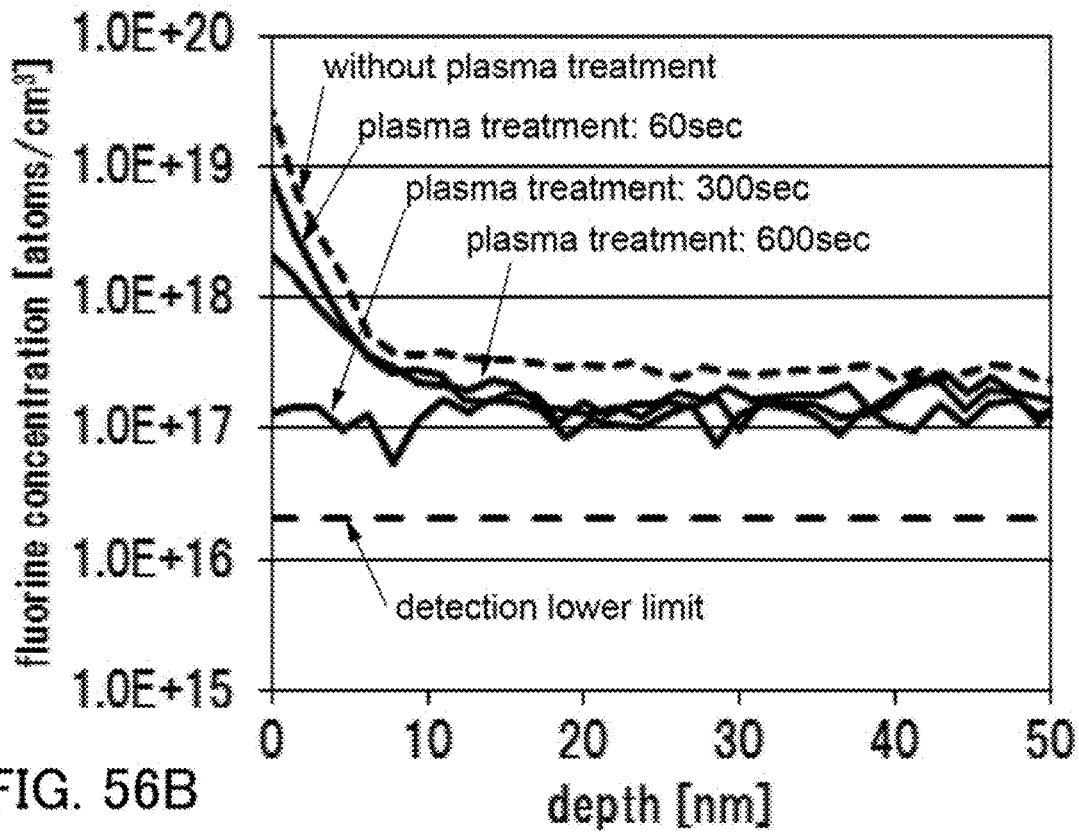
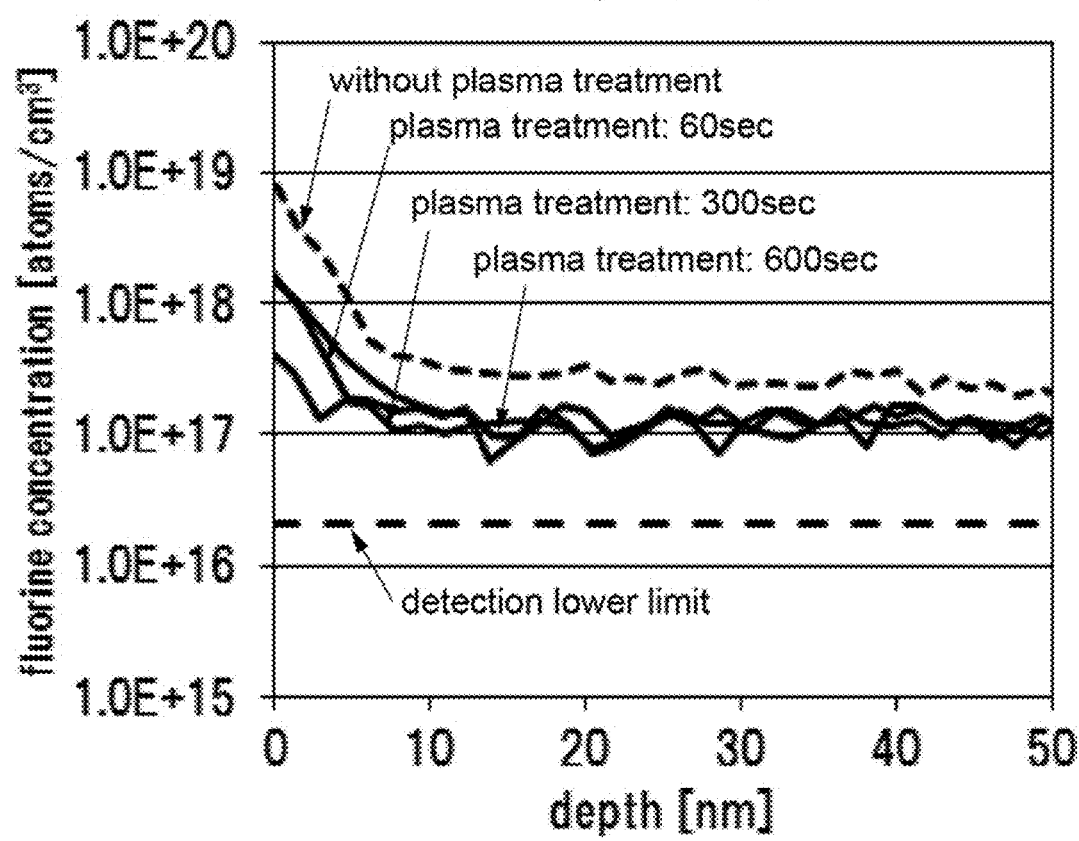

SEMICONDUCTOR DEVICE, SEMICONDUCTOR WAFER, MODULE, ELECTRONIC DEVICE, AND MANUFACTURING METHOD THEREOF

BACKGROUND OF THE INVENTION

1. Field of the Invention

The present invention relates to a transistor. The present invention relates to an object, a method, or a manufacturing method. One embodiment of the present invention relates to a process, a machine, manufacture, or a composition of matter. One embodiment of the present invention relates to a semiconductor device, a light-emitting device, a display device, an electronic appliance, a lighting device, and a manufacturing method thereof. In particular, one embodiment of the present invention relates to a light-emitting device using an organic electroluminescence (hereinafter also referred to as EL) phenomenon, and a method for fabricating the light-emitting device. For example, one embodiment of the present invention relates to an LSI, a CPU, a power device mounted in a power circuit, a semiconductor integrated circuit including a memory, a thyristor, a converter, an image sensor, or the like, and an electronic device including any of the above as a component.

Note that one embodiment of the present invention is not limited to the above technical field.

In this specification, a semiconductor device generally means a device that can function by utilizing semiconductor characteristics. An electro-optical device, a semiconductor circuit, and an electronic device include a semiconductor device in some cases.

2. Description of the Related Art

In recent years, semiconductor devices have been developed to be used mainly for an LSI, a CPU, or a memory. A CPU is an aggregation of semiconductor elements each provided with an electrode which is a connection terminal, which includes a semiconductor integrated circuit (including at least a transistor and a memory) separated from a semiconductor wafer.

A semiconductor circuit (IC chip) of an LSI, a CPU, a memory, or the like is mounted on a circuit board, for example, a printed wiring board, to be used as one of components of a variety of electronic devices.

A technique by which a transistor is formed using a semiconductor thin film formed over a substrate having an insulating surface has been attracting attention. The transistor is used in a wide range of electronic devices such as an integrated circuit (IC) or an image display device (also simply referred to as a display device). A silicon-based semiconductor material is widely known as a material for a semiconductor thin film that can be used for a transistor. As another material, an oxide semiconductor has been attracting attention.

It is known that a transistor including an oxide semiconductor has an extremely low leakage current in an off state. For example, a low-power-consumption CPU utilizing a characteristic of low leakage current of the transistor including an oxide semiconductor has been disclosed (see Patent Document 1).

A transistor including an oxide semiconductor is known to have a problem of low reliability because of high possibility of change in electrical characteristics, although the transistor including an oxide semiconductor can be operated at higher speed than a transistor including amorphous silicon and can be manufactured more easily than a transistor including polycrystalline silicon. For example, the threshold voltage of the transistor is changed in some cases after a bias-temperature stress test (BT test).

REFERENCE

Patent Document

[Patent Document 1] Japanese Published Patent Application No. 2012-257187

SUMMARY OF THE INVENTION

An object of one embodiment of the present invention is to improve the reliability of a semiconductor device including an oxide semiconductor. There is a problem in that a transistor including an oxide semiconductor tends to have normally-on characteristics and it is difficult to provide a logic circuit which operates properly in a driver circuit. Thus, an object of one embodiment of the present invention is to obtain normally-off characteristics of a transistor including an oxide semiconductor.

Another object is to provide a transistor having high reliability. Another object is to provide a transistor with extremely low leakage current in an off state.

Another object is to provide a semiconductor device having high reliability. Another object is to provide semiconductor devices with high productivity. Another object is to provide semiconductor devices with high yield. Another object is to provide a semiconductor device that occupies a small area.

Another object is to provide a highly integrated semiconductor device. Another object is to provide a semiconductor device which can operate at high speed. Another object is to provide a semiconductor device with low power consumption.

Another object is to provide a novel semiconductor device. Another object is to provide a module including any of the above semiconductor devices. Another object is to provide an electronic device including any of the above semiconductor devices or the module.

Note that the descriptions of these objects do not disturb the existence of other objects. In one embodiment of the present invention, there is no need to achieve all the objects. Other objects will be apparent from and can be derived from the description of the specification, the drawings, the claims, and the like.

(1) One embodiment of the present invention is a semiconductor device including a first insulator, a transistor over the first insulator, a second insulator over the transistor, and a third insulator over the second insulator. The transistor includes an oxide semiconductor. The second insulator has a property such that the amount of oxygen released from the second insulator when converted into oxygen molecules is larger than or equal to $1 \times 10^{14}$ molecules/cm$^2$ and smaller than $1 \times 10^{16}$ molecules/cm$^2$ in thermal desorption spectroscopy at a surface temperature of a film of the second insulator of higher than or equal to 50° C. and lower than or equal to 500° C. The second insulator includes oxygen, nitrogen, and silicon.

(2) One embodiment of the present invention is the semiconductor device described in (1) in which the third insulator includes a portion having a thickness of larger than or equal to 1 nm and smaller than 5 nm.

(3) One embodiment of the present invention is the semiconductor device described in (1) or (2) in which the third insulator includes a metal and oxygen.

(4) One embodiment of the present invention is a module including the semiconductor device described in any one of (1) to (3) and a printed circuit board.

(5) One embodiment of the present invention is an electronic device including the semiconductor device described in any one of (1) to (3), the module described in (4), and a speaker or an operation key.

(6) One embodiment of the present invention is a semiconductor wafer including a plurality of semiconductor devices described any one of (1) to (3) and a region for dicing.

(7) One embodiment of the present invention is a method for manufacturing a semiconductor device, including the steps of: forming a first insulator over a substrate; forming a transistor including an oxide semiconductor over the first insulator; forming a second insulator over the transistor; forming a third insulator over the second insulator; performing a plasma treatment including oxygen on the third insulator to add oxygen in the plasma as excess oxygen to the third insulator; and performing heat treatment to move the excess oxygen to the oxide semiconductor through the second insulator.

(8) One embodiment of the present invention is a method for manufacturing a module. The module includes the semiconductor device manufactured by the method described in (7) and a printed circuit board.

(9) One embodiment of the present invention is a method for manufacturing an electronic device. The electronic device includes the semiconductor device manufactured by the method described in (7), the module manufactured by the method described in (8), and a speaker or an operation key.

A change in electric characteristics can be prevented and reliability can be improved in a semiconductor device including a transistor including an oxide semiconductor. A transistor including an oxide semiconductor with high on-state current can be provided. A transistor including an oxide semiconductor with low off-state current can be provided. A semiconductor device with low power consumption can be provided.

A novel semiconductor device can be provided. A module including the semiconductor device can be provided. An electronic device including the semiconductor device or the module can be provided.

Note that the description of these effects does not preclude the existence of other effects. One embodiment of the present invention does not have to have all the effects listed above. Other effects will be apparent from and can be derived from the description of the specification, the drawings, the claims, and the like.

BRIEF DESCRIPTION OF THE DRAWINGS

FIGS. 4A and 4B illustrate cross-sectional structures of semiconductor devices of one embodiment.

FIGS. 5A and 5B illustrate cross-sectional structures of semiconductor devices of one embodiment.

FIGS. 7A to 7C illustrate a top view and cross-sectional structures of a transistor of one embodiment.

FIGS. 56A and 56B are graphs showing SIMS analysis results of Example 2.

DETAILED DESCRIPTION OF THE INVENTION

Figure 1:
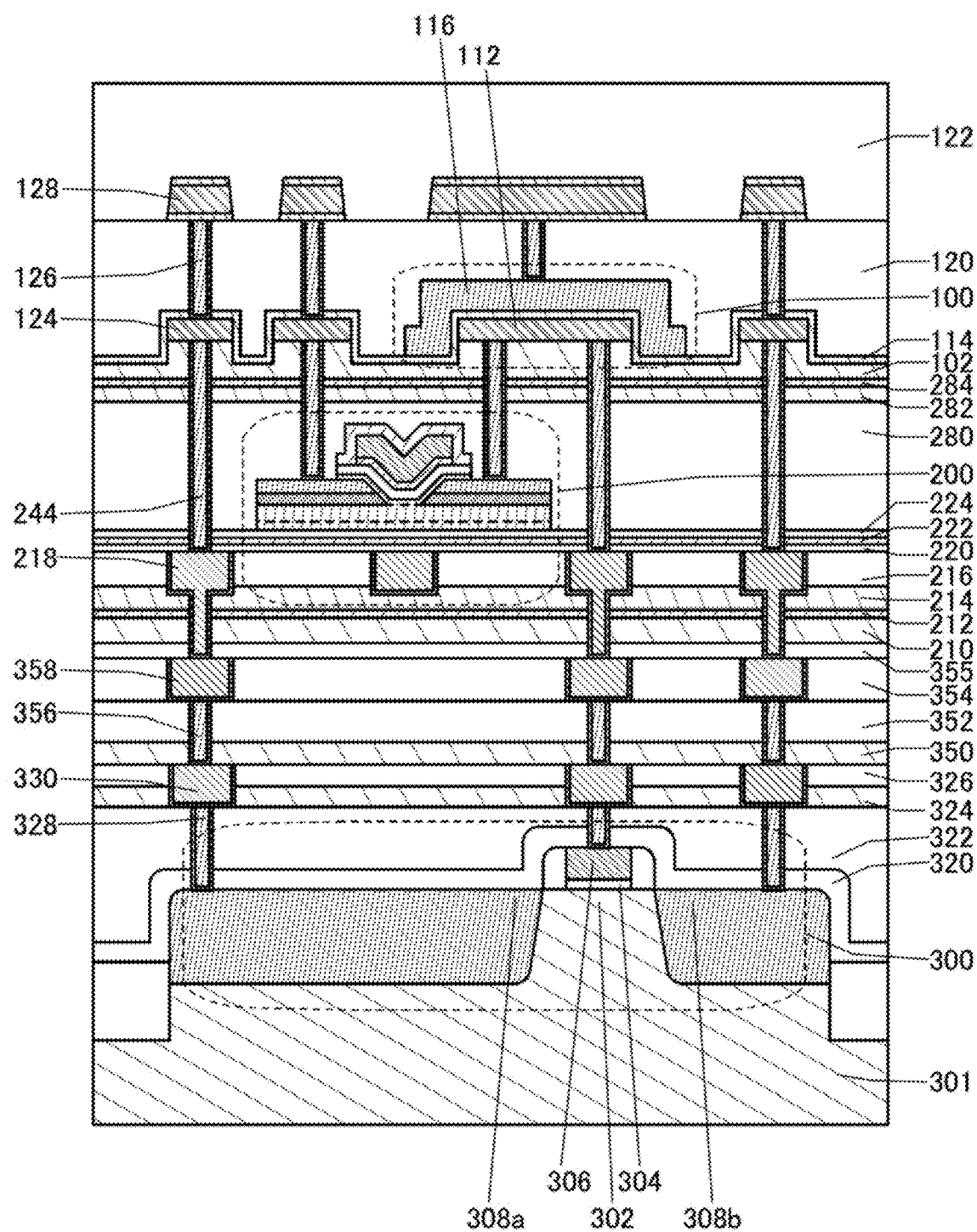
FIG. 1 illustrates a cross-sectional structure of a semiconductor device of one embodiment.

Hereinafter, embodiments will be described with reference to drawings. Note that the embodiments can be implemented with various modes, and it will be readily appreciated by those skilled in the art that modes and details can be changed in various ways without departing from the spirit and scope of the present invention. Thus, the present invention should not be interpreted as being limited to the following description of the embodiments.

In the drawings, the size, the layer thickness, or the region is exaggerated for clarity in some cases. Therefore, the size, the layer thickness, or the region is not limited to the illustrated scale. Note that the drawings are schematic views showing ideal examples, and embodiments of the present invention are not limited to shapes or values shown in the drawings. In the drawings, the same portions or portions having similar functions are denoted by the same reference numerals in different drawings, and explanation thereof will not be repeated. Further, the same hatching pattern is applied to portions having similar functions, and the portions are not especially denoted by reference numerals in some cases.

Note that the ordinal numbers such as "first", "second", and the like in this specification and the like are used for convenience and do not denote the order of steps or the stacking order of layers. Therefore, for example, description can be made even when "first" is replaced with "second" or "third", as appropriate. In addition, the ordinal numbers in this specification and the like are not necessarily the same as those which specify one embodiment of the present invention.

In this specification, terms for describing arrangement, such as "over", "above", "under", and "below", are used for convenience in describing a positional relation between components with reference to drawings. Furthermore, the positional relationship between components is changed as appropriate in accordance with a direction in which each component is described. Thus, there is no limitation on terms used in this specification, and description can be made appropriately depending on the situation.

The "semiconductor device" in this specification and the like means all devices which can operate by utilizing semiconductor characteristics. A semiconductor element such as a transistor, a semiconductor circuit, an arithmetic device, and a memory device are each an embodiment of a semiconductor device. An imaging device, a display device, a liquid crystal display device, a light-emitting device, an electro-optical device, a power generation device (including a thin film solar cell, an organic thin film solar cell, and the like), and an electronic device may each include a semiconductor device.

In this specification and the like, a transistor is an element having at least three terminals of a gate, a drain, and a source. The transistor has a channel region between a drain (a drain terminal, a drain region, or a drain electrode) and a source (a source terminal, a source region, or a source electrode), and current can flow through the drain, the channel region, and the source. Note that in this specification and the like, a channel region refers to a region through which current mainly flows.

Furthermore, functions of a source and a drain might be switched when transistors having different polarities are employed or a direction of current flow is changed in circuit operation, for example. Therefore, the terms "source" and "drain" can be switched in this specification and the like.

Note that in this specification and the like, a silicon oxynitride film refers to a film in which the proportion of oxygen is higher than that of nitrogen. The silicon oxynitride film preferably contains oxygen, nitrogen, silicon, and hydrogen at concentrations ranging from 55 atomic % to 65 atomic %, 1 atomic % to 20 atomic %, 25 atomic % to 35 atomic %, and 0.1 atomic % to 10 atomic %, respectively. A silicon nitride oxide film refers to a film in which the proportion of nitrogen is higher than that of oxygen. The silicon nitride oxide film preferably contains nitrogen, oxygen, silicon, and hydrogen at concentration ranging from 55 atomic % to 65 atomic %, 1 atomic % to 20 atomic %, 25 atomic % to 35 atomic %, and 0.1 atomic % to 10 atomic %, respectively.

In this specification and the like, the terms "film" and "layer" can be interchanged with each other. For example, the term "conductive layer" can be changed into the term "conductive film" in some cases. Also, the term "insulating film" can be changed into the term "insulating layer" in some cases.

In this specification and the like, the term "parallel" indicates that the angle formed between two straight lines is greater than or equal to −10° and less than or equal to 10°, and accordingly also includes the case where the angle is greater than or equal to −5° and less than or equal to 5°. In addition, the term "substantially parallel" indicates that the angle formed between two straight lines is greater than or equal to −30° and less than or equal to 30°. The term "perpendicular" indicates that the angle formed between two straight lines is greater than or equal to 80° and less than or equal to 100°, and accordingly also includes the case where the angle is greater than or equal to 85° and less than or equal to 95°. In addition, the term "substantially perpendicular" indicates that the angle formed between two straight lines is greater than or equal to 60° and less than or equal to 120°.

For example, in this specification and the like, an explicit description "X and Y are connected" means that X and Y are electrically connected, X and Y are functionally connected, and X and Y are directly connected. Accordingly, without being limited to a predetermined connection relationship, for example, a connection relationship shown in drawings or texts, another connection relationship is included in the drawings or the texts.

Here, X and Y each denote an object (e.g., a device, an element, a circuit, a wiring, an electrode, a terminal, a conductive film, or a layer).

Examples of the case where X and Y are directly connected include the case where an element that allows an electrical connection between X and Y (e.g., a switch, a transistor, a capacitor, an inductor, a resistor, a diode, a display element, a light-emitting element, and a load) is not connected between X and Y, and the case where X and Y are connected without the element that allows the electrical connection between X and Y provided therebetween.

For example, in the case where X and Y are electrically connected, one or more elements that enable an electrical connection between X and Y (e.g., a switch, a transistor, a capacitor, an inductor, a resistor, a diode, a display element, a light-emitting element, or a load) can be connected between X and Y. Note that the switch is controlled to be turned on or off. That is, the switch is conducting or not conducting (is turned on or off) to determine whether current flows therethrough or not. Alternatively, the switch has a function of selecting and changing a current path. Note that the case where X and Y are electrically connected includes the case where X and Y are directly connected.

For example, in the case where X and Y are functionally connected, one or more circuits that enable a functional connection between X and Y (e.g., a logic circuit such as an inverter, a NAND circuit, or a NOR circuit; a signal converter circuit such as a D/A converter circuit, an A/D converter circuit, or a gamma correction circuit; a potential level converter circuit such as a power supply circuit (e.g., a step-up circuit or a step-down circuit) or a level shifter circuit for changing the potential level of a signal; a voltage source; a current source; a switching circuit; an amplifier circuit such as a circuit that can increase signal amplitude, the amount of current, or the like, an operational amplifier, a differential amplifier circuit, a source follower circuit, and a buffer circuit; a signal generation circuit; a memory circuit; or a control circuit) can be connected between X and Y. For example, even when another circuit is interposed between X and Y, X and Y are functionally connected if a signal output from X is transmitted to Y. Note that the case where X and Y are functionally connected includes the case where X and Y are directly connected and the case where X and Y are electrically connected.

Note that in this specification and the like, an explicit description "X and Y are electrically connected" means that X and Y are electrically connected (i.e., the case where X and Y are connected with another element or another circuit provided therebetween), X and Y are functionally connected (i.e., the case where X and Y are functionally connected with another circuit provided therebetween), and X and Y are directly connected (i.e., the case where X and Y are connected without another element or another circuit provided therebetween). That is, in this specification and the like, the explicit description "X and Y are electrically connected" is the same as the description "X and Y are connected".

For example, any of the following expressions can be used for the case where a source (or a first terminal or the like) of a transistor is electrically connected to X through (or not through) Z1 and a drain (or a second terminal or the like) of the transistor is electrically connected to Y through (or not through) Z2, or the case where a source (or a first terminal or the like) of a transistor is directly connected to one part of Z1 and another part of Z1 is directly connected to X while a drain (or a second terminal or the like) of the transistor is directly connected to one part of Z2 and another part of Z2 is directly connected to Y.

Examples of the expressions include, "X, Y, a source (or a first terminal or the like) of a transistor, and a drain (or a second terminal or the like) of the transistor are electrically connected to each other, and X, the source (or the first terminal or the like) of the transistor, the drain (or the second terminal or the like) of the transistor, and Y are electrically connected to each other in this order", "a source (or a first terminal or the like) of a transistor is electrically connected to X, a drain (or a second terminal or the like) of the transistor is electrically connected to Y, and X, the source (or the first terminal or the like) of the transistor, the drain (or the second terminal or the like) of the transistor, and Y are electrically connected to each other in this order", and "X is electrically connected to Y through a source (or a first terminal or the like) and a drain (or a second terminal or the like) of a transistor, and X, the source (or the first terminal or the like) of the transistor, the drain (or the second terminal or the like) of the transistor, and Y are provided to be connected in this order". When the connection order in a circuit configuration is defined by an expression similar to the above examples, a source (or a first terminal or the like) and a drain (or a second terminal or the like) of a transistor can be distinguished from each other to specify the technical scope.

Other examples of the expressions include, "a source (or a first terminal or the like) of a transistor is electrically connected to X through at least a first connection path, the first connection path does not include a second connection path, the second connection path is a path between the source (or the first terminal or the like) of the transistor and a drain (or a second terminal or the like) of the transistor, Z1 is on the first connection path, the drain (or the second terminal or the like) of the transistor is electrically connected to Y through at least a third connection path, the third connection path does not include the second connection path, and Z2 is on the third connection path" and "a source (or a first terminal or the like) of a transistor is electrically connected to X at least with a first connection path through Z1, the first connection path does not include a second connection path, the second connection path includes a connection path through which the transistor is provided, a drain (or a second terminal or the like) of the transistor is electrically connected to Y at least with a third connection path through Z2, and the third connection path does not include the second connection path." Still another example of the expression is "a source (or a first terminal or the like) of a transistor is electrically connected to X through at least Z1 on a first electrical path, the first electrical path does not include a second electrical path, the second electrical path is an electrical path from the source (or the first terminal or the like) of the transistor to a drain (or a second terminal or the like) of the transistor, the drain (or the second terminal or the like) of the transistor is electrically connected to Y through at least Z2 on a third electrical path, the third electrical path does not include a fourth electrical path, and the fourth electrical path is an electrical path from the drain (or the second terminal or the like) of the transistor to the source (or the first terminal or the like) of the transistor". When the connection path in a circuit structure is defined by an expression similar to the above examples, a source (or a first terminal or the like) and a drain (or a second terminal or the like) of a transistor can be distinguished from each other to specify the technical scope.

Note that these expressions are examples and there is no limitation on the expressions. Here, X, Y, Z1, and Z2 each denote an object (e.g., a device, an element, a circuit, a wiring, an electrode, a terminal, a conductive film, and a layer).

Even when independent components are electrically connected to each other in a circuit diagram, one component has functions of a plurality of components in some cases. For example, when part of a wiring also functions as an electrode, one conductive film functions as the wiring and the electrode. Thus, "electrical connection" in this specification includes in its category such a case where one conductive film has functions of a plurality of components.

Embodiment 1

In this embodiment, one mode of a semiconductor device is described with reference to FIGS. 1 to 5B, FIGS. 19A and 19B, and FIG. 50.

STRUCTURE EXAMPLES

Figure 2:
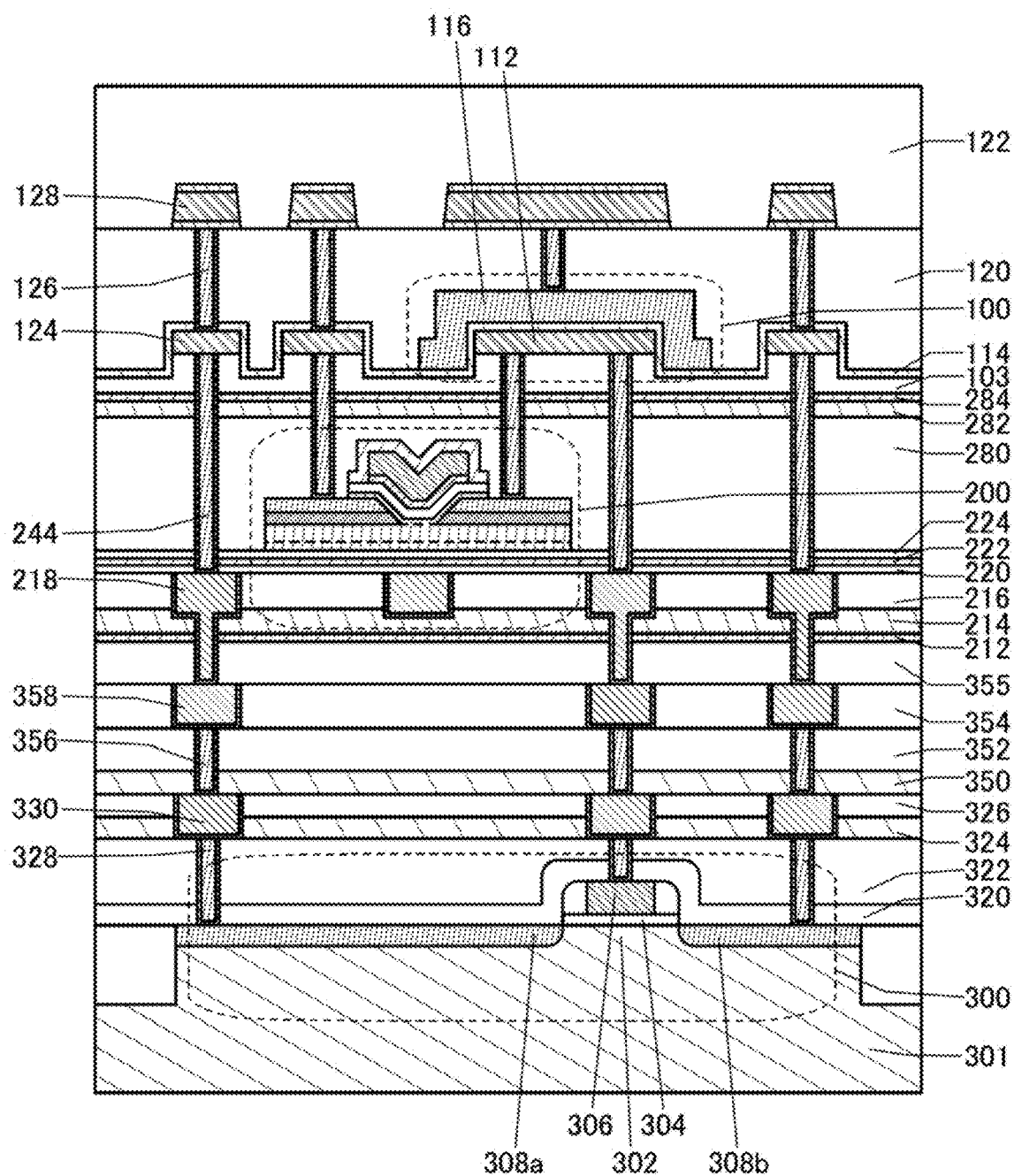
FIG. 2 illustrates a cross-sectional structure of a semiconductor device of one embodiment.
Figure 3:
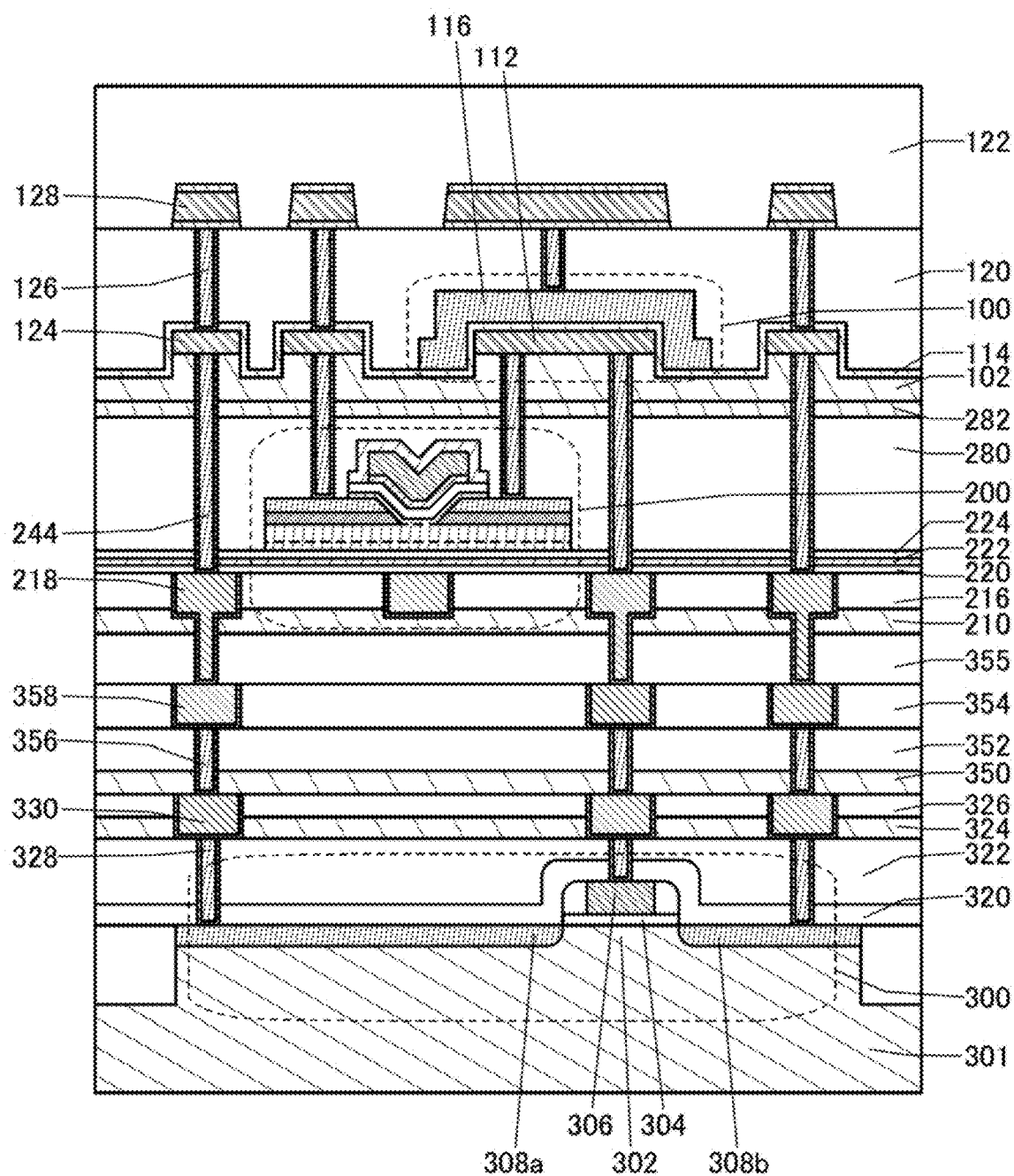
FIG. 3 illustrates a cross-sectional structure of a semiconductor device of one embodiment.
Figure 19A:
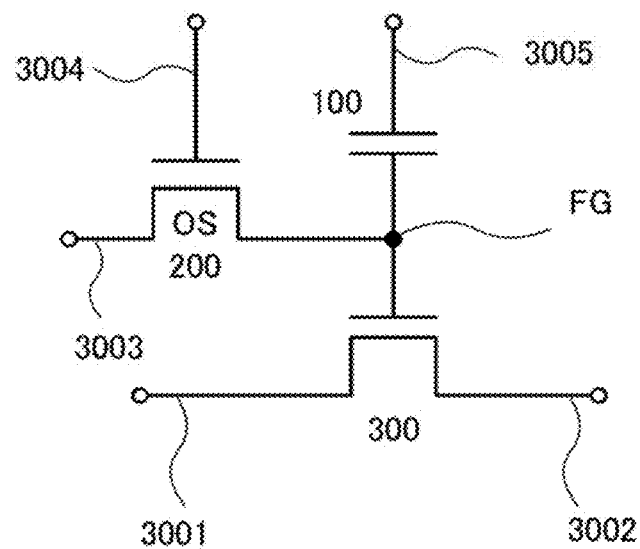
FIGS. 19A and 19B are circuit diagrams of a semiconductor device of one embodiment.

Examples of a semiconductor device (memory device) of one embodiment of the present invention are shown in FIGS. 1 to 5B and FIGS. 19A and 19B. Note that FIG. 19A is a circuit diagram of FIGS. 1 to 3. FIGS. 4A and 4B and FIGS. 5A and 5B show end portions of regions where semiconductor devices shown in FIGS. 1 to 3 are formed.
<Circuit Configuration 1 of Semiconductor Device>

Semiconductor devices shown in FIGS. 1 to 3 and FIG. 19A each include a transistor 300, a transistor 200, and a capacitor 100.

The transistor 200 is a transistor in which a channel is formed in a semiconductor layer including an oxide semiconductor. Since the off-state current of the transistor 200 is small, by using the transistor 200 in a semiconductor device (memory device), stored data can be retained for a long time. In other words, it is possible to obtain a semiconductor device (memory device) which does not require refresh operation or has an extremely low frequency of the refresh operation, which leads to a sufficient reduction in power consumption.

In FIG. 19A, a first wiring 3001 is electrically connected to a source of the transistor 300. A second wiring 3002 is electrically connected to a drain of the transistor 300. A third wiring 3003 is electrically connected to one of a source and a drain of the transistor 200. A fourth wiring 3004 is electrically connected to a gate of the transistor 200. A gate of the transistor 300 and the other of the source and the drain of the transistor 200 are electrically connected to one electrode of the capacitor 100. A fifth wiring 3005 is electrically connected to the other electrode of the capacitor 100.

The semiconductor device in FIG. 19A has a feature that the potential of the gate of the transistor 300 can be retained, and thus enables writing, retaining, and reading of data as follows.

Writing and retaining of data will be described. First, the potential of the fourth wiring 3004 is set to a potential at which the transistor 200 is turned on, so that the transistor 200 is turned on. Accordingly, the potential of the third wiring 3003 is supplied to a node FG where the gate of the transistor 300 and the one electrode of the capacitor 100 are electrically connected to each other. That is, a predetermined charge is supplied to the gate of the transistor 300 (writing). Here, one of two kinds of charges providing different potential levels (hereinafter referred to as a low-level charge and a high-level charge) is supplied. After that, the potential of the fourth wiring 3004 is set to a potential at which the transistor 200 is turned off, so that the transistor 200 is turned off. Thus, the charge is retained at the node FG (retaining).

In the case where the off-state current of the transistor 200 is low, the electric charge of the node FG is retained for a long time.

Next, reading of data is described. An appropriate potential (a reading potential) is supplied to the fifth wiring 3005 while a predetermined potential (a constant potential) is supplied to the first wiring 3001, whereby the potential of the second wiring 3002 varies depending on the amount of charge retained in the node FG. This is because in the case of using an n-channel transistor as the transistor 300, an apparent threshold voltage $V_{th\_H}$ at the time when the high-level electric charge is given to the gate of the transistor 300 is lower than an apparent threshold voltage $V_{th\_L}$ at the time when the low-level electric charge is given to the gate of the transistor 300. Here, an apparent threshold voltage refers to the potential of the fifth wiring 3005 which is needed to make the transistor 300 be in "on state". Thus, the potential of the fifth wiring 3005 is set to a potential $V_0$ which is between $V_{th\_H}$ and $V_{th\_L}$, whereby charge supplied to the node FG can be determined. For example, in the case where the high-level charge is supplied to the node FG in writing and the potential of the fifth wiring 3005 is $V_0$ ($>V_{th\_H}$), the transistor 300 is brought into "on state". On the other hand, in the case where the low-level charge is supplied to the node FG in writing, even when the potential of the fifth wiring 3005 is $V_0$ ($<V_{th\_L}$), the transistor 300 remains in "off state". Thus, the data retained in the node FG can be read by determining the potential of the second wiring 3002.

By arranging semiconductor devices each having the structure illustrated in FIG. 19A in a matrix, a memory device (memory cell array) can be formed.

Note that in the case where memory cells are arrayed, it is necessary that data of a desired memory cell is read in read operation. For example, in the case of a NOR-type memory cell array, only data of a desired memory cell can be read by turning off the transistors 300 of memory cells from which data is not read. In this case, a potential at which the transistor 300 is turned off regardless of the charge supplied to the node FG, that is, a potential lower than $V_{th\_H}$ is supplied to the fifth wiring 3005 connected to the memory cells from which data is not read. Alternatively, in the case of a NAND-type memory cell array, for example, only data of a desired memory cell can be read by turning on the transistors 300 of memory cells from which data is not read. In this case, a potential at which the transistor 300 is turned on regardless of the charge supplied to the node FG, that is, a potential higher than $V_{th\_L}$ is supplied to the fifth wiring 3005 connected to the memory cells from which data is not read.

<Circuit Configuration 2 of Semiconductor Device>

Figure 19B:
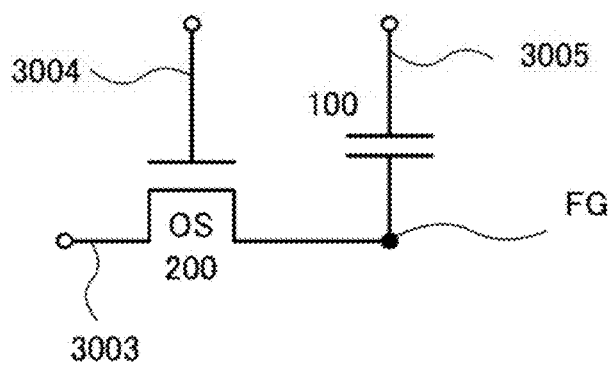

A semiconductor device in FIG. 19B is different from the semiconductor device in FIG. 19A in that the transistor 300 is not provided. Also in this case, data can be written and retained in a manner similar to that of the semiconductor device in FIG. 19A.

Reading of data in the semiconductor device in FIG. 19B is described. When the transistor 200 is brought into on state, the third wiring 3003 which is in a floating state and the capacitor 100 are brought into conduction, and the electric charge is redistributed between the third wiring 3003 and the capacitor 100. As a result, the potential of the third wiring 3003 is changed. The amount of change in the potential of the third wiring 3003 varies depending on the potential of the one electrode of the capacitor 100 (or the electric charge accumulated in the capacitor 100).

For example, the potential of the third wiring 3003 after the charge redistribution is $(C_B \times V_{B0} + C \times V)/(C_B + C)$, where V is the potential of the one electrode of the capacitor 100, C is the capacitance of the capacitor 100, $C_B$ is the capacitance component of the third wiring 3003, and $V_{B0}$ is the potential of the third wiring 3003 before the charge redistribution. Thus, it can be found that, assuming that the memory cell is in either of two states in which the potential of the one electrode of the capacitor 100 is $V_1$ and $V_0$ ($V_1 > V_0$), the potential of the third wiring 3003 in the case of retaining the potential $V_1$ $(=(C_B \times V_{B0} + C \times V_1)/(C_B + C))$ is higher than the potential of the third wiring 3003 in the case of retaining the potential $V_0$ $(=(C_B \times V_{B0} + C \times V_0)/(C_B + C))$.

Then, by comparing the potential of the third wiring 3003 with a predetermined potential, data can be read.

In this case, the transistor 300 may be used for a driver circuit for driving a memory cell, and the transistor 200 may be stacked over the driver circuit.

When including a transistor using an oxide semiconductor and having a low off-state current, the semiconductor device described above can retain stored data for a long time. In other words, refresh operation becomes unnecessary or the frequency of the refresh operation can be extremely low, which leads to a sufficient reduction in power consumption. Moreover, stored data can be retained for a long time even when power is not supplied (note that a potential is preferably fixed).

Furthermore, in the semiconductor device, high voltage is not needed for writing data and deterioration of elements is less likely to occur. Unlike in a conventional nonvolatile memory, for example, it is not necessary to inject and extract electrons into and from a floating gate; thus, a problem such as deterioration of an insulator is not caused. That is, unlike a conventional nonvolatile memory, the semiconductor device of one embodiment of the present invention does not have a limit on the number of times data can be rewritten, and the reliability thereof is drastically improved. Furthermore, data is written depending on the state of the transistor (on or off), whereby high-speed operation can be easily achieved.

<Structure 1 of Semiconductor Device>

The semiconductor device of one embodiment of the present invention includes the transistor 300, the transistor 200, and the capacitor 100 as shown in FIG. 1. The transistor 200 is provided over the transistor 300, and the capacitor 100 is provided over the transistor 300 and the transistor 200.

The transistor 300 includes a substrate 301, a conductor 306, an insulator 304, a semiconductor region 302 that is a part of the substrate 301, and low-resistance regions 308a and 308b functioning as a source region and a drain region.

The transistor 300 may be a p-channel transistor or an n-channel transistor.

It is preferable that a region of the semiconductor region 302 where a channel is formed, a region in the vicinity thereof, the low-resistance regions 308a and 308b functioning as a source region and a drain region, and the like contain a semiconductor such as a silicon-based semiconductor, more preferably single crystal silicon. Alternatively, a material including germanium (Ge), silicon germanium (SiGe), gallium arsenide (GaAs), gallium aluminum arsenide (GaAlAs), or the like may be contained. Silicon whose effective mass is controlled by applying stress to the crystal lattice and thereby changing the lattice spacing may be contained. Alternatively, the transistor 300 may be a high-electron-mobility transistor (HEMT) with GaAs and GaAlAs or the like.

The low-resistance regions 308a and 308b contain an element which imparts n-type conductivity, such as arsenic or phosphorus, or an element which imparts p-type conductivity, such as boron, in addition to a semiconductor material used for the semiconductor region 302.

The conductor 306 functioning as a gate electrode can be formed using a semiconductor material such as silicon containing the element which imparts n-type conductivity, such as arsenic or phosphorus, or the element which imparts p-type conductivity, such as boron, or a conductive material such as a metal material, an alloy material, or a metal oxide material.

Note that a work function is determined by a material of the conductor, whereby the threshold voltage can be adjusted. Specifically, it is preferable to use titanium nitride, tantalum nitride, or the like as the conductor. Furthermore, in order to ensure the conductivity and embeddability of the conductor, it is preferable to use a laminated layer of metal materials such as tungsten and aluminum as the conductor. In particular, tungsten is preferable in terms of heat resistance.

In the transistor 300 shown in FIG. 1, the semiconductor region 302 (part of the substrate 301) in which a channel is formed includes a protruding portion. Furthermore, the conductor 306 is provided to cover a side surface and a top surface of the semiconductor region 302 with the insulator 304 therebetween. Note that the conductor 306 may be formed using a material for adjusting the work function. The transistor 300 having such a structure is also referred to as a FIN-type transistor because the protruding portion of the semiconductor substrate is utilized. An insulator serving as a mask for forming the protruding portion may be provided in contact with a top surface of the protruding portion. Although the case where the protruding portion is formed by processing part of the semiconductor substrate is described here, a semiconductor film having a protruding shape may be formed by processing a silicon-on-insulator (SOI) substrate.

Note that the transistor 300 shown in FIG. 1 is just an example and is not limited to the structure shown therein; an appropriate transistor may be used in accordance with a circuit configuration or a driving method. For example, the transistor 300 may be a planar transistor as shown in FIG. 2. In the case of using the circuit configuration shown in FIG. 19B, the transistor 300 may be omitted.

An insulator 320, an insulator 322, an insulator 324, and an insulator 326 are stacked sequentially and cover the transistor 300.

The insulator 320, the insulator 322, the insulator 324, and the insulator 326 can be formed using, for example, silicon oxide, silicon oxynitride, silicon nitride oxide, silicon nitride, aluminum oxide, aluminum oxynitride, aluminum nitride oxide, aluminum nitride, or the like.

The insulator 322 functions as a planarization film for eliminating a level difference caused by the transistor 300 or the like underlying the insulator 322. A top surface of the insulator 322 may be planarized by planarization treatment using a chemical mechanical polishing (CMP) method or the like to increase the level of planarity.

The insulator 324 is preferably formed using, for example, a film having a barrier property that prevents hydrogen or impurities from diffusing from the substrate 301, the transistor 300, or the like into a region where the transistor 200 is formed.

As an example of the film having a barrier property with respect to hydrogen, silicon nitride formed by a chemical vapor deposition (CVD) method can be given. Diffusion of hydrogen into a semiconductor element including an oxide semiconductor, such as the transistor 200, degrades the characteristics of the semiconductor element in some cases. Therefore, a film that prevents hydrogen diffusion is preferably provided between the transistor 200 and the transistor 300. Specifically, the film that prevents hydrogen diffusion is a film from which hydrogen is less likely to be released.

The amount of released hydrogen can be measured by thermal desorption spectroscopy (TDS), for example. The amount of hydrogen released from the insulator 324 that is converted into hydrogen atoms per area of the insulator 324 is less than or equal to $10 \times 10^{15}$ atoms/cm$^2$, preferably less than or equal to $5 \times 10^{15}$ atoms/cm$^2$ in TDS analysis in the range of 50° C. to 500° C., for example.

Note that the relative dielectric constant of the insulator 326 is preferably lower than that of the insulator 324. For example, the relative dielectric constant of the insulator 326 is preferably lower than 4, more preferably lower than 3. For example, the relative dielectric constant of the insulator 326 is preferably 0.7 times or less that of the insulator 324, more preferably 0.6 times or less that of the insulator 324. In the case where a material with a low relative dielectric constant is used as an interlayer film, the parasitic capacitance between wirings can be reduced.

A conductor 328, a conductor 330, and the like that are electrically connected to the capacitor 100 and/or the transistor 200 are embedded in the insulator 320, the insulator 322, the insulator 324, and the insulator 326. Note that the conductor 328 and the conductor 330 each function as a plug or a wiring. Note that a plurality of structures of conductors functioning as plugs or wirings are collectively denoted by the same reference numeral in some cases, as described later. Furthermore, in this specification and the like, a wiring and a plug electrically connected to the wiring may be a single component. That is, there are cases where a part of a conductor functions as a wiring and a part of a conductor functions as a plug.

As a material of each of plugs and wirings (e.g., the conductor 328 and the conductor 330), a conductive material such as a metal material, an alloy material, a metal nitride material, or a metal oxide material can be used in a single-layer structure or a stacked-layer structure. It is preferable to use a high-melting-point material that has both heat resistance and conductivity, such as tungsten or molybdenum, and it is particularly preferable to use tungsten. Alternatively, a low-resistance conductive material such as aluminum or copper is preferably used. The use of a low-resistance conductive material can reduce wiring resistance.

A wiring layer may be provided over the insulator 326 and the conductor 330. For example, in FIG. 1, an insulator 350, an insulator 352, and an insulator 354 are stacked sequentially. Furthermore, a conductor 356 and a conductor 358 are formed in the insulator 350, the insulator 352, and the insulator 354. The conductor 356 and the conductor 358 each function as a plug or a wiring. Note that the conductor 356 and the conductor 358 can be formed using a material similar to that used for forming the conductor 328 and the conductor 330.

Note that for example, the insulator 350 is preferably formed using an insulator having a barrier property with respect to hydrogen, like the insulator 324. Furthermore, the conductor 356 and the conductor 358 preferably include a conductor having a barrier property with respect to hydrogen. The conductor having a barrier property with respect to hydrogen is formed particularly in an opening portion of the insulator 350 having a barrier property with respect to hydrogen. In such a structure, the transistor 300 and the transistor 200 can be separated by a barrier layer, so that diffusion of hydrogen from the transistor 300 to the transistor 200 can be prevented.

Note that as the conductor having a barrier property with respect to hydrogen, tantalum nitride may be used, for example. By stacking tantalum nitride and tungsten, which has high conductivity, diffusion of hydrogen from the transistor 300 can be prevented while the conductivity of a wiring is ensured. In this case, a tantalum nitride layer having a barrier property with respect to hydrogen is preferably in contact with the insulator 350 having a barrier property with respect to hydrogen.

An insulator 355, an insulator 210, an insulator 212, and an insulator 214 are stacked sequentially over the insulator 354. A material having a barrier property with respect to oxygen or hydrogen is preferably used for one or all of the insulator 355, the insulator 210, the insulator 212, and the insulator 214.

The insulator 210 is preferably formed using, for example, a film having a barrier property that prevents hydrogen or impurities from diffusing from a region where the substrate 301 or the transistor 300 is formed or the like into a region where the transistor 200 is formed. Therefore, the insulator 210 can be formed using a material similar to that used for forming the insulator 324.

As an example of the film having a barrier property with respect to hydrogen, silicon nitride formed by a CVD method can be given. Diffusion of hydrogen into a semiconductor element including an oxide semiconductor, such as the transistor 200, degrades the characteristics of the semiconductor element in some cases. Therefore, a film that prevents hydrogen diffusion is preferably provided between the transistor 200 and the transistor 300. Specifically, the film that prevents hydrogen diffusion is a film from which hydrogen is less likely to be released.

As the insulator 212 and the insulator 214, metal oxide such as aluminum oxide, hafnium oxide, or tantalum oxide is preferably used, for example.

In particular, aluminum oxide has an excellent blocking effect that prevents permeation of oxygen and impurities such as hydrogen and moisture which cause a change in electrical characteristics of the transistor. Accordingly, the use of aluminum oxide can prevent entry of impurities such as hydrogen and moisture into the transistor 200 in and after a manufacturing process of the transistor. In addition, release of oxygen from oxide in the transistor 200 can be prevented. Therefore, aluminum oxide is suitably used as a protective film for the transistor 200.

An insulator 216 is provided over the insulator 214. The insulator 216 can be formed using a material similar to that used for forming the insulator 320. For example, a silicon oxide film, a silicon oxynitride film, or the like can be used as the insulator 216.

A conductor 218, a conductor forming the transistor 200, and the like are embedded in the insulator 210, the insulator 212, the insulator 214, and the insulator 216. Note that the conductor 218 functions as a plug or a wiring that is electrically connected to the capacitor 100 or the transistor 300. The conductor 218 can be formed using a material similar to that used for forming the conductor 328 and the conductor 330.

In particular, the conductor 218 in a region in contact with the insulator 210, the insulator 212, and the insulator 214 is preferably a conductor having a barrier property with respect to oxygen, hydrogen, and water. In such a structure, the transistor 300 and the transistor 200 can be completely separated by a layer having a barrier property with respect to oxygen, hydrogen, and water, so that diffusion of hydrogen from the transistor 300 into the transistor 200 can be prevented.

Figure 62:
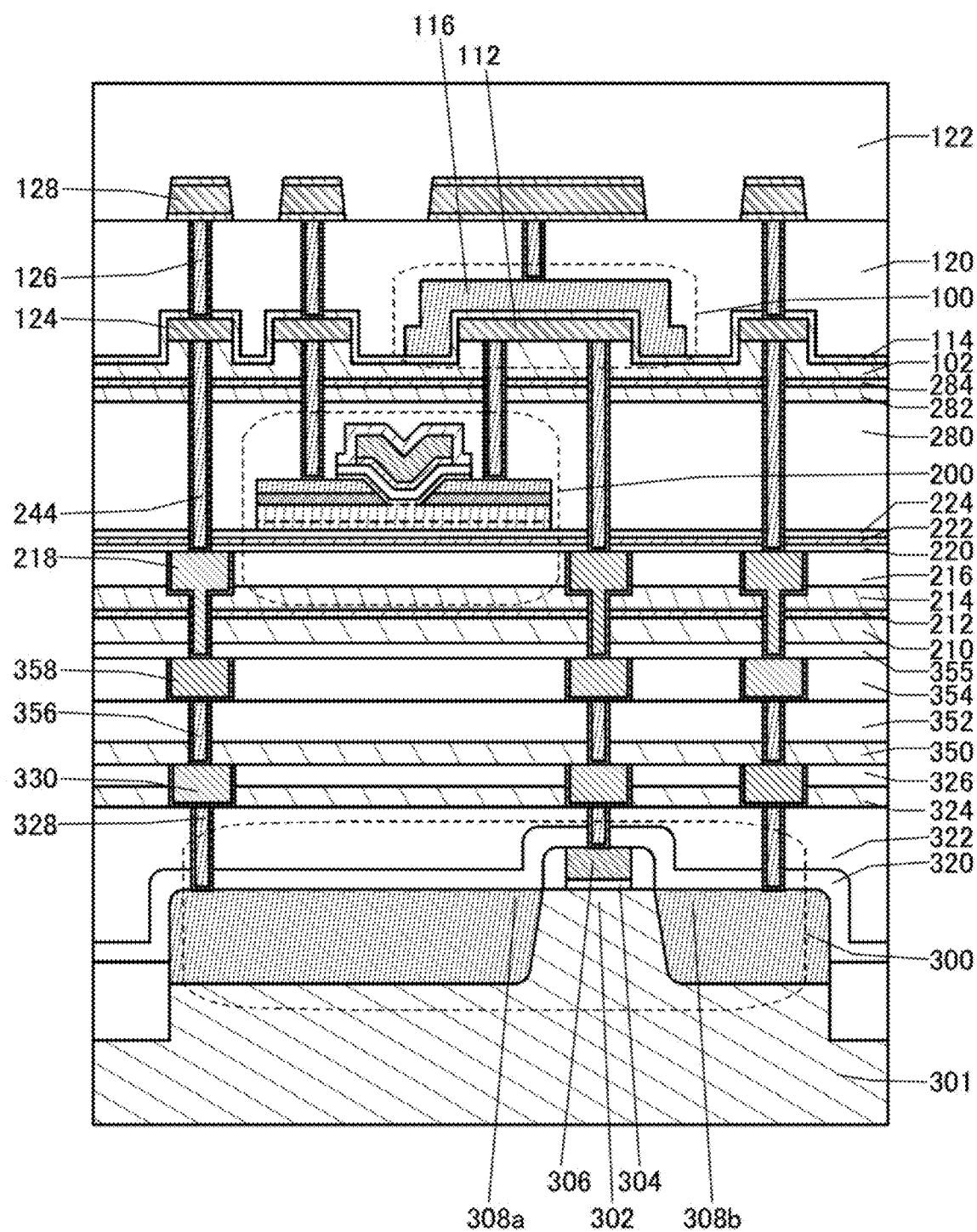
FIG. 62 illustrates a cross-sectional structure of a semiconductor device of one embodiment.

The transistor 200 is provided over the insulator 214. Note that a structure of the transistor 200 is described below using FIGS. 6A to 6C, FIGS. 7A to 7C, and FIGS. 8A to 8C. Note that the transistor 200 shown in FIG. 1 is just an example and is not limited to the structure shown therein; an appropriate transistor may be used in accordance with a circuit configuration or a driving method. For example, the transistor 200 may have a structure without the conductor 218 (see FIG. 62).

An insulator 280 is provided over the transistor 200. The insulator 280 preferably includes oxide containing oxygen in excess of that in the stoichiometric composition. That is, in the insulator 280, a region containing oxygen in excess of that in the stoichiometric composition (hereinafter also referred to as excess-oxygen region) is preferably formed. In particular, in the case of using an oxide semiconductor in the transistor 200, when an insulator including an excess-oxygen region is provided in an interlayer film or the like in the vicinity of the transistor 200, oxygen vacancies in the transistor 200 are reduced, whereby the reliability can be improved.

As the insulator including the excess-oxygen region, specifically, an oxide material that releases part of oxygen by heating is preferably used. An oxide that releases part of oxygen by heating is an oxide film of which the amount of released oxygen converted into oxygen molecules is larger than or equal to $1 \times 10^{14}$ molecules/cm$^2$ and smaller than $1 \times 10^{16}$ molecules/cm$^2$ in TDS analysis at a surface temperature of a film of the oxide of higher than or equal to 50° C. and lower than or equal to 500° C. Note that the temperature of the film surface in the TDS analysis is preferably higher than or equal to 100° C. and lower than or equal to 700° C., or higher than or equal to 100° C. and lower than or equal to 500° C.

For example, as such a material, a material containing silicon oxide or silicon oxynitride is preferably used. Alternatively, a metal oxide can be used. Note that in this specification, "silicon oxynitride" refers to a material that contains oxygen at a higher proportion than nitrogen, and "silicon nitride oxide" refers to a material that contains nitrogen at a higher proportion than oxygen.

The insulator 280 covering the transistor 200 may function as a planarization film that covers a roughness thereunder.

An insulator 282, an insulator 284, and an insulator 102 are stacked sequentially over the insulator 280. A conductor 244 and the like are embedded in an insulator 220, an insulator 222, an insulator 224, the insulator 280, the insulator 282, the insulator 284, and the insulator 102. Note that the conductor 244 functions as a plug or a wiring that is electrically connected to the capacitor 100, the transistor 200, or the transistor 300. The conductor 244 can be formed using a material similar to that used for forming the conductor 328 and the conductor 330.

A material having a barrier property with respect to oxygen or hydrogen is preferably used for one or all of the insulator 282, the insulator 284, and the insulator 102. Thus, the insulator 282 can be formed using a material similar to that used for forming the insulator 214. The insulator 284 can be formed using a material similar to that used for forming the insulator 212. The insulator 102 can be formed using an insulator similar to that of the insulator 210.

As the insulator 282 and the insulator 284, metal oxide such as aluminum oxide, hafnium oxide, or tantalum oxide is preferably used, for example.

In particular, aluminum oxide has an excellent blocking effect that prevents permeation of oxygen and impurities such as hydrogen and moisture which cause a change in electrical characteristics of the transistor. Accordingly, the use of aluminum oxide can prevent entry of impurities such as hydrogen and moisture into the transistor 200 in and after a manufacturing process of the transistor. In addition, release of oxygen from oxide in the transistor 200 can be prevented. Therefore, aluminum oxide is suitably used as a protective film for the transistor 200.

The thickness of the insulator 282 is preferably larger than or equal to 1 nm and smaller than 5 nm. In the case where the thickness of the insulator 282 is larger than or equal to 1 nm and smaller than 5 nm, oxygen in excess of that in the stoichiometric composition is introduced into the insulator 282 and into the vicinity of the interface between the insulator 282 and the insulator 280, so that an excess-oxygen region is formed efficiently.

The insulator 102 is preferably formed using, for example, a film having a barrier property that prevents hydrogen or impurities from diffusing from a region where the capacitor 100 is formed into a region where the transistor 200 is formed. Therefore, the insulator 102 can be formed using a material similar to that used for forming the insulator 324.

As an example of the film having a barrier property with respect to hydrogen, silicon nitride formed by a CVD method can be used. Diffusion of hydrogen into a semiconductor element including an oxide semiconductor, such as the transistor 200, degrades the characteristics of the semiconductor element in some cases. Therefore, a film that prevents hydrogen diffusion is preferably provided between the transistor 200 and the transistor 300. Specifically, the film that prevents hydrogen diffusion is a film from which hydrogen is less likely to be released.

Therefore, a structure can be obtained in which the transistor 200 and the insulator 280 including the excess-oxygen region are positioned between a stacked-layer structure of the insulator 210, the insulator 212, and the insulator 214 and a stacked-layer structure of the insulator 282, the insulator 284, and the insulator 102. The insulator 210, the insulator 212, the insulator 214, the insulator 282, the insulator 284, and the insulator 102 have a barrier property that prevents diffusion of oxygen or impurities such as hydrogen and water.

In the above-described structure, oxygen released from the insulator 280 and the transistor 200 can be prevented from diffusing into a layer where the capacitor 100 is formed or a layer where the transistor 300 is formed. Furthermore, impurities such as hydrogen and water can be prevented from diffusing from a layer over the insulator 282 and a layer under the insulator 214 into the transistor 200.

That is, oxygen can be efficiently supplied from the excess-oxygen region of the insulator 280 to oxide where a channel is formed in the transistor 200, so that oxygen vacancies can be reduced. Moreover, oxygen vacancies can be prevented from being formed by impurities in the oxide where a channel is formed in the transistor 200. Thus, the oxide where a channel is formed in the transistor 200 can be an oxide semiconductor with a low density of defect states and stable characteristics. That is, a change in electrical characteristics of the transistor 200 can be prevented and the reliability can be improved.

FIGS. 4A and 4B are each a cross-sectional view in the vicinity of a scribe line.

For example, as shown in FIG. 4A, an opening is provided in the insulator 216, the insulator 220, the insulator 222, the insulator 224, and the insulator 280 in the vicinity of a region overlapping with a scribe line (shown by a dashed-dotted line in FIG. 4A) formed in an edge of a memory cell including the transistor 200. The insulator 282, the insulator 284, and the insulator 102 are provided to cover side surfaces of the insulator 216, the insulator 220, the insulator 222, the insulator 224, and the insulator 280. Therefore, in the opening, the insulator 214 and the insulator 282 are in contact with each other, and a stacked-layer structure of the insulator 210, the insulator 212, the insulator 214, the insulator 282, the insulator 284, and the insulator 102 is obtained. At this time, in the case where the insulator 214 and the insulator 282 are formed using the same material and the same method, adhesion therebetween in the stacked-layer structure is increased.

In the structure, the insulator 216, the insulator 220, the insulator 222, the insulator 224, and the insulator 280 can be enclosed with the insulator 210, the insulator 212, the insulator 214, the insulator 282, the insulator 284, and the insulator 102. The insulator 210, the insulator 212, the insulator 214, the insulator 282, the insulator 284, and the insulator 102 have a function of preventing diffusion of oxygen, hydrogen, and water, and therefore, entry and diffusion of hydrogen or water from the side surfaces of the insulator 216, the insulator 220, the insulator 222, the insulator 224, and the insulator 280 into the transistor 200 can be prevented even when the semiconductor device described in this embodiment is subjected to scribing.

Furthermore, in the structure, excess oxygen in the insulator 280 can be prevented from diffusing into the outside of the insulator 282 and the insulator 214. Accordingly, excess oxygen in the insulator 280 is efficiently supplied to the oxide where a channel is formed in the transistor 200. The excess oxygen can reduce oxygen vacancies in the oxide where a channel is formed in the transistor 200. Thus, the oxide where a channel is formed in the transistor 200 can be an oxide semiconductor with a low density of defect states and stable characteristics. That is, a change in the electrical characteristics of the transistor 200 can be prevented and the reliability can be improved.

As another example, as shown in FIG. 4B, an opening is provided in the insulator 216, the insulator 220, the insulator 222, the insulator 224, and the insulator 280 in the vicinity of a region overlapping with a scribe line (shown by a dashed-dotted line in FIG. 4B). The insulator 282 and the insulator 284 are provided to cover the side surfaces of the insulator 216, the insulator 220, the insulator 222, the insulator 224, and the insulator 280. In addition, an opening is provided in the insulator 212, the insulator 214, the insulator 282, and the insulator 284, and the insulator 102 is provided to cover side surfaces of the insulator 212, the insulator 214, the insulator 282, and the insulator 284.

That is, in the opening, the insulator 214 and the insulator 282 are in contact with each other. Furthermore, on the side outer than that, the insulator 210 and the insulator 102 are in contact with each other. At this time, by forming the insulator 214 and the insulator 282 using the same material and the same method, a stacked-layer structure in which adhesion therebetween is high is obtained. Furthermore, by forming the insulator 210 and the insulator 102 using the same material and the same method, a stacked-layer structure in which adhesion therebetween is high is obtained.

In such a structure, the transistor 200 and the insulator 280 can be enclosed tightly. Thus, the oxide where a channel is formed in the transistor 200 can be an oxide semiconductor with a low density of defect states and stable characteristics. That is, a change in the electrical characteristics of the transistor 200 can be prevented and the reliability can be improved.

The capacitor 100 and a conductor 124 are provided over the insulator 284 (see FIG. 1). The capacitor 100 is provided over the insulator 102 and includes a conductor 112, an insulator 114, and a conductor 116. Note that the conductor 124 functions as a plug or a wiring that is electrically connected to the capacitor 100, the transistor 200, or the transistor 300.

The conductor 112 can be formed using a conductive material such as a metal material, an alloy material, or a metal oxide material. It is preferable to use a high-melting-point material that has both heat resistance and conductivity, such as tungsten or molybdenum, and it is particularly preferable to use tungsten. In the case where the conductor 112 is formed concurrently with another component such as a conductor, Cu (copper), Al (aluminum), or the like which is a low-resistance metal material may be used.

Note that the conductor 124 can be formed using a material similar to that used for forming the conductor 112 functioning as an electrode of the capacitor.

The insulator 114 is provided over the conductor 124 and the conductor 112. The insulator 114 can have a single-layer structure or a stacked-layer structure formed using, for example, silicon oxide, silicon oxynitride, silicon nitride oxide, silicon nitride, aluminum oxide, aluminum oxynitride, aluminum nitride oxide, aluminum nitride, hafnium oxide, hafnium oxynitride, hafnium nitride oxide, hafnium nitride, or the like.

In the case where the insulator 114 has a stacked-layer structure, for example, the stacked-layer structure is preferably formed using a high dielectric constant (high-k) material such as aluminum oxide and a material with high dielectric strength such as silicon oxynitride. In the capacitor 100 having the structure, a sufficient capacitance can be provided because of a high dielectric constant (high-k) insulator, and the dielectric strength can be increased and the electrostatic breakdown can be prevented because of an insulator with high dielectric strength.

The conductor 116 is provided over the conductor 112 with the insulator 114 therebetween. Note that the conductor 116 can be formed using a conductive material such as a metal material, an alloy material, or a metal oxide material. It is preferable to use a high-melting-point material which has both heat resistance and conductivity, such as tungsten or molybdenum, and it is particularly preferable to use tungsten. In the case where the conductor 116 is formed concurrently with another component such as a conductor, Cu (copper), Al (aluminum), or the like which is a low-resistance metal material may be used.

For example, as shown in FIG. 1, the insulator 114 is provided to cover a top surface and a side surface of the conductor 112. Furthermore, the conductor 116 is provided to cover the top surface and the side surface of the conductor 112 with the insulator 114 therebetween. In the structure, the conductor 116 faces the side surface of the conductor 112 with the insulator 114 therebetween. That is, a capacitance is formed also on the side surface of the conductor 112, so that a capacitance per projected area in a top surface of the capacitor can be increased. Thus, the semiconductor device can be reduced in area, highly integrated, and miniaturized.

An insulator 120 and an insulator 122 are stacked sequentially over the conductor 116 and the insulator 114. A conductor 126 is embedded in the insulator 120 and the insulator 114. A conductor 128 is embedded in the insulator 122. Note that the conductor 126 and the conductor 128 each function as a plug or a wiring that is electrically connected to the transistor 200 or the transistor 300. The conductor 126 can be formed using a material similar to that used for forming the conductor 328 and the conductor 330.

The insulator 120 and the insulator 122 can be formed using a material similar to that used for forming the insulator 320. The insulator 120 covering the capacitor 100 may function as a planarization film that covers a roughness thereunder.

The above is the description of the structure example.

With the use of the structure, a change in electrical characteristics can be prevented and reliability can be improved in a semiconductor device including a transistor including an oxide semiconductor. Furthermore, a transistor including an oxide semiconductor with high on-state current can be provided. Furthermore, a transistor including an oxide semiconductor with low off-state current can be provided. Furthermore, a semiconductor device with low power consumption can be provided.

Modification Example 1

As a modification example of this embodiment, the insulator 210 may be omitted as shown in FIG. 2. An insulator 103 may be used instead of the insulator 102. The insulator 103 preferably has a dielectric constant lower than that of the insulator 102, like the insulator 326. For example, the relative dielectric constant of the insulator 103 is preferably lower than 4, more preferably lower than 3. For example, the relative dielectric constant of the insulator 103 is preferably 0.7 times or less that of the insulator 102, more preferably 0.6 times or less that of the insulator 102. The use of a material with a low dielectric constant in an interlayer film can reduce the parasitic capacitance between wirings.

A structure can be obtained in which the transistor 200 and the insulator 280 including the excess-oxygen region are provided between a stacked-layer structure of the insulator 212 and the insulator 214 and a stacked-layer structure of the insulator 282 and the insulator 284. The insulator 212, the insulator 214, the insulator 282, and the insulator 284 have a barrier property that prevents diffusion of oxygen or impurities such as hydrogen and water.

Accordingly, oxygen released from the insulator 280 and the transistor 200 can be prevented from diffusing into the layer where the capacitor 100 is formed or the layer where the transistor 300 is formed. Furthermore, impurities such as hydrogen and water can be prevented from diffusing from the layer over the insulator 282 and the layer under the insulator 214 into the transistor 200.

That is, oxygen can be efficiently supplied from the excess-oxygen region of the insulator 280 to oxide where a channel is formed in the transistor 200, so that oxygen vacancies can be reduced. Moreover, oxygen vacancies can be prevented from being formed by impurities in the oxide where a channel is formed in the transistor 200. Thus, the oxide where a channel is formed in the transistor 200 can be an oxide semiconductor with a low density of defect states and stable characteristics. That is, a change in electrical characteristics of the transistor 200 can be prevented and the reliability can be improved.

FIG. 5A is a cross-sectional view in the vicinity of a scribe line in this modification example.

For example, as shown in FIG. 5A, in the vicinity of a region overlapping with a scribe line (shown by a dashed-dotted line in FIG. 5A), the insulator 214 and the insulator 282 are in contact with each other and a stacked-layer structure of the insulator 212, the insulator 214, the insulator 282, and the insulator 284 is obtained. At this time, in the case where the insulator 214 and the insulator 282 are formed using the same material and the same method, adhesion therebetween in the stacked-layer structure is increased.

In the structure, the insulator 216, the insulator 220, the insulator 222, the insulator 224, and the insulator 280 can be enclosed with the insulator 212, the insulator 214, the insulator 282, and the insulator 284. The insulator 212, the insulator 214, the insulator 282, and the insulator 284 have a function of preventing diffusion of oxygen, hydrogen, and water, and therefore, entry and diffusion of hydrogen or water from the side surfaces of the insulator 216, the insulator 220, the insulator 222, the insulator 224, and the insulator 280 into the transistor 200 can be prevented even when the semiconductor device described in this embodiment is subjected to scribing.

Furthermore, in the structure, excess oxygen in the insulator 280 can be prevented from diffusing into the outside of the insulator 282 and the insulator 214. Accordingly, excess oxygen in the insulator 280 is efficiently supplied to the oxide where a channel is formed in the transistor 200. The oxygen can reduce oxygen vacancies in the oxide where a channel is formed in the transistor 200. Thus, the oxide where a channel is formed in the transistor 200 can be an oxide semiconductor with a low density of defect states and stable characteristics. That is, a change in the electrical characteristics of the transistor 200 can be prevented and the reliability can be improved.

Modification Example 2

As a modification example of this embodiment, the insulator 212, the insulator 214, and the insulator 284 may be omitted as shown in FIG. 3.

A structure can be obtained in which the transistor 200 and the insulator 280 including the excess-oxygen region are positioned between the insulator 210 and a stacked-layer structure of the insulator 282 and the insulator 102. The insulator 210, the insulator 282, and the insulator 102 have a barrier property that prevents diffusion of oxygen or impurities such as hydrogen and water.

Thus, oxygen released from the insulator 280 and the transistor 200 can be prevented from diffusing into the layer where the capacitor 100 is formed or the layer where the transistor 300 is formed. Furthermore, impurities such as hydrogen and water can be prevented from diffusing from the layer over the insulator 282 and the layer under the insulator 210 into the transistor 200.

That is, oxygen can be efficiently supplied from the excess-oxygen region of the insulator 280 to oxide where a channel is formed in the transistor 200, so that oxygen vacancies can be reduced. Moreover, oxygen vacancies can be prevented from being formed by impurities in the oxide where a channel is formed in the transistor 200. Thus, the oxide where a channel is formed in the transistor 200 can be an oxide semiconductor with a low density of defect states and stable characteristics. That is, a change in electrical characteristics of the transistor 200 can be prevented and the reliability can be improved.

FIG. 5B is a cross-sectional view in the vicinity of a scribe line in this modification example.

For example, as shown in FIG. 5B, in the vicinity of a region overlapping with a scribe line (shown by a dashed-dotted line in FIG. 5B), the insulator 210 and the insulator 282 are in contact with each other and a stacked-layer structure of the insulator 210, the insulator 282, and the insulator 102 is obtained.

In the above-described structure, the insulator 216, the insulator 220, the insulator 222, the insulator 224, and the insulator 280 can be enclosed with the insulator 210, the insulator 282, and the insulator 102. The insulator 210, the insulator 282, and the insulator 102 have a function of preventing diffusion of oxygen, hydrogen, and water, and therefore, entry and diffusion of hydrogen or water from the side surfaces of the insulator 216, the insulator 220, the insulator 222, the insulator 224, and the insulator 280 into the transistor 200 can be prevented even when the semiconductor device described in this embodiment is subjected to scribing.

Furthermore, in the above-described structure, excess oxygen in the insulator 280 can be prevented from diffusing into the outside of the insulator 282 and the insulator 210. Accordingly, excess oxygen in the insulator 280 is efficiently supplied to the oxide where a channel is formed in the transistor 200. The oxygen can reduce oxygen vacancies in the oxide where a channel is formed in the transistor 200. Thus, the oxide where a channel is formed in the transistor 200 can be an oxide semiconductor with a low density of defect states and stable characteristics. That is, a change in the electrical characteristics of the transistor 200 can be prevented and the reliability can be improved.

Modification Example 3

Figure 50:
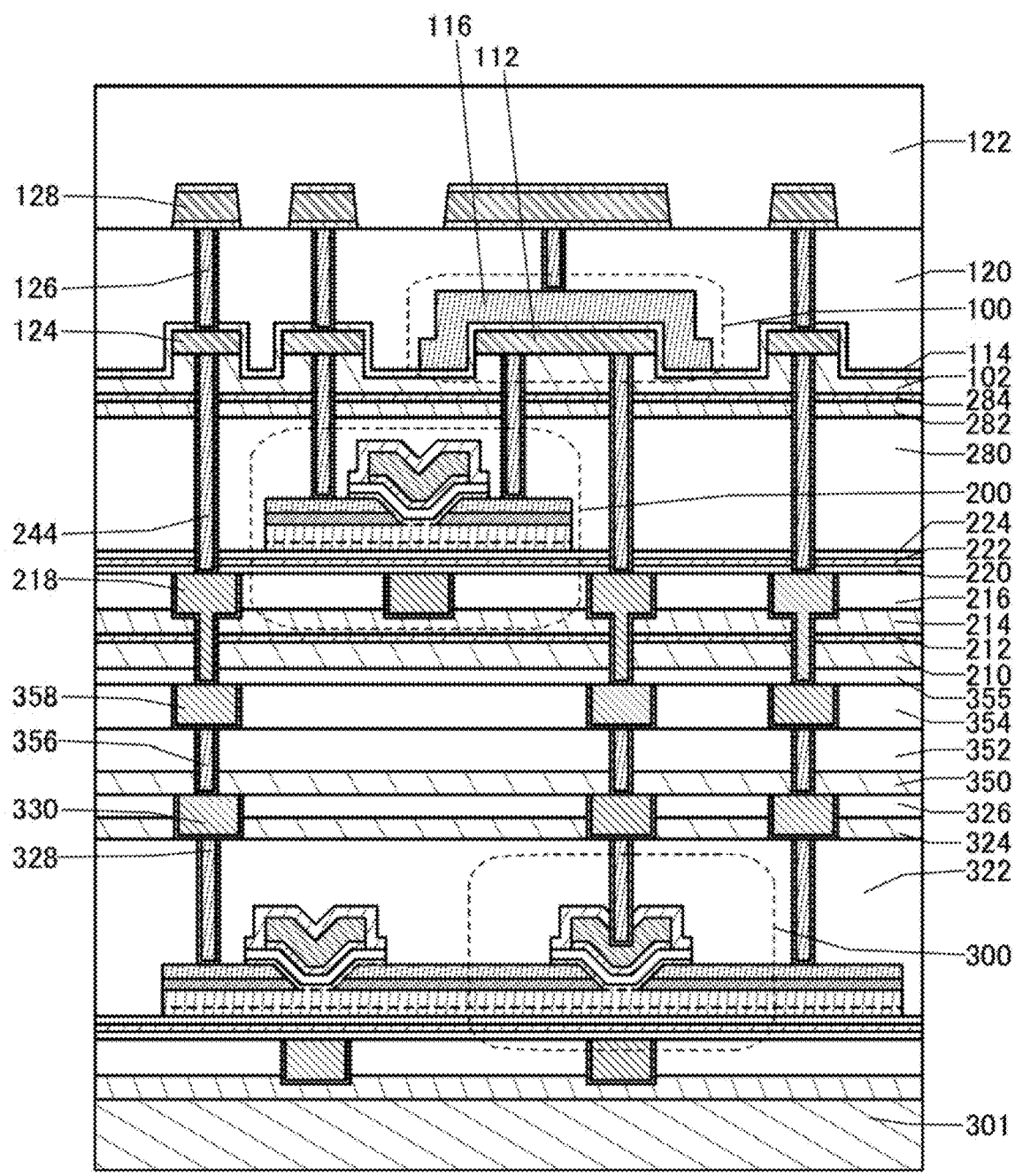
FIG. 50 illustrates a cross-sectional structure of a semiconductor device of one embodiment.
Figure 51A:
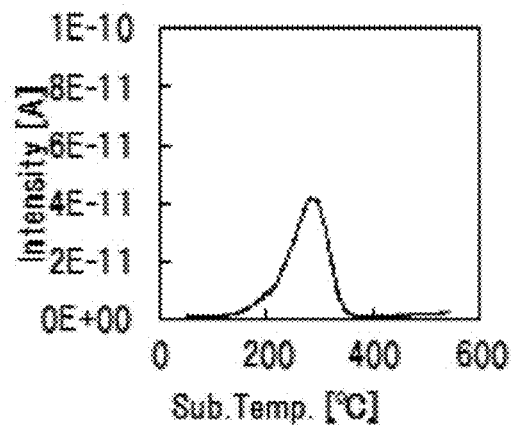
FIGS. 51A to 51E are graphs showing TDS analysis results of Example 1.
Figure 51B:
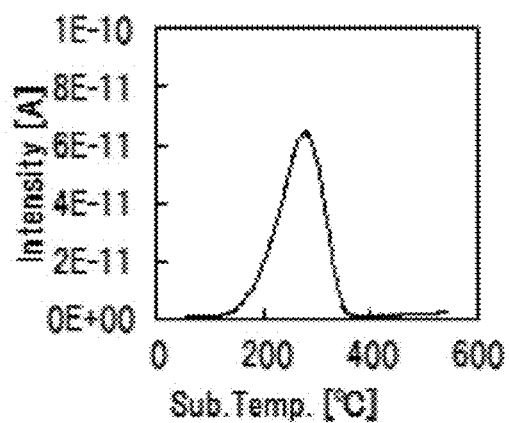
Figure 51C:
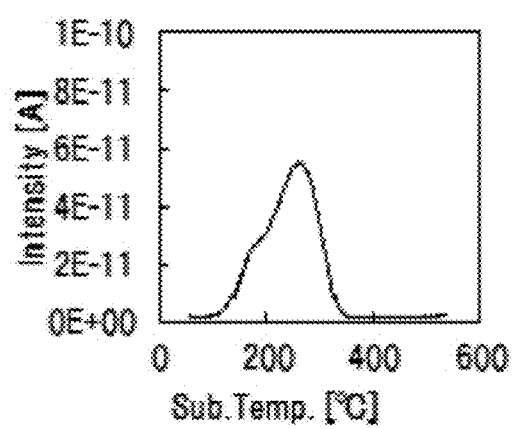
Figure 51D:
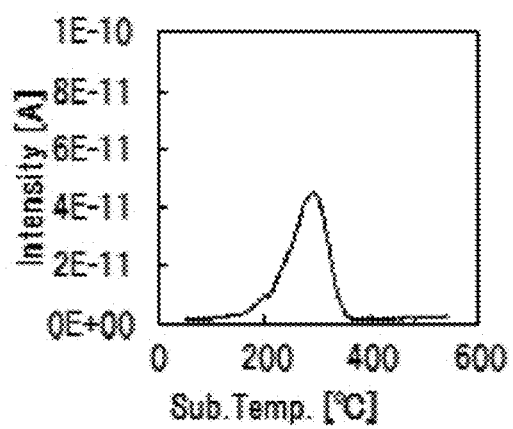
Figure 51E:
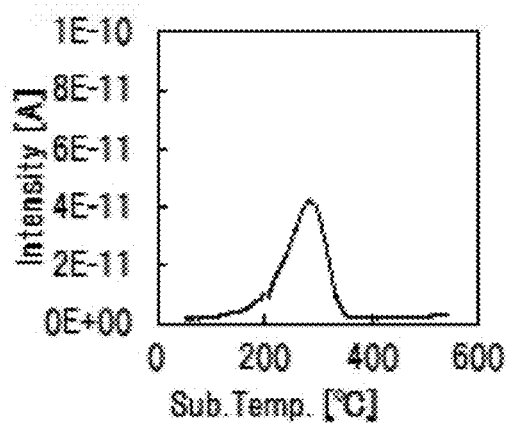
Figure 52A:
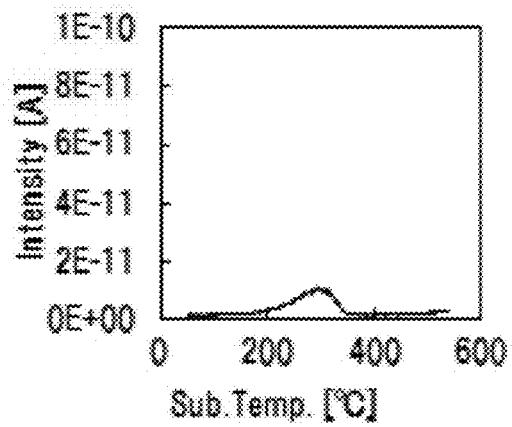
FIGS. 52A to 52D are graphs showing TDS analysis results of Example 1.
Figure 52B:
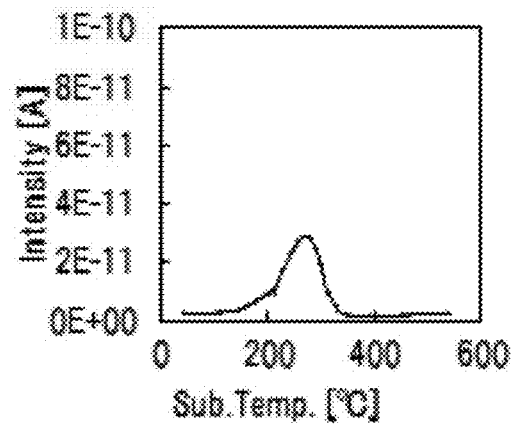
Figure 52C:
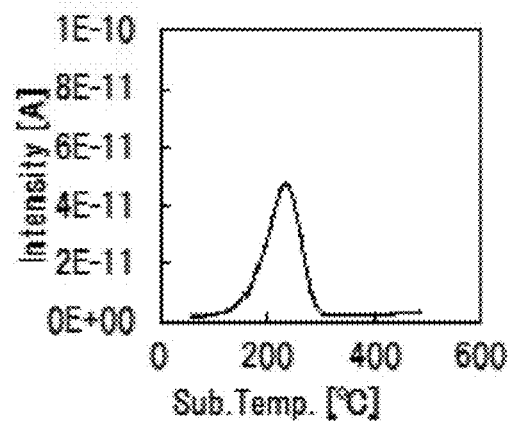
Figure 52D:
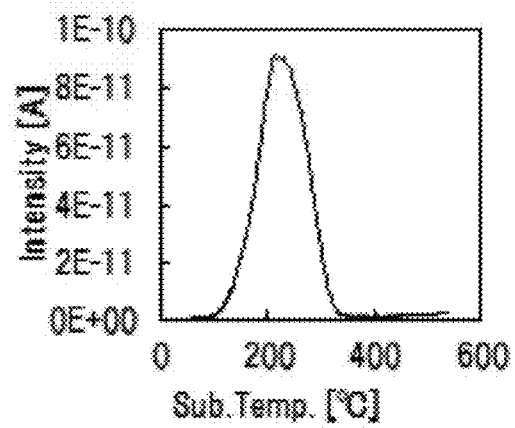

In a modification example of this embodiment, the structure of the transistor 300 is the same as that of the transistor 200 as shown in FIG. 50. The transistor 200 is a transistor in which a channel is formed in the semiconductor layer including an oxide semiconductor. The transistor 300 that has the same structure as the transistor 200 has a small off-state current, and thus, stored data can be retained for a long time. In other words, it is possible to obtain a semiconductor device (memory device) which does not require refresh operation or has an extremely low frequency of the refresh operation, which leads to a sufficient reduction in power consumption.

In the case where the structure of the transistor 200 is used for the transistor 300, the insulator 324 is preferably formed using a material similar to that used for forming the insulator 282.

At least part of this embodiment can be implemented in combination with any of the other embodiments and examples described in this specification as appropriate.

Embodiment 2

In this embodiment, one mode of a transistor is described with reference to FIGS. 6A to 6C, FIGS. 7A to 7C, and FIGS. 8A to 8C.

<Transistor Structure 1>

Figure 6A:
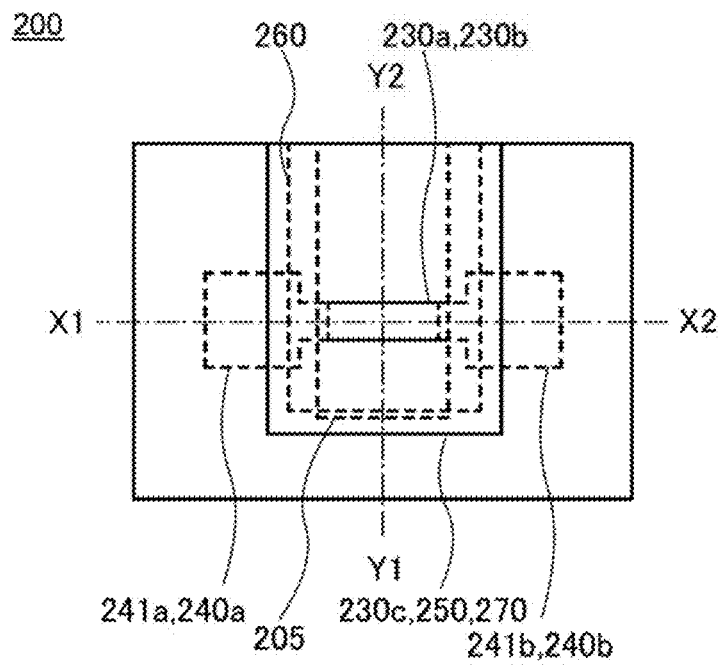
FIGS. 6A to 6C illustrate a top view and cross-sectional structures of a transistor of one embodiment.
Figure 6B:
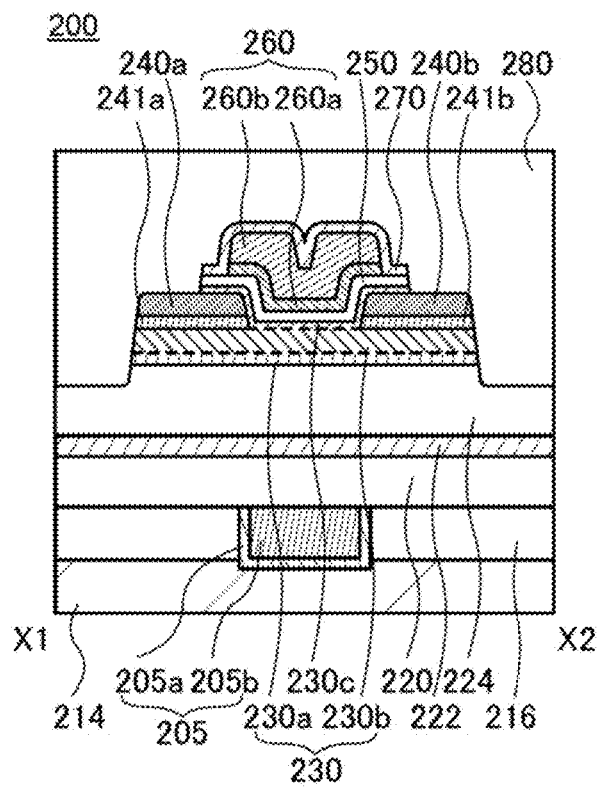
Figure 6C:
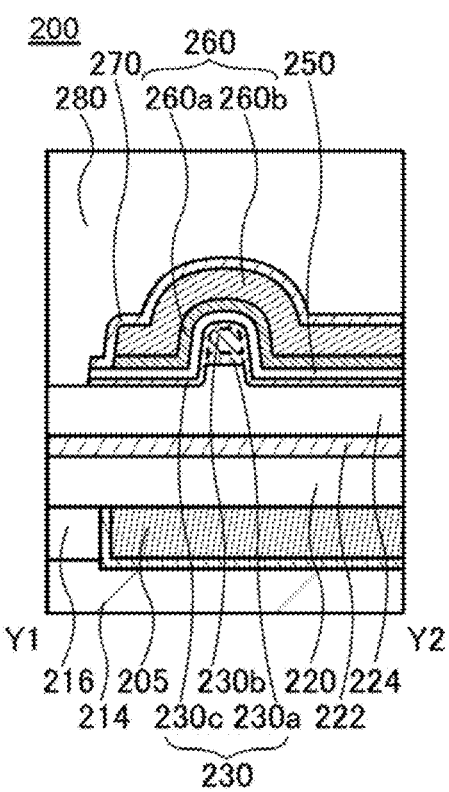

An example of a transistor of one embodiment of the present invention is described below. FIGS. 6A to 6C are a top view and cross-sectional views illustrating a transistor of one embodiment of the present invention. FIG. 6A is a top view. FIG. 6B is a cross-sectional view taken along dashed-dotted line X1-X2 in FIG. 6A. FIG. 6C is a cross-sectional view taken along dashed-dotted line Y1-Y2 in FIG. 6A. Note that for simplification of the drawing, some components in the top view in FIG. 6A are not illustrated.

The transistor 200 may be formed over a substrate. A structure where the insulator 214 is formed over a substrate may be used, for example.

As the substrate, a glass substrate, a quartz substrate, a sapphire substrate, a stabilized zirconia substrate (e.g., an yttria-stabilized zirconia substrate), or a resin substrate is used, for example. As a semiconductor substrate, a semiconductor substrate of silicon, germanium, or the like, or a compound semiconductor substrate of silicon carbide, silicon germanium, gallium arsenide, indium phosphide, zinc oxide, or gallium oxide is used, for example. A semiconductor substrate in which an insulator region is provided in the above semiconductor substrate, e.g., an SOI substrate or the like is used. As a conductor substrate, a graphite substrate, a metal substrate, an alloy substrate, a conductive resin substrate, or the like is used. A substrate including a metal nitride, a substrate including a metal oxide, or the like is used. An insulator substrate provided with a conductor or a semiconductor, a semiconductor substrate provided with a conductor or an insulator, a conductor substrate provided with a semiconductor or an insulator, or the like is used.

The transistor 200 includes a conductor 205 and a conductor 260 that function as gate electrodes; the insulator 220, the insulator 222, the insulator 224, and an insulator 250 that function as gate insulating layers; an oxide 230 that includes a region where a channel is formed; a conductor 240a and a conductor 241a that function as one of a source and a drain; a conductor 240b and a conductor 241b that function as the other of the source and the drain; an insulator 270; and the insulator 280 that includes excess oxygen.

The oxide 230 includes an oxide 230a, an oxide 230b over the oxide 230a, and an oxide 230c over the oxide 230b. When the transistor 200 is turned on, a current flows (a channel is formed) mainly in the oxide 230b. Although current sometimes flows through a region in the vicinity of the interface (a mixed region in some cases) between the oxide 230b and the oxides 230a and 230c, the oxides 230a and 230c function as insulators at the other region.

Note that in the transistor illustrated in FIGS. 6A to 6C, components having the same functions as the components in the semiconductor device illustrated in FIG. 1 are denoted by the same reference numerals.

The conductor 205 is formed using a metal film containing an element selected from molybdenum, titanium, tantalum, tungsten, aluminum, copper, chromium, neodymium, and scandium; a metal nitride film containing any of the above elements as its component (e.g., a titanium nitride film, a molybdenum nitride film, or a tungsten nitride film); or the like. Alternatively, a conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added can also be used.

A two-layer structure of a conductor 205a and a conductor 205b is shown in FIGS. 6A to 6C, but the structure of the conductor 205 is not limited thereto, and a single-layer structure or a stacked-layer structure of three or more layers may be used. For example, a conductor having a barrier property with respect to hydrogen, e.g., tantalum nitride, may be used as the conductor 205a, and tungsten, which has high conductivity, may be stacked thereover as the conductor 205b. The use of the combination of the materials can prevent diffusion of hydrogen into the oxide 230 while conductivity of a wiring is ensured.

Each of the insulators 220 and 224 is preferably an insulator containing oxygen, such as a silicon oxide film or a silicon oxynitride film. In particular, the insulator 224 is preferably an insulator containing excess oxygen (containing oxygen in excess of that in the stoichiometric composition). In the case where such an insulator containing excess oxygen is provided in contact with an oxide in the transistor 200, oxygen vacancies in the oxide can be compensated. Note that the insulators 222 and 224 are not necessarily formed of the same material.

The insulator 222 preferably has a single-layer structure or a stacked-layer structure formed using an insulator containing silicon oxide, silicon oxynitride, silicon nitride oxide, aluminum oxide, hafnium oxide, tantalum oxide, zirconium oxide, lead zirconate titanate (PZT), strontium titanate ($SrTiO_3$), (Ba,Sr)$TiO_3$ (BST), or the like. Aluminum oxide, bismuth oxide, germanium oxide, niobium oxide, silicon oxide, titanium oxide, tungsten oxide, yttrium oxide, or zirconium oxide may be added to the insulator, for example. The insulator may be subjected to nitriding treatment. A layer of silicon oxide, silicon oxynitride, or silicon nitride may be stacked over the insulator.

Note that the insulator 222 may have a stacked-layer structure of two or more layers. In this case, the stacked layers are not necessarily formed of the same material but may be formed of different materials.

In the case where the insulator 222 including a high-k material is provided between the insulator 220 and the insulator 224, electrons can be trapped in the insulator 222 under specific conditions, and the threshold voltage can be increased. As a result, the insulator 222 is negatively charged in some cases.

For example, in the case where the insulator 220 and the insulator 224 are formed using silicon oxide and the insulator 222 is formed using a material having a lot of electron trap states such as hafnium oxide, aluminum oxide, or tantalum oxide, the state where the potential of the conductor 205 is higher than the potential of the source electrode and the drain electrode is kept at a temperature higher than the operating temperature or the storage temperature of the semiconductor device (e.g., at a temperature of 125° C. or higher and 450° C. or lower, typically 150° C. or higher and 300° C. or lower) for 10 milliseconds or longer, typically one minute or longer. Thus, electrons are moved from the oxide in the transistor 200 to the conductor 205. At this time, some of the moving electrons are trapped by the electron trap states of the insulator 222.

In the transistor in which a necessary amount of electrons is trapped by the electron trap states of the insulator 222, the threshold voltage is shifted in the positive direction. By controlling the voltage of the conductor 205, the amount of electrons to be trapped can be controlled, and thus the threshold voltage can be controlled. The transistor 200 having the structure is a normally-off transistor which is in a non-conduction state (also referred to as an off state) even when the gate voltage is 0 V.

The treatment for trapping the electrons may be performed in the manufacturing process of the transistor. For example, the treatment is preferably performed at any step before factory shipment, such as after the formation of a conductor connected to a source conductor or a drain conductor of the transistor, after the preceding process (wafer processing), after a wafer-dicing step, or after packaging. In either case, it is preferable that the transistor be not exposed to temperatures of 125° C. or higher for one hour or more after the process for trapping electrons.

When the insulators 220 and 224 are formed using silicon oxide and the insulator 222 is formed using hafnium oxide, the insulators 220 and 224 may be formed by a CVD method or an atomic layer deposition (ALD) method and the insulator 222 may be formed by a sputtering method. Note that using a sputtering method for the formation of the insulator 222 might easily crystallize the insulator 222 at low temperature to generate a large amount of fixed charges.

The threshold voltages can be controlled by appropriate adjustment of the thicknesses of the insulator 220, the insulator 222, and the insulator 224. A transistor having a low leakage current in an off state can be provided. A transistor with stable electrical characteristics can be provided. A transistor having a high on-state current can be provided. A transistor with a small subthreshold swing value can be provided. A highly reliable transistor can be provided.

The insulator 222 is preferably formed using a material having a barrier property with respect to oxygen and hydrogen. When such a material is used, release of oxygen from the oxide in the transistor 200 or entry of an impurity such as hydrogen from the outside can be prevented.

The oxide 230a, the oxide 230b, and the oxide 230c are formed using metal oxide such as In-M-Zn oxide (M is Al, Ga, Y, or Sn). In—Ga oxide or In—Zn oxide may be used as the oxide 230.

The oxide 230 according to the present invention is described below.

An oxide used as the oxide 230 preferably contains at least indium or zinc. In particular, indium and zinc are preferably contained. In addition, aluminum, gallium, yttrium, tin, or the like is preferably contained. Furthermore, one or more elements selected from boron, silicon, titanium, iron, nickel, germanium, zirconium, molybdenum, lanthanum, cerium, neodymium, hafnium, tantalum, tungsten, magnesium, or the like may be contained.

Here, the case where an oxide contains indium, an element M, and zinc is considered. The element M is aluminum, gallium, yttrium, tin, or the like. Alternatively, the element M can be boron, silicon, titanium, iron, nickel, germanium, zirconium, molybdenum, lanthanum, cerium, neodymium, hafnium, tantalum, tungsten, magnesium, or the like. Note that two or more of the above elements may be used in combination as the element M.

First, preferred ranges of the atomic ratio of indium, the element M, and zinc contained in an oxide according to the present invention are described with reference to FIGS. 20A to 20C. Note that the proportion of oxygen atoms is not shown in FIGS. 20A to 20C. The terms of the atomic ratio of indium, the element M, and zinc contained in the oxide are denoted by [In], [M], and [Zn], respectively.

Figure 20A:
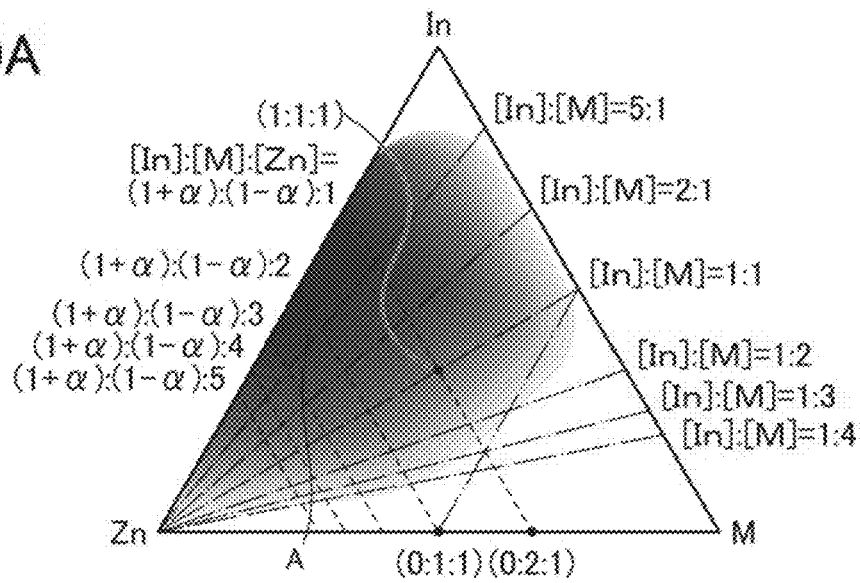
FIGS. 20A to 20C each illustrate an atomic ratio range of an oxide semiconductor of the present invention.
Figure 20B:
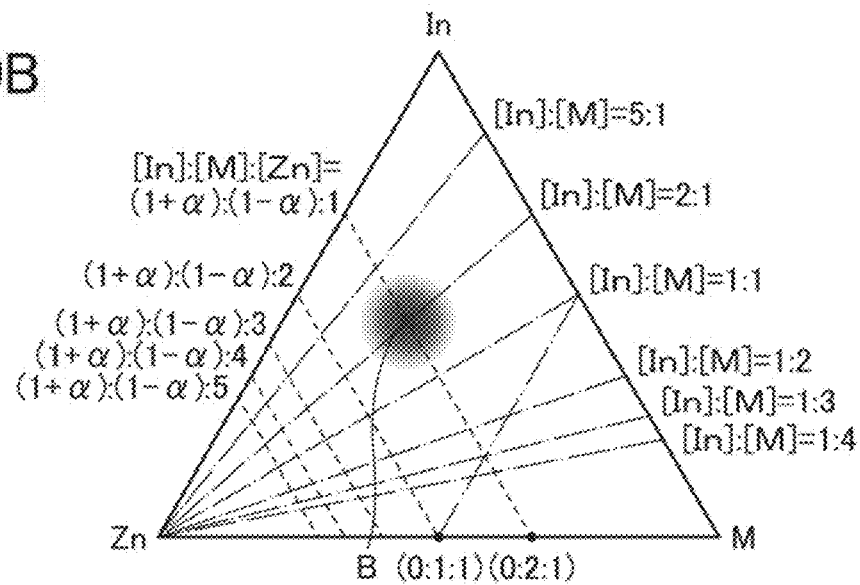
Figure 20C:
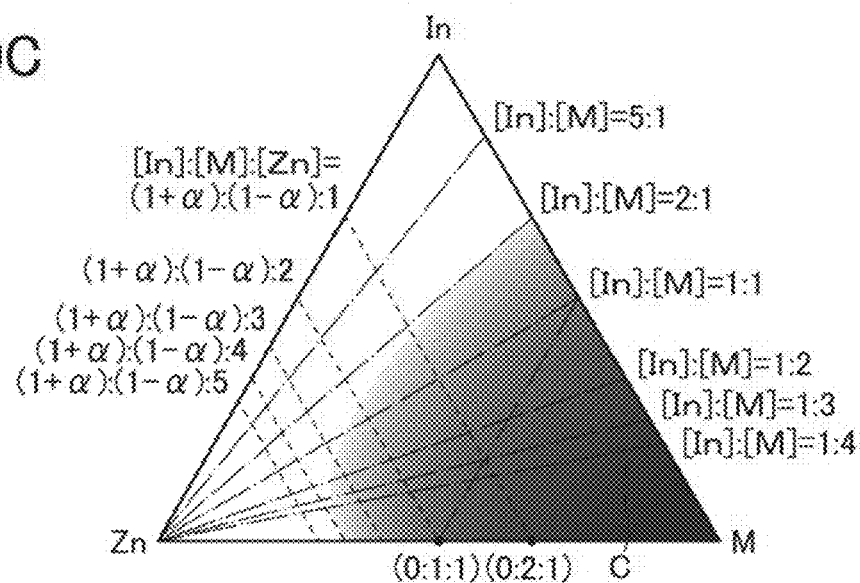

In FIGS. 20A to 20C, broken lines indicate a line where the atomic ratio [In]:[M]:[Zn] is $(1+\alpha):(1-\alpha):1$, where $-1\leq\alpha\leq1$, a line where the atomic ratio [In]:[M]:[Zn] is $(1+\alpha):(1-\alpha):2$, a line where the atomic ratio [In]:[M]:[Zn] is $(1+\alpha):(1-\alpha):3$, a line where the atomic ratio [In]:[M]:[Zn] is $(1+\alpha):(1-\alpha):4$, and a line where the atomic ratio [In]:[M]:[Zn] is $(1+\alpha):(1-\alpha):5$.

Dashed-dotted lines indicate a line where the atomic ratio [In]:[M]:[Zn] is $1:1:\beta$, where $\beta\geq0$, a line where the atomic ratio [In]:[M]:[Zn] is $1:2:\beta$, a line where the atomic ratio [In]:[M]:[Zn] is $1:3:\beta$, a line where the atomic ratio [In]:[M]:[Zn] is $1:4:\beta$, a line where the atomic ratio [In]:[M]:[Zn] is $2:1:\beta$, and a line where the atomic ratio [In]:[M]:[Zn] is $5:1:\beta$.

Dashed-double dotted lines indicate a line where the atomic ratio [In]:[M]:[Zn] is $(1+\gamma):2:(1-\gamma)$, where $-1\leq\gamma\leq1$. An oxide having the atomic ratio of [In]:[M]:[Zn]=0:2:1 or a neighborhood thereof in FIGS. 20A to 20C tends to have a spinel crystal structure.

FIGS. 20A and 20B show examples of the preferred ranges of the atomic ratio of indium, the element M, and zinc contained in an oxide in one embodiment of the present invention.

Figure 21:
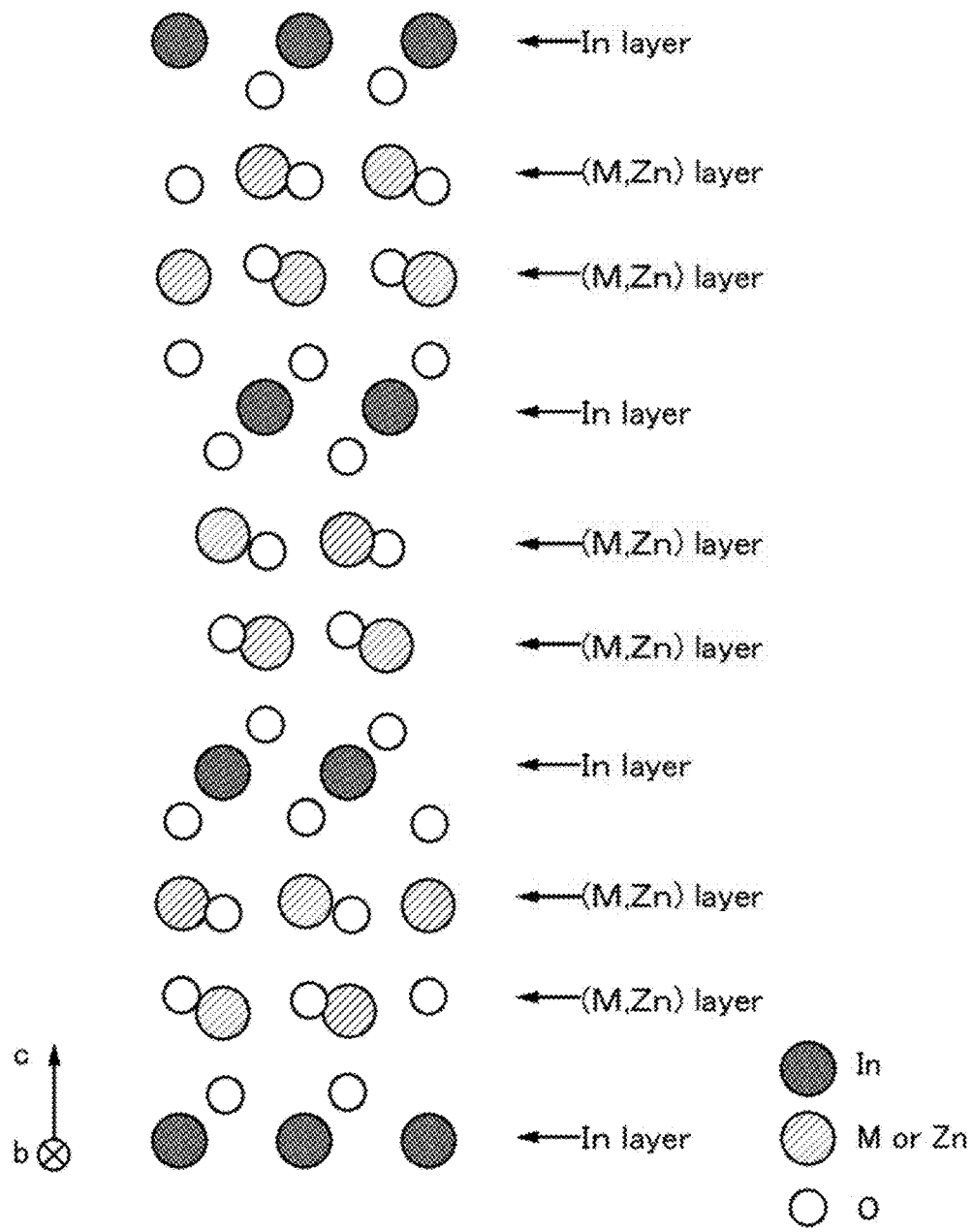
FIG. 21 illustrates an $InMZnO_4$ crystal.

FIG. 21 shows an example of the crystal structure of InMZnO$_4$ whose atomic ratio [In]:[M]:[Zn] is 1:1:1. The crystal structure shown in FIG. 21 is InMZnO$_4$ observed from a direction parallel to a b-axis. Note that a metal element in a layer that contains M, Zn, and oxygen (hereinafter, this layer is referred to as an "(M,Zn) layer") in FIG. 21 represents the element M or zinc. In that case, the proportion of the element M is the same as the proportion of zinc. The element M and zinc can be replaced with each other, and their arrangement is random.

InMZnO$_4$ has a layered crystal structure (also referred to as a layered structure) and includes one layer that contains indium and oxygen (hereinafter referred to as an In layer) for every two (M,Zn) layers that contain the element M, zinc, and oxygen, as shown in FIG. 21.

Indium and the element M can be replaced with each other. Therefore, when the element M in the (M,Zn) layer is replaced with indium, the layer can also be referred to as an (In,M,Zn) layer. In that case, a layered structure that contains one In layer for every two (In,M,Zn) layers is obtained.

An oxide whose atomic ratio [In]:[M]:[Zn] is 1:1:2 has a layered structure that contains one In layer for every three (M,Zn) layers. In other words, if [Zn] is higher than [In] and [M], the proportion of the (M,Zn) layer to the In layer becomes higher when the oxide is crystallized.

Note that in the case where the number of (M,Zn) layers with respect to one In layer is not an integer in the oxide, the oxide might have plural kinds of layered structures where the number of (M,Zn) layers with respect to one In layer is an integer. For example, in the case of [In]:[M]:[Zn]=1:1:1.5, the oxide might have the following layered structures: a layered structure of one In layer for every two (M,Zn) layers and a layered structure of one In layer for every three (M,Zn) layers.

For example, in the case where the oxide is deposited with a sputtering apparatus, a film having an atomic ratio deviated from the atomic ratio of a target is formed. In particular, [Zn] in the film might be smaller than [Zn] in the target depending on the substrate temperature in deposition.

A plurality of phases (e.g., two phases or three phases) exist in the oxide in some cases. For example, with an atomic ratio [In]:[M]:[Zn] that is close to 0:2:1, two phases of a spinel crystal structure and a layered crystal structure are likely to exist. In addition, with an atomic ratio [In]:[M]:[Zn] that is close to 1:0:0, two phases of a bixbyite crystal structure and a layered crystal structure are likely to exist. In the case where a plurality of phases exist in the oxide, a grain boundary might be formed between different crystal structures.

In addition, the oxide containing indium in a higher proportion can have high carrier mobility (electron mobility). This is because in an oxide containing indium, the element M, and zinc, the s orbital of heavy metal mainly contributes to carrier transfer, and when the indium content in the oxide is increased, overlaps of the s orbitals of indium atoms are increased; therefore, an oxide having a high content of indium has higher carrier mobility than an oxide having a low content of indium.

In contrast, when the indium content and the zinc content in an oxide become lower, carrier mobility becomes lower. Thus, with an atomic ratio of [In]:[M]:[Zn]=0:1:0 and the vicinity thereof (e.g., a region C in FIG. 20C), insulation performance becomes better.

Accordingly, an oxide in one embodiment of the present invention preferably has an atomic ratio represented by a region A in FIG. 20A. With the atomic ratio, a layered structure with high carrier mobility and a few grain boundaries is easily obtained.

A region B in FIG. 20B represents an atomic ratio of [In]:[M]:[Zn]=4:2:3 to 4:2:4.1 and the vicinity thereof. The vicinity includes an atomic ratio of [In]:[M]:[Zn]=5:3:4. An oxide with an atomic ratio represented by the region B is an excellent oxide that has particularly high crystallinity and high carrier mobility.

Note that a condition where an oxide forms a layered structure is not uniquely determined by an atomic ratio. There is a difference in the degree of difficulty in forming a layered structure among atomic ratios. Even with the same atomic ratio, whether a layered structure is formed or not depends on a formation condition. Therefore, the illustrated regions each represent an atomic ratio with which an oxide has a layered structure, and boundaries of the regions A to C are not clear.

Next, the case where the oxide is used for a transistor is described.

Note that when the oxide is used for a transistor, carrier scattering or the like at a grain boundary can be reduced; thus, the transistor can have high field-effect mobility. In addition, the transistor can have high reliability.

An oxide with low carrier density is preferably used for the transistor. For example, an oxide whose carrier density is lower than $8\times10^{11}/cm^3$, preferably lower than $1\times10^{11}/cm^3$, more preferably lower than $1\times10^{10}/cm^3$, and greater than or equal to $1\times10^{-9}/cm^3$ is used.

A highly purified intrinsic or substantially highly purified intrinsic oxide has few carrier generation sources and thus can have a low carrier density. The highly purified intrinsic or substantially highly purified intrinsic oxide has a low density of defect states and accordingly has a low density of trap states in some cases.

Charge trapped by the trap states in the oxide takes a long time to be released and may behave like fixed charge. Thus, a transistor whose channel region is formed in an oxide having a high density of trap states has unstable electrical characteristics in some cases.

In order to obtain stable electrical characteristics of the transistor, it is effective to reduce the concentration of impurities in the oxide. In addition, in order to reduce the concentration of impurities in the oxide, the concentration of impurities in a film that is adjacent to the oxide is preferably reduced. Examples of impurities include hydrogen, nitrogen, alkali metal, alkaline earth metal, iron, nickel, and silicon.

Here, the influence of impurities in the oxide is described.

When silicon or carbon that is one of Group 14 elements is contained in the oxide, defect states are formed. Thus, the concentration of silicon or carbon in the oxide and around an interface with the oxide (measured by secondary ion mass spectrometry (SIMS)) is set lower than or equal to $2 \times 10^{18}$ atoms/cm$^3$, and preferably lower than or equal to $2 \times 10^{17}$ atoms/cm$^3$.

When the oxide contains alkali metal or alkaline earth metal, defect states are formed and carriers are generated, in some cases. Thus, a transistor including an oxide that contains alkali metal or alkaline earth metal is likely to be normally-on. Therefore, it is preferable to reduce the concentration of alkali metal or alkaline earth metal in the oxide. Specifically, the concentration of alkali metal or alkaline earth metal of the oxide, which is measured by SIMS, is set lower than or equal to $1 \times 10^{18}$ atoms/cm$^3$, and preferably lower than or equal to $2 \times 10^{16}$ atoms/cm$^3$.

When the oxide contains nitrogen, the oxide easily becomes n-type by generation of electrons serving as carriers and an increase of carrier density. Thus, a transistor whose semiconductor includes an oxide that contains nitrogen is likely to be normally-on. For this reason, nitrogen in the oxide is preferably reduced as much as possible; the nitrogen concentration of the oxide, which is measured by SIMS, is set, for example, lower than $5 \times 10^{19}$ atoms/cm$^3$, preferably lower than or equal to $5 \times 10^{18}$ atoms/cm$^3$, further preferably lower than or equal to $1 \times 10^{18}$ atoms/cm$^3$, and still further preferably lower than or equal to $5 \times 10^{17}$ atoms/cm$^3$.

Hydrogen contained in an oxide reacts with oxygen bonded to a metal atom to be water, and thus causes an oxygen vacancy, in some cases. Due to entry of hydrogen into the oxygen vacancy, an electron serving as a carrier is generated in some cases. Furthermore, in some cases, bonding of part of hydrogen to oxygen bonded to a metal atom causes generation of an electron serving as a carrier. Thus, a transistor including an oxide that contains hydrogen is likely to be normally-on. Accordingly, it is preferable that hydrogen in the oxide be reduced as much as possible. Specifically, the hydrogen concentration of the oxide, which is measured by SIMS, is set lower than $1 \times 10^{20}$ atoms/cm$^3$, preferably lower than $1 \times 10^{19}$ atoms/cm$^3$, further preferably lower than $5 \times 10^{18}$ atoms/cm$^3$, and still further preferably lower than $1 \times 10^{18}$ atoms/cm$^3$.

When an oxide with sufficiently reduced impurity concentration is used for a channel formation region in a transistor, the transistor can have stable electrical characteristics.

Next, the case where the oxide has a two-layer structure or a three-layer structure is described. A band diagram of a stacked-layer structure of an oxide S1, an oxide S2, and an oxide S3 and insulators that are in contact with the stacked-layer structure and a band diagram of a stacked-layer structure of the oxide S2 and the oxide S3 and insulators that are in contact with the stacked-layer structure are described with reference to FIGS. 22A and 22B.

Figure 22A:
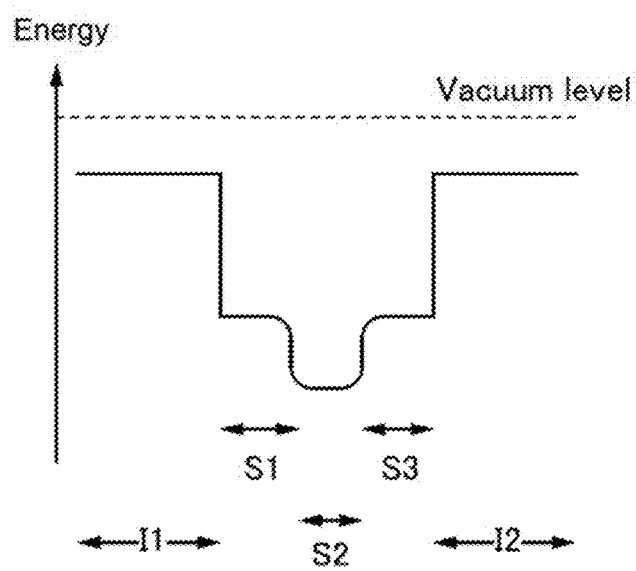
FIGS. 22A and 22B are each a band diagram of a layered structure including an oxide semiconductor.
Figure 22B:
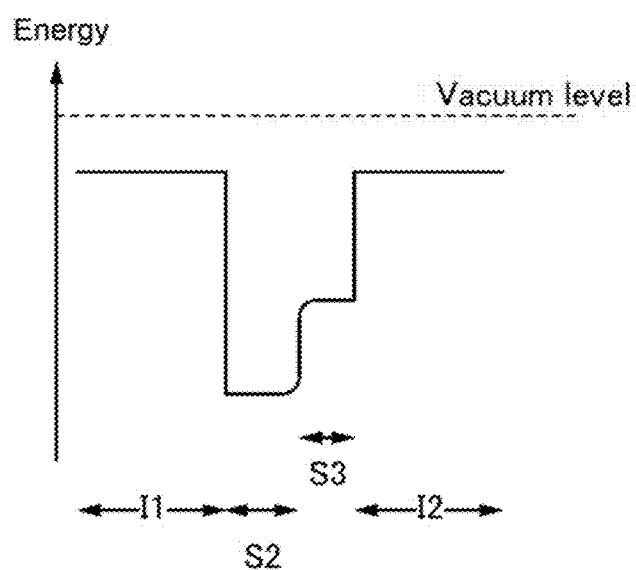

FIG. 22A is an example of a band diagram of a stacked-layer structure including an insulator I1, the oxide S1, the oxide S2, the oxide S3, and an insulator I2 in a film thickness direction. FIG. 22B is an example of a band diagram of a stacked-layer structure including the insulator I1, the oxide S2, the oxide S3, and the insulator I2 in a film thickness direction. Note that for easy understanding, the energy level of the conduction band minimum (Ec) of each of the insulator I1, the oxide S1, the oxide S2, the oxide S3, and the insulator I2 is shown in the band diagrams.

The energy level of the conduction band minimum of each of the oxides S1 and S3 is closer to the vacuum level than that of the oxide S2. Typically, a difference in energy level between the conduction band minimum of the oxide S2 and the conduction band minimum of each of the oxides S1 and S3 is preferably greater than or equal to 0.15 eV or greater than or equal to 0.5 eV, and less than or equal to 2 eV or less than or equal to 1 eV. That is, it is preferable that the electron affinity of the oxide S2 be higher than the electron affinity of each of the oxides S1 and S3, and the difference between the electron affinity of each of the oxides S1 and S3 and the electron affinity of the oxide S2 be greater than or equal to 0.15 eV or greater than or equal to 0.5 eV, and less than or equal to 2 eV or less than or equal to 1 eV.

As shown in FIGS. 22A and 22B, the energy level of the conduction band minimum of each of the oxides S1 to S3 is gradually varied. In other words, the energy level of the conduction band minimum is continuously varied or continuously connected. In order to obtain such a band diagram, the density of defect states in a mixed layer formed at an interface between the oxides S1 and S2 or an interface between the oxides S2 and S3 is preferably made low.

Specifically, when the oxides S1 and S2 or the oxides S2 and S3 contain the same element (as a main component) in addition to oxygen, a mixed layer with a low density of defect states can be formed. For example, in the case where the oxide S2 is an In—Ga—Zn oxide, it is preferable to use an In—Ga—Zn oxide, a Ga—Zn oxide, gallium oxide, or the like as each of the oxides S1 and S3.

At this time, the oxide S2 serves as a main carrier path. Since the density of defect states at the interface between the oxides S1 and S2 and the interface between the oxides S2 and S3 can be made low, the influence of interface scattering on carrier conduction is small, and high on-state current can be obtained.

When an electron is trapped in a trap state, the trapped electron behaves like fixed charge; thus, the threshold voltage of the transistor is shifted in a positive direction. The oxides S1 and S3 can make the trap state apart from the oxide S2. This structure can prevent the positive shift of the threshold voltage of the transistor.

A material whose conductivity is sufficiently lower than that of the oxide S2 is used for the oxides S1 and S3. In that case, the oxide S2, the interface between the oxides S1 and S2, and the interface between the oxides S2 and S3 mainly function as a channel region. For example, an oxide with high insulation performance and the atomic ratio represented by the region C in FIG. 20C may be used as each of the oxides S1 and S3. Note that the region C in FIG. 20C represents the atomic ratio of [In]:[M]:[Zn]=0:1:0 or the vicinity thereof.

In the case where an oxide with the atomic ratio represented by the region A is used as the oxide S2, it is particularly preferable to use an oxide with [M]/[In] of greater than or equal to 1, preferably greater than or equal to 2 as each of the oxides S1 and S3. In addition, it is suitable to use an oxide with sufficiently high insulation performance and [M]/([Zn]+[In]) of greater than or equal to 1 as the oxide S3.

The insulator 250 can have a single-layer structure or a stacked-layer structure using, for example, one or more of an insulator containing silicon oxide, silicon oxynitride, silicon nitride oxide, aluminum oxide, hafnium oxide, tantalum oxide, zirconium oxide, lead zirconate titanate (PZT), strontium titanate ($SrTiO_3$), $(Ba,Sr)TiO_3$ (BST), or the like. Alternatively, aluminum oxide, bismuth oxide, germanium oxide, niobium oxide, silicon oxide, titanium oxide, tungsten oxide, yttrium oxide, or zirconium oxide may be added to the insulator, for example. Alternatively, the insulator may be subjected to nitriding treatment. A layer of silicon oxide, silicon oxynitride, or silicon nitride may be stacked over the insulator.

As the insulator 250, like the insulator 224, an oxide insulator that contains oxygen in excess of the stoichiometric composition is preferably used. When such an insulator containing excess oxygen is provided in contact with the oxide 230, oxygen vacancies in the oxide 230 can be reduced.

As the insulator 250, an insulating film formed of aluminum oxide, aluminum oxynitride, gallium oxide, gallium oxynitride, yttrium oxide, yttrium oxynitride, hafnium oxide, hafnium oxynitride, silicon nitride, or the like, which has barrier properties with respect to oxygen and hydrogen, can be used. The insulator 250 formed of such a material each serve as a layer that prevents release of oxygen from the oxide 230 and entry of an impurity such as hydrogen from the outside.

Note that the insulator 250 may have a stacked-layer structure similar to that of the insulator 220, the insulator 222, and the insulator 224. When the insulator 250 includes an insulator in which a necessary amount of electrons is trapped by electron trap states, the threshold voltage of the transistor 200 can be shifted in the positive direction. The transistor 200 having the structure is a normally-off transistor that is in a non-conduction state (also referred to as an off state) even when the gate voltage is 0 V.

In addition to the insulator 250, a barrier film may be provided between the oxide 230 and the conductor 260 in the transistor shown in FIGS. 6A to 6C. The oxide 230c may have a barrier property with respect to oxygen and hydrogen.

For example, an insulating film containing excess oxygen is provided in contact with the oxide 230 and covered by a film having a barrier property with respect to oxygen and hydrogen, whereby the composition of the oxide can be almost the same as the stoichiometric composition or can be in a supersaturated state containing more oxygen than that in the stoichiometric composition. It is also possible to prevent entry of impurities such as hydrogen into the oxide 230.

One of a pair of the conductor 240a and the conductor 241a and a pair of the conductor 240b the conductor 241b functions as a source electrode, and the other pair functions as a drain electrode.

Any of metals such as aluminum, titanium, chromium, nickel, copper, yttrium, zirconium, molybdenum, silver, tantalum, and tungsten, or an alloy containing any of the metals as its main component can be used for each of the conductors 240a, 241a, 240b, and 241b. Although a two-layer structure is shown in FIGS. 6A to 6C, a single-layer structure or a stacked-layer structure of three or more layers may be used.

For example, a titanium film is used as each of the conductor 240a and the conductor 240b, and an aluminum film is used as each of the conductor 241a and the conductor 241a. Other examples include a two-layer structure where an aluminum film is stacked over a tungsten film, a two-layer structure where a copper film is stacked over a copper-magnesium-aluminum alloy film, a two-layer structure where a copper film is stacked over a titanium film, and a two-layer structure where a copper film is stacked over a tungsten film.

Other examples include a three-layer structure where a titanium film or a titanium nitride film is formed, an aluminum film or a copper film is stacked over the titanium film or the titanium nitride film, and a titanium film or a titanium nitride film is formed over the aluminum film or the copper film; and a three-layer structure where a molybdenum film or a molybdenum nitride film is formed, an aluminum film or a copper film is stacked over the molybdenum film or the molybdenum nitride film, and a molybdenum film or a molybdenum nitride film is formed over the aluminum film or the copper film. Note that a transparent conductive material containing indium oxide, tin oxide, or zinc oxide may be used.

Conductors 260a and 260b functioning as a gate electrode can be formed using, for example, a metal selected from aluminum, chromium, copper, tantalum, titanium, molybdenum, and tungsten, an alloy containing any of these metals as its component, an alloy containing any of these metals in combination, or the like. Furthermore, one or both of manganese and zirconium may be used. Alternatively, a semiconductor typified by polycrystalline silicon doped with an impurity element such as phosphorus, or a silicide such as nickel silicide may be used.

For example, a two-layer structure where aluminum is used as the conductor 260a and a titanium film is used as the conductor 260b is used. Other examples include a two-layer structure where a titanium film is stacked over a titanium nitride film, a two-layer structure where a tungsten film is stacked over a titanium nitride film, and a two-layer structure where a tungsten film is stacked over a tantalum nitride film or a tungsten nitride film.

Other examples include a three-layer structure where a titanium film is formed, an aluminum film is stacked over the titanium film, and a titanium film is formed over the aluminum film. An alloy film or a nitride film that contains aluminum and one or more metals selected from titanium, tantalum, tungsten, molybdenum, chromium, neodymium, and scandium may be used.

The conductor 260 can also be formed using a light-transmitting conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added. The conductor 260 can have a stacked-layer structure of the above light-transmitting conductive material and the above metal.

A metal oxide may be provided between the conductor 260 and the insulator 250. For example, an aluminum oxide is preferably used as the metal oxide, in which case the diffusion of nitrogen from the conductor 260 into the insulator 250 can be blocked. By blocking the diffusion of nitrogen into the insulator 250, the formation of NOx in the insulator 250 serving as a gate insulator can be prevented. NOx forms an electron trap state in the gate insulator in some cases and might cause a reduction in the reliability of the transistor.

The insulator 270 may be provided to cover the conductor 260. In the case where the insulator 280 is formed using an oxide material from which oxygen is released, the insulator 270 is formed using a substance having a barrier property with respect to oxygen to prevent the conductor 260 from being oxidized by the released oxygen.

For example, the insulator 270 can be formed using metal oxide such as aluminum oxide. The insulator 270 is formed to a thickness with which the oxidation of the conductor 260 is prevented. For example, the thickness of the insulator 270 is set greater than or equal to 1 nm and less than or equal to 10 nm, preferably greater than or equal to 3 nm and less than or equal to 7 nm.

Thus, the oxidation of the conductor 260 can be prevented, and oxygen released from the insulator 280 can be supplied to the oxide 230 efficiently.

A structure in which a region of the oxide 230b where a channel is formed can be electrically surrounded by an electric field of the conductor 260 that functions as a gate electrode (the structure is referred to as an s-channel region) is included in the structure. Therefore, a channel might be formed in the entire oxide 230b, which faces the conductor 260 with the insulator 250 interposed therebetween. In the s-channel structure, a large amount of current can flow between a source and a drain of a transistor, so that a high on-state current can be obtained. Furthermore, a voltage is applied from all directions to a region where a channel is formed, and thus, a transistor in which leakage current is suppressed can be provided.

Figure 63A:
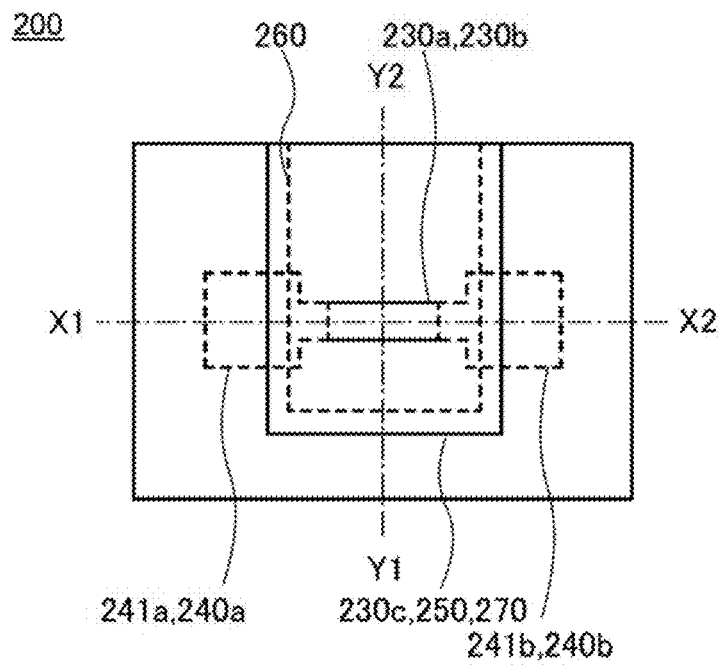
FIGS. 63A to 63C illustrate a top view and cross-sectional structures of a transistor of one embodiment.
Figure 63B:
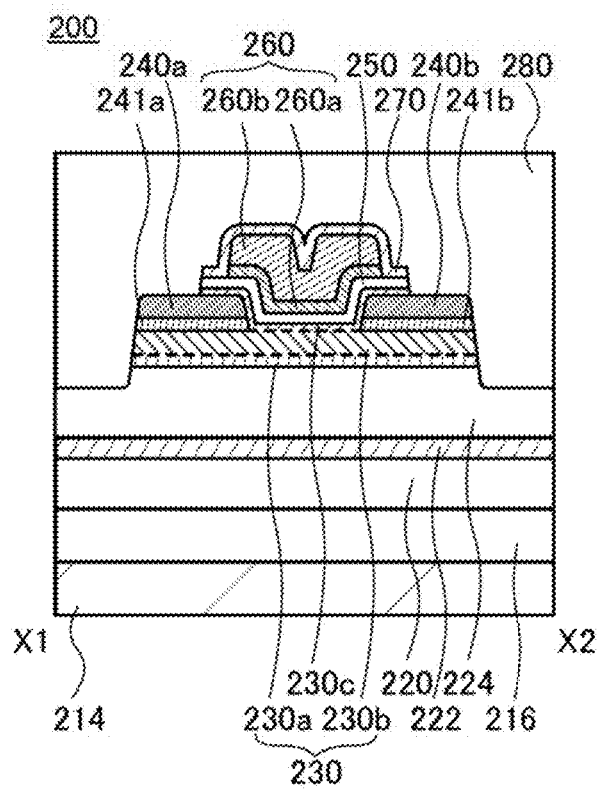
Figure 63C:
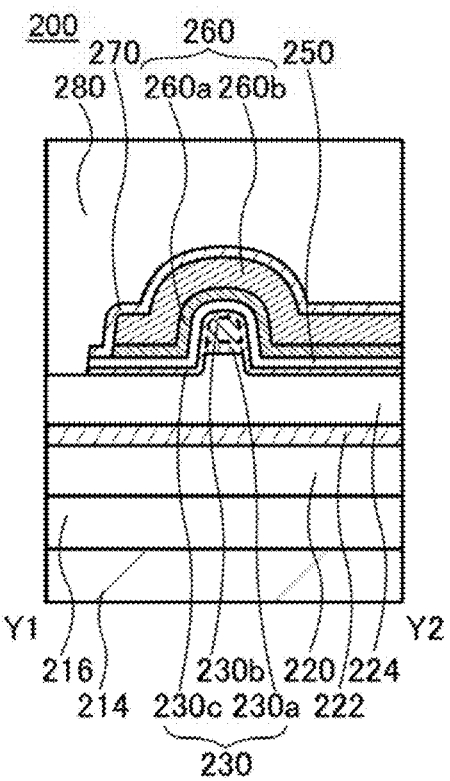

The transistor 200 may have a structure where, of the conductors 205 and 260 that serve as gate electrodes, the conductor 205 is not provided (FIGS. 63A to 63C).

<Transistor Structure 2>

FIGS. 7A to 7C illustrate an example of a structure that can be used for the transistor 200. FIG. 7A is a top view of the transistor 200. For simplification of the figure, some films are omitted in FIG. 7A. FIG. 7B is a cross-sectional view taken along dashed-dotted line X1-X2 in FIG. 7A, and FIG. 7C is a cross-sectional view taken along dashed-dotted line Y1-Y2 in FIG. 7A.

Note that in the transistor 200 shown in FIGS. 7A to 7C, components having the same function as the components in the transistor 200 shown in FIGS. 6A to 6C are denoted by the same reference numerals.

The transistor 200 may be formed over a substrate. A structure where the insulator 214 is formed over a substrate may be used, for example.

In the structure shown in FIGS. 7A to 7C, the oxide 230c, the insulator 250, and the conductor 260 are formed in an opening portion formed in the insulator 280. Furthermore, one end portion of each of the conductor 240a, the conductor 240b, the conductor 241a, and the conductor 241b is aligned with an end portion of the opening portion formed in the insulator 280. Furthermore, three end portions of each of the conductor 240a, the conductor 240b, the conductor 241a, and the conductor 241b are aligned with parts of end portions of each of the oxide 230a and the oxide 230b. Therefore, the conductor 240a, the conductor 240b, the conductor 241a, and the conductor 241b can be formed concurrently with the oxide 230a, the oxide 230b, or the opening portion in the insulator 280. This leads to a reduction in the number of masks and steps and improvement in yield and productivity.

A metal oxide may be provided between the conductor 260 and the insulator 250. For example, an aluminum oxide is preferably used as the metal oxide, in which case the diffusion of nitrogen from the conductor 260 into the insulator 250 can be blocked. By blocking the diffusion of nitrogen into the insulator 250, the formation of NOx in the insulator 250 serving as a gate insulator can be prevented. NOx forms an electron trap state in the gate insulator in some cases and might cause a reduction in the reliability of the transistor.

Since the transistor 200 shown in FIGS. 7A to 7C has a structure in which the conductors 240a, 240b, 241a, and 241b hardly overlap with the conductor 260, the parasitic capacitance added to the conductor 260 can be reduced. Thus, the transistor 200 that operates at high frequency can be provided.

<Transistor Structure 3>

Figure 8A:
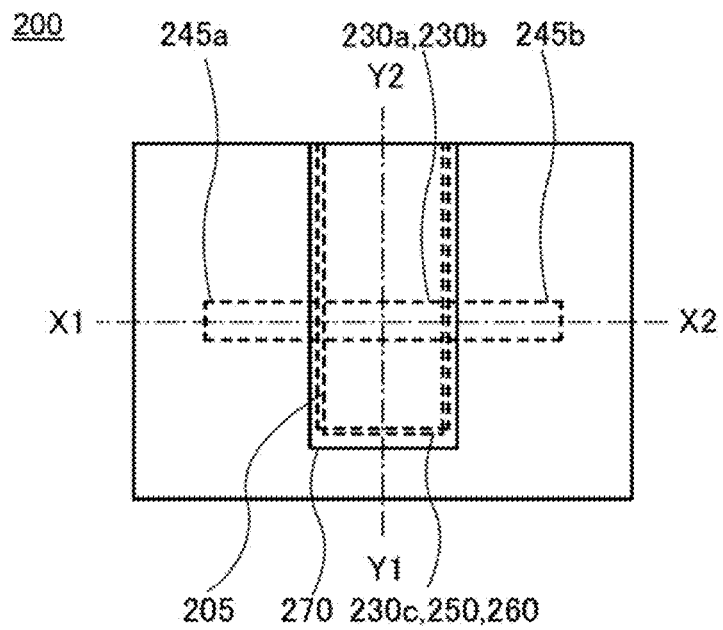
FIGS. 8A to 8C illustrate a top view and cross-sectional structures of a transistor of one embodiment.
Figure 8B:
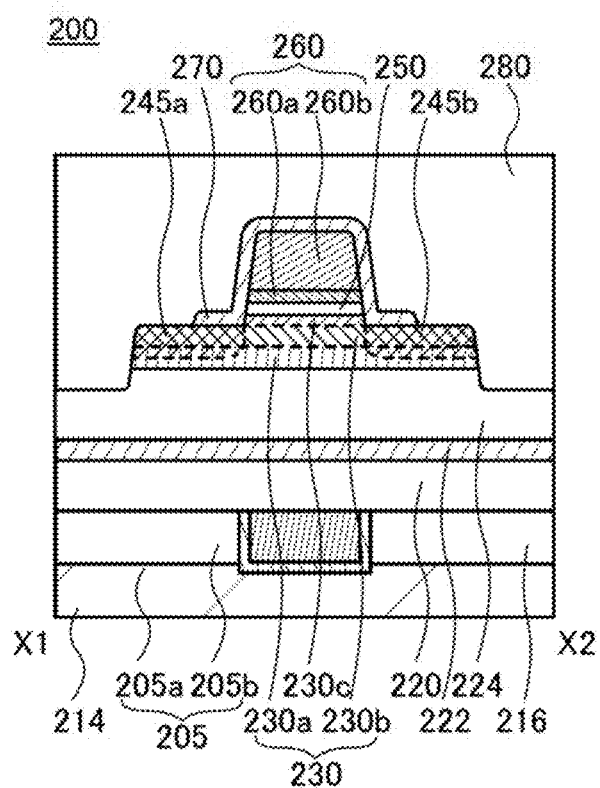
Figure 8C:
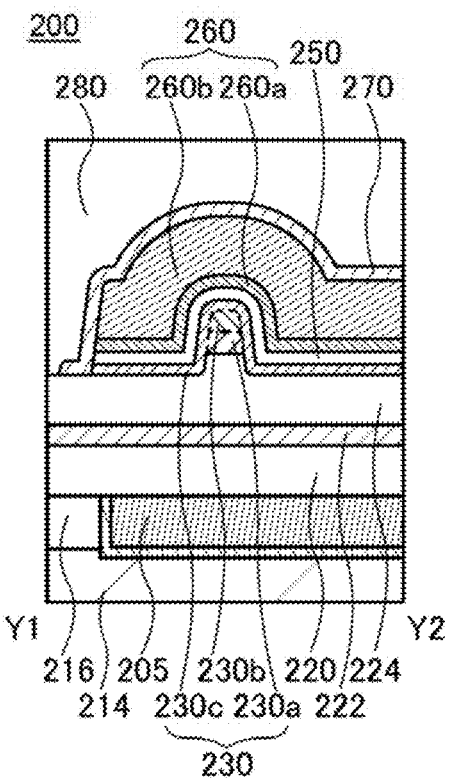

FIGS. 8A to 8C illustrate an example of a structure that can be used for the transistor 200. FIG. 8A is a top view of the transistor 200. For simplification of the figure, some films are omitted in FIG. 8A. FIG. 8B is a cross-sectional view taken along dashed-dotted line X1-X2 in FIG. 8A, and FIG. 8C is a cross-sectional view taken along dashed-dotted line Y1-Y2 in FIG. 8A.

Note that in the transistor 200 in FIGS. 8A to 8C, components having the same function as the components in the transistor 200 in FIGS. 6A to 6C are denoted by the same reference numerals.

The transistor 200 may be formed over a substrate. A structure where the insulator 214 is formed over a substrate may be used, for example.

As the substrate, a glass substrate, a quartz substrate, a sapphire substrate, a stabilized zirconia substrate (e.g., an yttria-stabilized zirconia substrate), or a resin substrate is used, for example. As a semiconductor substrate, a semiconductor substrate of silicon, germanium, or the like, or a compound semiconductor substrate of silicon carbide, silicon germanium, gallium arsenide, indium phosphide, zinc oxide, or gallium oxide is used, for example. A semiconductor substrate in which an insulator region is provided in the above semiconductor substrate, e.g., an SOI substrate or the like is used. As a conductor substrate, a graphite substrate, a metal substrate, an alloy substrate, a conductive resin substrate, or the like is used. A substrate including a metal nitride, a substrate including a metal oxide, or the like is used. An insulator substrate provided with a conductor or a semiconductor, a semiconductor substrate provided with a conductor or an insulator, a conductor substrate provided with a semiconductor or an insulator, or the like is used.

In the structure illustrated in FIGS. 8A to 8C, a region 245a functioning as one of a source region and a drain region and a region 245b functioning as the other of the source region and the drain region are provided in the oxide 230. The regions can be formed in such a manner that an impurity such as boron, phosphorus, or argon is added to the oxide 230 using the conductor 260 as a mask. Alternatively, the regions can be formed in such a manner that the insulator 280 is formed of an insulator containing hydrogen, such as a silicon nitride film and hydrogen is diffused to part of the oxide 230. This leads to a reduction in the number of masks and steps and improvement in yield and productivity.

A metal oxide may be provided between the conductor 260 and the insulator 250. For example, an aluminum oxide is preferably used as the metal oxide, in which case the diffusion of nitrogen from the conductor 260 into the insulator 250 can be blocked. By blocking the diffusion of nitrogen into the insulator 250, the formation of NOx in the insulator 250 serving as a gate insulator can be prevented. NOx forms an electron trap state in the gate insulator in some cases and might cause a reduction in the reliability of the transistor.

The structures, the methods, and the like described in this embodiment can be combined as appropriate with any of the structures, the methods, and the like described in the other embodiments and examples.

Embodiment 3

In this embodiment, an example of a method for manufacturing the semiconductor device described in the above structural example is described with reference to FIGS. 9A to 18.

<Method for Manufacturing Semiconductor Device>

First, the substrate 301 is prepared. A semiconductor substrate is used as the substrate 301. For example, a single crystal silicon substrate (including a p-type semiconductor substrate or an n-type semiconductor substrate), a compound semiconductor substrate containing silicon carbide or gallium nitride, or the like can be used. An SOI substrate may alternatively be used as the substrate 301. The case where single crystal silicon is used as the substrate 301 is described below.

Then, an element isolation layer is formed in the substrate 301. The element isolation layer may be formed by a local oxidation of silicon (LOCOS) method, a shallow trench isolation (STI) method, or others.

In the case where a p-channel transistor and an n-channel transistor are formed on the same substrate, an n-well or a p-well may be formed in part of the substrate 301. For example, a p-well may be formed by adding an impurity element that imparts p-type conductivity, such as boron, to the n-type substrate 301, and an n-channel transistor and a p-channel transistor may be formed on the same substrate.

Then, an insulator to be the insulator 304 is formed over the substrate 301. For example, after surface nitriding treatment, oxidizing treatment may be performed to oxidize the interface between silicon and silicon nitride, whereby a silicon oxynitride film may be formed. For example, a silicon oxynitride film can be obtained by performing oxygen radical oxidation after a thermal silicon nitride film is formed on the surface at 700° C. in an $NH_3$ atmosphere.

The insulator may be formed by a sputtering method, a CVD method, a thermal CVD method, a metal organic CVD (MOCVD) method, a plasma enhanced CVD (PECVD) method, a molecular beam epitaxy (MBE) method, an ALD method, a pulsed laser deposition (PLD) method, or the like.

Then, a conductive film to be the conductor 306 is formed. It is preferable that the conductive film be formed using a metal selected from tantalum, tungsten, titanium, molybdenum, chromium, niobium, and the like, or an alloy material or a compound material including any of the metals as its main component. Alternatively, polycrystalline silicon to which an impurity such as phosphorus is added can be used. Further alternatively, a stacked-layer structure of a film of metal nitride and a film of any of the above metals may be used. As a metal nitride, tungsten nitride, molybdenum nitride, or titanium nitride can be used. When the film of metal nitride is provided, adhesiveness of the metal film can be increased; thus, separation can be prevented. Note that the threshold voltage of the transistor 300 can be adjusted by determining a work function of the conductor 306, and therefore, a material of the conductive film is selected as appropriate in accordance with the characteristics that the transistor 300 needs to have.

The conductive film can be formed by a sputtering method, an evaporation method, a CVD method (including a thermal CVD method, an MOCVD method, a PECVD method, and the like), or the like. It is preferable to use a thermal CVD method, an MOCVD method, or an ALD method in order to reduce plasma damage.

Then, a resist mask is formed over the conductive film by a photolithography process or the like and an unnecessary portion of the conductive film is removed. After that, the resist mask is removed, whereby the conductor 306 is formed.

Here, a method for processing a film is described. In the case of finely processing a film, a variety of fine processing techniques can be used. For example, it is possible to use a method in which a resist mask formed by a photolithography process or the like is subjected to slimming treatment. Alternatively, a dummy pattern is formed by a photolithography process or the like, the dummy pattern is provided with a sidewall and is then removed, and a film is etched using the remaining sidewall as a resist mask. In order to achieve a high aspect ratio, anisotropic dry etching is preferably used for etching of a film. Alternatively, a hard mask formed of an inorganic film or a metal film may be used.

As light used to form the resist mask, light with an i-line (with a wavelength of 365 nm), light with a g-line (with a wavelength of 436 nm), light with an h-line (with a wavelength of 405 nm), or light in which the i-line, the g-line, and the h-line are mixed can be used. Alternatively, ultraviolet light, KrF laser light, ArF laser light, or the like can be used. Exposure may be performed by liquid immersion exposure technique. As the light for the exposure, extreme ultra-violet light (EUV) or X-rays may be used. Instead of the light for the exposure, an electron beam can be used. It is preferable to use extreme EUV, X-rays, or an electron beam because extremely minute processing can be performed. Note that in the case of performing exposure by scanning of a beam such as an electron beam, a photomask is not needed.

An organic resin film having a function of improving the adhesion between a film to be processed and a resist film may be formed before the resist film serving as a resist mask is formed. The organic resin film can be formed to planarize a surface by covering a step under the film by a spin coating method or the like, and thus can reduce variation in thickness of the resist mask over the organic resin film. In the case of fine processing, in particular, a material serving as a film preventing reflection of light for the exposure is preferably used for the organic resin film. Examples of the organic resin film having such a function include a bottom anti-reflection coating (BARC) film. The organic resin film may be removed at the same time as the removal of the resist mask or after the removal of the resist mask.

After the conductor 306 is formed, a sidewall covering a side surface of the conductor 306 may be formed. The sidewall can be formed in such a manner that an insulator thicker than the conductor 306 is formed and subjected to anisotropic etching so that only a portion of the insulator on the side surface of the conductor 306 remains.

The insulator to be the insulator 304 is etched concurrently with the formation of the sidewall, whereby the insulator 304 is formed under the conductor 306 and the sidewall. The insulator 304 may be formed by etching the insulator with the conductor 306 or a resist mask for processing the conductor 306 used as an etching mask after the conductor 306 is formed. In this case, the insulator 304 is formed under the conductor 306. Alternatively, the insulator can be used as the insulator 304 without being processed by etching.

Then, an element that imparts n-type conductivity, such as phosphorus, or an element that imparts p-type conductivity, such as boron, is added to a region of the substrate 301 where the conductor 306 (and the sidewall) is not provided.

Then, the insulator 320 is formed, and then, heat treatment is performed to activate the aforementioned element that imparts conductivity.

The insulator 320 can be formed to have a single-layer structure or a stacked-layer structure using, for example, silicon oxide, silicon oxynitride, silicon nitride oxide, silicon nitride, aluminum oxide, aluminum oxynitride, aluminum nitride oxide, aluminum nitride, or the like. The insulator 320 is preferably formed using silicon nitride containing oxygen and hydrogen (SiNOH) because the amount of hydrogen released by heating can be increased. The insulator 320 can also be formed using silicon oxide with high step coverage that is formed by reacting tetraethyl orthosilicate (TEOS), silane, or the like with oxygen, nitrous oxide, or the like.

The insulator 320 can be formed by, for example, a sputtering method, a CVD method (including a thermal CVD method, an MOCVD method, a PECVD method, and the like), an MBE method, an ALD method, a PLD method, or the like. In particular, it is preferable that the insulator be formed by a CVD method, further preferably a plasma CVD method because coverage can be further improved. It is preferable to use a thermal CVD method, an MOCVD method, or an ALD method in order to reduce plasma damage.

The heat treatment can be performed at a temperature higher than or equal to 400° C. and lower than the strain point of the substrate in an inert gas atmosphere such as a rare gas atmosphere or a nitrogen gas atmosphere or in a reduced-pressure atmosphere.

At this stage, the transistor 300 is formed. Note that in the case of using the circuit configuration shown in FIG. 19B, the transistor 300 may be omitted. In that case, there is no particular limitation on the substrate that can be used as the substrate. For example, a glass substrate of barium borosilicate glass, aluminoborosilicate glass, or the like, a ceramic substrate, a quartz substrate, or a sapphire substrate can be used. A single crystal semiconductor substrate or a polycrystalline semiconductor substrate of silicon, silicon carbide, or the like; a compound semiconductor substrate of silicon germanium, gallium arsenide, indium arsenide, or indium gallium arsenide, or the like; a silicon-on-insulator (SOI) substrate; a germanium-on-insulator (GOI) substrate; or the like can be used as the substrate. Any of these substrates provided with a semiconductor element may be used as the substrate.

A flexible substrate may be used as the substrate. A transistor may be directly formed over a flexible substrate; or alternatively, a transistor may be formed over a substrate and then separated from the substrate and transferred to a flexible substrate. In order that the transistor be separated from the substrate to be transferred to the flexible substrate, it is preferable to provide a separation layer between the manufacturing substrate and the transistor including an oxide semiconductor.

Figure 9A:
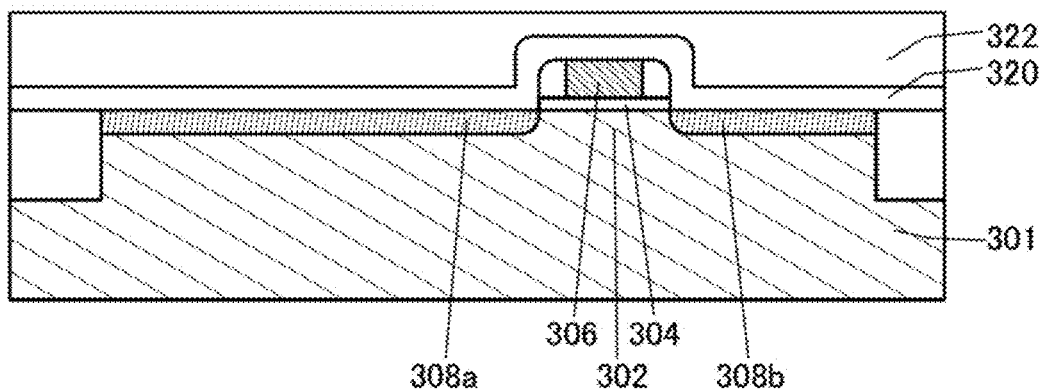
FIGS. 9A to 9C illustrate an example of a method for manufacturing a semiconductor device of one embodiment.

Then, the insulator 322 is formed over the insulator 320. The insulator 322 can be formed using a material and a method similar to those used for forming the insulator 320. In addition, the top surface of the insulator 322 is planarized by a CMP method or the like (FIG. 9A).

Figure 9B:
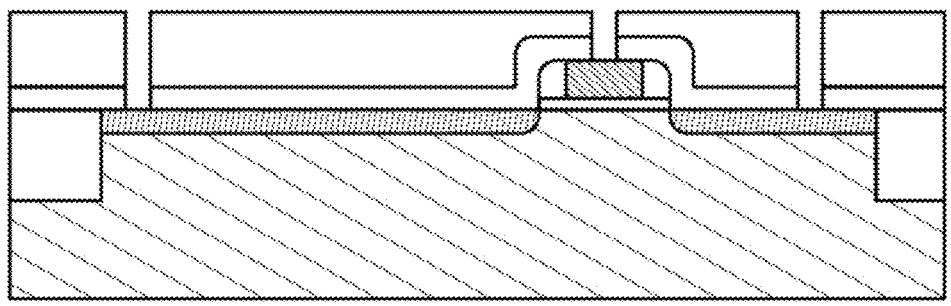
Figure 9C:
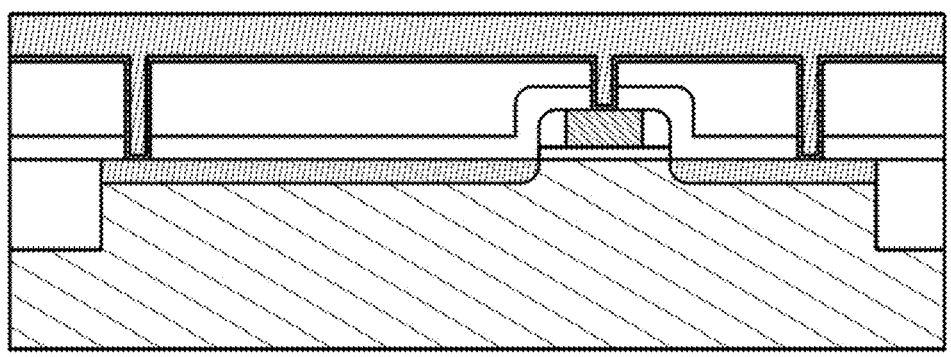

Then, opening portions that reach the low-resistance region 308a, the low-resistance region 308b, the conductor 306, and the like are formed in the insulator 320 and the insulator 322 by a photolithography process or the like (FIG. 9B). After that, a conductive film is formed to fill the opening portions (FIG. 9C). The conductive film can be formed by a sputtering method, a CVD method (including a thermal CVD method, an MOCVD method, a PECVD method, and the like), an MBE method, an ALD method, a PLD method, or others.

Figure 10A:
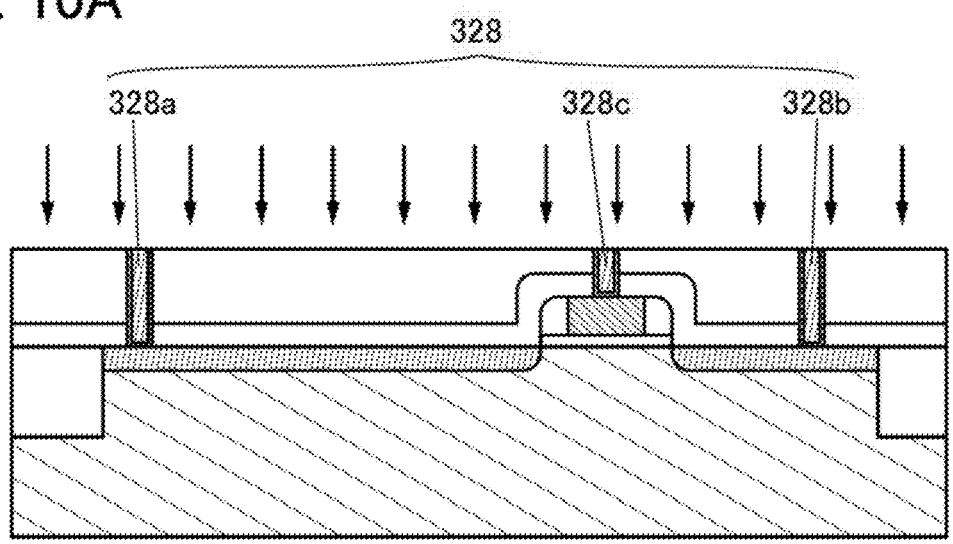
FIGS. 10A to 10C illustrate an example of a method for manufacturing a semiconductor device of one embodiment.

Then, planarization treatment is performed on the conductive film to expose a top surface of the insulator 322, whereby a conductor 328a, a conductor 328b, a conductor 328c, and the like are formed (FIG. 10A). Note that arrows in FIG. 10A show CMP treatment. Furthermore, in the specification and the drawings, the conductor 328a, the conductor 328b, and the conductor 328c each function as a plug or a wiring and are collectively referred to as conductor 328 in some cases. Note that in this specification, conductors each functioning as a plug or a wiring are treated in a similar manner.

Figure 10B:
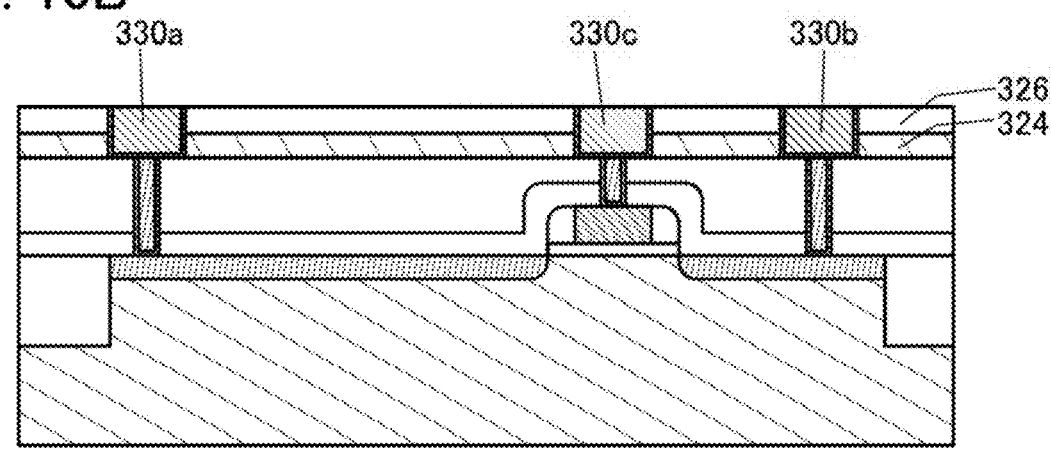

Then, a conductor 330a, a conductor 330b, and a conductor 330c are formed over the insulator 320 by a damascene process or the like (FIG. 10B).

The insulator 324 and the insulator 326 can be formed using a material and a method similar to those used for forming the insulator 320.

The insulator 324 is preferably formed using, for example, a film having a barrier property that prevents hydrogen or impurities from diffusing from the substrate 301, the transistor 300, or the like into a region where the transistor 200 is formed. As an example of the film having a barrier property with respect to hydrogen, silicon nitride formed by a CVD method can be given.

The insulator 326 is preferably an insulator having a low dielectric constant (low-k material). For example, silicon oxide formed by a CVD method can be used. The use of a material with a low dielectric constant in an interlayer film can reduce the parasitic capacitance between wirings.

A conductive film to be the conductor 330 can be formed using a material and a method similar to those used for forming the conductor 328.

Note that in the case where the conductor 330 has a stacked-layer structure, a conductor having a barrier property with respect to oxygen, hydrogen, or water, such as tantalum nitride, is preferably used as a conductor in contact with the insulator 324. For example, tantalum nitride having a barrier property can be formed by an ALD method using a deposition gas that does not contain chlorine at a substrate temperature of 250° C. A dense conductor including reduced defects such as cracks or pinholes or having a uniform thickness can be formed by an ALD method. In the case where the insulator 324 having a barrier property with respect to oxygen, hydrogen, or water is in contact with the conductor having a barrier property with respect to oxygen, hydrogen, or water, the diffusion of oxygen, hydrogen, or water can be prevented more reliably.

Figure 10C:
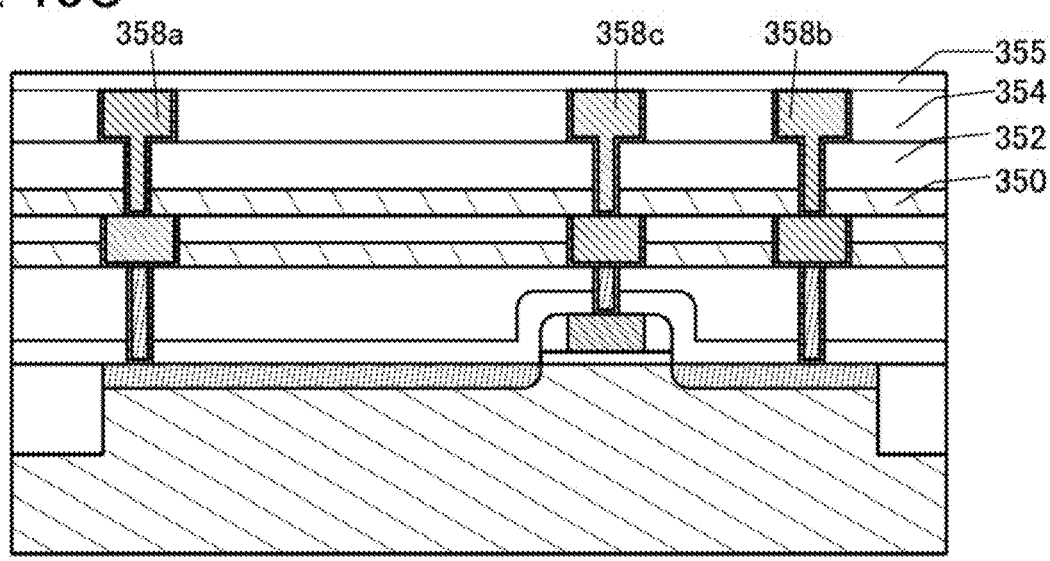

Then, the insulator 352, the insulator 354, the insulator 355, a conductor 358a, a conductor 358b, and a conductor 358c are formed (FIG. 10C). The insulator 352 and the insulator 354 can be formed using a material and a method similar to those used for forming the insulator 320. The conductor 358 can be formed using a material similar to that used for forming the conductor 328 by a dual damascene process or the like.

Then, the transistor 200 is formed.

After the insulator 210 is formed, the insulator 212 and the insulator 214 having a barrier property with respect to hydrogen or oxygen are formed. The insulator 210, the insulator 212, and the insulator 214 can be formed using a material and a method similar to those used for forming the insulator 320.

The insulator 210 is preferably formed using, for example, a film having a barrier property that prevents hydrogen or impurities from diffusing from the substrate 301, the transistor 300, or the like into a region where the transistor 200 is formed. As an example of the film having a barrier property with respect to hydrogen, silicon nitride formed by a CVD method can be given.

The insulator 212 can be aluminum oxide formed by an ALD method as an example of a film having a barrier property with respect to hydrogen, for example. A dense insulator including reduced defects such as cracks or pinholes or having a uniform thickness can be formed by an ALD method.

The insulator 214 can be aluminum oxide formed by a sputtering method as an example of a film having a barrier property with respect to hydrogen, for example.

Figure 11A:
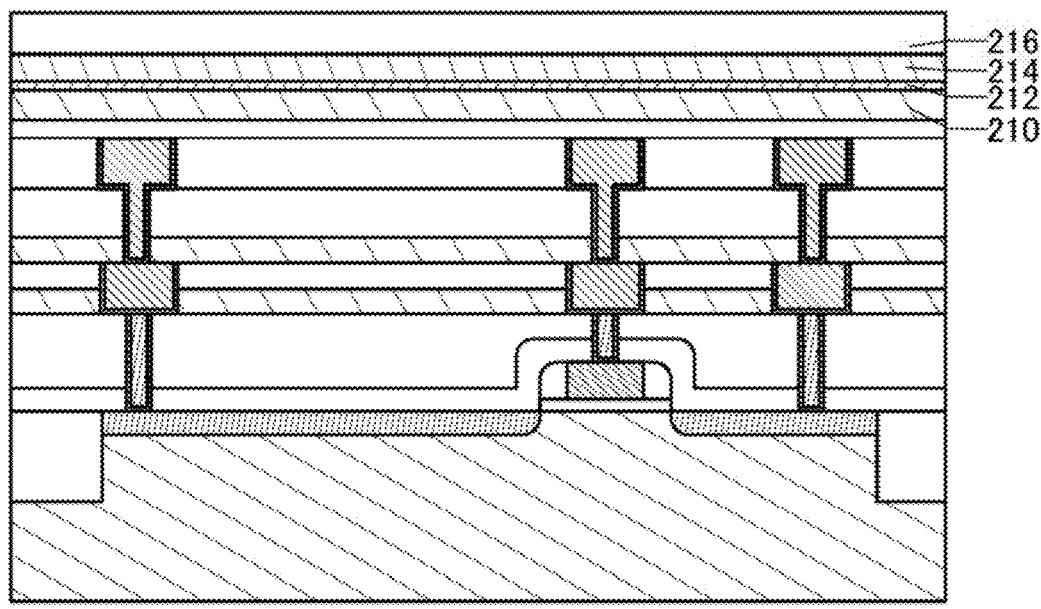
FIGS. 11A and 11B illustrate an example of a method for manufacturing a semiconductor device of one embodiment.

Then, the insulator 216 is formed over the insulator 214. The insulator 216 can be formed using a material and a method similar to those used for forming the insulator 210 (FIG. 11A).

Figure 11B:
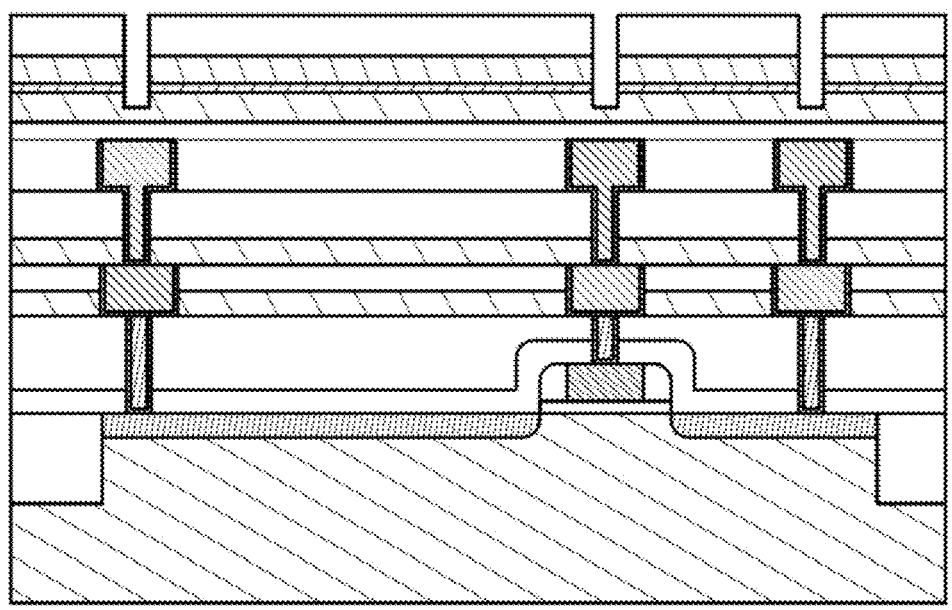

Then, depressed portions are formed in regions overlapping with the conductor 358a, the conductor 358b, the conductor 358c, and the like in the stacked-layer structure of the insulator 210, the insulator 212, the insulator 214, and the insulator 216 (FIG. 11B). Note that each of the depressed portions is preferably deep enough to form an opening portion in at least the insulator formed using a hardly-etched material. Here, the hardly-etched material denotes a material that is hardly etched, e.g., metal oxide. Typical examples of a metal oxide film formed of a hardly-etched material include a film containing any of aluminum oxide, zirconium oxide, and hafnium oxide; a silicate film containing any of these materials ($HfSi_xO_y$, $ZrSi_xO_y$, or the like), and a film of a composite oxide containing two or more of these materials ($Hf_{1-x}Al_xO_y$, $Zr_{1-x}Al_xO_y$, or the like).

Figure 12A:
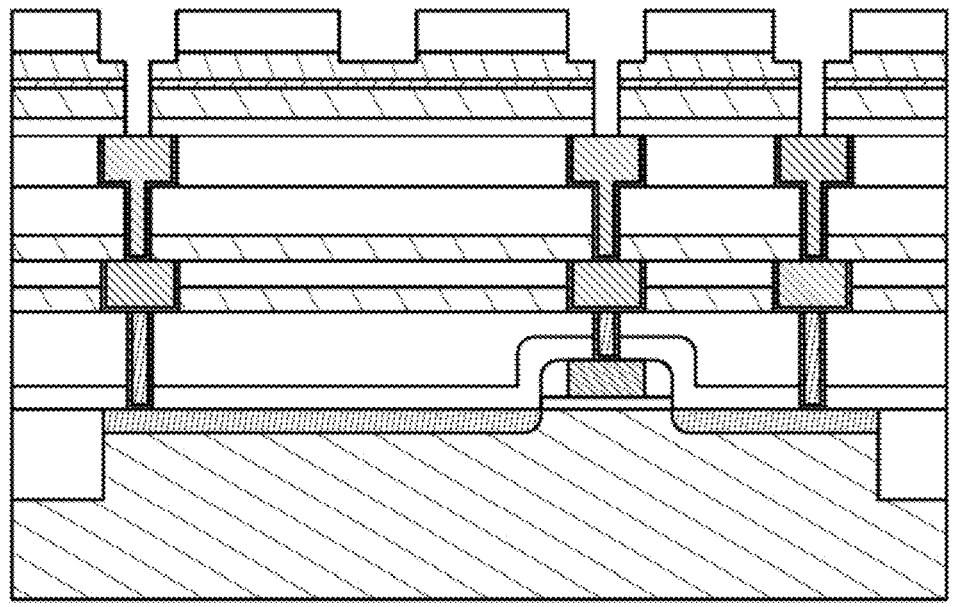
FIGS. 12A and 12B illustrate an example of a method for manufacturing a semiconductor device of one embodiment.

Then, opening portions that reach the conductor 358a, the conductor 358b, and the conductor 358c and grooves where wirings are to be formed are formed in the stacked-layer structure of the insulator 355, the insulator 210, the insulator 212, the insulator 214, and the insulator 216 (FIG. 12A).

Figure 12B:
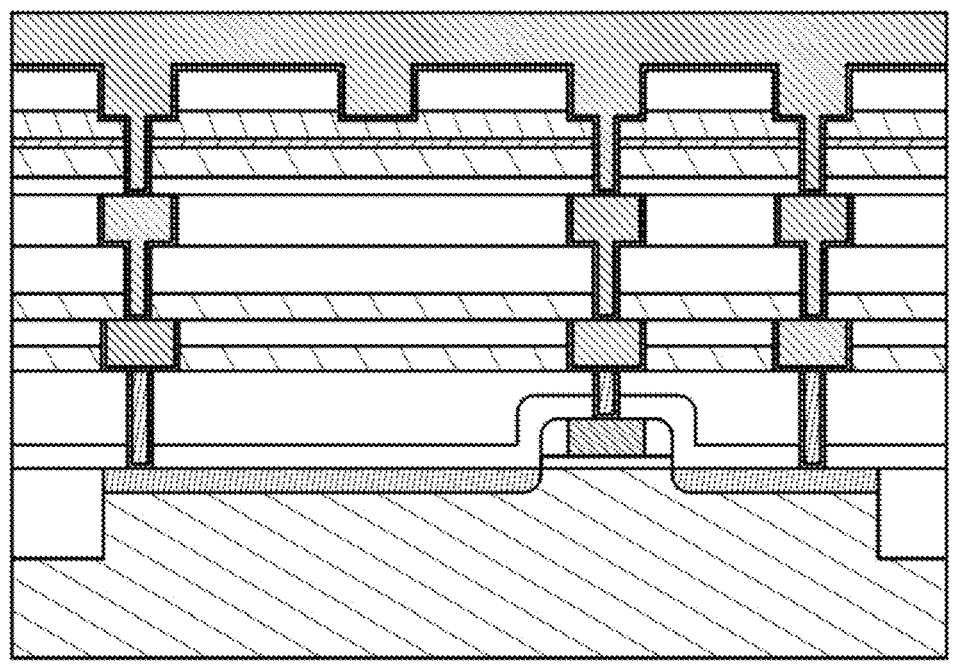
Figure 13A:
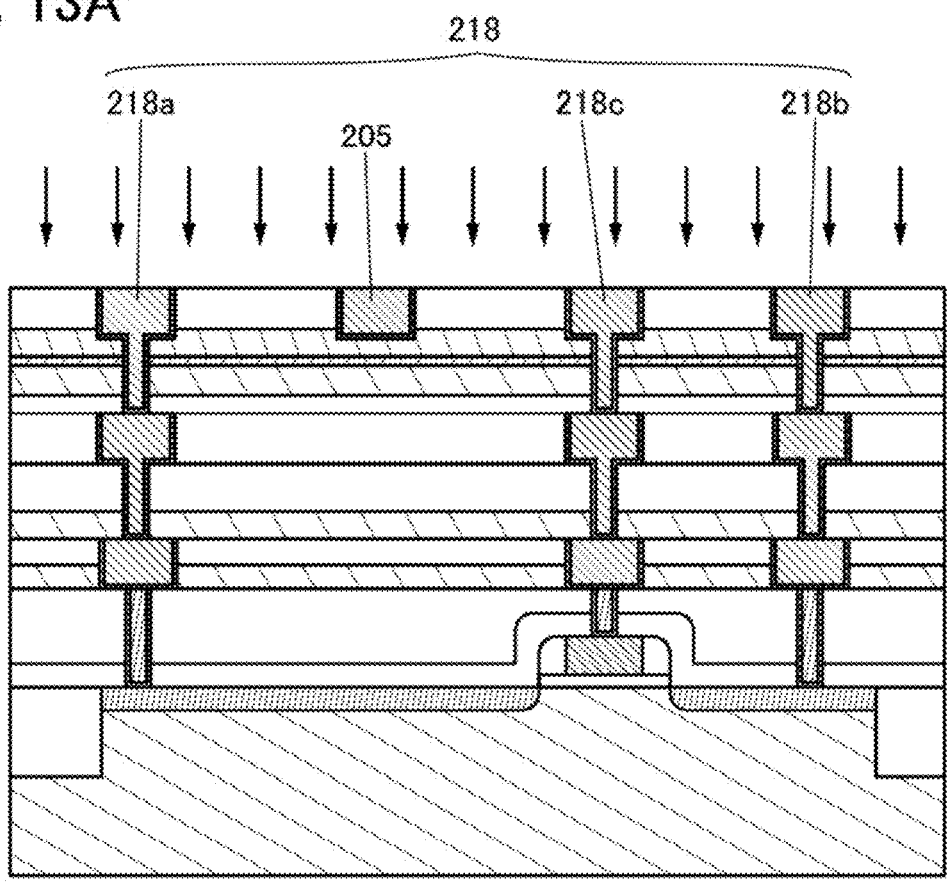
FIGS. 13A and 13B illustrate an example of a method for manufacturing a semiconductor device of one embodiment.

Then, a conductive film is formed to fill the opening portions and the grooves (FIG. 12B). The conductive film can be formed using a material and a method similar to those used for forming the conductor 328. Then, planarization treatment is performed on the conductive film to expose a top surface of the insulator 216, whereby a conductor 218a, a conductor 218b, a conductor 218c, and the conductor 205 are formed (FIG. 13A). Note that arrows in FIG. 13A show CMP treatment.

Then, the insulator 220, the insulator 222, and the insulator 224 are formed.

The insulator 220, the insulator 222, and the insulator 224 can be formed using a material and a method similar to those used for forming the insulator 320. It is particularly preferable to use a high-k material such as hafnium oxide as the insulator 222.

Then, an oxide to be the oxide 230a and an oxide to be the oxide 230b are sequentially formed. The oxides are preferably formed successively without exposure to the air.

After the oxide to be the oxide 230b is formed, heat treatment is preferably performed. The heat treatment may be performed at a temperature higher than or equal to 250° C. and lower than or equal to 650° C., preferably higher than or equal to 300° C. and lower than or equal to 500° C., in an inert gas atmosphere, an atmosphere containing an oxidizing gas at 10 ppm or more, or a reduced pressure state. The heat treatment may be performed in such a manner that heat treatment is performed in an inert gas atmosphere, and then another heat treatment is performed in an atmosphere containing an oxidizing gas at 10 ppm or more, in order to compensate desorbed oxygen. The heat treatment may be performed directly after the formation of the oxide to be the oxide 230b or may be performed after the oxide to be the oxide 230b is processed into an island shape. By the heat treatment, oxygen can be supplied from the insulator formed under the oxide 230a to the oxide 230a and the oxide 230b, so that oxygen vacancies in the oxide can be reduced.

Then, a conductive film to be the conductor 240a and the conductor 240b is formed over the oxide to be the oxide 230b. Then, a resist mask is formed by a method similar to that described above, and unnecessary portions of the conductive film are removed by etching. After that, unnecessary portions of the oxides are removed by etching using the conductive film as a mask. Then, the resist mask is removed. Thus, a stacked-layer structure of the oxide 230a, the oxide 230b, and a conductor each having an island shape can be formed.

Then, a resist mask is formed over the conductive film having an island shape by a method similar to that described above, and unnecessary portions of the conductive film are removed by etching. Then, the resist mask is removed. Thus, the conductor 240a and the conductor 240b are formed.

Then, an oxide to be the oxide 230c, an insulator to be the insulator 250, and a conductive film to be the conductor 260 are sequentially formed. For example, the conductive film to be the conductor 260 can be formed by stacking tantalum nitride formed by an ALD method and tungsten with high conductivity. The conductive film is preferably formed using a deposition gas that does not include chlorine. By the formation of tantalum nitride that has a barrier property with respect to oxygen, hydrogen, and water and is in contact with the insulator 250, the tungsten can be prevented from being oxidized by excess oxygen diffused into the insulator 250.

Then, a resist mask is formed over the conductive film by a method similar to that described above, and unnecessary portions of the conductive film are removed by etching, whereby the conductor 260 is formed.

Then, an insulator to be the insulator 270 is formed over the insulator to be the insulator 250 and the conductor 260. The insulator to be the insulator 270 is preferably formed using a material having a barrier property with respect to hydrogen and oxygen. Then, a resist mask is formed over the insulator by a method similar to that described above, and unnecessary portions of the insulator to be the insulator 270, the insulator to be the insulator 250, and the oxide to be the oxide 230c are removed by etching. After that, the resist mask is removed. Thus, the transistor 200 is formed.

Figure 13B:
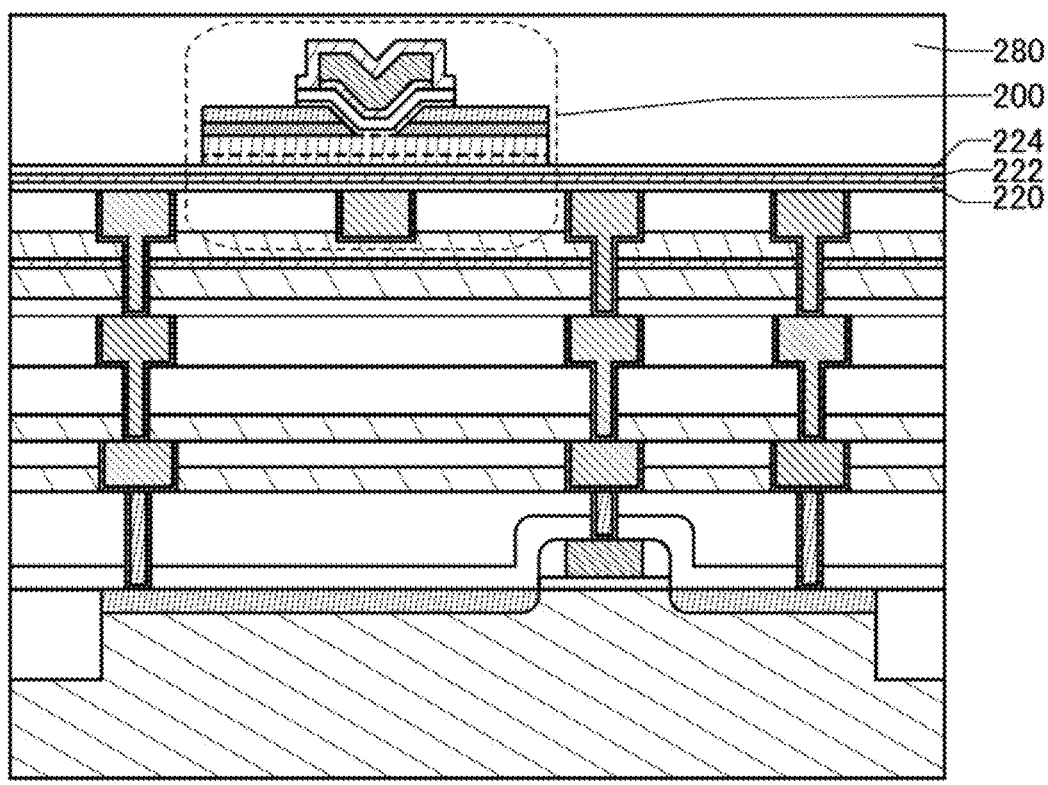

Then, the insulator 280 is formed. The insulator 280 preferably includes an oxide containing oxygen in excess of that in the stoichiometric composition. After an insulator to be the insulator 280 is formed, planarization treatment using a CMP method or the like may be performed to improve the planarity of a top surface of the insulator (FIG. 13B).

To make the insulator 280 contain excess oxygen, the insulator 280 may be formed in an oxygen atmosphere, for example. Alternatively, a region containing excess oxygen may be formed by introducing oxygen into the insulator 280 that has been formed. Both the methods may be combined.

Then, the insulator 282 is formed over the insulator 280. The insulator 282 is preferably formed by an ALD method. An ALD method causes less plasma damage to an object to be processed. An ALD method does not cause plasma damage during deposition, so that a film with few defects can be obtained.

Unlike in a deposition method in which particles ejected from a target or the like are deposited, in an ALD method, a film is formed by reaction at a surface of an object to be processed. An ALD method enables excellent step coverage and excellent thickness uniformity and can be favorably used for covering a surface of an opening with a high aspect ratio, for example.

As the insulator 282, an aluminum oxide film is preferably formed by an ALD method to a thickness of greater than or equal to 1 nm and less than 5 nm.

Figure 14:
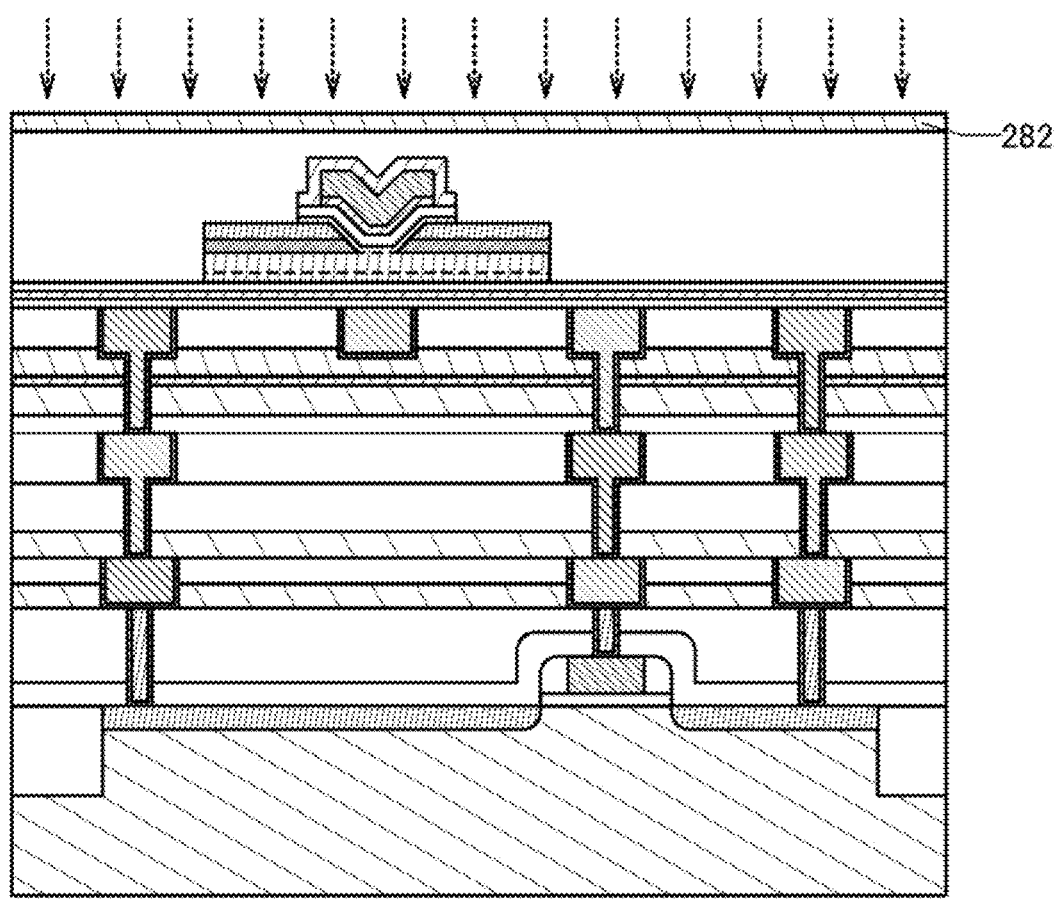
FIG. 14 illustrates an example of a method for manufacturing a semiconductor device of one embodiment.

Then, oxygen (at least including any of oxygen radicals, oxygen atoms, and oxygen ions) may be introduced into the insulator 280 through the insulator 282, so that a region containing excess oxygen is formed. Oxygen can be introduced by an ion implantation method, an ion doping method, a plasma immersion ion implantation method, plasma treatment, or the like. By performing the oxygen introduction treatment through the insulator 282, an excess-oxygen region can be formed in a state where the insulator 280 is protected (FIG. 14). Note that arrows in FIG. 14 show the oxygen introduction treatment.

In typical oxygen plasma treatment, the surface of an oxide semiconductor is processed by radicals generated from an oxygen gas by glow discharge plasma. However, as a gas from which plasma is generated, a mixed gas of an oxygen gas and a rare gas may be used, as well as oxygen. For example, oxygen plasma treatment may be performed at a temperature higher than or equal to 250° C. and lower than or equal to 400° C., preferably higher than or equal to 300° C. and lower than or equal to 400° C., in an atmosphere containing an oxidizing gas or under reduced pressure. A gas containing oxygen can be used for the oxygen introduction treatment. As a gas containing oxygen, oxygen, dinitrogen monoxide, nitrogen dioxide, carbon dioxide, carbon monoxide, or the like can be used. A rare gas may be contained in the oxygen-containing gas in introducing oxygen. For example, a mixed gas of carbon dioxide, hydrogen, and argon can be used.

The oxygen plasma treatment dehydrates or dehydrogenates the insulator 280 and the oxide 230 of the transistor 200 and introduces excess oxygen to the insulator 280; as a result, an excess-oxygen region can be formed. In addition, oxygen vacancies are generated in the dehydrated or dehydrogenated oxide 230 and the resistance of the oxide 230 is reduced. Meanwhile, the excess oxygen in the insulator 280 compensates oxygen vacancies of the oxide 230. Thus, by the oxygen plasma treatment, hydrogen and water that serve as impurities can be removed from the oxide 230 while oxygen vacancies in the insulator 280 and the oxide 230 are compensated. Consequently, the electrical characteristics of the transistor 200 can be improved and variation in the electrical characteristics thereof can be reduced.

As an apparatus used for plasma treatment, a capacitively coupled plasma (CCP) apparatus including parallel plate type electrodes can be used. The capacitively coupled plasma apparatus including the parallel plate type electrodes may have a structure in which a high-frequency power source is applied to one of the parallel plate type electrodes. Alternatively, the capacitively coupled plasma apparatus may have a structure in which different high-frequency power sources are applied to one of the parallel plate type electrodes. Alternatively, the capacitively coupled plasma apparatus may have a structure in which high-frequency power sources with the same frequency are applied to the parallel plate type electrodes. Alternatively, the capacitively coupled plasma apparatus may have a structure in which high-frequency power sources with different frequencies are applied to the parallel plate type electrodes. Alternatively, an apparatus including a high-density plasma source can be used. Examples of the apparatus including a high-density plasma source include an inductively coupled plasma (ICP) apparatus, an electron cyclotron resonance (ECR) plasma apparatus, a helicon wave plasma (HWP) apparatus, a surface wave plasma (SWP) apparatus, and a magnetron plasma apparatus.

Through the above-described steps, oxygen in excess of that in the stoichiometric composition is introduced into the insulator 282 and into the vicinity of the interface between the insulator 282 and the insulator 280, so that an excess-oxygen region is formed. In the case where an aluminum oxide is formed as the insulator 282 by an ALD method to a thickness of larger than or equal to 1 nm and smaller than 5 nm, the excess oxygen can be formed efficiently in the insulator 282 and in the vicinity of the interface between the insulator 282 and the insulator 280.

Figure 15:
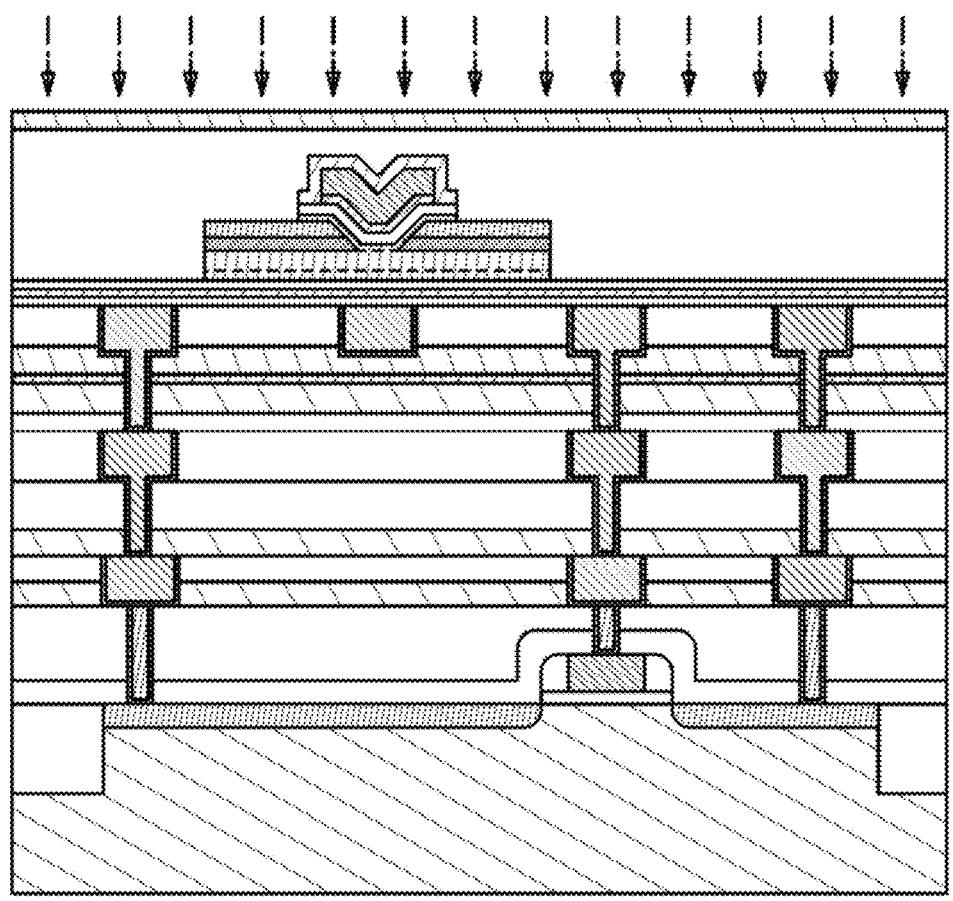
FIG. 15 illustrates an example of a method for manufacturing a semiconductor device of one embodiment.

Then, heat treatment is performed. The heat treatment may be performed at a temperature higher than or equal to 250° C. and lower than or equal to 650° C., preferably higher than or equal to 300° C. and lower than or equal to 500° C., more preferably higher than or equal to 350° C. and lower than or equal to 400° C., in an inert gas atmosphere, an atmosphere containing an oxidizing gas at 10 ppm or more, or a reduced pressure state. The heat treatment may be performed in such a manner that heat treatment is performed in an inert gas atmosphere, and then another heat treatment is performed in an atmosphere containing an oxidizing gas at 10 ppm or more, in order to compensate desorbed oxygen. For the heat treatment, lamp heating can be performed with the use of an RTA apparatus (FIG. 15). Note that arrows in FIG. 15 show the heat treatment.

By the heat treatment, excess oxygen introduced into the insulator 282 and into the vicinity of the interface between the insulator 282 and the insulator 280 is diffused into the insulator 280. The insulator 280 is enclosed with the insulator 210 and the insulator 282 having a barrier property with respect to oxygen. Thus, excess oxygen introduced into the insulator 280 is prevented from being released to the outside and is supplied to the oxide 230 efficiently.

Moreover, by the heat treatment, hydrogen in the insulator 280 is moved to the insulator 282. Hydrogen moved to the insulator 282 reacts with oxygen in the insulator 282, whereby water is produced in some cases. The formed water is released from a top surface of the insulator 282. Thus, hydrogen and water as impurities in the insulator 280 can be reduced. Note that in the case where insulator 282 is formed using aluminum oxide, the insulator 282 may function as a catalyst.

Oxygen supplied to the oxide 230 compensates oxygen vacancies in the oxide 230. Thus, the oxide where a channel is formed in the transistor 200 can be an oxide semiconductor with a low density of defect states and stable characteristics. That is, a change in electrical characteristics of the transistor 200 can be prevented and the reliability can be improved.

The oxygen introduction treatment and the heat treatment may be repeated a plurality of times until the excess-oxygen region is formed sufficiently or as long as the barrier property of the insulator 282 is not lost by damage caused by the oxygen introduction treatment.

In the case where the barrier property of the insulator 282 is degraded or destroyed, the oxygen introduction treatment and the heat treatment may be performed after the insulator 284 is formed. By performing the oxygen introduction treatment through the insulator 282 and the insulator 284, the excess-oxygen region can be formed in a state where the insulator 280 is protected.

Note that as the insulator 284, an aluminum oxide film having a barrier property is preferably formed by an ALD method, for example. A dense conductor including reduced defects such as cracks or pinholes or having a uniform thickness can be formed by an ALD method.

Figure 16:
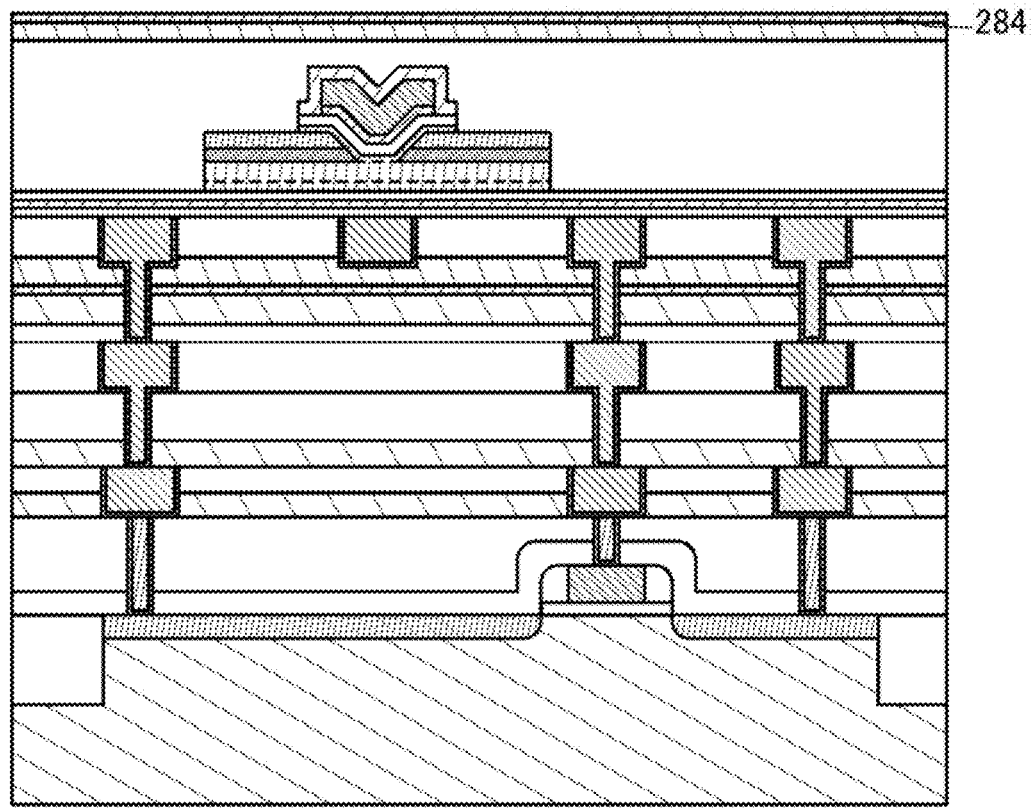
FIG. 16 illustrates an example of a method for manufacturing a semiconductor device of one embodiment.

By stacking the insulator 284 having dense film quality over the insulator 282, excess oxygen introduced into the insulator 280 can be effectively sealed on the transistor 200 side (FIG. 16).

Next, the capacitor 100 is formed. First, the insulator 102 is formed over the insulator 284. The insulator 102 can be formed using a material and a method similar to those used for forming the insulator 210.

The insulator 102 is preferably formed using, for example, a film having a barrier property that prevents diffusion of hydrogen and impurities from the capacitor 100 and the like into a region where the transistor 200 is formed. As an example of the film having a barrier property with respect to hydrogen, silicon nitride formed by a CVD method can be given.

Then, opening portions that reach the conductor 218a, the conductor 218b, the conductor 218c, the conductor 240a, the conductor 240b, and the like are formed in the insulator 220, the insulator 222, the insulator 224, the insulator 280, the insulator 282, and the insulator 284.

Figure 17:
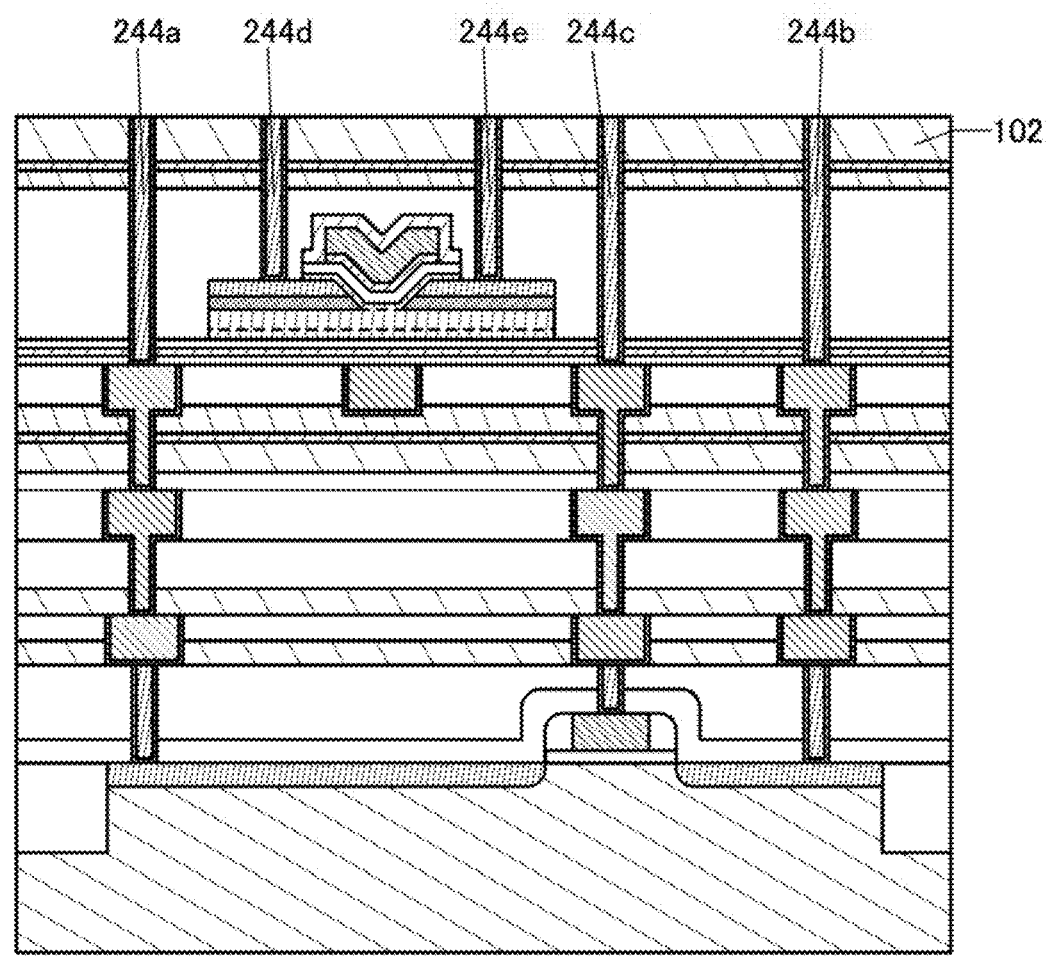
FIG. 17 illustrates an example of a method for manufacturing a semiconductor device of one embodiment.

Then, a conductive film is formed to fill the opening portions, and planarization treatment is performed on the conductive film to expose a top surface of the insulator 102, whereby a conductor 244a, a conductor 244b, a conductor 244c, a conductor 244d, and a conductor 244e are formed. Note that the conductive film can be formed using a material and a method similar to those used for forming the conductor 328 (FIG. 17).

Note that in the case where the conductor 244 has a stacked-layer structure, a conductor having a barrier property with respect to oxygen, hydrogen, or water, such as tantalum nitride, is preferably formed by an ALD method as a conductor in contact with the insulator 104. A dense conductor including reduced defects such as cracks or pinholes or having a uniform thickness can be formed by an ALD method. In the case where the insulator 104 having a barrier property with respect to oxygen, hydrogen, or water is in contact with the conductor 244 having a barrier property with respect to oxygen, hydrogen, or water, the diffusion of oxygen, hydrogen, or water can be prevented more reliably.

Then, the conductor 112 and the conductor 128 are formed over the insulator 102. Note that the conductor 112 and the conductor 128 can be formed using similar materials and similar methods. When the conductor 112 and the conductor 128 are formed, the top surface of the insulator 102 is preferably removed by a thickness larger than a thickness of the insulator 114. For example, by performing over-etching treatment, a part of the insulator 102 can be removed concurrently. Furthermore, by forming the conductor 112 or the like by over-etching treatment, etching can be performed without leaving an etching residue.

By changing the kind of etching gas in the etching treatment, a part of the insulator 102 can be removed efficiently.

After the conductor 112 is formed, a part of the insulator 102 may be removed using the conductor 112 as a hard mask, for example.

After the conductor 112 is formed, a surface of the conductor 112 may be subjected to cleaning treatment. By the cleaning treatment, an etching residue or the like can be removed.

Then, the insulator 114 covering a side surface and a top surface of the conductor 112 is formed. The insulator 114 can have a single-layer structure or a stacked-layer structure formed using, for example, silicon oxide, silicon oxynitride, silicon nitride oxide, silicon nitride, aluminum oxide, aluminum oxynitride, aluminum nitride oxide, aluminum nitride, hafnium oxide, hafnium oxynitride, hafnium nitride oxide, hafnium nitride, or the like.

For example, a stacked-layer structure of a high-k material such as aluminum oxide and a material with high dielectric strength such as silicon oxynitride is preferably used. The structure enables the capacitor 100 to include a high-k material and a material with high dielectric strength; thus, a sufficient capacitance can be provided, the dielectric strength can be increased, and the electrostatic breakdown of the capacitor 100 can be prevented, which leads to improvement in the reliability of the capacitor 100.

Then, the conductor 116 is formed over the insulator 114. Note that the conductor 116 can be formed using a material and a method similar to those used for forming the conductor 112.

The conductor 116 is preferably provided to cover the side surface and the top surface of the conductor 112 with the insulator 114 positioned therebetween. In the structure, the side surface of the conductor 112 faces the conductor 116 with the insulator 114 positioned therebetween. Thus, the capacitor can have a large capacitance per projected area.

Then, the insulator 120 that covers the capacitor 100 is formed. An insulator to be the insulator 120 can be formed using a material and a method similar to those used for forming the insulator 320 and the like.

A conductor 128a, a conductor 128b, a conductor 128c, and a conductor 128d are formed over the insulator 120. The conductor 128 can be formed using a material and a method similar to those used for forming the conductor 328.

Figure 18:
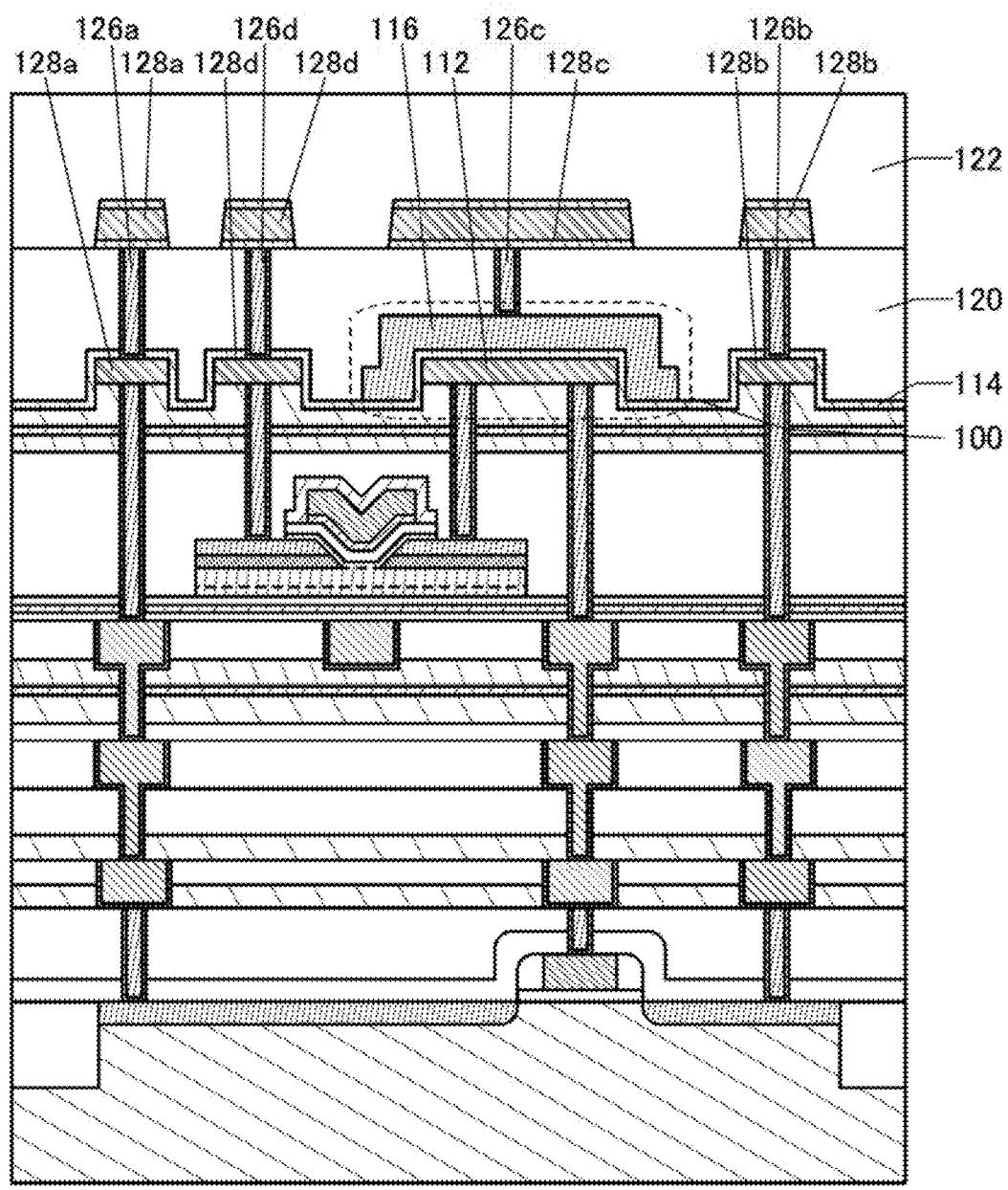
FIG. 18 illustrates an example of a method for manufacturing a semiconductor device of one embodiment.

Then, the insulator 122 is formed over the insulator 120 (FIG. 18). An insulator to be the insulator 122 can be formed using a material and a method similar to those used for forming the insulator 122 and the like.

Through the above steps, the semiconductor device of one embodiment of the present invention can be manufactured.

In a semiconductor device including a transistor using an oxide semiconductor and manufactured through the above steps, a change in electrical characteristics can be inhibited and reliability can be improved. A transistor including an oxide semiconductor with high on-state current can be provided. A transistor including an oxide semiconductor with low off-state current can be provided. A semiconductor device with low power consumption can be provided.

At least part of this embodiment can be implemented in combination with any of the other embodiments and examples described in this specification as appropriate.

Embodiment 4

In this embodiment, an oxide semiconductor included in the transistor described in the above embodiment will be described below with reference to FIGS. 23A to 23E, FIGS. 24A to 24E, FIGS. 25A to 25D, FIGS. 26A and 26B, and FIG. 27.

<Structure of Oxide Semiconductor>

The structure of an oxide semiconductor will be described below.

An oxide semiconductor is classified into a single crystal oxide semiconductor and a non-single-crystal oxide semiconductor. Examples of a non-single-crystal oxide semiconductor include a c-axis aligned crystalline oxide semiconductor (CAAC-OS), a polycrystalline oxide semiconductor, a nanocrystalline oxide semiconductor (nc-OS), an amorphous-like oxide semiconductor (a-like OS), and an amorphous oxide semiconductor.

From another perspective, an oxide semiconductor is classified into an amorphous oxide semiconductor and a crystalline oxide semiconductor. Examples of a crystalline oxide semiconductor include a single crystal oxide semiconductor, a CAAC-OS, a polycrystalline oxide semiconductor, and an nc-OS.

An amorphous structure is generally thought to be isotropic and have no non-uniform structure, to be metastable and not have fixed positions of atoms, to have a flexible bond angle, and to have a short-range order but have no long-range order, for example.

This means that a stable oxide semiconductor cannot be regarded as a completely amorphous oxide semiconductor. Moreover, an oxide semiconductor that is not isotropic (e.g., an oxide semiconductor that has a periodic structure in a microscopic region) cannot be regarded as a completely amorphous oxide semiconductor. In contrast, an a-like OS, which is not isotropic, has an unstable structure that contains a void. Because of its instability, an a-like OS has physical properties similar to those of an amorphous oxide semiconductor.

<CAAC-OS>

First, a CAAC-OS is described.

A CAAC-OS is one of oxide semiconductors having a plurality of c-axis aligned crystal parts (also referred to as pellets).

Figure 23A:
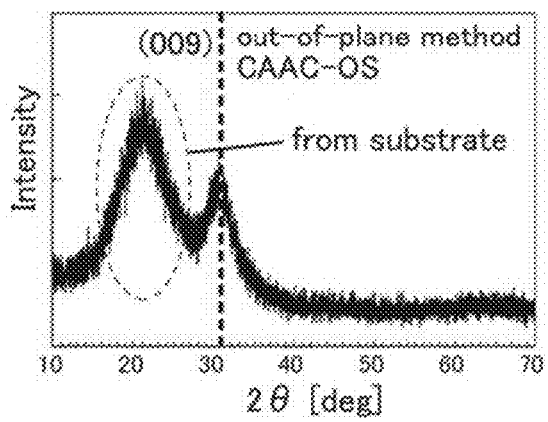
FIGS. 23A to 23E show structural analysis of a CAAC-OS and a single crystal oxide semiconductor by XRD and selected-area electron diffraction patterns of a CAAC-OS.

Analysis of a CAAC-OS by X-ray diffraction (XRD) is described. For example, when the structure of a CAAC-OS including an $InGaZnO_4$ crystal that is classified into the space group R-3m is analyzed by an out-of-plane method, a peak appears at a diffraction angle (2θ) of around 31° as shown in FIG. 23A. This peak is derived from the (009) plane of the $InGaZnO_4$ crystal, which indicates that crystals in the CAAC-OS have c-axis alignment, and that the c-axes are aligned in a direction substantially perpendicular to a surface over which the CAAC-OS film is formed (also referred to as a formation surface) or the top surface of the CAAC-OS film. Note that a peak sometimes appears at a 2θ of around 36° in addition to the peak at a 2θ of around 31°. The peak at a 2θ of around 36° is derived from a crystal structure that is classified into the space group Fd-3m; thus, this peak is preferably not exhibited in a CAAC-OS.

Figure 23B:
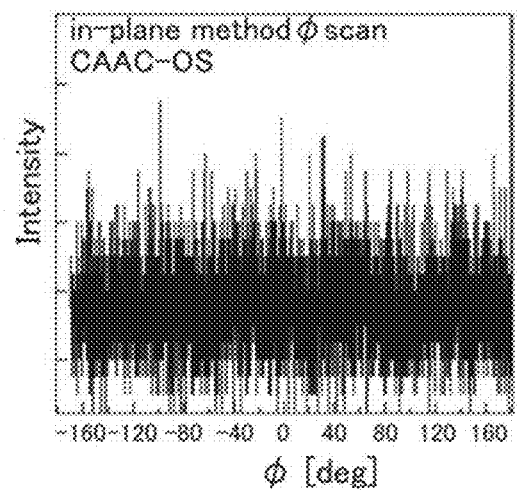
Figure 23C:
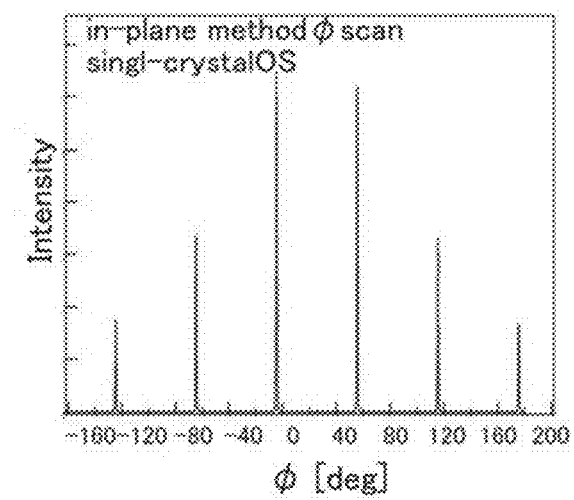
Figure 23D:
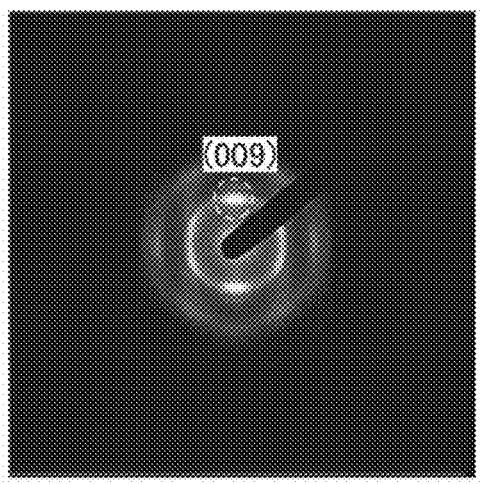

On the other hand, in structural analysis of the CAAC-OS by an in-plane method in which an X-ray is incident on the CAAC-OS in a direction parallel to the formation surface, a peak appears at a 2θ of around 56°. This peak is attributed to the (110) plane of the $InGaZnO_4$ crystal. When analysis (φ scan) is performed with 2θ fixed at around 56° and with the sample rotated using a normal vector to the sample surface as an axis (φ axis), as shown in FIG. 23B, a peak is not clearly observed. In contrast, in the case where single crystal $InGaZnO_4$ is subjected to φ scan with 2θ fixed at around 56°, as shown in FIG. 23C, six peaks which are derived from crystal planes equivalent to the (110) plane are observed. Accordingly, the structural analysis using XRD shows that the directions of a-axes and b-axes are irregularly oriented in the CAAC-OS.

Figure 23E:
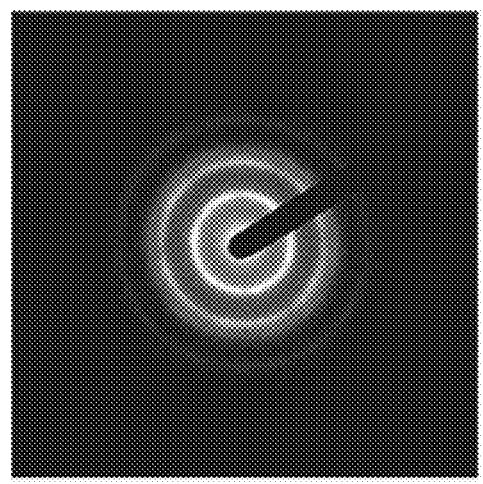

Next, a CAAC-OS analyzed by electron diffraction is described. For example, when an electron beam with a probe diameter of 300 nm is incident on a CAAC-OS including an $InGaZnO_4$ crystal in a direction parallel to the formation surface of the CAAC-OS, a diffraction pattern (also referred to as a selected-area electron diffraction pattern) shown in FIG. 23D can be obtained. In this diffraction pattern, spots derived from the (009) plane of an $InGaZnO_4$ crystal are included. Thus, the electron diffraction also indicates that pellets included in the CAAC-OS have c-axis alignment and that the c-axes are aligned in a direction substantially perpendicular to the formation surface or the top surface of the CAAC-OS. Meanwhile, FIG. 23E shows a diffraction pattern obtained in such a manner that an electron beam with a probe diameter of 300 nm is incident on the same sample in a direction perpendicular to the sample surface. As shown in FIG. 23E, a ring-like diffraction pattern is observed. Thus, the electron diffraction using an electron beam with a probe diameter of 300 nm also indicates that the a-axes and b-axes of the pellets included in the CAAC-OS do not have regular orientation. The first ring in FIG. 23E is considered to be derived from the (010) plane, the (100) plane, and the like of the $InGaZnO_4$ crystal. The second ring in FIG. 23E is considered to be derived from the (110) plane and the like.

In a combined analysis image (also referred to as a high-resolution TEM image) of a bright-field image and a diffraction pattern of a CAAC-OS, which is obtained using a transmission electron microscope (TEM), a plurality of pellets can be observed. However, even in the high-resolution TEM image, a boundary between pellets, that is, a grain boundary is not clearly observed in some cases. Thus, in the CAAC-OS, a reduction in electron mobility due to the grain boundary is less likely to occur.

Figure 24A:
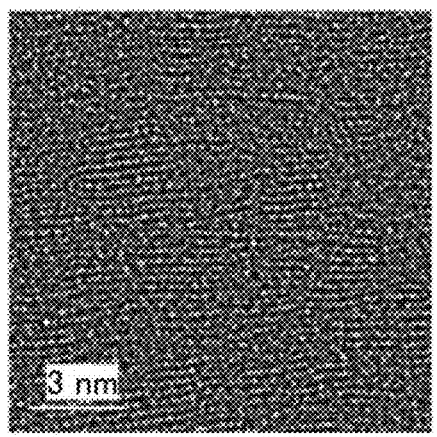
FIGS. 24A to 24E show a cross-sectional TEM image and plan-view TEM images of a CAAC-OS and images obtained through analysis thereof.

FIG. 24A shows a high-resolution TEM image of a cross section of the CAAC-OS which is observed from a direction substantially parallel to the sample surface. The high-resolution TEM image is obtained with a spherical aberration corrector function. The high-resolution TEM image obtained with a spherical aberration corrector function is particularly referred to as a Cs-corrected high-resolution TEM image. The Cs-corrected high-resolution TEM image can be observed with, for example, an atomic resolution analytical electron microscope JEM-ARM200F manufactured by JEOL Ltd.

FIG. 24A shows pellets in which metal atoms are arranged in a layered manner. FIG. 24A proves that the size of a pellet is greater than or equal to 1 nm or greater than or equal to 3 nm. Therefore, the pellet can also be referred to as a nanocrystal (nc). Furthermore, the CAAC-OS can also be referred to as an oxide semiconductor including c-axis aligned nanocrystals (CANC). A pellet reflects unevenness of a formation surface or a top surface of the CAAC-OS, and is parallel to the formation surface or the top surface of the CAAC-OS.

Figure 24B:
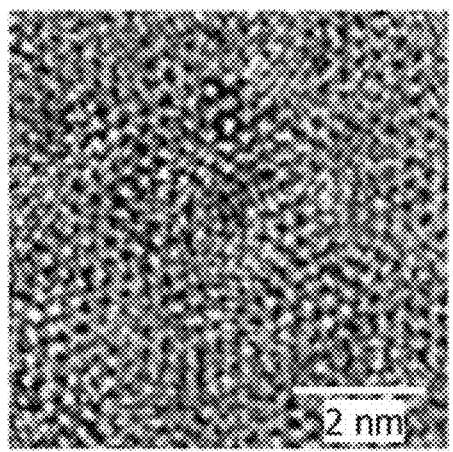
Figure 24C:
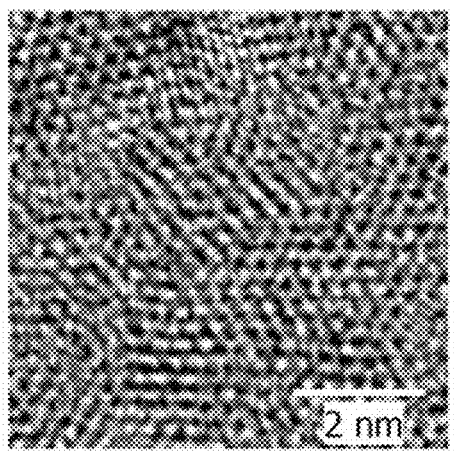
Figure 24D:
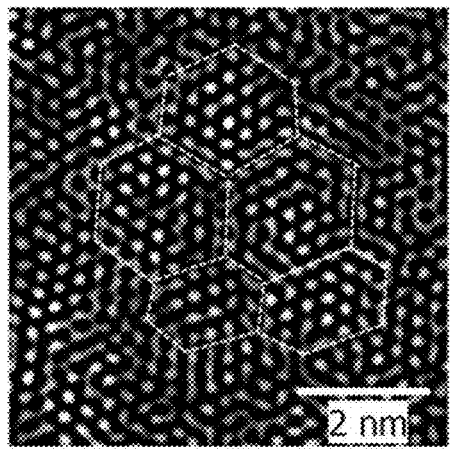
Figure 24E:
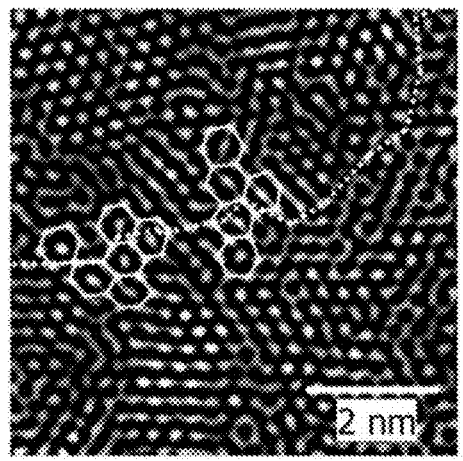

FIGS. 24B and 24C show Cs-corrected high-resolution TEM images of a plane of the CAAC-OS observed from a direction substantially perpendicular to the sample surface. FIGS. 24D and 24E are images obtained through image processing of FIGS. 24B and 24C. The method of image processing is as follows. The image in FIG. 24B is subjected to fast Fourier transform (FFT), so that an FFT image is obtained. Then, mask processing is performed such that a range of from 2.8 $nm^{-1}$ to 5.0 $nm^{-1}$ from the origin in the obtained FFT image remains. After the mask processing, the FFT image is processed by inverse fast Fourier transform (IFFT) to obtain a processed image. The image obtained in this manner is called an FFT filtering image. The FFT filtering image is a Cs-corrected high-resolution TEM image from which a periodic component is extracted, and shows a lattice arrangement.

In FIG. 24D, a portion where a lattice arrangement is broken is denoted with a dashed line. A region surrounded by a dashed line is one pellet. The portion denoted with the dashed line is a junction of pellets. The dashed line draws a hexagon, which means that the pellet has a hexagonal shape. Note that the shape of the pellet is not always a regular hexagon but is a non-regular hexagon in many cases.

In FIG. 24E, a dotted line denotes a portion where the direction of a lattice arrangement is changed between a region with a regular lattice arrangement and another region with a regular lattice arrangement, and a dashed line denotes the change in the direction of the lattice arrangement. A clear crystal grain boundary cannot be observed even in the vicinity of the dotted line. When a lattice point in the vicinity of the dotted line is regarded as a center and surrounding lattice points are joined, a distorted hexagon, pentagon, and/or heptagon can be formed, for example. That is, a lattice arrangement is distorted so that formation of a crystal grain boundary is inhibited. This is probably because the CAAC-OS can tolerate distortion owing to a low density of arrangement of oxygen atoms in an a-b plane direction, an interatomic bond distance changed by substitution of a metal element, and the like.

As described above, the CAAC-OS has c-axis alignment, its pellets (nanocrystals) are connected in an a-b plane direction, and the crystal structure has distortion. For this reason, the CAAC-OS can also be referred to as an oxide semiconductor including a c-axis-aligned a-b-plane-anchored (CAA) crystal.

The CAAC-OS is an oxide semiconductor with high crystallinity. Entry of impurities, formation of defects, or the like might decrease the crystallinity of an oxide semiconductor. This means that the CAAC-OS has small amounts of impurities and defects (e.g., oxygen vacancies).

Note that the impurity means an element other than the main components of the oxide semiconductor, such as hydrogen, carbon, silicon, or a transition metal element. For example, an element (specifically, silicon or the like) having higher strength of bonding to oxygen than a metal element included in an oxide semiconductor extracts oxygen from the oxide semiconductor, which results in disorder of the atomic arrangement and reduced crystallinity of the oxide semiconductor. A heavy metal such as iron or nickel, argon, carbon dioxide, or the like has a large atomic radius (or molecular radius), and thus disturbs the atomic arrangement of the oxide semiconductor and decreases crystallinity.

The characteristics of an oxide semiconductor having impurities or defects might be changed by light, heat, or the like. Impurities contained in the oxide semiconductor might serve as carrier traps or carrier generation sources, for example. For example, an oxygen vacancy in the oxide semiconductor might serve as a carrier trap or serve as a carrier generation source when hydrogen is captured therein.

The CAAC-OS having small amounts of impurities and oxygen vacancies is an oxide semiconductor with low carrier density (specifically, lower than $8\times10^{11}$ cm$^{-3}$, preferably lower than $1\times10^{11}$ cm$^{-3}$, and further preferably lower than $1\times10^{10}$ cm$^{-3}$, and is higher than or equal to $1\times10^{-9}$ cm$^{-3}$). Such an oxide semiconductor is referred to as a highly purified intrinsic or substantially highly purified intrinsic oxide semiconductor. A CAAC-OS has a low impurity concentration and a low density of defect states. Thus, the CAAC-OS can be referred to as an oxide semiconductor having stable characteristics.

<nc-OS>

Next, an nc-OS is described.

Analysis of an nc-OS by XRD is described. When the structure of an nc-OS is analyzed by an out-of-plane method, a peak indicating orientation does not appear. That is, a crystal of an nc-OS does not have orientation.

Figure 25A:
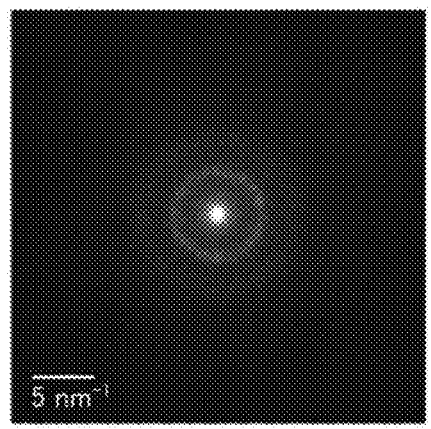
FIGS. 25A to 25D show electron diffraction patterns and a cross-sectional TEM image of an nc-OS.
Figure 25B:
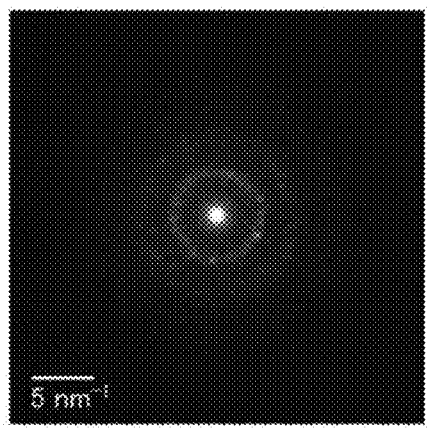

For example, when an electron beam with a probe diameter of 50 nm is incident on a 34-nm-thick region of thinned nc-OS including an InGaZnO$_4$ crystal in a direction parallel to the formation surface, a ring-shaped diffraction pattern (a nanobeam electron diffraction pattern) shown in FIG. 25A is observed. FIG. 25B shows a diffraction pattern obtained when an electron beam with a probe diameter of 1 nm is incident on the same sample. As shown in FIG. 25B, a plurality of spots are observed in a ring-like region. In other words, ordering in an nc-OS is not observed with an electron beam with a probe diameter of 50 nm but is observed with an electron beam with a probe diameter of 1 nm.

Figure 25C:
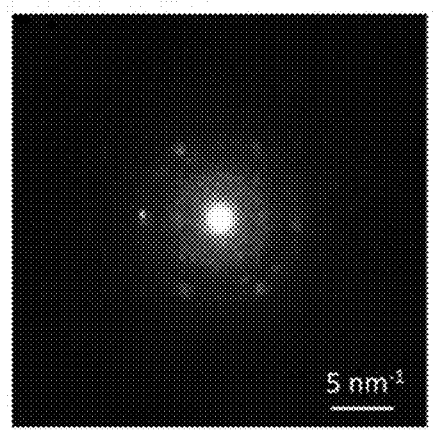

Furthermore, an electron diffraction pattern in which spots are arranged in an approximately regular hexagonal shape is observed in some cases as shown in FIG. 25C when an electron beam having a probe diameter of 1 nm is incident on a region with a thickness of less than 10 nm. This means that an nc-OS has a well-ordered region, i.e., a crystal, in the range of less than 10 nm in thickness. Note that an electron diffraction pattern having regularity is not observed in some regions because crystals are aligned in various directions.

Figure 25D:
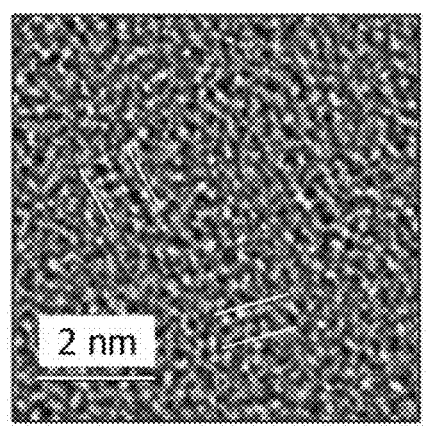

FIG. 25D shows a Cs-corrected high-resolution TEM image of a cross section of an nc-OS observed from the direction substantially parallel to the formation surface. In a high-resolution TEM image, an nc-OS has a region in which a crystal part is observed, such as the part indicated by additional lines in FIG. 25D, and a region in which a crystal part is not clearly observed. In most cases, the size of a crystal part included in the nc-OS is greater than or equal to 1 nm and less than or equal to 10 nm, in particular, greater than or equal to 1 nm and less than or equal to 3 nm. Note that an oxide semiconductor including a crystal part whose size is greater than 10 nm and less than or equal to 100 nm is sometimes referred to as a microcrystalline oxide semiconductor. In a high-resolution TEM image of the nc-OS, for example, a grain boundary is not clearly observed in some cases. Note that there is a possibility that the origin of the nanocrystal is the same as that of a pellet in a CAAC-OS. Therefore, a crystal part of the nc-OS may be referred to as a pellet in the following description.

As described above, in the nc-OS, a microscopic region (e.g., a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different pellets in the nc-OS. Thus, the orientation of the whole film is not ordered. Accordingly, the nc-OS cannot be distinguished from an a-like OS or an amorphous oxide semiconductor, depending on an analysis method.

Since there is no regularity of crystal orientation between the pellets (nanocrystals) as mentioned above, the nc-OS can also be referred to as an oxide semiconductor including random aligned nanocrystals (RANC) or an oxide semiconductor including non-aligned nanocrystals (NANC).

The nc-OS is an oxide semiconductor that has high regularity as compared to an amorphous oxide semiconductor. Therefore, the nc-OS is likely to have a lower density of defect states than an a-like OS and an amorphous oxide semiconductor. Note that there is no regularity of crystal orientation between different pellets in the nc-OS. Therefore, the nc-OS has a higher density of defect states than the CAAC-OS.

<a-like OS>

An a-like OS has a structure intermediate between those of the nc-OS and the amorphous oxide semiconductor.

Figure 26A:
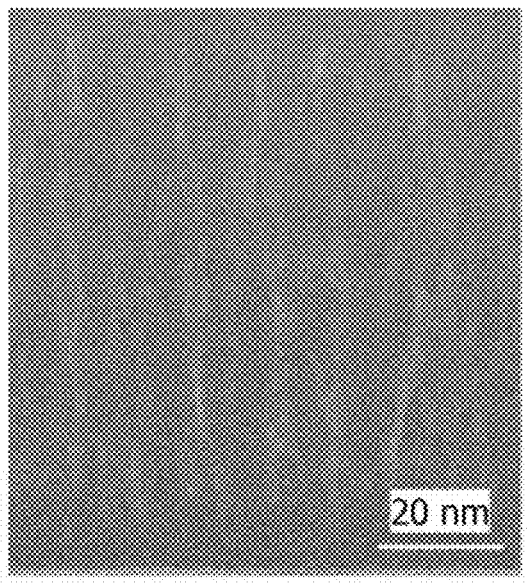
FIGS. 26A and 26B show cross-sectional TEM images of an a-like OS.
Figure 26B:
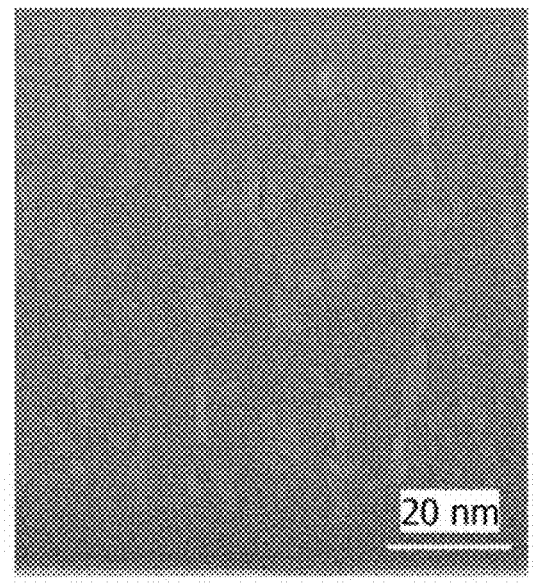

FIGS. 26A and 26B are high-resolution cross-sectional TEM images of an a-like OS. FIG. 26A is the high-resolution cross-sectional TEM image of the a-like OS at the start of the electron irradiation. FIG. 26B is the high-resolution cross-sectional TEM image of a-like OS after the electron (e) irradiation at $4.3 \times 10^8$ e$^-$/nm$^2$. FIGS. 26A and 26B show that stripe-like bright regions extending vertically are observed in the a-like OS from the start of the electron irradiation. It can be also found that the shape of the bright region changes after the electron irradiation. Note that the bright region is presumably a void or a low-density region.

The a-like OS has an unstable structure because it contains a void. To verify that an a-like OS has an unstable structure as compared to a CAAC-OS and an nc-OS, a change in structure caused by electron irradiation is described below.

An a-like OS, an nc-OS, and a CAAC-OS are prepared as samples. Each of the samples is an In—Ga—Zn oxide.

First, a high-resolution cross-sectional TEM image of each sample is obtained. The high-resolution cross-sectional TEM images show that all the samples have crystal parts.

It is known that a unit cell of an InGaZnO$_4$ crystal has a structure in which nine layers including three In—O layers and six Ga—Zn—O layers are stacked in the c-axis direction. The distance between the adjacent layers is equivalent to the lattice spacing on the (009) plane (also referred to as d value). The value is calculated to be 0.29 nm from crystal structural analysis. Accordingly, a portion where the spacing between lattice fringes is greater than or equal to 0.28 nm and less than or equal to 0.30 nm is regarded as a crystal part of InGaZnO$_4$ in the following description. Each of lattice fringes corresponds to the a-b plane of the InGaZnO$_4$ crystal.

Figure 27:
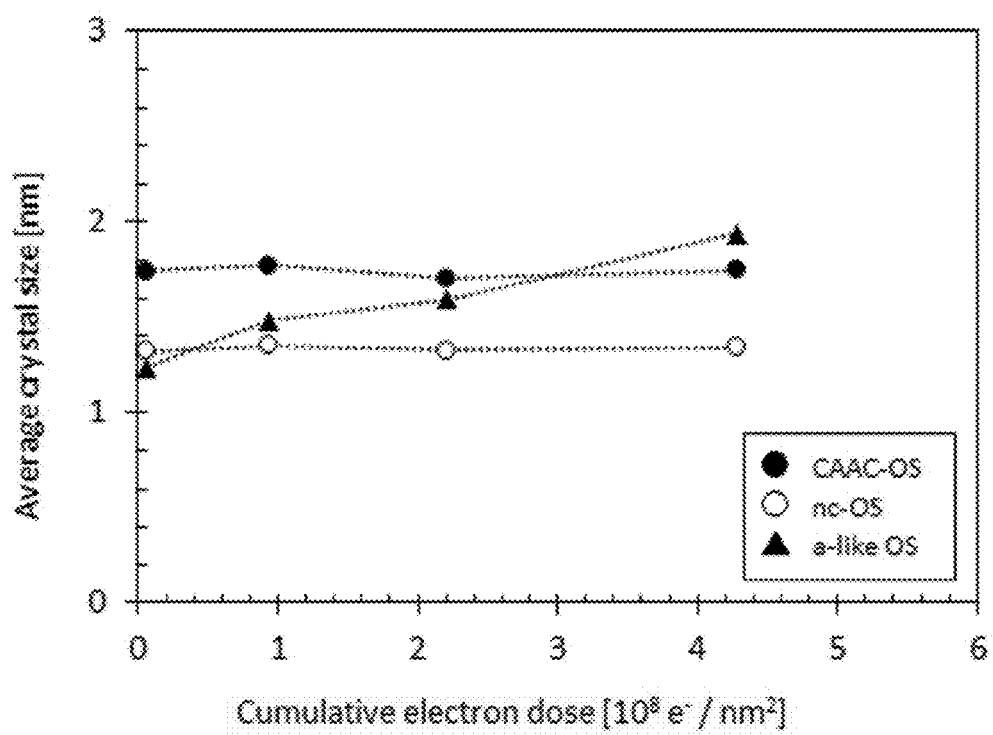
FIG. 27 shows a change in a crystal part of an In—Ga—Zn oxide induced by electron irradiation.

FIG. 27 shows change in the average size of crystal parts (at 22 points to 30 points) in each sample. Note that the crystal part size corresponds to the length of a lattice fringe. FIG. 27 indicates that the crystal part size in the a-like OS increases with an increase in the cumulative electron dose in obtaining TEM images, for example. As shown in FIG. 27, a crystal part of approximately 1.2 nm (also referred to as an initial nucleus) at the start of TEM observation grows to a size of approximately 1.9 nm at a cumulative electron (e) dose of $4.2 \times 10^8$ e$^-$/nm$^2$. In contrast, the crystal part size in the nc-OS and the CAAC-OS shows little change from the start of electron irradiation to a cumulative electron dose of $4.2 \times 10^8$ e/nm$^2$. As shown in FIG. 27, the crystal part sizes in an nc-OS and a CAAC-OS are approximately 1.3 nm and approximately 1.8 nm, respectively, regardless of the cumulative electron dose. For the electron beam irradiation and TEM observation, a Hitachi H-9000NAR transmission electron microscope is used. The conditions of electron beam irradiation are as follows: the accelerating voltage is 300 kV; the current density is $6.7 \times 10^5$ e$^-$/(nm$^2$·s); and the diameter of irradiation region is 230 nm.

In this manner, growth of the crystal part in the a-like OS is sometimes induced by electron irradiation. In contrast, in the nc-OS and the CAAC-OS, growth of the crystal part is hardly induced by electron irradiation. Therefore, the a-like OS has an unstable structure as compared to the nc-OS and the CAAC-OS.

The a-like OS has a lower density than the nc-OS and the CAAC-OS because it contains a void. Specifically, the density of the a-like OS is higher than or equal to 78.6% and lower than 92.3% of the density of the single crystal oxide semiconductor having the same composition. The density of each of the nc-OS and the CAAC-OS is higher than or equal to 92.3% and lower than 100% of the density of the single crystal oxide semiconductor having the same composition. Note that it is difficult to deposit an oxide semiconductor having a density of lower than 78% of the density of the single crystal oxide semiconductor.

For example, in the case of an oxide semiconductor having an atomic ratio of In:Ga:Zn=1:1:1, the density of single crystal InGaZnO$_4$ with a rhombohedral crystal structure is 6.357 g/cm$^3$. Accordingly, in the case of the oxide semiconductor having an atomic ratio of In:Ga:Zn=1:1:1, the density of the a-like OS is higher than or equal to 5.0 g/cm$^3$ and lower than 5.9 g/cm$^3$. For example, in the case of the oxide semiconductor having an atomic ratio of In:Ga:Zn=1:1:1, the density of each of the nc-OS and the CAAC-OS is higher than or equal to 5.9 g/cm$^3$ and lower than 6.3 g/cm$^3$.

Note that in the case where an oxide semiconductor having a certain composition does not exist in a single crystal structure, single crystal oxide semiconductors with different compositions are combined at an adequate ratio, which makes it possible to calculate density equivalent to that of a single crystal oxide semiconductor with the desired composition. The density of a single crystal oxide semiconductor having the desired composition can be calculated using a weighted average according to the combination ratio of the single crystal oxide semiconductors with different compositions. Note that it is preferable to use as few kinds of single crystal oxide semiconductors as possible to calculate the density.

As described above, oxide semiconductors have various structures and various properties. Note that an oxide semiconductor may be a stacked layer film including two or more films of an amorphous oxide semiconductor, an a-like OS, an nc-OS, and a CAAC-OS, for example.

The structure described above in this embodiment can be combined with any of the structures described in the other embodiments and examples as appropriate.

Embodiment 5

In this embodiment, examples of CPUs including semiconductor devices such as the transistor of one embodiment of the present invention and the above-described memory device are described.

<Configuration of CPU>

Figure 28:
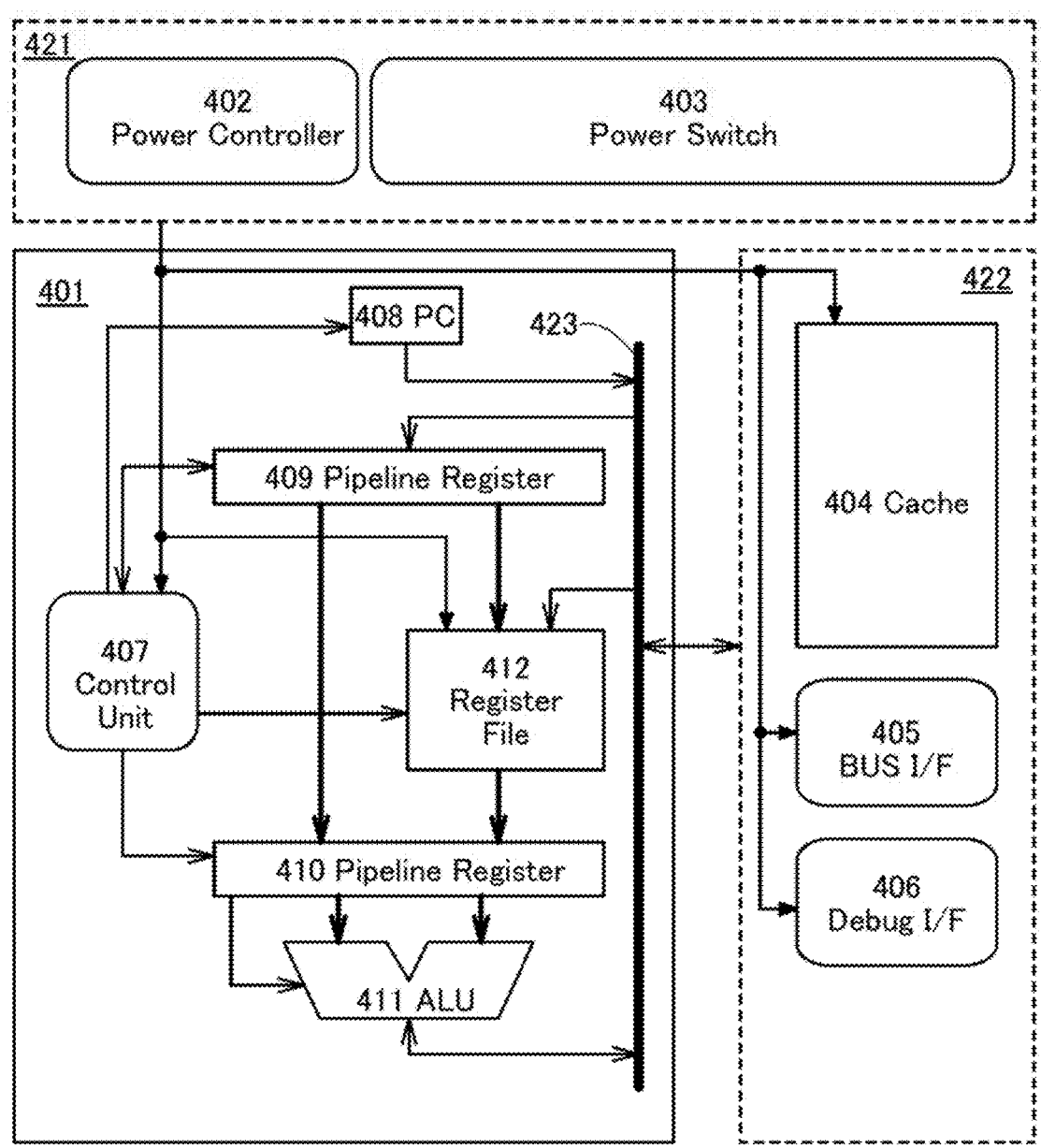
FIG. 28 is a block diagram of a semiconductor device of one embodiment of the present invention.

A semiconductor device 4000 shown in FIG. 28 includes a CPU core 4001, a power management unit 4201, and a peripheral circuit 4202. The power management unit 4201 includes a power controller 4002 and a power switch 4003. The peripheral circuit 4202 includes a cache 4004 including cache memory, a bus interface (BUS I/F) 4005, and a debug interface (Debug I/F) 4006. The CPU core 4001 includes a data bus 4203, a control unit 4007, a PC (program counter) 4008, a pipeline register 4009, a pipeline register 4100, an ALU (arithmetic logic unit) 4101, and a register file 4102. Data is transmitted between the CPU core 4001 and the peripheral circuit 4202 such as the cache 4004 via the data bus 4203.

The semiconductor device (cell) can be used for many logic circuits typified by the power controller 4002 and the control unit 4007, particularly to all logic circuits that can be constituted using standard cells. Accordingly, the semiconductor device 4000 can be small. The semiconductor device 4000 can have reduced power consumption. The semiconductor device 4000 can have a higher operating speed. The semiconductor device 4000 can have a smaller power supply voltage variation.

When p-channel Si transistors and the transistor described in the above embodiment which includes an oxide semiconductor (preferably an oxide containing In, Ga, and Zn) in a channel formation region are used in the semiconductor device (cell) and the semiconductor device (cell) is used in the semiconductor device 4000, the semiconductor device 4000 can be small. The semiconductor device 4000 can have reduced power consumption. The semiconductor device 4000 can have a higher operating speed. Particularly when the Si transistors are only p-channel ones, the manufacturing cost can be reduced.

The control unit 4007 has functions of totally controlling operations of the PC 4008, the pipeline register 4009, the pipeline register 4100, the ALU 4101, the register file 4102, the cache 4004, the bus interface 4005, the debug interface 4006, and the power controller 4002 to decode and execute instructions contained in a program such as input applications.

The ALU 4101 has a function of performing a variety of arithmetic operations such as four arithmetic operations and logic operations.

The cache 4004 has a function of temporarily storing frequently-used data. The PC 4008 is a register having a function of storing an address of an instruction to be executed next. Note that although not shown in FIG. 28, the cache 4004 is provided with a cache controller for controlling the operation of the cache memory.

The pipeline register 4009 has a function of temporarily storing instruction data.

The register file 4102 includes a plurality of registers including a general purpose register and can store data that is read from the main memory, data obtained as a result of arithmetic operations in the ALU 4101, or the like.

The pipeline register 4100 has a function of temporarily storing data used for arithmetic operations of the ALU 4101, data obtained as a result of arithmetic operations of the ALU 4101, or the like.

The bus interface 4005 has a function as a path for data between the semiconductor device 4000 and various devices outside the semiconductor device 4000. The debug interface 4006 has a function as a path of a signal for inputting an instruction to control debugging to the semiconductor device 4000.

The power switch 4003 has a function of controlling supply of a power source voltage to various circuits included in the semiconductor device 4000 other than the power controller 4002. The above various circuits belong to several different power domains. The power switch 4003 controls whether the power supply voltage is supplied to the various circuits in the same power domain. In addition, the power controller 4002 has a function of controlling the operation of the power switch 4003.

The semiconductor device 4000 having the above structure is capable of performing power gating. A description will be given of an example of the power gating operation sequence.

First, by the CPU core 4001, timing for stopping the supply of the power supply voltage is set in a register of the power controller 4002. Then, an instruction of starting power gating is sent from the CPU core 4001 to the power controller 4002. Then, various registers and the cache 4004 included in the semiconductor device 4000 start data storing. Then, the power switch 4003 stops the supply of a power supply voltage to the various circuits other than the power controller 4002 included in the semiconductor device 4000. Then, an interrupt signal is input to the power controller 4002, whereby the supply of the power supply voltage to the various circuits included in the semiconductor device 4000 is started. Note that a counter may be provided in the power controller 4002 to be used to determine the timing of starting the supply of the power supply voltage regardless of input of an interrupt signal. Next, the various registers and the cache 4004 start data recovery. Then, the instruction is resumed in the control unit 4007.

Such power gating can be performed in the whole processor or one or a plurality of logic circuits forming the processor. Furthermore, power supply can be stopped even for a short time. Consequently, power consumption can be reduced finely in terms of a space or time.

In performing power gating, data held by the CPU core 4001 or the peripheral circuit 4202 is preferably restored in a short time. In that case, the power can be turned on or off in a short time, and an effect of saving power becomes significant.

In order that the data held by the CPU core 4001 or the peripheral circuit 4202 be restored in a short time, the data is preferably restored to a flip-flop circuit itself (referred to as a flip-flop circuit capable of backup operation). Furthermore, the data is preferably restored to an SRAM cell itself (referred to as an SRAM cell capable of backup operation). The flip-flop circuit and SRAM cell which are capable of backup operation preferably include transistors including an oxide semiconductor (preferably an oxide containing In, Ga, and Zn) in a channel formation region. Consequently, the transistor has a low off-state current; thus, the flip-flop circuit and SRAM cell which are capable of backup operation can retain data for a long time without power supply. When the transistor has a high switching speed, the flip-flop circuit and SRAM cell which are capable of backup operation can restore and return data in a short time in some cases.

Figure 29:
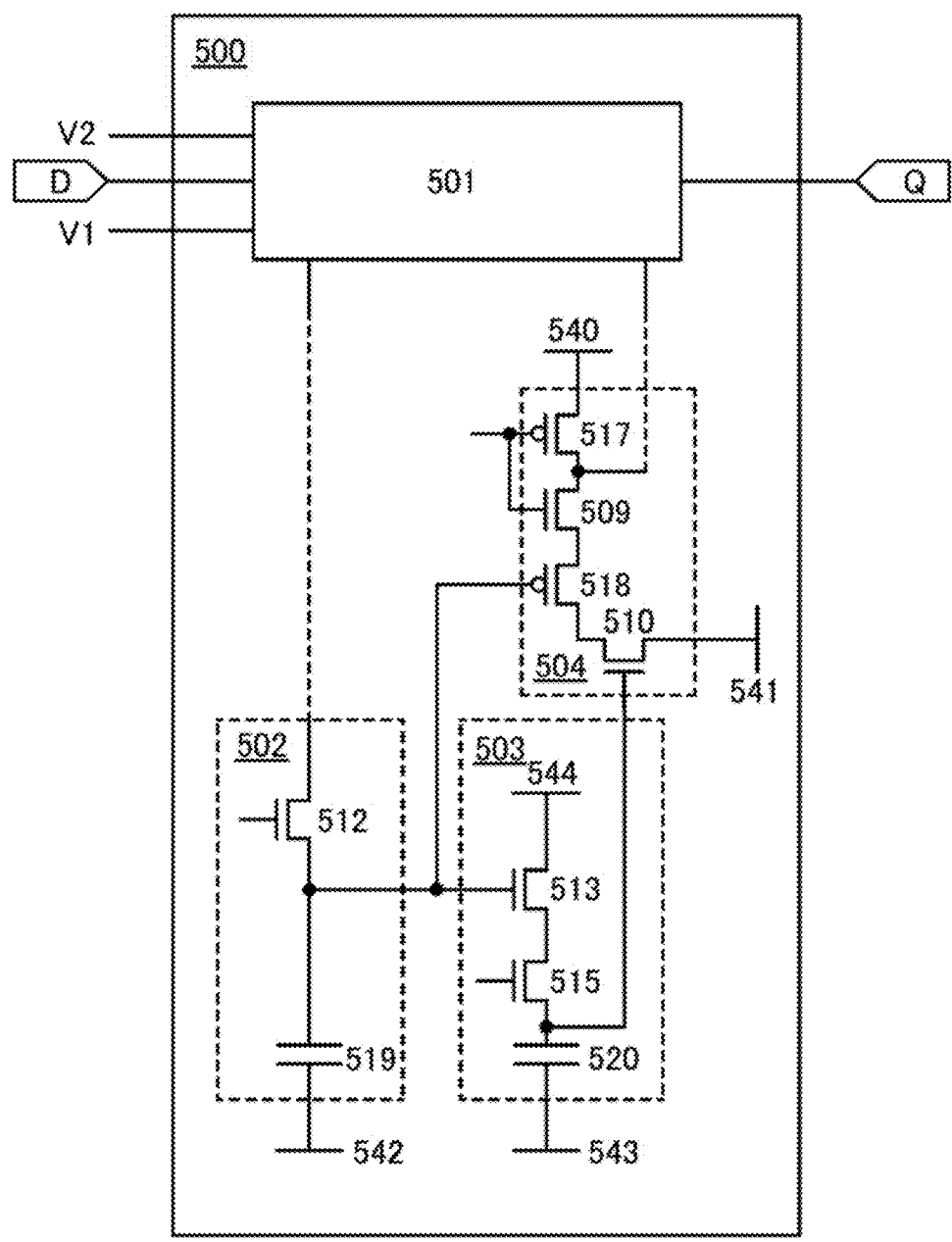
FIG. 29 is a circuit diagram of a semiconductor device of one embodiment of the present invention.

An example of the flip-flop circuit capable of backup operation is described using FIG. 29.

A semiconductor device 5000 shown in FIG. 29 is an example of the flip-flop circuit capable of backup operation. The semiconductor device 5000 includes a first memory circuit 5001, a second memory circuit 5002, a third memory circuit 5003, and a read circuit 5004. As a power supply voltage, a potential difference between a potential V1 and a potential V2 is supplied to the semiconductor device 5000. One of the potential V1 and the potential V2 is at a high level, and the other is at a low level. An example of the structure of the semiconductor device 5000 when the potential V1 is at a low level and the potential V2 is at a high level will be described below.

The first memory circuit 5001 has a function of retaining data when a signal D including the data is input in a period during which the power supply voltage is supplied to the semiconductor device 5000. Furthermore, the first memory circuit 5001 outputs a signal Q including the retained data in the period during which the power supply voltage is supplied to the semiconductor device 5000. On the other hand, the first memory circuit 5001 cannot retain data in a period during which the power supply voltage is not supplied to the semiconductor device 5000. That is, the first memory circuit 5001 can be referred to as a volatile memory circuit.

The second memory circuit 5002 has a function of reading the data held in the first memory circuit 5001 to store (or restore) it. The third memory circuit 5003 has a function of reading the data held in the second memory circuit 5002 to store (or restore) it. The read circuit 5004 has a function of reading the data held in the second memory circuit 5002 or the third memory circuit 5003 to store (or return) it in (to) the first memory circuit 5001.

In particular, the third memory circuit 5003 has a function of reading the data held in the second memory circuit 5002 to store (or restore) it even in the period during which the power supply voltage is not supplied to the semiconductor device 5000.

As shown in FIG. 29, the second memory circuit 5002 includes a transistor 5102 and a capacitor 5109. The third memory circuit 5003 includes a transistor 5103, a transistor 5105, and a capacitor 5200. The read circuit 5004 includes a transistor 5100, a transistor 5108, a transistor 5009, and a transistor 5107.

The transistor 5102 has a function of charging and discharging the capacitor 5109 in accordance with data held in the first memory circuit 5001. The transistor 5102 is desirably capable of charging and discharging the capacitor 5109 at a high speed in accordance with data held in the first memory circuit 5001. Specifically, the transistor 5102 desirably contains crystalline silicon (preferably polycrystalline silicon, further preferably single crystal silicon) in a channel formation region.

The conduction state or the non-conduction state of the transistor 5103 is determined in accordance with the charge held in the capacitor 5109. The transistor 5105 has a function of charging and discharging the capacitor 5200 in accordance with the potential of a wiring 5404 when the transistor 5103 is in a conduction state. It is desirable that the off-state current of the transistor 5105 be extremely low. Specifically, the transistor 5105 desirably contains an oxide semiconductor (preferably an oxide containing In, Ga, and Zn) in a channel formation region.

Specific connection relations between the elements are described. One of a source electrode and a drain electrode of the transistor 5102 is connected to the first memory circuit 5001. The other of the source electrode and the drain electrode of the transistor 5102 is connected to one electrode of the capacitor 5109, a gate electrode of the transistor 5103, and a gate electrode of the transistor 5108. The other electrode of the capacitor 5109 is connected to the wiring 5402. One of a source electrode and a drain electrode of the transistor 5103 is connected to the wiring 5404. The other of the source electrode and the drain electrode of the transistor 5103 is connected to one of a source electrode and a drain electrode of the transistor 5105. The other of the source electrode and the drain electrode of the transistor 5105 is connected to one electrode of the capacitor 5200 and a gate electrode of the transistor 5100. The other electrode of the capacitor 5200 is connected to the wiring 5403. One of a source electrode and a drain electrode of the transistor 5100 is connected to a wiring 5401. The other of the source electrode and the drain electrode of the transistor 5100 is connected to one of a source electrode and a drain electrode of the transistor 5108. The other of the source electrode and the drain electrode of the transistor 5108 is connected to one of a source electrode and a drain electrode of the transistor 5009. The other of the source electrode and the drain electrode of the transistor 5009 is connected to one of a source electrode and a drain electrode of the transistor 5107 and the first memory circuit 5001. The other of the source electrode and the drain electrode of the transistor 5107 is connected to a wiring 5400. Furthermore, although a gate electrode of the transistor 5009 is connected to a gate electrode of the transistor 5107 in FIG. 29, the gate electrode of the transistor 5009 is not necessarily connected to the gate electrode of the transistor 5107.

The transistor described in the above embodiment as an example can be applied to the transistor 5105. Because of the low off-state current of the transistor 5105, the semiconductor device 5000 can retain data for a long time without power supply. The favorable switching characteristics of the transistor 5105 allow the semiconductor device 5000 to perform high-speed backup and recovery.

The structure described in this embodiment can be combined with any of the structures described in the other embodiments and examples as appropriate.

Embodiment 6

In this embodiment, an example of an imaging device including the transistor or the like of one embodiment of the present invention is described.

<Imaging Device>

An imaging device of one embodiment of the present invention is described below.

Figure 30A:
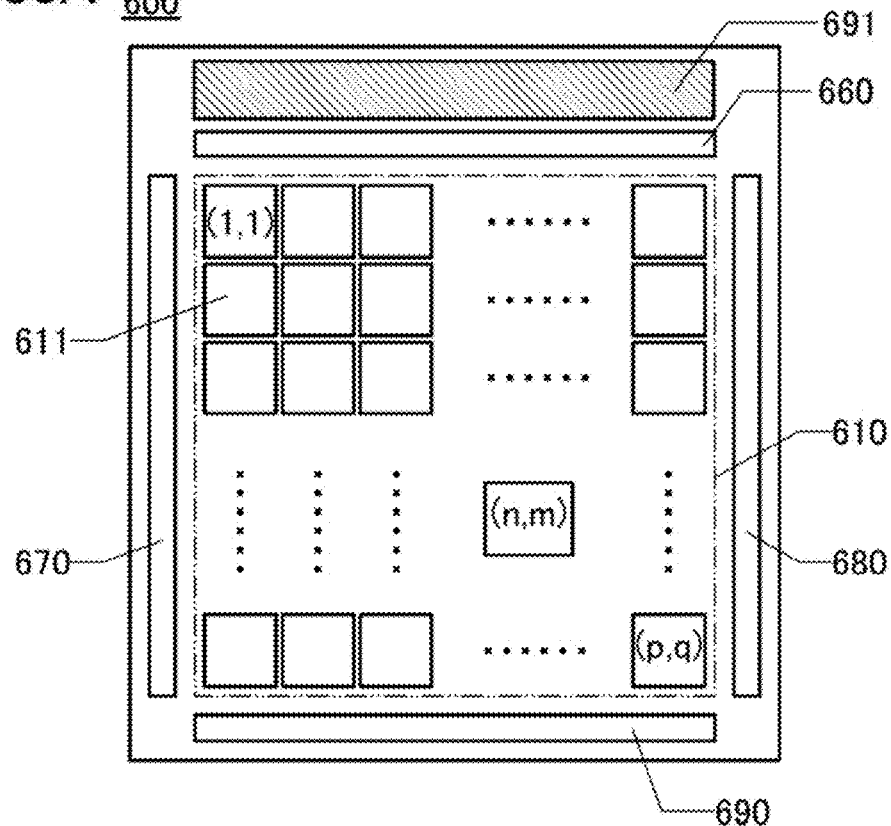
FIGS. 30A and 30B are plan views of imaging devices of one embodiment of the present invention.

FIG. 30A is a plan view illustrating an example of an imaging device 600 of one embodiment of the present invention. The imaging device 600 includes a pixel portion 610 and peripheral circuits for driving the pixel portion 610 (a peripheral circuit 660, a peripheral circuit 670, a peripheral circuit 680, and a peripheral circuit 690). The pixel portion 610 includes a plurality of pixels 611 arranged in a matrix with p rows and q columns (p and q are each an integer of 2 or more). The peripheral circuit 660, the peripheral circuit 670, the peripheral circuit 680, and the peripheral circuit 690 are each connected to the plurality of pixels 611, and a signal for driving the plurality of pixels 611 is supplied. In this specification and the like, in some cases, a "peripheral circuit" or a "driver circuit" indicate all of the peripheral circuits 660, 670, 680, and 690. For example, the peripheral circuit 660 can be regarded as part of the peripheral circuit.

The imaging device 600 preferably includes a light source 691. The light source 691 can emit detection light P1.

The peripheral circuit includes at least one of a logic circuit, a switch, a buffer, an amplifier circuit, and a converter circuit. The peripheral circuit may be formed over a substrate where the pixel portion 610 is formed. A semiconductor device such as an IC chip may be used as part or the whole of the peripheral circuit. Note that as the peripheral circuit, one or more of the peripheral circuits 660, 670, 680, and 690 may be omitted.

Figure 30B:
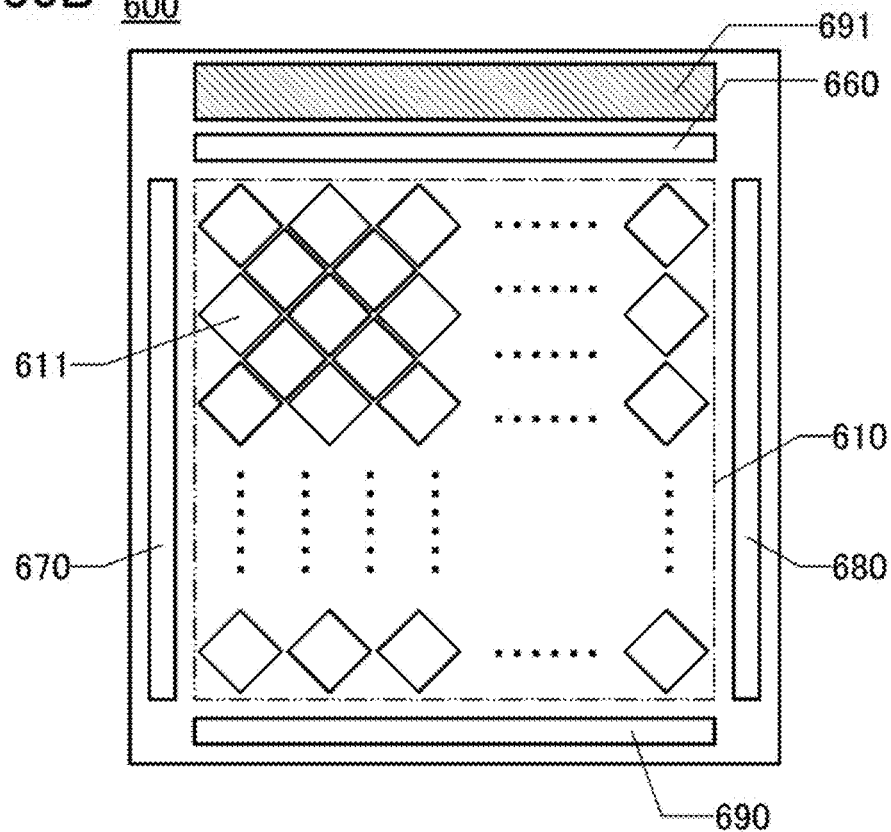

As illustrated in FIG. 30B, the pixels 611 may be provided to be inclined in the pixel portion 610 included in the imaging device 600. When the pixels 611 are obliquely arranged, the distance between pixels (pitch) can be shortened in the row direction and the column direction. Accordingly, the quality of an image taken with the imaging device 600 can be improved.

Configuration Example 1 of Pixel

The pixel 611 included in the imaging device 600 is formed with a plurality of subpixels 612, and each subpixel 612 is combined with a filter (color filter) which transmits light in a specific wavelength band, whereby data for achieving color image display can be obtained.

Figure 31A:
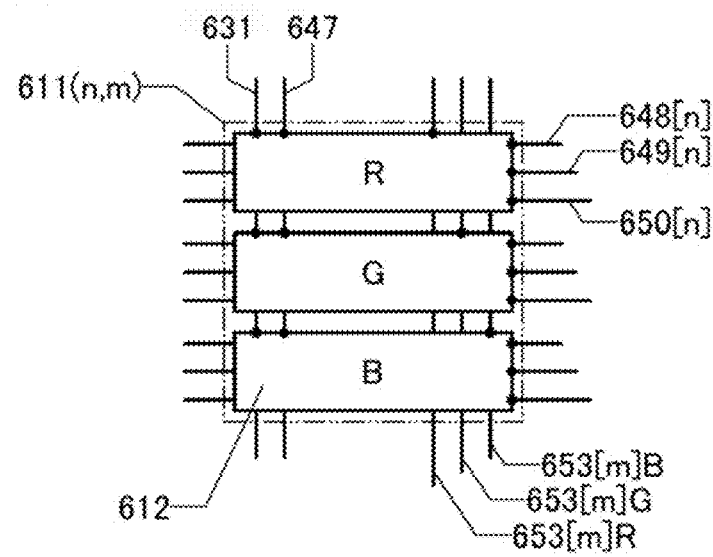
FIGS. 31A and 31B are plan views of pixels of an imaging device of one embodiment of the present invention.

FIG. 31A is a top view showing an example of the pixel 611 with which a color image is obtained. The pixel 611 illustrated in FIG. 31A includes a subpixel 612 provided with a color filter that transmits light in a red (R) wavelength band (also referred to as a subpixel 612R), a subpixel 612 provided with a color filter that transmits light in a green (G) wavelength band (also referred to as a subpixel 612G), and a subpixel 612 provided with a color filter that transmits light in a blue (B) wavelength band (also referred to as a subpixel 612B). The subpixel 612 can function as a photosensor.

The subpixel 612 (the subpixel 612R, the subpixel 612G, and the subpixel 612B) is electrically connected to a wiring 631, a wiring 647, a wiring 648, a wiring 649, and a wiring 650. In addition, the subpixel 612R, the subpixel 612G, and the subpixel 612B are connected to respective wirings 653 which are independently provided. In this specification and the like, for example, the wiring 648, the wiring 649, and the wiring 650 that are connected to the pixel 611 in the n-th row are referred to as a wiring 648[n], a wiring 649[n], and a wiring 650[n]. For example, the wiring 653 connected to the pixel 611 in the m-th column is referred to as a wiring 653[m]. Note that in FIG. 31A, the wirings 653 connected to the subpixel 612R, the subpixel 612G, and the subpixel 612B in the pixel 611 in the m-th column are referred to as a wiring 653[m]R, a wiring 653[m]G, and a wiring 653[m]B. The subpixels 612 are electrically connected to the peripheral circuit through the above wirings.

Figure 31B:
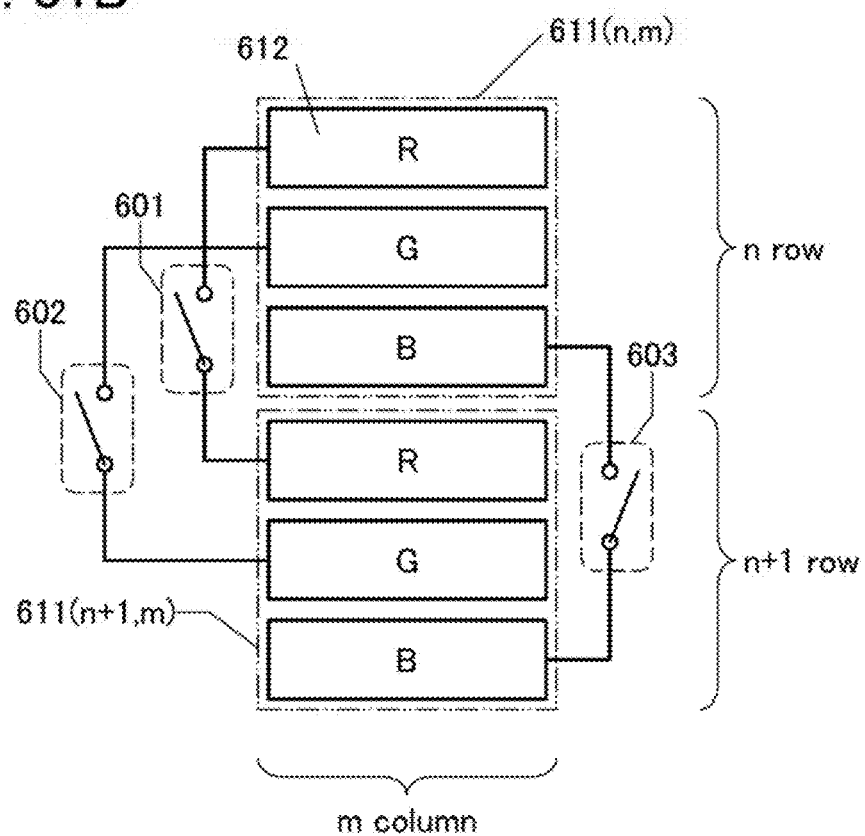

The imaging device 600 has a structure in which the subpixel 612 is electrically connected to the subpixel 612 in an adjacent pixel 611 which is provided with a color filter transmitting light in the same wavelength band as the subpixel 612, via a switch. FIG. 31B shows a connection example of the subpixels 612: the subpixel 612 in the pixel 611 arranged in the n-th (n is an integer greater than or equal to 1 and less than or equal to p) row and the m-th (m is an integer greater than or equal to 1 and less than or equal to q) column and the subpixel 612 in the adjacent pixel 611 arranged in an (n+1)-th row and the m-th column. In FIG. 31B, the subpixel 612R arranged in the n-th row and the m-th column and the subpixel 612R arranged in the (n+1)-th row and the m-th column are connected to each other via a switch 601. The subpixel 612G arranged in the n-th row and the m-th column and the subpixel 612G arranged in the (n+1)-th row and the m-th column are connected to each other via a switch 602. The subpixel 612B arranged in the n-th row and the m-th column and the subpixel 612B arranged in the (n+1)-th row and the m-th column are connected to each other via a switch 603.

The color filter used in the subpixel 612 is not limited to red (R), green (G), and blue (B) color filters, and color filters that transmit light of cyan (C), yellow (Y), and magenta (M) may be used. By provision of the subpixels 612 that sense light in three different wavelength bands in one pixel 611, a full-color image can be obtained.

The pixel 611 including the subpixel 612 provided with a color filter transmitting yellow (Y) light may be provided, in addition to the subpixels 612 provided with the color filters transmitting red (R), green (G), and blue (B) light. The pixel 611 including the subpixel 612 provided with a color filter transmitting blue (B) light may be provided, in addition to the subpixels 612 provided with the color filters transmitting cyan (C), yellow (Y), and magenta (M) light. When the subpixels 612 sensing light in four different wavelength bands are provided in one pixel 611, the reproducibility of colors of an obtained image can be increased.

For example, in FIG. 31A, in regard to the subpixel 612 sensing light in a red wavelength band, the subpixel 612 sensing light in a green wavelength band, and the subpixel 612 sensing light in a blue wavelength band, the pixel number ratio (or the light receiving area ratio) thereof is not necessarily 1:1:1. For example, the Bayer arrangement in which the pixel number ratio (the light receiving area ratio) is set at red:green:blue=1:2:1 may be employed. Alternatively, the pixel number ratio (the light receiving area ratio) of red and green to blue may be 1:6:1.

Although the number of subpixels 612 provided in the pixel 611 may be one, two or more subpixels are preferably provided. For example, when two or more subpixels 612 sensing light in the same wavelength band are provided, the redundancy is increased, and the reliability of the imaging device 600 can be increased.

When an infrared (IR) filter that transmits infrared light and absorbs or reflects visible light is used as the filter, the imaging device 600 that senses infrared light can be achieved.

Furthermore, when a neutral density (ND) filter (dark filter) is used, output saturation which occurs when a large amount of light enters a photoelectric conversion element (light-receiving element) can be prevented. With a combination of ND filters with different dimming capabilities, the dynamic range of the imaging device can be increased.

Besides the above-described filter, the pixel 611 may be provided with a lens. An arrangement example of the pixel 611, a filter 654, and a lens 655 is described with cross-sectional views in FIGS. 32A and 32B. With the lens 655, the photoelectric conversion element provided in the subpixel 612 scan receive incident light efficiently. Specifically, as illustrated in FIG. 32A, light 656 enters a photoelectric conversion element 620 through the lens 655, the filter 654 (a filter 654R, a filter 654G, and a filter 654B), a pixel circuit 630, and the like which are provided in the pixel 611.

As indicated by a region surrounded with dashed dotted lines, however, part of the light 656 indicated by arrows might be blocked by some wirings 657. Thus, a preferable structure is such that the lens 655 and the filter 654 are provided on the photoelectric conversion element 620 side as illustrated in FIG. 32B, whereby the photoelectric conversion element 620 can efficiently receive the light 656. When the light 656 enters the photoelectric conversion element 620 from the photoelectric conversion element 620 side, the imaging device 600 with high sensitivity can be provided.

Figure 32A:
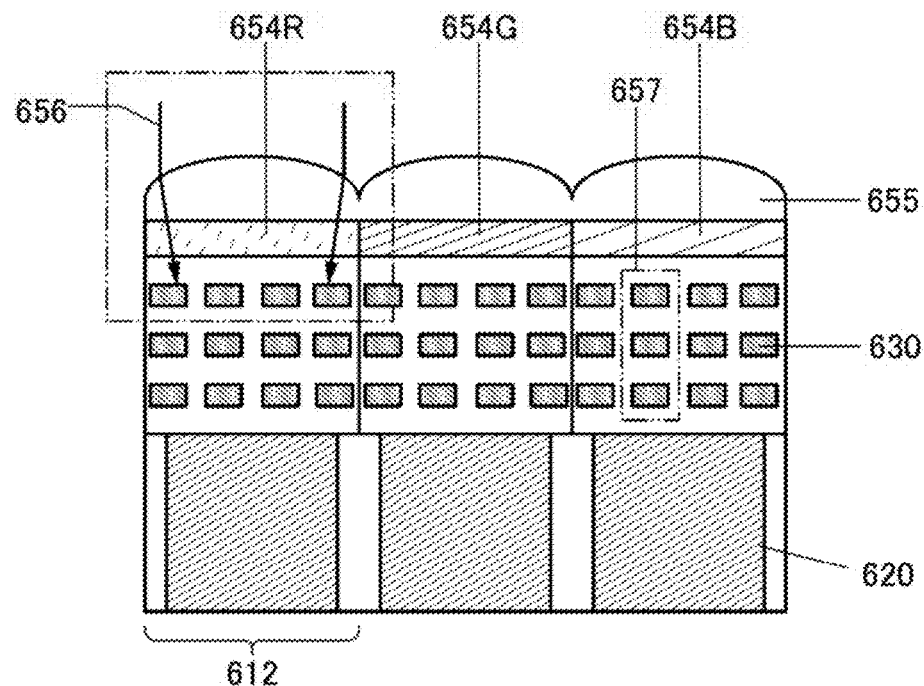
FIGS. 32A and 32B are cross-sectional views of imaging devices of one embodiment of the present invention.
Figure 32B:
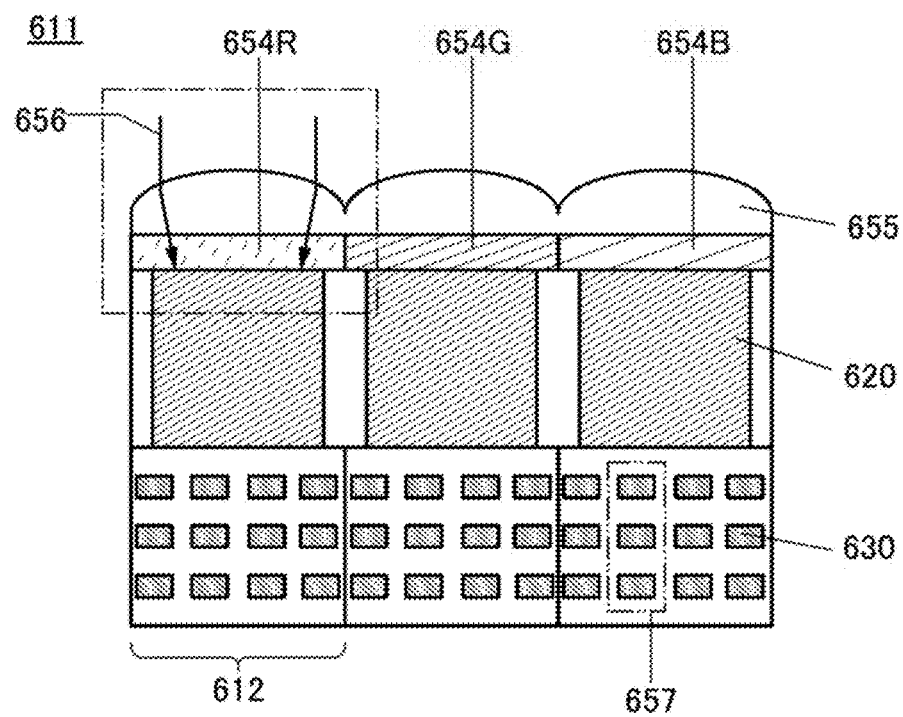

As the photoelectric conversion element 620 illustrated in FIGS. 32A and 32B, a photoelectric conversion element in which a p-n junction or a p-i-n junction is formed may be used.

The photoelectric conversion element 620 may be formed using a substance that has a function of absorbing a radiation and generating electric charges. Examples of the substance that has a function of absorbing a radiation and generating electric charges include selenium, lead iodide, mercury iodide, gallium arsenide, cadmium telluride, and cadmium zinc alloy.

For example, when selenium is used for the photoelectric conversion element 620, the photoelectric conversion element 620 can have a light absorption coefficient in a wide wavelength band, such as visible light, ultraviolet light, infrared light, X-rays, and gamma rays.

One pixel 611 included in the imaging device 600 may include the subpixel 612 with a first filter in addition to the subpixel 612 illustrated in FIGS. 31A and 31B.

Configuration Example 2 of Pixel

An example of a pixel including a transistor including silicon and a transistor including an oxide semiconductor is described below. A transistor similar to any of the transistors described in the above embodiment can be used as each of the transistors.

Figure 33:
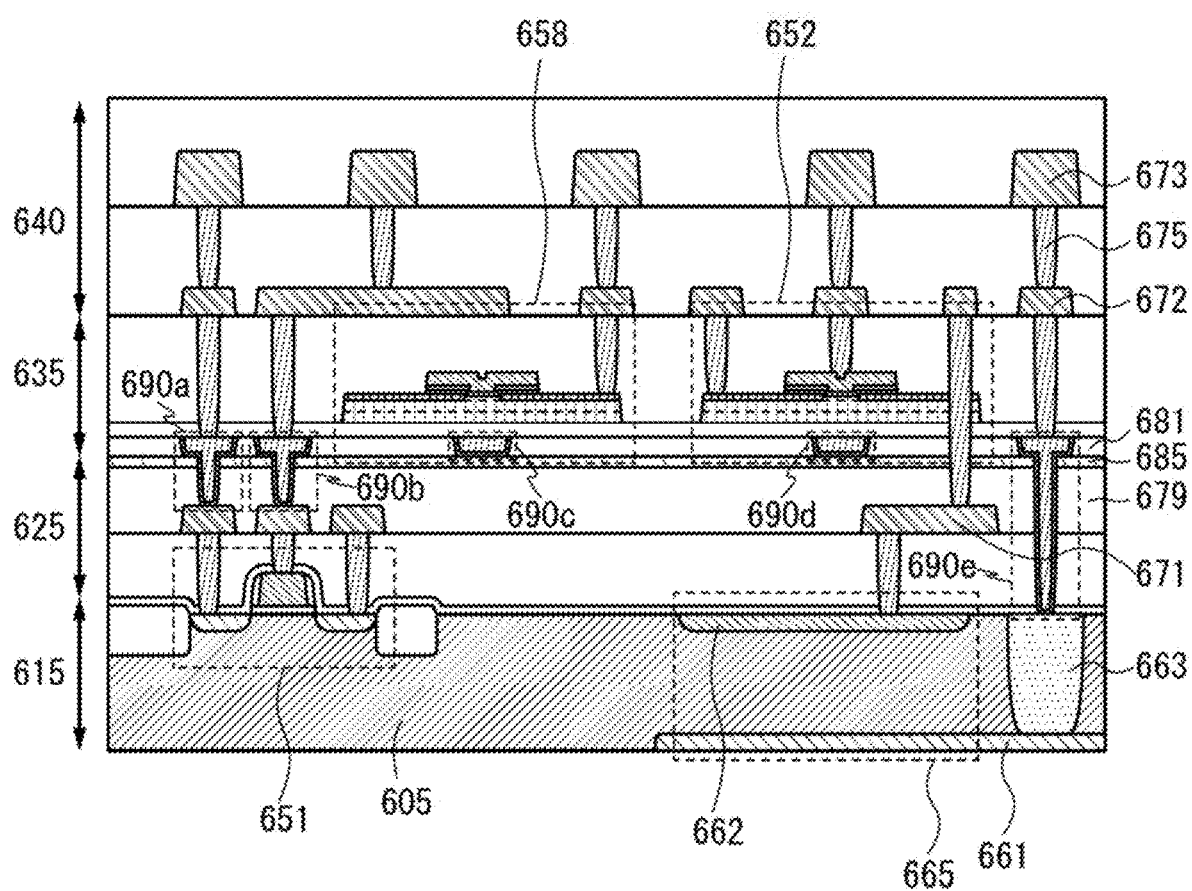
FIG. 33 is a cross-sectional view of an imaging device of one embodiment of the present invention.

FIG. 33 is a cross-sectional view of an element included in an imaging device. The imaging device illustrated in FIG. 33 includes a transistor 651 including silicon over a silicon substrate 605, transistors 652 and 658 which include an oxide semiconductor and are stacked over the transistor 651, and a photodiode 665 provided in the silicon substrate 605. The transistors and the photodiode 665 are electrically connected to various plugs 675 and wirings 671. In addition, an anode 661 of the photodiode 665 is electrically connected to the plug 675 through a low-resistance region 663.

The imaging device includes a layer 615 including the transistor 651 provided on the silicon substrate 605 and the photodiode 665 provided in the silicon substrate 605, a layer 625 which is in contact with the layer 615 and includes the wirings 671, a layer 635 which is in contact with the layer 625 and includes the transistors 652 and 658, and a layer 640 which is in contact with the layer 635 and includes a wiring 672 and a wiring 673.

In the example of the cross-sectional view in FIG. 33, a light-receiving surface of the photodiode 665 is provided on the side opposite to a surface of the silicon substrate 605 where the transistor 651 is formed. With this structure, a light path can be secured without an influence of the transistors and the wirings. Thus, a pixel with a high aperture ratio can be formed. Note that the light-receiving surface of the photodiode 665 can be the same as the surface where the transistor 651 is formed.

In the case where a pixel is formed with use of only transistors including an oxide semiconductor, the layer 615 may include the transistor including an oxide semiconductor. Alternatively, the layer 615 may be omitted, and the pixel may include only transistors including an oxide semiconductor.

Note that the silicon substrate 605 may be an SOI substrate. Furthermore, the silicon substrate 605 can be replaced with a substrate made of germanium, silicon germanium, silicon carbide, gallium arsenide, aluminum gallium arsenide, indium phosphide, gallium nitride, or an organic semiconductor.

Here, an insulator 685 is provided between the layer 615 including the transistor 651 and the photodiode 665 and the layer 635 including the transistors 652 and 658. However, there is no limitation on the position of the insulator 685. An insulator 679 is provided under the insulator 685, and an insulator 681 is provided over the insulator 685.

Conductors 691a to 691e are provided in openings formed in the insulators 679 and 685. The conductors 691a, 691b, and 691e function as plugs and wirings. The conductor 691c functions as a back gate of the transistor 658. The conductor 691d functions as a back gate of the transistor 652.

Hydrogen in an insulator provided in the vicinity of a channel formation region of the transistor 651 terminates dangling bonds of silicon; accordingly, the reliability of the transistor 651 can be improved. In contrast, hydrogen in the insulator provided in the vicinity of the transistor 652, the transistor 658, and the like becomes one of factors generating a carrier in the oxide semiconductor. Thus, the hydrogen may cause a reduction of the reliability of the transistor 652, the transistor 658, and the like. For this reason, in the case where the transistor including an oxide semiconductor is provided over the transistor including a silicon-based semiconductor, it is preferable that the insulator 685 having a function of blocking hydrogen be provided between the transistors. When the hydrogen is confined in layers below the insulator 685, the reliability of the transistor 651 can be improved. In addition, the hydrogen can be prevented from diffusing from the layers below the insulator 685 to layers above the insulator 685; thus, the reliability of the transistor 652, the transistor 658, and the like can be increased. The conductors 691a, 691b, and 691e can prevent hydrogen from diffusing to the layers provided thereover through the via holes formed in the insulator 685, resulting in improvement in the reliability of the transistors 652 and 658 and the like.

In the cross-sectional view in FIG. 33, the photodiode 665 in the layer 615 and the transistor in the layer 635 can be formed so as to overlap with each other. Thus, the degree of integration of pixels can be increased. In other words, the resolution of the imaging device can be increased.

Part or the whole of the imaging device may be bent. The bent imaging device enables the curvature of field and astigmatism to be reduced. Thus, the optical design of lens and the like, which is used in combination of the imaging device, can be facilitated. For example, the number of lenses used for aberration correction can be reduced; accordingly, a reduction in size or weight of electronic devices using the imaging device, and the like, can be achieved. In addition, the quality of a captured image can be improved.

The structure described in this embodiment can be used as appropriate in combination with any of the structures described in the other embodiments and examples.

Embodiment 7

In this embodiment, display devices each including the transistor or the like of one embodiment of the present invention will be described with reference to FIGS. 34A to 34C and FIGS. 35A and 35B.

<Structure of Display Device>

Examples of a display element provided in the display device include a liquid crystal element (also referred to as a liquid crystal display element) and a light-emitting element (also referred to as a light-emitting display element). The light-emitting element includes, in its category, an element whose luminance is controlled by a current or voltage, and specifically includes, in its category, an inorganic electroluminescent (EL) element, an organic EL element, and the like. A display device including an EL element (EL display device) and a display device including a liquid crystal element (liquid crystal display device) are described below as examples of the display device.

Note that the display device described below includes in its category a panel in which a display element is sealed and a module in which an IC such as a controller is mounted on the panel.

The display device described below refers to an image display device or a light source (including a lighting device). The display device includes any of the following modules: a module provided with a connector such as an FPC or a TCP; a module in which a printed wiring board is provided at the end of TCP; and a module in which an IC is mounted directly on a display element by a COG method.

Figure 34A:
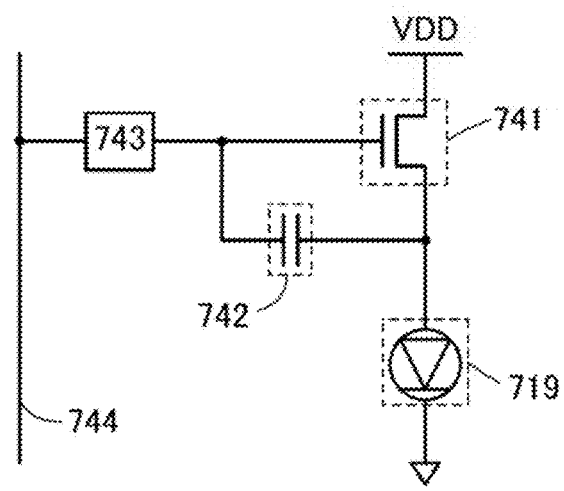
FIGS. 34A to 34C are a circuit diagram, a top view, and a cross-sectional view of a semiconductor device of one embodiment of the present invention.
Figure 34B:
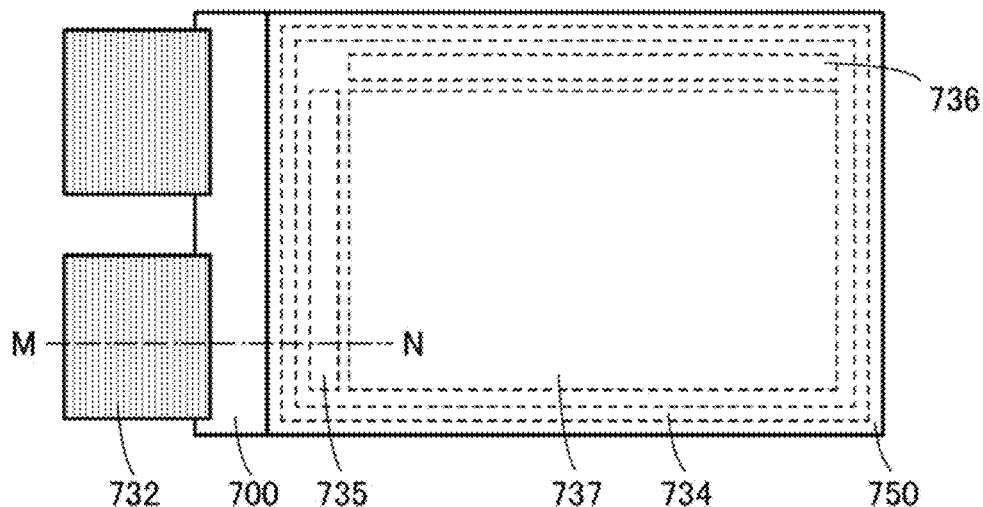
Figure 34C:
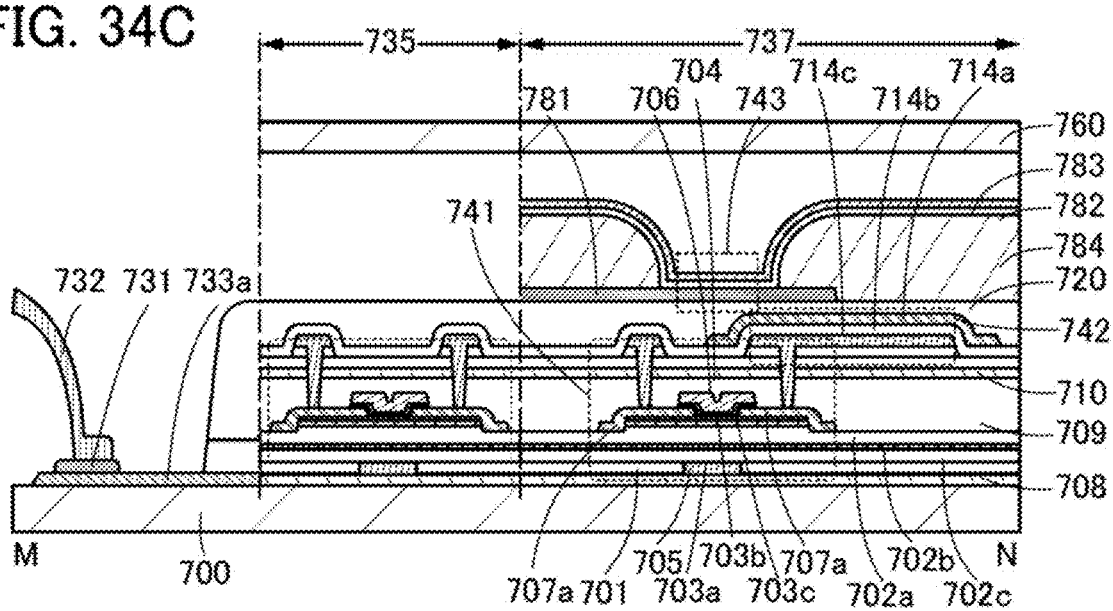

FIGS. 34A to 34C illustrate an example of an EL display device of one embodiment of the present invention. FIG. 34A is a circuit diagram of a pixel in an EL display device. FIG. 34B is a top view showing the whole of the EL display device. FIG. 34C is a cross-sectional view taken along part of dashed-dotted line M-N in FIG. 34B.

FIG. 34A illustrates an example of a circuit diagram of a pixel used in an EL display device.

Note that in this specification and the like, it might be possible for those skilled in the art to constitute one embodiment of the invention even when portions to which all the terminals of an active element (e.g., a transistor or a diode), a passive element (e.g., a capacitor or a resistor), or the like are connected are not specified. In other words, one embodiment of the invention can be clear even when connection portions are not specified. Furthermore, in the case where a connection portion is disclosed in this specification and the like, it can be determined that one embodiment of the invention in which a connection portion is not specified is disclosed in this specification and the like, in some cases. Particularly in the case where the number of portions to which a terminal is connected might be more than one, it is not necessary to specify the portions to which the terminal is connected. Therefore, it might be possible to constitute one embodiment of the invention by specifying only portions to which some of terminals of an active element (e.g., a transistor or a diode), a passive element (e.g., a capacitor or a resistor), or the like are connected.

Note that in this specification and the like, it might be possible for those skilled in the art to specify the invention when at least the connection portion of a circuit is specified. Alternatively, it might be possible for those skilled in the art to specify the invention when at least a function of a circuit is specified. In other words, when a function of a circuit is specified, one embodiment of the present invention can be clear. Furthermore, it can be determined that one embodiment of the present invention whose function is specified is disclosed in this specification and the like. Therefore, when a connection portion of a circuit is specified, the circuit is disclosed as one embodiment of the invention even when a function is not specified, and one embodiment of the invention can be constituted. Alternatively, when a function of a circuit is specified, the circuit is disclosed as one embodiment of the invention even when a connection portion is not specified, and one embodiment of the invention can be constituted.

The EL display device illustrated in FIG. 34A includes a switching element 743, a transistor 741, a capacitor 742, and a light-emitting element 719.

Note that FIG. 34A and the like each illustrate an example of a circuit structure; therefore, a transistor can be provided additionally. In contrast, for each node in FIG. 34A and the like, it is possible not to provide an additional transistor, switch, passive element, or the like.

A gate of the transistor 741 is electrically connected to one terminal of the switching element 743 and one electrode of the capacitor 742. A source of the transistor 741 is electrically connected to the other electrode of the capacitor 742 and one electrode of the light-emitting element 719. A power supply potential VDD is supplied to a drain of the transistor 741. The other terminal of the switching element 743 is electrically connected to a signal line 744. A constant potential is supplied to the other electrode of the light-emitting element 719. The constant potential is a ground potential GND or a potential lower than the ground potential GND.

It is preferable to use a transistor as the switching element 743. When the transistor is used as the switching element, the area of a pixel can be reduced, so that the EL display device can have high resolution. As the switching element 743, a transistor formed through the same step as the transistor 741 can be used, so that EL display devices can be manufactured with high productivity. Note that as the transistor 741 and/or the switching element 743, the above-described transistor can be used, for example.

FIG. 34B is a top view of the EL display device. The EL display device includes a substrate 700, a substrate 760, a sealant 734, a driver circuit 735, a driver circuit 736, a pixel 737, and an FPC 732. The sealant 734 is provided between the substrate 700 and the substrate 760 so as to surround the pixel 737, the driver circuit 735, and the driver circuit 736. Note that the driver circuit 735 and/or the driver circuit 736 may be provided outside the sealant 734.

FIG. 34C is a cross-sectional view of the EL display device taken along part of dashed-dotted line M-N in FIG. 34B.

The transistor 741 in FIG. 34C includes a conductor 705 over the substrate 700, an insulator 701 in which the conductor 705 is embedded, an insulator 702 over the insulator 701, a semiconductor 703 over the insulator 702, a conductor 707a and a conductor 707b over the semiconductor 703, an insulator 706 over the semiconductor 703, and a conductor 704 over the insulator 706. Note that the structure of the transistor 741 is just an example; the transistor 741 may have a structure different from that in FIG. 34C.

Thus, in the transistor 741 illustrated in FIG. 34C, the conductors 704 and 705 each function as a gate electrode, the insulators 702 and 706 each function as a gate insulator, and the conductors 707a and 707b function as a source electrode or a drain electrode. Note that in some cases, electrical characteristics of the semiconductor 703 change if light enters the semiconductor 703. To prevent this, it is preferable that one or more of the conductor 705 and the conductor 704 have a light-blocking property.

Note that an insulator 709 including an excess-oxygen region is provided over the transistor 741. The transistor 741 is provided between an insulator 708 and an insulator 710 having a barrier property.

FIG. 34C illustrates a structure including, as the capacitor 742, a conductor 714c over an insulator 710, an insulator 714b over the conductor 714c, and a conductor 714a over the insulator 714b.

In the capacitor 742, the conductor 714a serves as one electrode, and the conductor 714c serves as the other electrode.

The capacitor 742 illustrated in FIG. 34C has a large capacitance per area occupied by the capacitor. Therefore, the EL display device illustrated in FIG. 34C has high display quality.

An insulator 720 is provided over the transistor 741 and the capacitor 742. Here, the insulator 716 and the insulator 720 may have an opening portion reaching the region 705a that serves as the source of the transistor 741. A conductor 781 is provided over the insulator 720. The conductor 781 is electrically connected to the transistor 741 through the opening portion in the insulator 720.

A partition wall 784 having an opening portion reaching the conductor 781 is provided over the conductor 781. A light-emitting layer 782 in contact with the conductor 781 through the opening portion formed in the partition wall 784 is provided over the partition wall 784. A conductor 783 is provided over the light-emitting layer 782. A region where the conductor 781, the light-emitting layer 782, and the conductor 783 overlap with one another serves as the light-emitting element 719.

So far, examples of the EL display device are described. Next, an example of a liquid crystal display device is described.

Figure 35A:
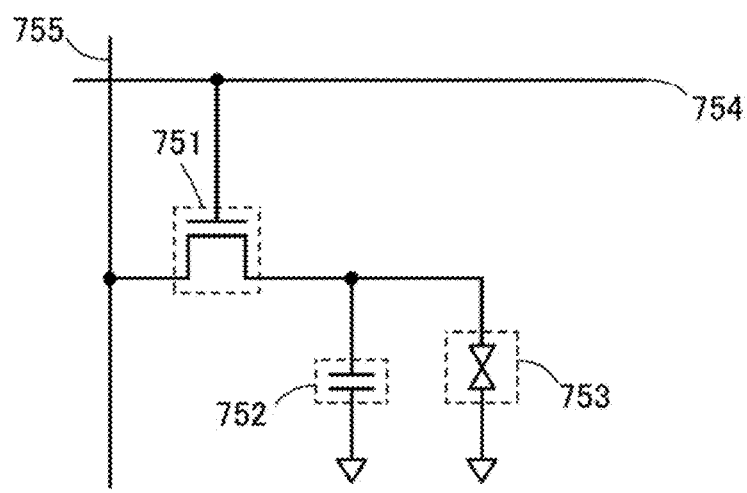
FIGS. 35A and 35B are a circuit diagram and a cross-sectional view of a semiconductor device of one embodiment of the present invention.

FIG. 35A is a circuit diagram showing a structural example of a pixel of the liquid crystal display device. A pixel illustrated in FIGS. 35A and 35B includes a transistor 751, a capacitor 762, and an element (liquid crystal element) 763 in which a space between a pair of electrodes is filled with a liquid crystal.

One of a source and a drain of the transistor 751 is electrically connected to a signal line 765, and a gate of the transistor 751 is electrically connected to a scan line 764.

One electrode of the capacitor 762 is electrically connected to the other of the source and the drain of the transistor 751, and the other electrode of the capacitor 762 is electrically connected to a wiring for supplying a common potential.

One electrode of the liquid crystal element 763 is electrically connected to the other of the source and the drain of the transistor 751, and the other electrode of the liquid crystal element 763 is electrically connected to a wiring for supplying a common potential. The common potential supplied to the wiring electrically connected to the other electrode of the capacitor 762 may be different from that supplied to the other electrode of the liquid crystal element 763.

Figure 35B:
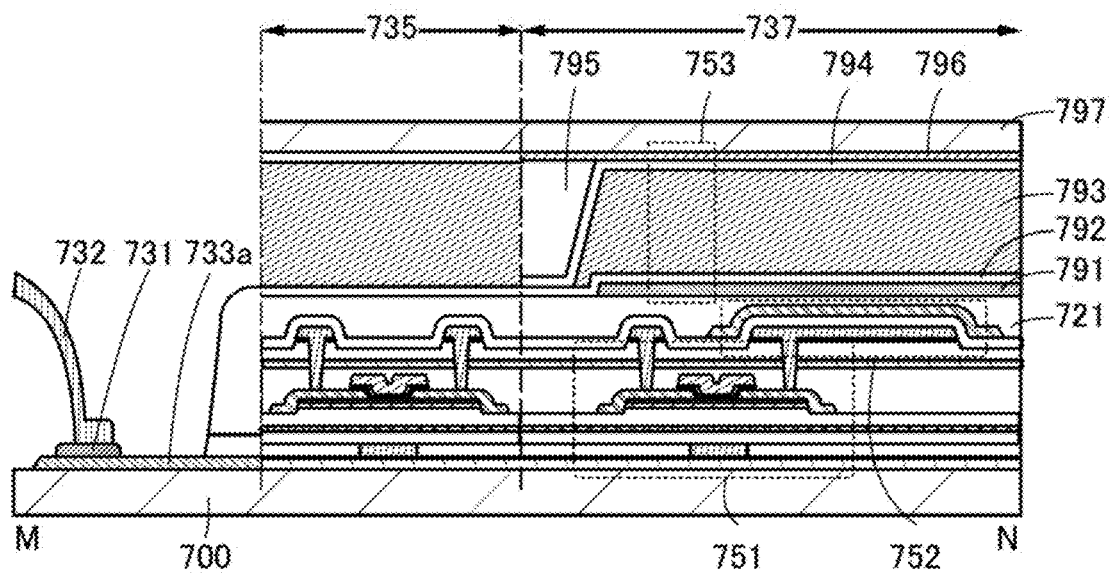

Note that the description of the liquid crystal display device is made on the assumption that the top view of the liquid crystal display device is similar to that of the EL display device. FIG. 35B is a cross-sectional view of the liquid crystal display device taken along part of dashed-dotted line M-N in FIG. 34B. In FIG. 35B, the FPC 732 is connected to the wiring 733a via the terminal 731. Note that the wiring 733a may be formed using the same kind of conductor as the conductor of the transistor 751 or using the same kind of semiconductor as the semiconductor of the transistor 751.

For the transistor 751, the description of the transistor 741 is referred to. For the capacitor 762, the description of the capacitor 742 is referred to. Note that the structure of the capacitor 762 in FIG. 35B corresponds to, but is not limited to, the structure of the capacitor 742 in FIG. 34C.

Note that in the case where an oxide semiconductor is used as the semiconductor of the transistor 751, the off-state current of the transistor 751 can be extremely small. Therefore, an electric charge held in the capacitor 762 is unlikely to leak, so that the voltage applied to the liquid crystal element 763 can be maintained for a long time. Accordingly, the transistor 751 can be kept off during a period in which moving images with few motions or a still image are/is displayed, whereby power for the operation of the transistor 751 can be saved in that period; accordingly a liquid crystal display device with low power consumption can be provided. Furthermore, the area occupied by the capacitor 762 can be reduced; thus, a liquid crystal display device with a high aperture ratio or a high-resolution liquid crystal display device can be provided.

An insulator 721 is provided over the transistor 751 and the capacitor 762. The insulator 721 has an opening reaching the transistor 751. A conductor 791 is provided over the insulator 721. The conductor 791 is electrically connected to the transistor 751 through the opening in the insulator 721.

An insulator 792 serving as an alignment film is provided over the conductor 791. A liquid crystal layer 793 is provided over the insulator 792. An insulator 794 serving as an alignment film is provided over the liquid crystal layer 793. A spacer 795 is provided over the insulator 794. A conductor 796 is provided over the spacer 795 and the insulator 794. A substrate 797 is provided over the conductor 796.

Note that the following methods can be employed for driving the liquid crystal: a twisted nematic (TN) mode, a super twisted nematic (STN) mode, an in-plane-switching (IPS) mode, a fringe field switching (FFS) mode, a multi-domain vertical alignment (MVA) mode, a patterned vertical alignment (PVA) mode, an advanced super view (ASV) mode, an axially symmetric aligned microcell (ASM) mode, an optically compensated birefringence (OCB) mode, an electrically controlled birefringence (ECB) mode, a ferroelectric liquid crystal (FLC) mode, an anti-ferroelectric liquid crystal (AFLC) mode, a polymer dispersed liquid crystal (PDLC) mode, a guest-host mode, and a blue phase mode. Note that the present invention is not limited to these examples, and various driving methods can be used.

Owing to the above-described structure, a display device including a capacitor occupying a small area, a display device with high display quality, or a high-resolution display device can be provided.

For example, in this specification and the like, a display element, a display device which is a device including a display element, a light-emitting element, and a light-emitting device which is a device including a light-emitting element can employ various modes or can include various elements. For example, the display element, the display device, the light-emitting element, or the light-emitting device includes at least one of a light-emitting diode (LED) for white, red, green, blue, or the like, a transistor (a transistor that emits light depending on current), an electron emitter, a liquid crystal element, electronic ink, an electrophoretic element, a grating light valve (GLV), a plasma display panel (PDP), a display element using micro electro mechanical systems (MEMS), a digital micromirror device (DMD), a digital micro shutter (DMS), an interferometric modulator display (IMOD) element, a MEMS shutter display element, an optical-interference-type MEMS display element, an electrowetting element, a piezoelectric ceramic display, and a display element including a carbon nanotube. Other than the above, display media whose contrast, luminance, reflectivity, transmittance, or the like is changed by an electrical or magnetic effect may be included.

Note that examples of display devices having EL elements include an EL display. Examples of a display device including an electron emitter include a field emission display (FED), an SED-type flat panel display (SED: surface-conduction electron-emitter display), and the like. Examples of display devices including liquid crystal elements include a liquid crystal display (e.g., a transmissive liquid crystal display, a transflective liquid crystal display, a reflective liquid crystal display, a direct-view liquid crystal display, or a projection liquid crystal display). Examples of a display devices having electronic ink or an electrophoretic element include electronic paper. In the case of a transflective liquid crystal display or a reflective liquid crystal display, some of or all of pixel electrodes function as reflective electrodes. For example, some or all of pixel electrodes are formed to contain aluminum, silver, or the like. In such a case, a memory circuit such as an SRAM can be provided under the reflective electrodes, leading to lower power consumption.

Note that in the case of using an LED, graphene or graphite may be provided under an electrode or a nitride semiconductor of the LED. Graphene or graphite may be a multilayer film in which a plurality of layers are stacked. As described above, provision of graphene or graphite enables easy formation of a nitride semiconductor thereover, such as an n-type GaN semiconductor including crystals. Furthermore, a p-type GaN semiconductor including crystals or the like can be provided thereover, and thus the LED can be formed. Note that an AlN layer may be provided between the n-type GaN semiconductor including crystals and graphene or graphite. The GaN semiconductors included in the LED may be formed by MOCVD. Note that when the graphene is provided, the GaN semiconductors included in the LED can also be formed by a sputtering method.

The structure described above in this embodiment can be combined with any of the structures described in the other embodiments and examples as appropriate.

Embodiment 8

In this embodiment, circuit configuration examples to which the OS transistors described in the above embodiment can be used are described with reference to FIGS. 36A to 36C, FIGS. 37A to 37C, FIGS. 38A and 38B, and FIGS. 39A and 39B.

Figure 36A:
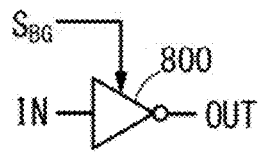
FIGS. 36A to 36C are circuit diagrams and a timing chart illustrating one embodiment of the present invention.

FIG. 36A is a circuit diagram of an inverter. An inverter 800 outputs a signal whose logic is inverted from the logic of a signal supplied to an input terminal IN to an output terminal OUT. The inverter 800 includes a plurality of OS transistors. A signal $S_{BG}$ can switch electrical characteristics of the OS transistors.

Figure 36B:
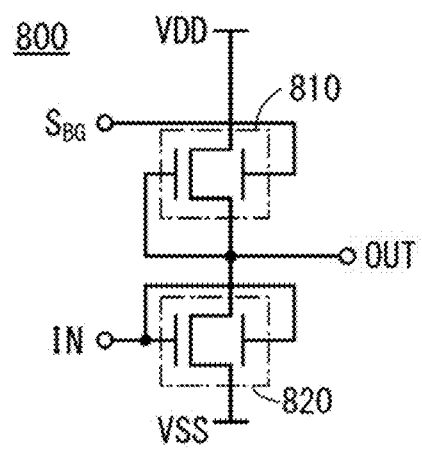

FIG. 36B illustrates an example of the inverter 800. The inverter 800 includes an OS transistor 810 and an OS transistor 820. The inverter 800 can be formed using only n-channel transistors; thus, the inverter 800 can be formed at lower cost than an inverter formed using a complementary metal oxide semiconductor (i.e., a CMOS inverter).

Note that the inverter 800 including the OS transistors can be provided over a CMOS circuit including Si transistors. Since the inverter 800 can be provided so as to overlap with the CMOS circuit, no additional area is required for the inverter 800, and thus, an increase in the circuit area can be suppressed.

Each of the OS transistors 810 and 820 includes a first gate functioning as a front gate, a second gate functioning as a back gate, a first terminal functioning as one of a source and a drain, and a second terminal functioning as the other of the source and the drain.

The first gate of the OS transistor 810 is connected to its second terminal. The second gate of the OS transistor 810 is connected to a wiring that supplies the signal $S_{BG}$. The first terminal of the OS transistor 810 is connected to a wiring that supplies a voltage VDD. The second terminal of the OS transistor 810 is connected to the output terminal OUT.

The first gate of the OS transistor 820 is connected to the input terminal IN. The second gate of the OS transistor 820 is connected to the input terminal IN. The first terminal of the OS transistor 820 is connected to the output terminal OUT. The second terminal of the OS transistor 820 is connected to a wiring that supplies a voltage VSS.

Figure 36C:
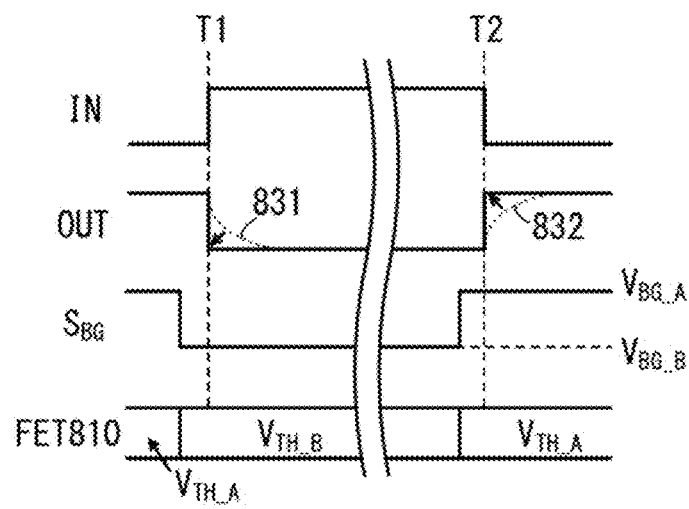

FIG. 36C is a timing chart illustrating the operation of the inverter 800. The timing chart in FIG. 36C illustrates changes of a signal waveform of the input terminal IN, a signal waveform of the output terminal OUT, a signal waveform of the signal $S_{BG}$, and the threshold voltage of the OS transistor 810.

The signal $S_{BG}$ can be supplied to the second gate of the OS transistor 810 to control the threshold voltage of the OS transistor 810.

The signal $S_{BG}$ includes a voltage $V_{BG\_A}$ for shifting the threshold voltage in the negative direction and a voltage $V_{BG\_B}$ for shifting the threshold voltage in the positive direction. The threshold voltage of the OS transistor 810 can be shifted in the negative direction to be a threshold voltage $V_{TH\_A}$ when the voltage $V_{BG\_A}$ is applied to the second gate. The threshold voltage of the OS transistor 810 can be shifted in the positive direction to be a threshold voltage $V_{TH\_B}$ when the voltage $V_{BG\_B}$ is applied to the second gate.

To visualize the above description, FIG. 36A shows a $V_g$-$I_d$ curve, which is one of indicators of the transistor's electrical characteristics.

Figure 37A:
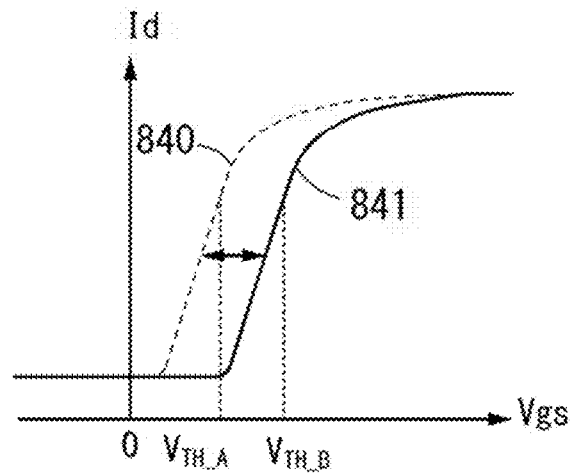
FIGS. 37A to 37C are a graph and circuit diagrams illustrating one embodiment of the present invention.

When a high voltage such as the voltage $V_{BG\_A}$ is applied to the second gate, the electrical characteristics of the OS transistor 810 can be shifted to match a curve shown by a dashed line 840 in FIG. 37A. When a low voltage such as the voltage $V_{BG\_B}$ is applied to the second gate, the electrical characteristics of the OS transistor 810 can be shifted to match a curve shown by a solid line 841 in FIG. 37A. As shown in FIG. 37A, switching the signal $S_{BG}$ between the voltage $V_{BG\_A}$ and the voltage $V_{BG\_B}$ enables the threshold voltage of the OS transistor 810 to be shifted in the negative direction or the positive direction.

Figure 37B:
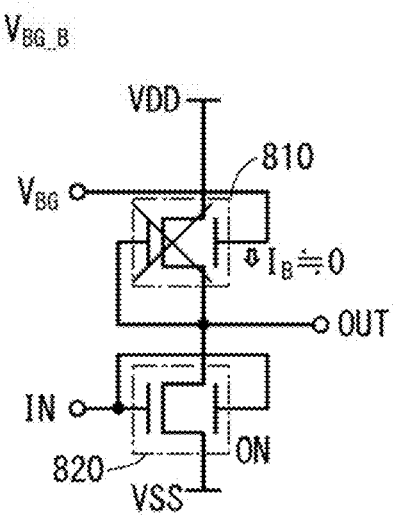

The shift of the threshold voltage in the positive direction toward the threshold voltage $V_{TH\_B}$ can make a current less likely to flow in the OS transistor 810. FIG. 37B visualizes the state. As illustrated in FIG. 37B, a current h that flows in the OS transistor 810 can be extremely low. Thus, when a signal supplied to the input terminal IN is at a high level and the OS transistor 820 is on (ON), the voltage of the output terminal OUT can drop sharply.

Since a state in which a current is less likely to flow in the OS transistor 810 as illustrated in FIG. 37B can be obtained, a signal waveform 831 of the output terminal in the timing chart in FIG. 36C can be made steep. Shoot-through current between the wiring that supplies the voltage VDD and the wiring that supplies the voltage VSS can be low, leading to low-power operation.

Figure 37C:
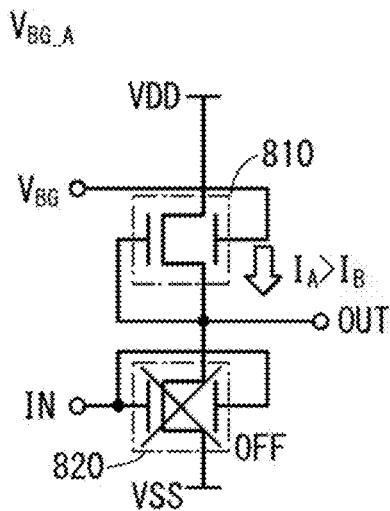

The shift of the threshold voltage in the negative direction toward the threshold voltage $V_{TH\_A}$ can make a current flow easily in the OS transistor 810. FIG. 37C visualizes the state. As illustrated in FIG. 37C, a current IA flowing at this time can be higher than at least the current h. Thus, when a signal supplied to the input terminal IN is at a low level and the OS transistor 820 is off (OFF), the voltage of the output terminal OUT can be increased sharply.

Since a state in which current is likely to flow in the OS transistor 810 as illustrated in FIG. 37C can be obtained, a signal waveform 832 of the output terminal in the timing chart in FIG. 36C can be made steep.

Note that the threshold voltage of the OS transistor 810 is preferably controlled by the signal $S_{BG}$ before the state of the OS transistor 820 is switched, i.e., before time T1 or time T2. For example, as in FIG. 36C, it is preferable that the threshold voltage of the OS transistor 810 be switched from the threshold voltage $V_{TH\_A}$ to the threshold voltage $V_{TH\_B}$ before time T1 at which the level of the signal supplied to the input terminal IN is switched to a high level. Moreover, as in FIG. 36C, it is preferable that the threshold voltage of the OS transistor 810 be switched from the threshold voltage $V_{TH\_B}$ to the threshold voltage $V_{TH\_A}$ before time T2 at which the level of the signal supplied to the input terminal IN is switched to a low level.

Figure 38A:
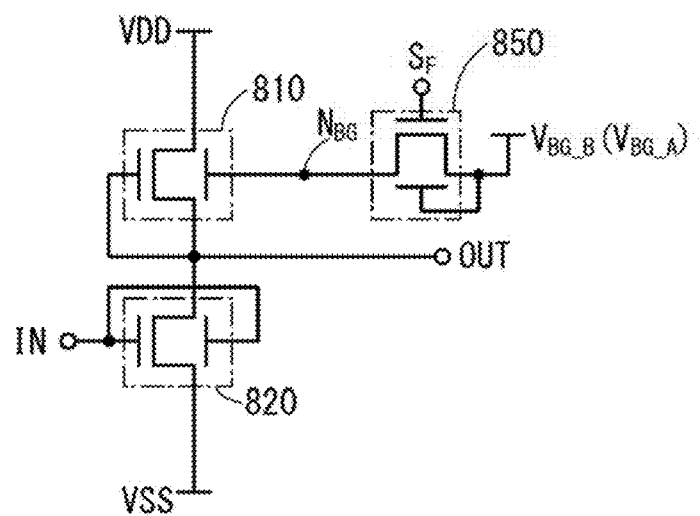
FIGS. 38A and 38B are a circuit diagram and a timing chart illustrating one embodiment of the present invention.

Although the timing chart in FIG. 36C illustrates the structure in which the level of the signal $S_{BG}$ is switched in accordance with the signal supplied to the input terminal IN, a different structure may be employed in which voltage for controlling the threshold voltage is held by the second gate of the OS transistor 810 in a floating state, for example. FIG. 38A illustrates an example of such a circuit configuration.

The circuit configuration in FIG. 34A is the same as that in FIG. 36B, except that an OS transistor 850 is added. A first terminal of the OS transistor 850 is connected to the second gate of the OS transistor 810. A second terminal of the OS transistor 850 is connected to a wiring that supplies the voltage $V_{BG\_B}$ (or the voltage $V_{BG\_A}$). A first gate of the OS transistor 850 is connected to a wiring that supplies a signal $S_F$. A second gate of the OS transistor 850 is connected to the wiring that supplies the voltage $V_{BG\_B}$ (or the voltage $V_{BG\_A}$).

Figure 38B:
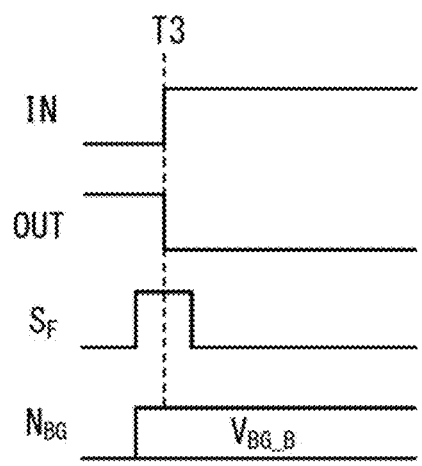

The operation with the circuit configuration in FIG. 38A is described with reference to a timing chart in FIG. 38B.

The voltage for controlling the threshold voltage of the OS transistor 810 is supplied to the second gate of the OS transistor 810 before time T3 at which the level of the signal supplied to the input terminal IN is switched to a high level. The signal $S_F$ is set to a high level and the OS transistor 850 is turned on, so that the voltage $V_{BG\_B}$ for controlling the threshold voltage is supplied to a node $N_{BG}$.

The OS transistor 850 is turned off after the voltage of the node $N_{BG}$ becomes $V_{BG\_B}$. Since the off-state current of the OS transistor 850 is extremely low, the voltage $V_{BG\_B}$ held by the node $N_{BG}$ can be retained while the OS transistor 850 remains off and the node $N_{BG}$ is in a state that is very close to a floating state. Therefore, the number of times the voltage $V_{BG\_B}$ is supplied to the second gate of the OS transistor 850 can be reduced and accordingly, the power consumption for rewriting the voltage $V_{BG\_B}$ can be reduced.

Figure 39A:
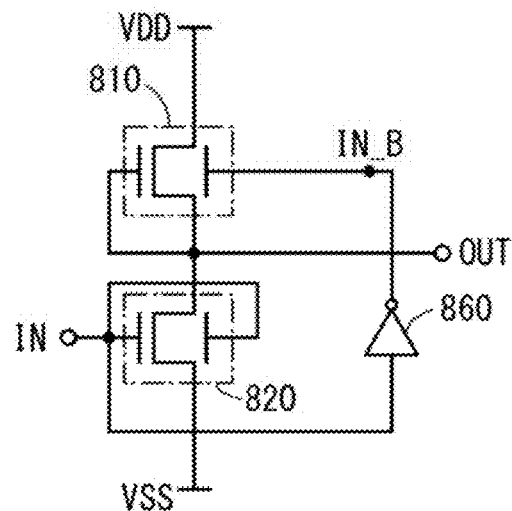
FIGS. 39A and 39B are a circuit diagram and a timing chart illustrating one embodiment of the present invention.

Although FIG. 36B and FIG. 38A each illustrate the case where the voltage is supplied to the second gate of the OS transistor 810 by control from the outside, a different structure may be employed in which voltage for controlling the threshold voltage is generated on the basis of the signal supplied to the input terminal IN and supplied to the second gate of the OS transistor 810, for example. FIG. 39A illustrates an example of such a circuit configuration.

The circuit configuration in FIG. 39A is the same as that in FIG. 36B, except that a CMOS inverter 860 is provided between the input terminal IN and the second gate of the OS transistor 810. An input terminal of the CMOS inverter 860 is connected to the input terminal IN. An output terminal of the CMOS inverter 860 is connected to the second gate of the OS transistor 810.

The operation with the circuit configuration in FIG. 39A is described with reference to a timing chart in FIG. 39B. The timing chart in FIG. 39B illustrates changes of a signal waveform of the input terminal IN, a signal waveform of the output terminal OUT, an output waveform IN_B of the CMOS inverter 860, and a threshold voltage of the OS transistor 810.

The output waveform IN_B which corresponds to a signal whose logic is inverted from the logic of the signal supplied to the input terminal IN can be used as a signal that controls the threshold voltage of the OS transistor 810. Thus, the threshold voltage of the OS transistor 810 can be controlled as described with reference to FIGS. 36A to 36C. For example, the signal supplied to the input terminal IN is at a high level and the OS transistor 820 is turned on at time T4 in FIG. 39B. At this time, the output waveform IN_B is at a low level. Accordingly, a current can be made less likely to flow in the OS transistor 810; thus, the voltage of the output terminal OUT can be sharply decreased.

Figure 39B:
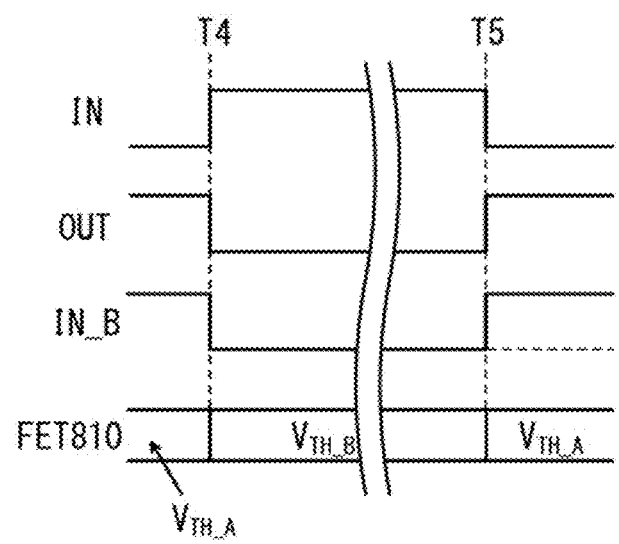

Moreover, the signal supplied to the input terminal IN is at a low level and the OS transistor 820 is turned off at time T5 in FIG. 39B. At this time, the output waveform IN_B is at a high level. Accordingly, a current can easily flow in the OS transistor 810; thus, a rise in the voltage of the output terminal OUT can be made steep.

As described above, in the configuration of the inverter including the OS transistor in this embodiment, the voltage of the back gate is switched in accordance with the logic of the signal supplied to the input terminal IN. In such a configuration, the threshold voltage of the OS transistor can be controlled. The control of the threshold voltage of the OS transistor by the signal supplied to the input terminal IN can cause a steep change in the voltage of the output terminal OUT. Moreover, shoot-through current between the wirings that supply power supply voltages can be reduced. Thus, power consumption can be reduced.

The structure described above in this embodiment can be combined with any of the structures described in the other embodiments and examples as appropriate.

Embodiment 9

In this embodiment, examples of a semiconductor device which includes a plurality of circuits including OS transistors described in the above embodiment are described with reference to FIGS. 40A to 40E, FIGS. 41A and 41B, FIGS. 42A and 42B, FIGS. 43A to 43C, FIGS. 44 and 44B, FIGS. 45A to 45C, and FIGS. 46A and 46B.

Figure 40A:
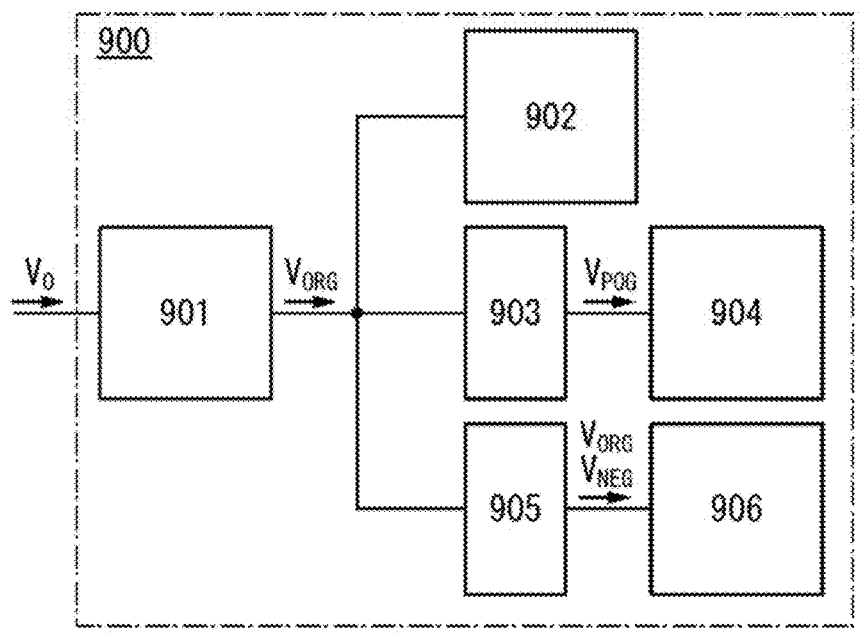
FIGS. 40A to 40E are a block diagram, circuit diagrams, and waveform diagrams illustrating one embodiment of the present invention.

FIG. 40A is a block diagram of a semiconductor device 900. The semiconductor device 900 includes a power supply circuit 901, a circuit 902, a voltage generation circuit 903, a circuit 904, a voltage generation circuit 905, and a circuit 906.

The power supply circuit 901 is a circuit that generates a voltage $V_{ORG}$ used as a reference. The voltage $V_{ORG}$ is not necessarily one voltage and can be a plurality of voltages. The voltage $V_{ORG}$ can be generated on the basis of a voltage $V_0$ supplied from the outside of the semiconductor device 900. The semiconductor device 900 can generate the voltage $V_{ORG}$ on the basis of one power supply voltage supplied from the outside. Thus, the semiconductor device 900 can operate without the supply of a plurality of power supply voltages from the outside.

The circuits 902, 904, and 906 operate with different power supply voltages. For example, the power supply voltage of the circuit 902 is a voltage applied on the basis of the voltage $V_{ORG}$ and the voltage $V_{SS}$ ($V_{ORG} > V_{SS}$). For example, the power supply voltage of the circuit 904 is a voltage applied on the basis of a voltage $V_{POG}$ and the voltage $V_{SS}$ ($V_{POG} > V_{ORG}$). For example, the power supply voltages of the circuit 906 are voltages applied on the basis of the voltage $V_{ORG}$, the voltage $V_{SS}$, and a voltage $V_{NEG}$ ($V_{ORG} > V_{SS} > V_{NEG}$). When the voltage $V_{SS}$ is equal to a ground potential (GND), the kinds of voltages generated in the power supply circuit 901 can be reduced.

The voltage generation circuit 903 is a circuit that generates the voltage $V_{POG}$. The voltage generation circuit 903 can generate the voltage $V_{POG}$ on the basis of the voltage $V_{ORG}$ supplied from the power supply circuit 901. Thus, the semiconductor device 900 including the circuit 904 can operate on the basis of one power supply voltage supplied from the outside.

The voltage generation circuit 905 is a circuit that generates the voltage $V_{NEG}$. The voltage generation circuit 905 can generate the voltage $V_{NEG}$ on the basis of the voltage $V_{ORG}$ supplied from the power supply circuit 901. Thus, the semiconductor device 900 including the circuit 906 can operate on the basis of one power supply voltage supplied from the outside.

Figure 40B:
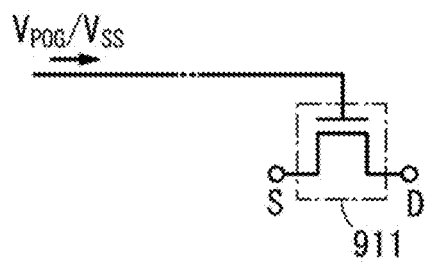
Figure 40C:
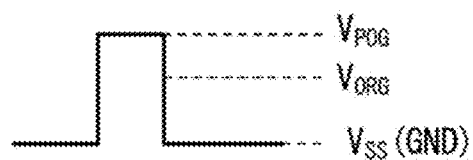

FIG. 40B illustrates an example of the circuit 904 that operates with the voltage $V_{POG}$ and FIG. 40C illustrates an example of a waveform of a signal for operating the circuit 904.

FIG. 40B illustrates a transistor 911. A signal supplied to a gate of the transistor 911 is generated on the basis of, for example, the voltage $V_{POG}$ and the voltage $V_{SS}$. The signal is generated on the basis of the voltage $V_{POG}$ at the time when the transistor 911 is turned on and on the basis of the voltage $V_{SS}$ at the time when the transistor 911 is turned off. As shown in FIG. 40C, the voltage $V_{POG}$ is higher than the voltage $V_{ORG}$. Thus, a source (S) and a drain (D) of the transistor 911 can be electrically connected to each other without fail. As a result, the frequency of malfunction of the circuit 904 can be reduced.

Figure 40D:
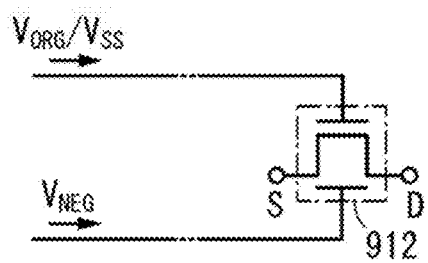
Figure 40E:
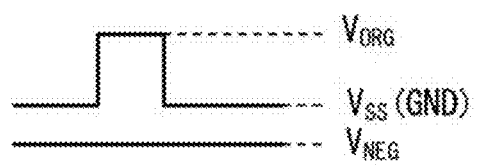

FIG. 40D illustrates an example of the circuit 906 that operates with the voltage $V_{NEG}$ and FIG. 40E illustrates an example of a waveform of a signal for operating the circuit 906.

FIG. 40D illustrates a transistor 912 having a back gate. A signal supplied to a gate of the transistor 912 is generated on the basis of, for example, the voltage $V_{ORG}$ and the voltage $V_{SS}$. The signal has generated on the basis of the voltage $V_{ORG}$ at the time when the transistor 912 is turned on and on the basis of the voltage $V_{SS}$ at the time when the transistor 912 is turned off. A signal supplied to the back gate of the transistor 912 is generated on the basis of the voltage $V_{NEG}$. As shown in FIG. 40E, the voltage $V_{NEG}$ is lower than the voltage $V_{SS}$ (GND). Therefore, the threshold voltage of the transistor 912 can be controlled so as to be shifted in the positive direction. Thus, the transistor 912 can be surely turned off and a current flowing between a source (S) and a drain (D) can be reduced. As a result, the frequency of malfunction of the circuit 906 can be reduced and power consumption thereof can be reduced.

The voltage $V_{NEG}$ may be directly supplied to the back gate of the transistor 912. Alternatively, a signal supplied to the gate of the transistor 912 may be generated on the basis of the voltage $V_{ORG}$ and the voltage $V_{NEG}$ and the generated signal may be supplied to the back gate of the transistor 912.

Figure 41A:
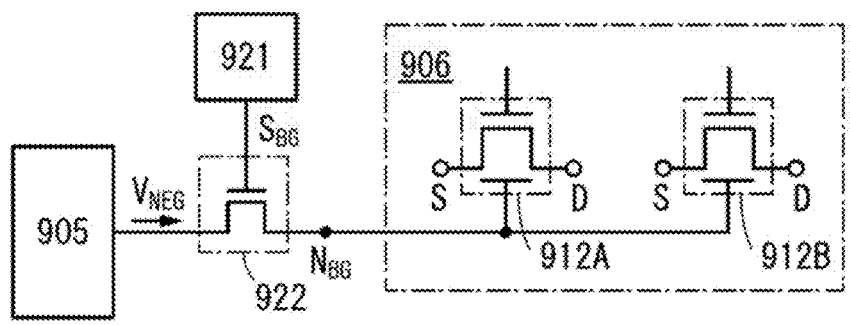
FIGS. 41A and 41B are a circuit diagram and a timing chart illustrating one embodiment of the present invention.
Figure 41B:
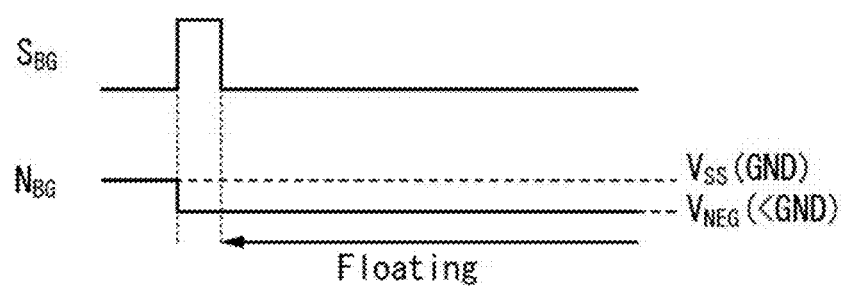

FIGS. 41A and 41B illustrate a modification example of FIGS. 40D and 40E.

In a circuit diagram illustrated in FIG. 41A, a transistor 922 whose conduction state can be controlled by a control circuit 921 is provided between the voltage generation circuit 905 and the circuit 906. The transistor 922 is an n-channel OS transistor. The control signal $S_{BG}$ output from the control circuit 921 is a signal for controlling the conduction state of the transistor 922. Transistors 912A and 912B included in the circuit 906 are the same OS transistors as the transistor 922.

A timing chart in FIG. 41B shows changes in a potential of the control signal $S_{BG}$ and a potential of the node $N_{BG}$. The potential of the node $N_{BG}$ indicates the states of potentials of back gates of the transistors 912A and 912B. When the control signal $S_{BG}$ is at a high level, the transistor 922 is turned on and the voltage of the node $N_{BG}$ becomes the voltage $V_{NEG}$. Then, when the control signal $S_{BG}$ is at a low level, the node $N_{BG}$ is brought into an electrically floating state. Since the transistor 922 is an OS transistor, its off-state current is small. Accordingly, even when the node $N_{BG}$ is in an electrically floating state, the voltage $V_{NEG}$ which has been supplied can be held.

Figure 42A:
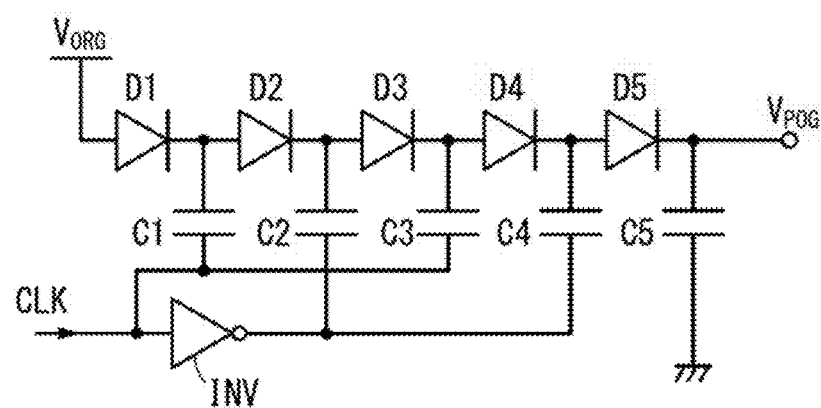
FIGS. 42A and 42B are circuit diagrams illustrating one embodiment of the present invention.

FIG. 42A illustrates an example of a circuit configuration applicable to the above-described voltage generation circuit 903. The voltage generation circuit 903 illustrated in FIG. 42A is a five-stage charge pump including diodes D1 to D5, capacitors C1 to C5, and an inverter INV. A clock signal CLK is supplied to the capacitors C1 to C5 directly or through the inverter INV. When a power supply voltage of the inverter INV is a voltage applied on the basis of the voltage $V_{ORG}$ and the voltage $V_{SS}$, the voltage $V_{POG}$, which has been increased to a positive voltage having a positively quintupled value of the voltage $V_{ORG}$ by application of the clock signal CLK, can be obtained. Note that a forward voltage of the diodes D1 to D5 is 0 V. A desired voltage $V_{POG}$ can be obtained when the number of stages of the charge pump is changed.

Figure 42B:
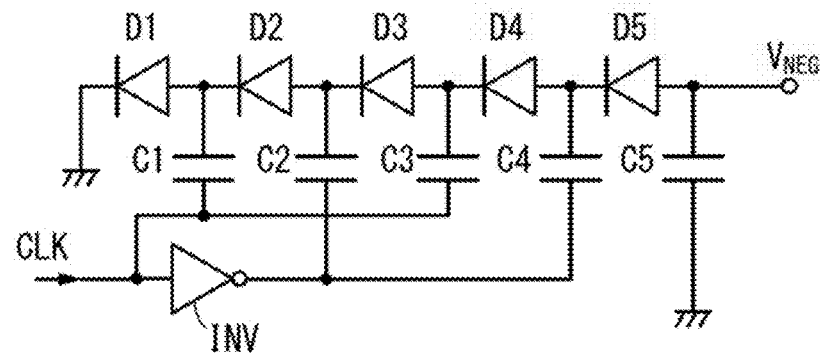

FIG. 42B illustrates an example of a circuit configuration applicable to the above-described voltage generation circuit 905. The voltage generation circuit 905 illustrated in FIG. 42B is a four-stage charge pump including the diodes D1 to D5, the capacitors C1 to C5, and the inverter INV. The clock signal CLK is supplied to the capacitors C1 to C5 directly or through the inverter INV. When a power supply voltage of the inverter INV is a voltage applied on the basis of the voltage $V_{ORG}$ and the voltage $V_{SS}$, the voltage $V_{NEG}$, which has been reduced from GND (i.e., the voltage $V_{SS}$) to a negative voltage having a negatively quadrupled value of the voltage $V_{ORG}$ by application of the clock signal CLK, can be obtained. Note that a forward voltage of the diodes D1 to D5 is 0 V. A desired voltage $V_{NEG}$ can be obtained when the number of stages of the charge pump is changed.

The circuit configuration of the voltage generation circuit 903 is not limited to the configuration of the circuit diagram illustrated in FIG. 42A. Modification examples of the voltage generation circuit 903 are shown in FIGS. 43A to 43C and FIGS. 44A and 44B.

Figure 43A:
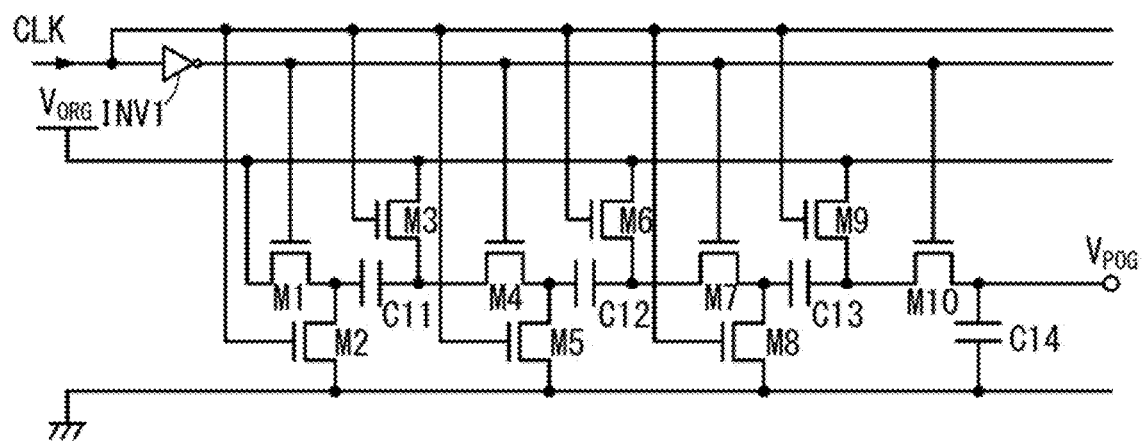
FIGS. 43A to 43C are circuit diagrams illustrating one embodiment of the present invention.

The voltage generation circuit 903A illustrated in FIG. 43A includes transistors M1 to M10, capacitors C11 to C14, and an inverter INV1. The clock signal CLK is supplied to gates of the transistors M1 to M10 directly or through the inverter INV1. By application of the clock signal CLK, the voltage $V_{POG}$, which has been increased to a positive voltage having a positively quadrupled value of the voltage $V_{ORG}$, can be obtained. A desired voltage $V_{POG}$ can be obtained when the number of stages is changed. In the voltage generation circuit 903A in FIG. 43A, off-state current of each of the transistors M1 to M10 can be low when the transistors M1 to M10 are OS transistors, and leakage of charge held in the capacitors C11 to C14 can be suppressed. Accordingly, raising from the voltage $V_{ORG}$ to the voltage $V_{POG}$ can be efficiently performed.

Figure 43B:
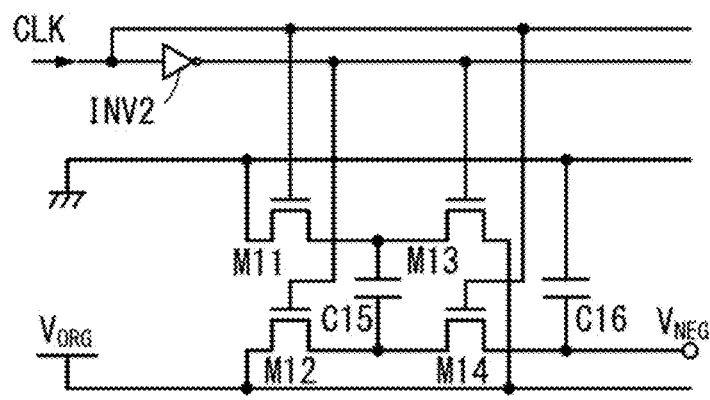

The voltage generation circuit 903B illustrated in FIG. 43B includes transistors M11 to M14, capacitors C15 and C16, and an inverter INV2. The clock signal CLK is supplied to gates of the transistors M11 to M14 directly or through the inverter INV2. By application of the clock signal CLK, the voltage $V_{POG}$, which has been increased to a positive voltage having a positively doubled value of the voltage $V_{ORG}$, can be obtained. In the voltage generation circuit 903B in FIG. 43B, off-state current of each of the transistors M11 to M14 can be low when the transistors M11 to M14 are OS transistors, and leakage of charge held in the capacitors C15 and C16 can be suppressed. Accordingly, raising from the voltage $V_{ORG}$ to the voltage $V_{POG}$ can be efficiently performed.

Figure 43C:
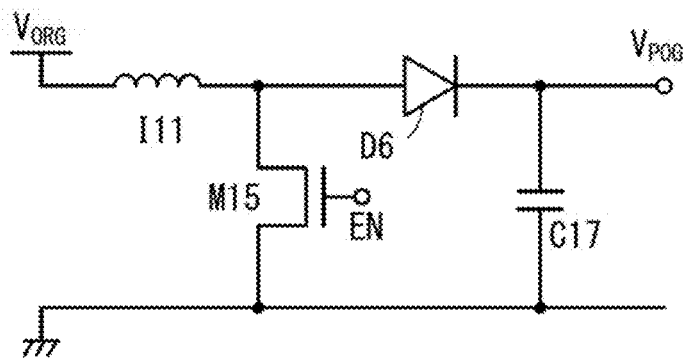

The voltage generation circuit 903C in FIG. 43C includes an inductor 111, a transistor M15, a diode D6, and a capacitor C17. The conduction state of the transistor M15 is controlled by a control signal EN. Owing to the control signal EN, the voltage $V_{POG}$ which is obtained by increasing the voltage $V_{ORG}$ can be obtained. Since the voltage generation circuit 903C in FIG. 43C increases the voltage using the inductor 111, the voltage can be increased efficiently.

Figure 44A:
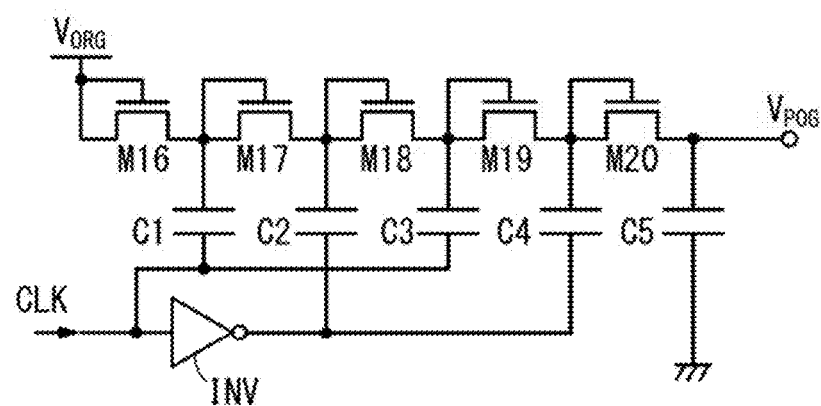
FIGS. 44A and 44B are circuit diagrams illustrating one embodiment of the present invention.

A voltage generation circuit 903D in FIG. 44A has a configuration in which the diodes D1 to D5 of the voltage generation circuit 903 in FIG. 42A are replaced with diode-connected transistors M16 to M20. In the voltage generation circuit 903D in FIG. 44A, when the OS transistors are used as the transistors M16 to M20, the off-state current can be reduced, so that leakage of charge held in the capacitors C1 to C5 can be inhibited. Thus, efficient voltage increase from the voltage $V_{ORG}$ to the voltage $V_{POG}$ is possible.

Figure 44B:
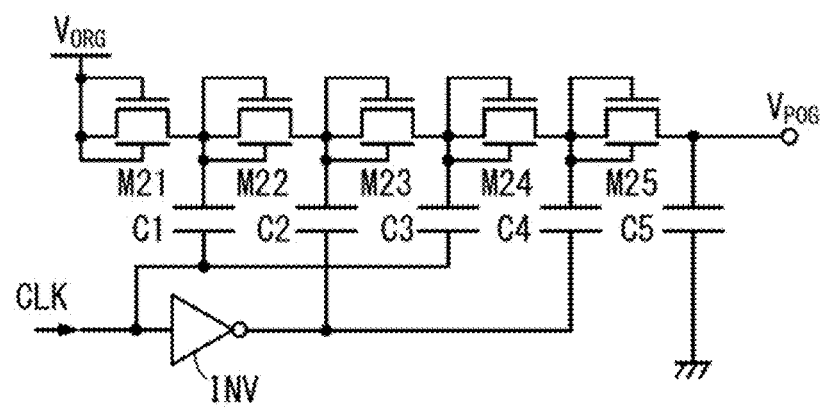
Figure 45A:
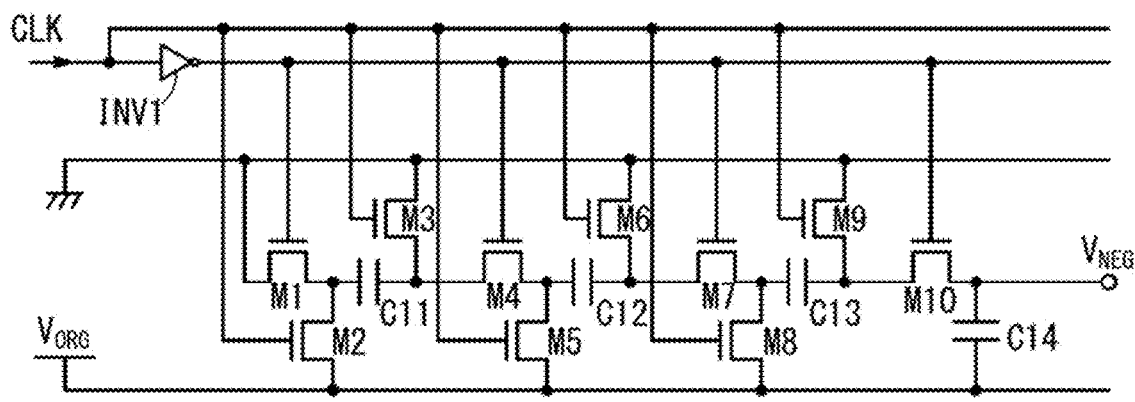
FIGS. 45A to 45C are circuit diagrams illustrating one embodiment of the present invention.
Figure 45B:
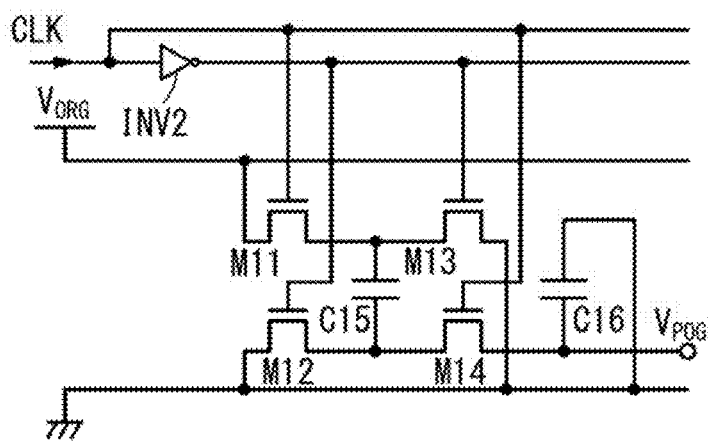
Figure 45C:
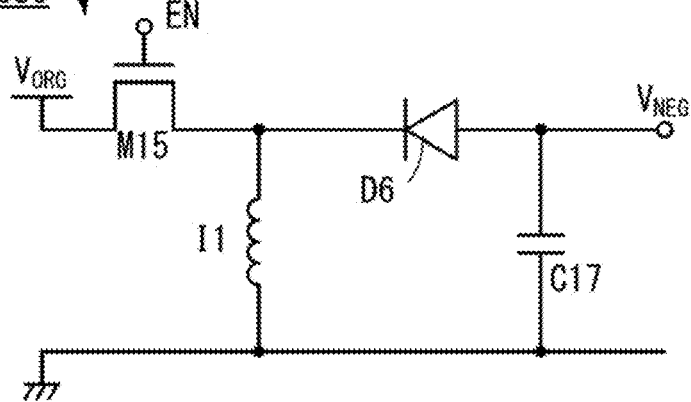
Figure 46A:
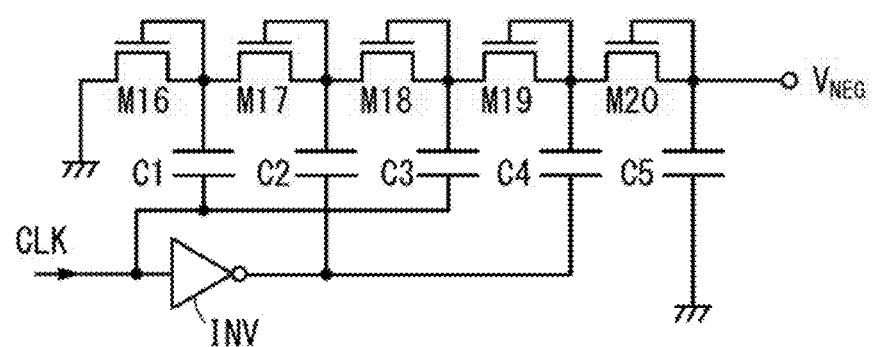
FIGS. 46A and 46B are circuit diagrams illustrating one embodiment of the present invention.
Figure 46B:
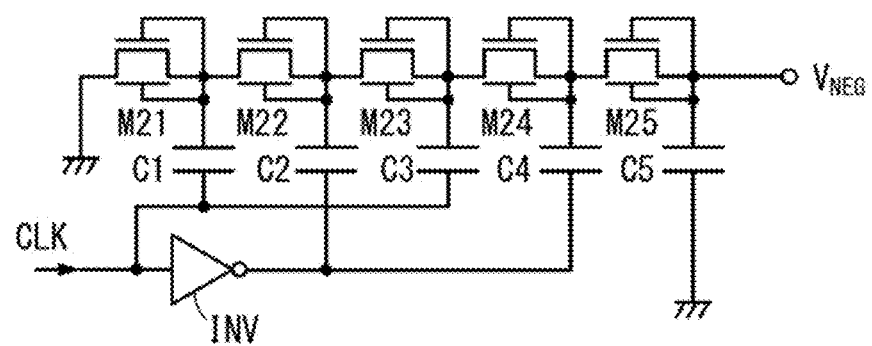

A voltage generation circuit 903E in FIG. 44B has a configuration in which the transistors M16 to M20 of the voltage generation circuit 903D in FIG. 44A are replaced with transistor M21 to M25 having back gates. In the voltage generation circuit 903E in FIG. 44B, the back gates can be supplied with voltages that are the same as those of the gates, so that the current flowing through the transistors can be increased. Thus, efficient voltage increase from the voltage $V_{ORG}$ to the voltage $V_{POG}$ is possible.

Note that the modification examples of the voltage generation circuit 903 can also be applied to the voltage generation circuit 905 in FIG. 42B. The configurations of a circuit diagram in this case are illustrated in FIGS. 45A to 45C and FIGS. 46A and 46B. In a voltage generation circuit 905A illustrated in FIG. 45A, the voltage $V_{NEG}$ which has been reduced from the voltage $V_{SS}$ to a negative voltage having a negatively tripled value of the voltage $V_{ORG}$ by application of the clock signal CLK, can be obtained. In a voltage generation circuit 905B illustrated in FIG. 45B, the voltage $V_{NEG}$ which has been reduced from the voltage $V_{SS}$ to a negative voltage having a negatively doubled value of the voltage $V_{ORG}$ by application of the clock signal CLK, can be obtained.

The voltage generation circuits 905A to 905E illustrated in FIGS. 45A to 45C and FIGS. 46A and 46B have configurations formed by changing the voltages applied to the wirings or the arrangement of the elements of the voltage generation circuits 903A to 903E illustrated in FIGS. 43A to 43C and FIGS. 44A and 44B. In the voltage generation circuits 905A to 905E illustrated in FIGS. 45A to 45C and FIGS. 46A and 46B, as in the voltage generation circuits 903A to 903E, an efficient voltage decrease from the voltage $V_{SS}$ to the voltage $V_{NEG}$ is possible.

As described above, in any of the structures of this embodiment, a voltage required for circuits included in a semiconductor device can be internally generated. Thus, in the semiconductor device, the kinds of power supply voltages supplied from the outside can be reduced.

The structure described in this embodiment can be used as appropriate in combination with any of the structures described in the other embodiments and examples.

Embodiment 10

<Electronic Device>

The semiconductor device of one embodiment of the present invention can be used for display devices, personal computers, or image reproducing devices provided with recording media (typically, devices which reproduce the content of recording media such as digital versatile discs (DVDs) and have displays for displaying the reproduced images). Other examples of electronic devices that can be equipped with the semiconductor device of one embodiment of the present invention are mobile phones, game machines including portable game consoles, portable data terminals, e-book readers, cameras such as video cameras and digital still cameras, goggle-type displays (head mounted displays), navigation systems, audio reproducing devices (e.g., car audio players and digital audio players), copiers, facsimiles, printers, multifunction printers, automated teller machines (ATM), and vending machines. FIGS. 47A to 47F illustrate specific examples of these electronic devices.

Figure 47A:
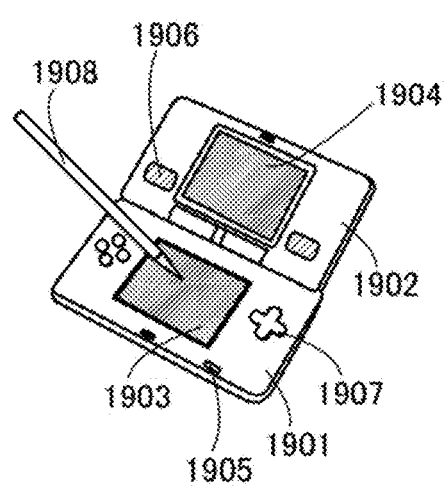
FIGS. 47A to 47F illustrate electronic devices of one embodiment of the present invention.

FIG. 47A illustrates a portable game console including a housing 1901, a housing 1902, a display portion 1903, a display portion 1904, a microphone 1905, a speaker 1906, an operation key 1907, a stylus 1908, and the like. Although the portable game console in FIG. 47A has the two display portions 1903 and 1904, the number of display portions included in a portable game console is not limited to this.

Figure 47B:
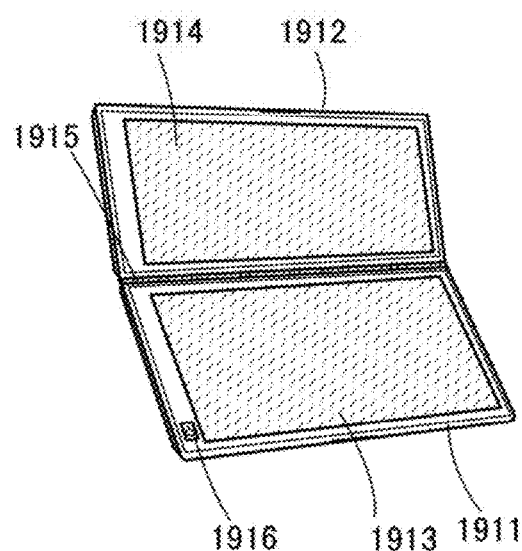

FIG. 47B illustrates a portable data terminal including a first housing 1911, a second housing 1912, a first display portion 1913, a second display portion 1914, a joint 1915, an operation key 1916, and the like. The first display portion 1913 is provided in the first housing 1911, and the second display portion 1914 is provided in the second housing 1912. The first housing 1911 and the second housing 1912 are connected to each other with the joint 1915, and the angle between the first housing 1911 and the second housing 1912 can be changed with the joint 1915. An image on the first display portion 1913 may be switched in accordance with the angle at the joint 1915 between the first housing 1911 and the second housing 1912. A display device with a position input function may be used as at least one of the first display portion 1913 and the second display portion 1914. Note that the position input function can be added by providing a touch panel in a display device. Alternatively, the position input function can be added by providing a photoelectric conversion element called a photosensor in a pixel portion of a display device.

Figure 47C:
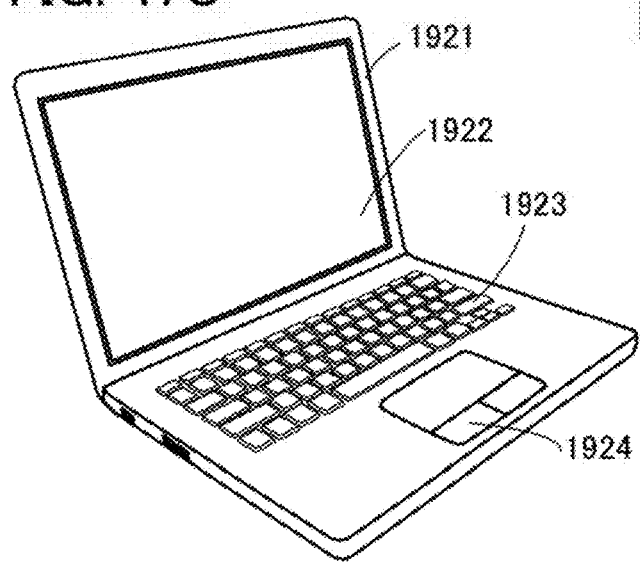

FIG. 47C illustrates a notebook personal computer, which includes a housing 1921, a display portion 1922, a keyboard 1923, a pointing device 1924, and the like.

Figure 47D:
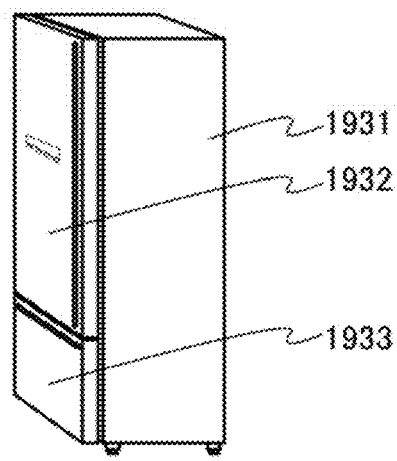

FIG. 47D illustrates an electric refrigerator-freezer, which includes a housing 1931, a door for a refrigerator 1932, a door for a freezer 1933, and the like.

Figure 47E:
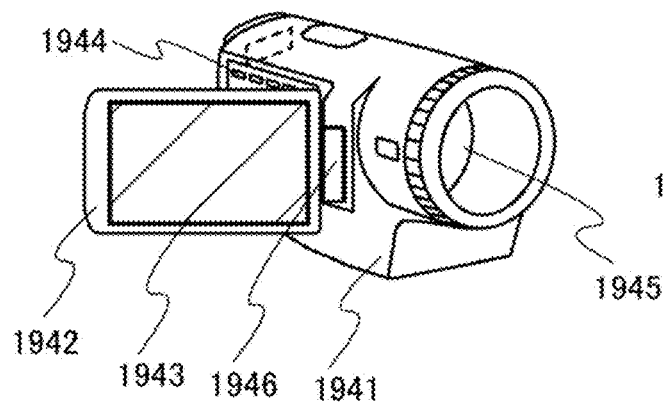

FIG. 47E illustrates a video camera, which includes a first housing 1941, a second housing 1942, a display portion 1943, operation keys 1944, a lens 1945, a joint 1946, and the like. The operation keys 1944 and the lens 1945 are provided for the first housing 1941, and the display portion 1943 is provided for the second housing 1942. The first housing 1941 and the second housing 1942 are connected to each other with the joint 1946, and the angle between the first housing 1941 and the second housing 1942 can be changed with the joint 1946. Images displayed on the display portion 1943 may be switched in accordance with the angle at the joint 1946 between the first housing 1941 and the second housing 1942.

Figure 47F:
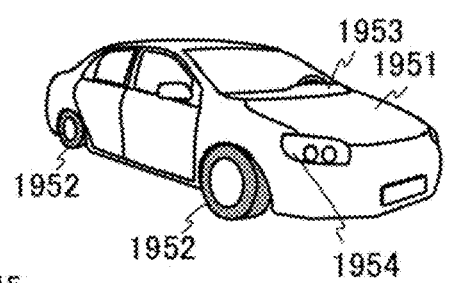

FIG. 47F illustrates a car including a car body 1951, wheels 1952, a dashboard 1953, lights 1954, and the like.

The structure described in this embodiment can be combined with any of the structures described in the other embodiments and examples as appropriate.

Embodiment 11

In this embodiment, a semiconductor wafer, a chip, and an electronic component of one embodiment of the present invention will be described.

<Semiconductor Wafer and Chip>

Figure 48A:
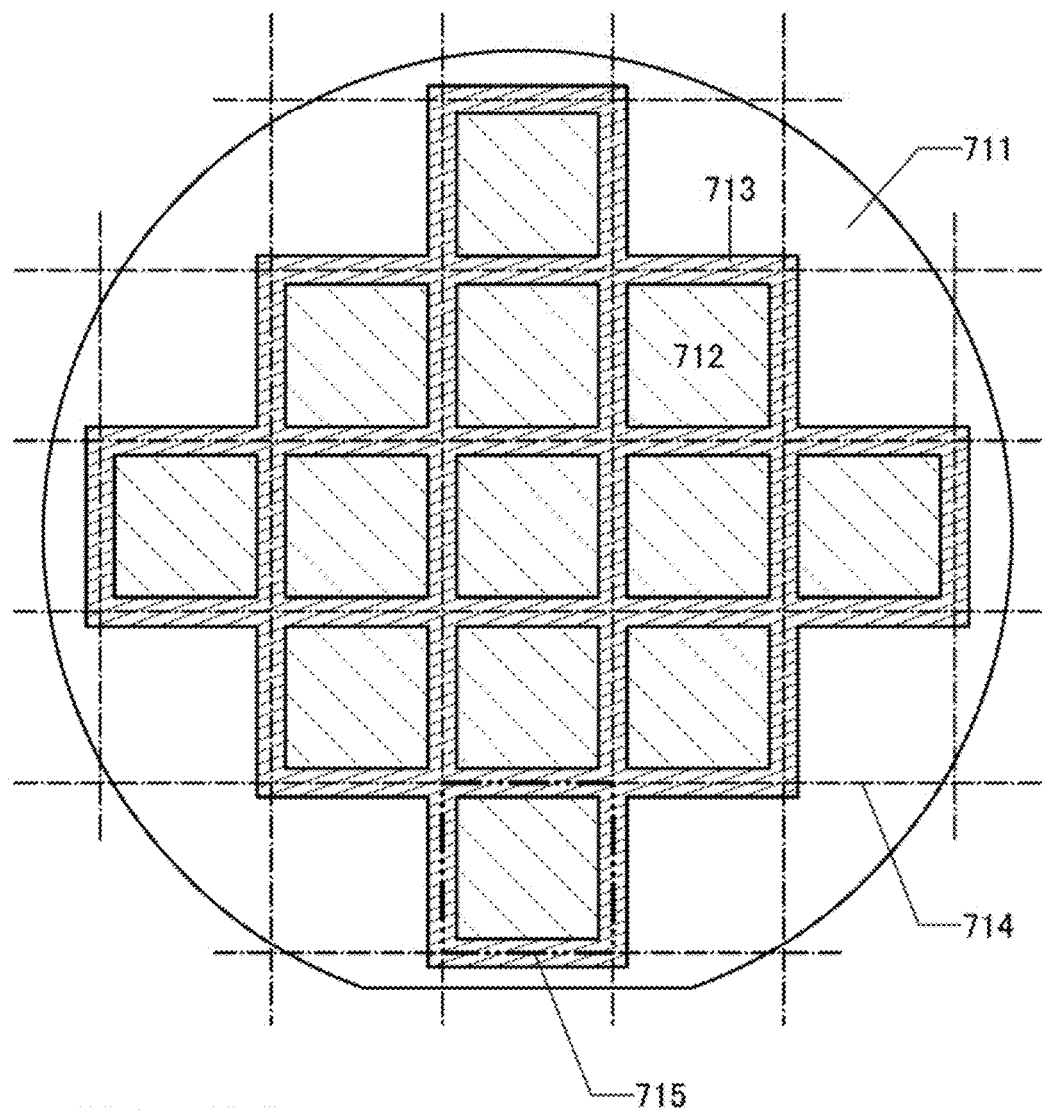
FIGS. 48A and 48B are top views of a semiconductor wafer of one embodiment of the present invention.

FIG. 48A is a top view illustrating a substrate 711 before dicing treatment. As the substrate 711, a semiconductor substrate (also referred to as a "semiconductor wafer") can be used, for example. A plurality of circuit regions 712 are provided over the substrate 711. A semiconductor device, a CPU, or an RF tag according to one embodiment of the present invention, an image sensor, or the like can be provided in the circuit region 712.

Figure 48B:
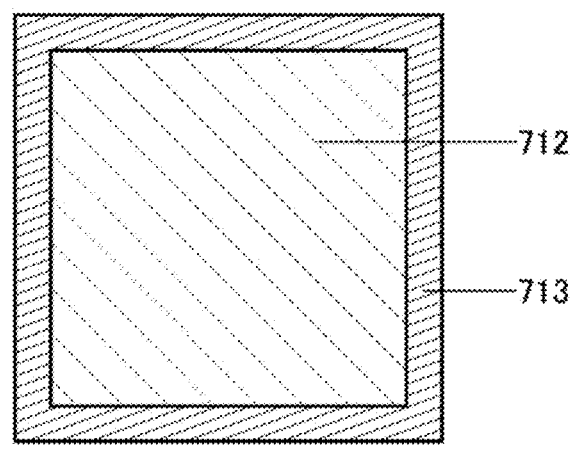

The plurality of circuit regions 712 are each surrounded by a separation region 713. Separation lines (also referred to as "dicing lines") 714 are set at a position overlapping with the separation regions 713. The substrate 711 can be cut along the separation lines 714 into chips 715 including the circuit regions 712. FIG. 48B is an enlarged view of the chip 715.

A conductive layer or a semiconductor layer may be provided in the separation regions 713. Providing a conductive layer or a semiconductor layer in the separation regions 713 relieves ESD that might be caused in a dicing step, preventing a decrease in the yield of the dicing step. A dicing step is generally performed while letting pure water whose specific resistance is decreased by dissolution of a carbonic acid gas or the like flow to a cut portion, in order to cool down a substrate, remove swarf, and prevent electrification, for example. Providing a conductive layer or a semiconductor layer in the separation regions 713 allows a reduction in the usage of the pure water. Therefore, the cost of manufacturing semiconductor devices can be reduced. Thus, semiconductor devices can be manufactured with improved productivity.

For a semiconductor layer provided in the separation regions 713, a material having a band gap greater than or equal to 2.5 eV and less than or equal to 4.2 eV, preferably greater than or equal to 2.7 eV and less than or equal to 3.5 eV is preferably used. The use of such a material allows accumulated charges to be released slowly; thus, the rapid move of charges due to ESD can be suppressed and electrostatic breakdown is less likely to occur.

<Electronic Component>

Figure 49A:
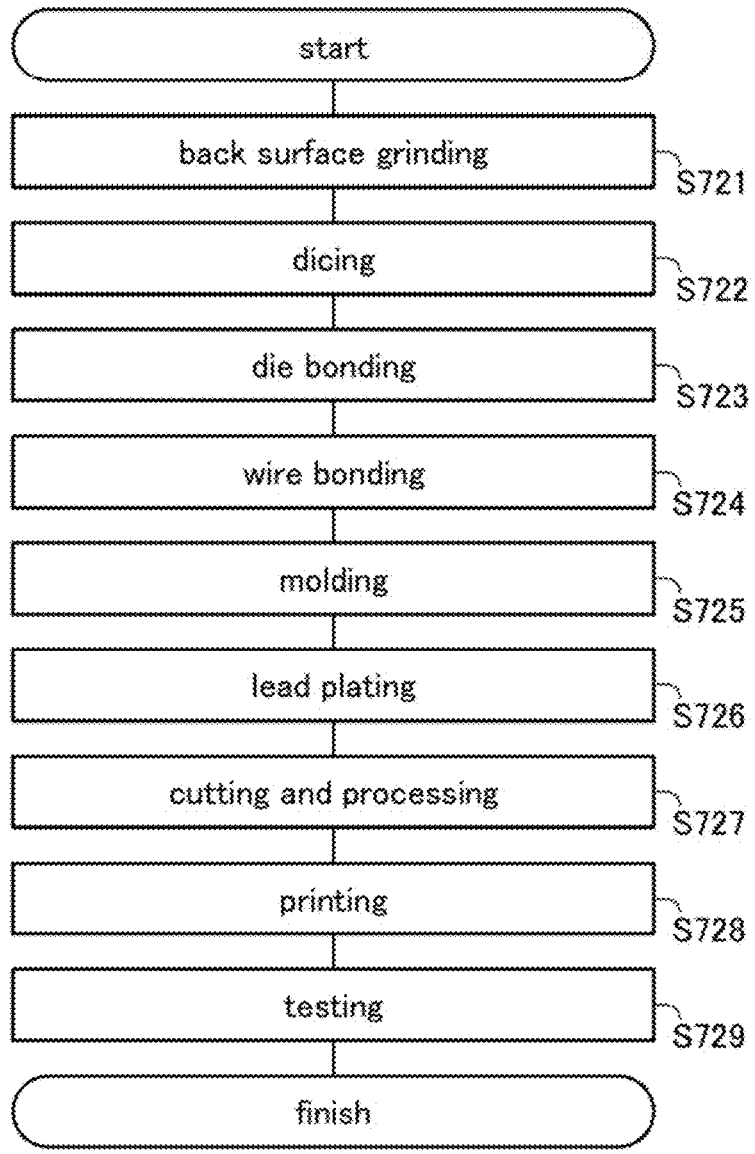
FIG. 49A is a flowchart showing a manufacturing process example of an electronic component of one embodiment of the present invention.
Figure 49B:
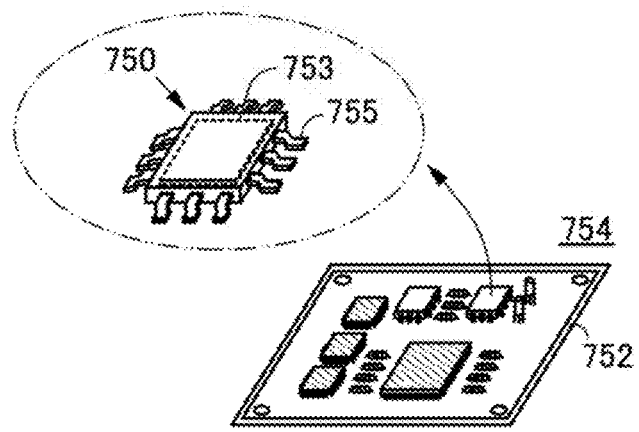
FIG. 49B is a schematic perspective view of the electronic component.

FIGS. 49A and 49B show an example where the chip 715 is used to make an electronic component. Note that the electronic component is also referred to as a semiconductor package or an IC package. This electronic component has a plurality of standards and names depending on a terminal extraction direction and a terminal shape.

The electronic component can be completed in an assembly process (post-process) in which the semiconductor device described in the above embodiment and a component other than the semiconductor device are combined.

The post-process will be described with reference to a flow chart in FIG. 49A. After an element substrate including the semiconductor device described in any of the above embodiments is completed in a pre-process, a back surface grinding step in which a back surface (a surface where a semiconductor device and the like are not formed) of the element substrate is ground is performed (Step S721). When the element substrate is thinned by grinding, warpage or the like of the element substrate is reduced, so that the size of the electronic component can be reduced.

Next, the element substrate is divided into a plurality of chips (chips 715) in a dicing step (Step S722). Then, the separated chips are individually picked up to be bonded to a lead frame in a die bonding step (Step S723). To bond a chip and a lead frame in the die bonding step, a method such as resin bonding or tape-automated bonding is selected as appropriate depending on products. Note that the chip may be bonded to an interposer substrate instead of the lead frame.

Next, a wire bonding step for electrically connecting a lead of the lead frame and an electrode on the chip through a metal wire is performed (Step S724). As the metal wire, a silver wire or a gold wire can be used. Ball bonding or wedge bonding can be used as the wire bonding.

The wire-bonded chip is subjected to a molding step of sealing the chip with an epoxy resin or the like (Step S725). Through the molding step, the inside of the electronic component is filled with a resin, so that a circuit portion incorporated in the chip and a wire for connecting the chip to the lead can be protected from external mechanical force, and deterioration of characteristics (decrease in reliability) due to moisture or dust can be reduced.

Subsequently, the lead of the lead frame is plated in a lead plating step (Step S726). This plating process prevents rust of the lead and facilitates soldering at the time of mounting the chip on a printed circuit board in a later step. Then, the lead is cut and processed in a formation step (Step S727).

Next, a printing (marking) step is performed on a surface of the package (Step S728). After a testing step (Step S729) for checking whether an external shape is good and whether there is a malfunction, for example, the electronic component is completed (Step S729).

FIG. 49B is a perspective schematic diagram of a completed electronic component. FIG. 49B is a perspective schematic diagram illustrating a quad flat package (QFP) as an example of the electronic component. An electronic component 750 in FIG. 49B includes a lead 755 and a semiconductor device 753. As the semiconductor device 753, the semiconductor device described in any of the above embodiments can be used.

The electronic component 750 in FIG. 49B is mounted on a printed circuit board 752, for example. A plurality of electronic components 750 that are combined and electrically connected to each other over the printed circuit board 752; thus, a substrate on which the electronic components are mounted (a circuit board 754) is completed. The completed circuit board 754 is provided in an electronic device or the like.

The structure described above in this embodiment can be combined with any of the structures described in the other embodiments and examples as appropriate.

Embodiments of the present invention have been described in the above embodiments. Note that one embodiment of the present invention is not limited to the above examples. That is, various embodiments of the invention are described in this embodiment and the like, and one embodiment of the present invention is not limited to a particular embodiment. For example, an example in which a channel formation region, source and drain regions, and the like of a transistor include an oxide semiconductor is described as one embodiment of the present invention; however, one embodiment of the present invention is not limited to this example. Alternatively, depending on circumstances or conditions, various semiconductors may be included in various transistors, a channel formation region of a transistor, a source region or a drain region of a transistor, or the like of one embodiment of the present invention. Depending on circumstances or conditions, at least one of silicon, germanium, silicon germanium, silicon carbide, gallium arsenide, aluminum gallium arsenide, indium phosphide, gallium nitride, an organic semiconductor, and the like may be included in various transistors, a channel formation region of a transistor, a source region or a drain region of a transistor, or the like of one embodiment of the present invention. Alternatively, depending on circumstances or conditions, an oxide semiconductor is not necessarily included in various transistors, a channel formation region of a transistor, a source region or a drain region of a transistor, or the like of one embodiment of the present invention, for example.

Example 1

In Example 1, plasma treatment was performed on aluminum oxide films formed by an ALD method and oxygen was introduced into silicon oxide films through the aluminum oxide films to form samples. Furthermore, TDS analysis was performed on the samples.

In each of the samples, the silicon oxide film was formed on a single crystal silicon wafer to a thickness of 100 nm by a thermal oxidation method. Then, the aluminum oxide film was formed over the oxide film by an ALD method. In each of Samples 1 to 5, the aluminum oxide film was formed to a thickness of 1 nm. In each of Samples 6 to 9, the aluminum oxide film was formed to a thickness of 3 nm.

Next, the plasma treatment was performed on each of the samples. The plasma treatment was performed with a plasma oxidation nitridation apparatus including a high-density plasma source. For the plasma treatment conditions, argon (flow rate: 900 sccm) and oxygen (flow rate: 40 sccm) were used, the pressure in a reaction chamber was maintained at 666.65 Pa, a microwave power (4000 W) was applied, and the temperature of a substrate stage for setting each sample was set to 400° C. The plasma treatment time was varied according to the samples. The plasma treatment was performed on Sample 1 for 10 seconds, Sample 2 for 30 seconds, Samples 3 and 6 for 60 seconds, Samples 4 and 7 for 180 seconds, Samples 5 and 8 for 300 seconds, and Sample 9 for 600 seconds.

Then, the aluminum oxide film in each of the samples was removed by a wet etching method. For the wet etching, a mixed solution of nitric acid, acetic acid, and phosphoric acid was used.

Next, the TDS analysis was performed on the samples. For the TDS analysis conditions, the temperature of a heater for a temperature rise was set to 50° C. at the start of the measurement and 950° C. at the end of the measurement, and the temperature rise rate was set to 32° C./min. The surface temperature of the film of each of the samples was approximately 50° C. at the start of the measurement and approximately 540° C. at the end of the measurement. The pressure in a sample chamber at the start of the measurement was $1.5 \times 10^{-7}$ Pa.

TDS analysis results of the samples are shown. FIGS. 51A to 51E and FIGS. 52A to 52D show the temperature dependence of the release intensity of a mass-to-charge ratio M/z=32 corresponding to an oxygen molecule. The results of Samples 1 to 5 are shown in FIGS. 51A to 51E, and the results of Samples 6 to 9 are shown in FIGS. 52A to 52D. In each of Samples 1 to 5 where the aluminum oxide film thickness was 1 nm, the release peak intensity is observed in a range of approximately higher than or equal to 250° C. and lower than 285° C., and the intensity does not depend on the plasma treatment time. In each of Samples 6 to 9 where the aluminum oxide film thickness was 3 nm, the release peak intensity is observed in a range of approximately higher than or equal to 220° C. and lower than 290° C., and the intensity depends on the plasma treatment time obviously. That is, the release peak intensity tends to increase when the plasma treatment time is increased.

Figure 53A:
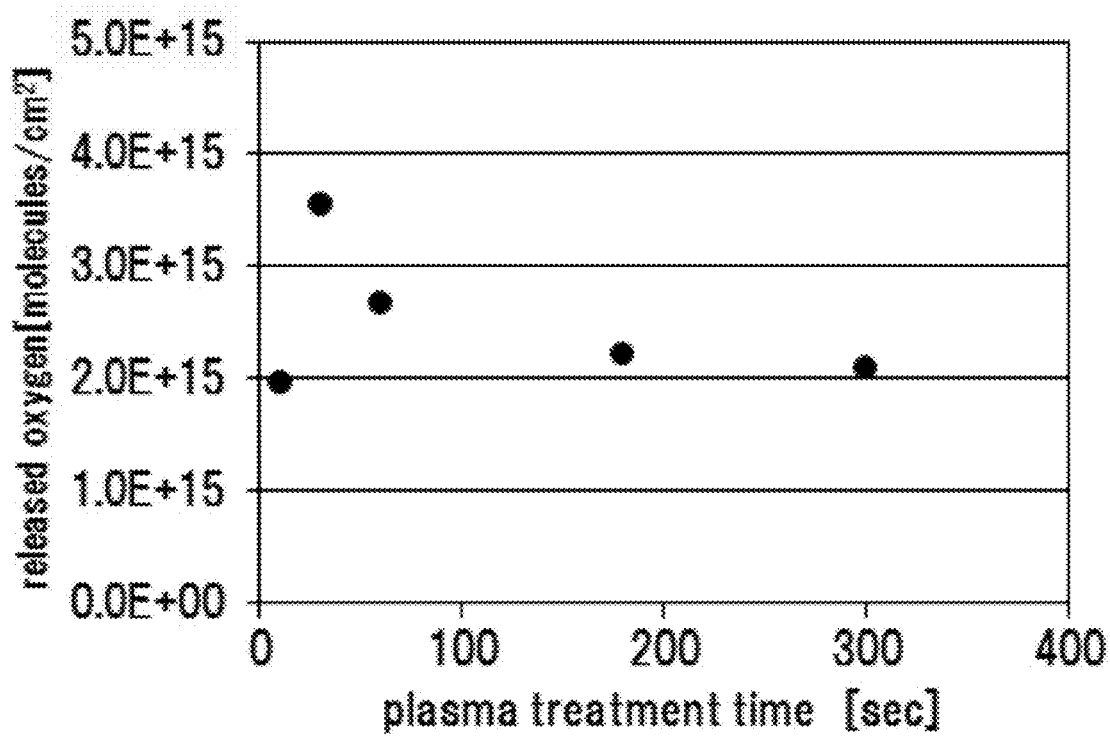
FIGS. 53A and 53B are graphs showing TDS analysis results of Example 1.
Figure 53B:
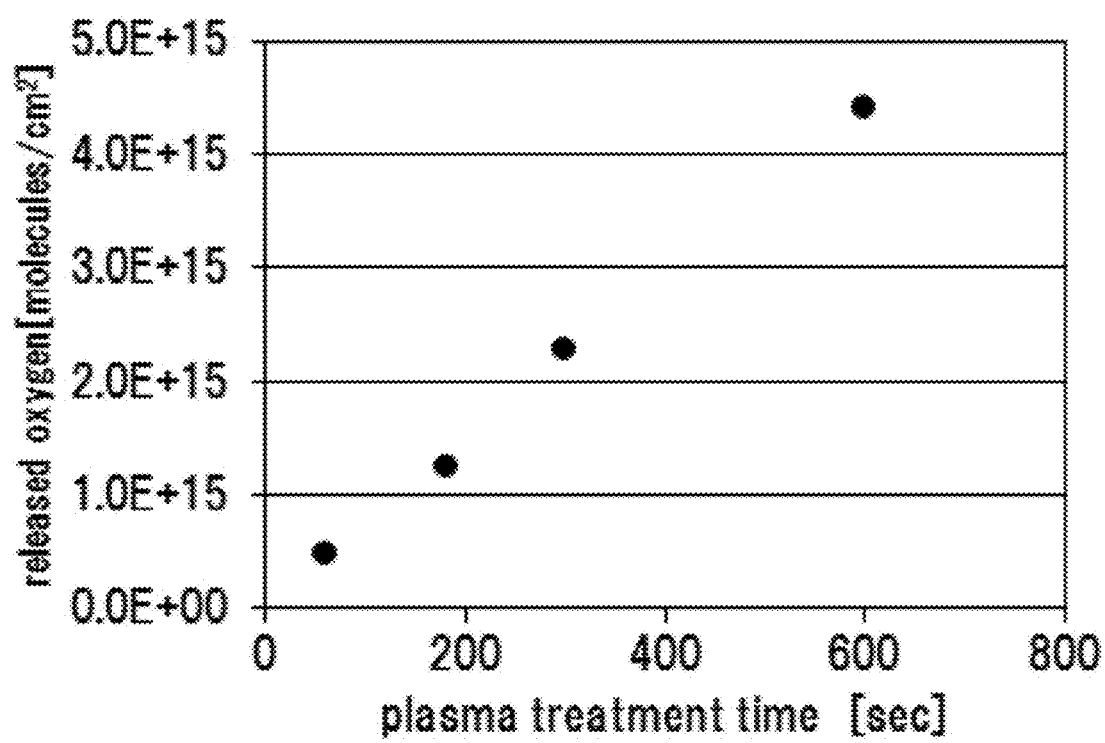

FIGS. 53A and 53B show the plasma treatment time dependence of the released amount of a mass-to-charge ratio M/z=32 corresponding to an oxygen molecule. FIG. 53A is a graph showing the dependence of the released amount on the plasma treatment time in the case where the aluminum oxide film thickness was 1 nm. The dependence of the released amount on the plasma treatment time is not observed. When the plasma treatment was performed for 10 seconds or longer, the released amount was approximately $2 \times 10^{15}$ molecules/cm$^2$. FIG. 53B is a graph showing the dependence of the released amount on the plasma treatment time in the case where the aluminum oxide film thickness was 3 nm. The dependence of the released amount on the plasma treatment time is clearly observed. That is, the released amount tends to increase when the plasma treatment time is increased. When the plasma treatment was performed for 60 seconds, the released amount was approximately $5 \times 10^{14}$ molecules/cm$^2$. When the plasma treatment was performed for 600 seconds, the released amount was approximately $4.5 \times 10^{15}$ molecules/cm$^2$.

These results show that, by the plasma treatment, oxygen is introduced as excess oxygen into the silicon oxide film or into the vicinity of a surface of the silicon oxide film through the aluminum oxide film formed by an ALD method. Furthermore, the dependence on the plasma treatment time is observed in the case where the aluminum oxide film thickness is 3 nm; by increasing the plasma treatment time, a larger amount of oxygen is introduced as excess oxygen into the silicon oxide film or into the vicinity of the surface of the silicon oxide film.

Example 2

In Example 2, plasma treatment was performed on samples including In—Ga—Zn oxides, and SIMS analysis and analysis using an electron spin resonance (ESR) method were performed.

In each of the samples, a first In—Ga—Zn oxide was formed over a quartz substrate by a sputtering method, and a second In—Ga—Zn oxide was formed over the first In—Ga—Zn oxide by a sputtering method.

Then, using an electric furnace, heat treatment was performed in a nitrogen atmosphere at 550° C. for 1 hour, and after that, heat treatment was performed in an oxygen atmosphere at 550° C. for 1 hour.

Then, a 13-nm-thick silicon oxynitride film was formed over the second In—Ga—Zn oxide by a CVD method. A first film formation condition was used for forming the silicon oxynitride film of each of Samples A and C. A second film formation condition was used for forming the silicon oxynitride film of each of Samples B and D.

Then, a 1-nm-thick aluminum oxide film was formed by an ALD method in each of Samples A and B, and a 3-nm-thick aluminum oxide film was formed by an ALD method in each of Samples C and D.

Then, Samples A, B, C, and D were each divided into eight pieces. That is, Sample A was divided into eight pieces to form Samples A-1 to A-8, Sample B was divided into eight pieces to form Samples B-1 to B-8, Sample C was divided into eight pieces to form Samples C-1 to C-8, and Sample D was divided into eight pieces to form Samples D-1 to D-8.

Next, the plasma treatment was performed on each of the samples. The plasma treatment was performed with a plasma oxidation nitridation apparatus including a high-density plasma source. For the plasma treatment conditions, argon (flow rate: 900 sccm) and oxygen (flow rate: 40 sccm) were used, the pressure in a reaction chamber was maintained at 666.65 Pa, a microwave power (4000 W) was applied, and the temperature of a substrate stage for setting each sample was set to 400° C. The plasma treatment time was varied according to the samples.

The plasma treatment was not performed on Samples A-1, A-5, B-1, B-5, C-1, C-5, D-1, and D-5. The plasma treatment was performed on Samples A-2, A-6, B-2, B-6, C-2, C-6, D-2, and D-6 for 60 seconds. The plasma treatment was performed on Samples A-3, A-7, B-3, B-7, C-3, C-7, D-3, and D-7 for 300 seconds. The plasma treatment was performed on Samples A-4, A-8, B-4, B-8, C-4, C-8, D-4, and D-8 for 600 seconds.

Figure 54A:
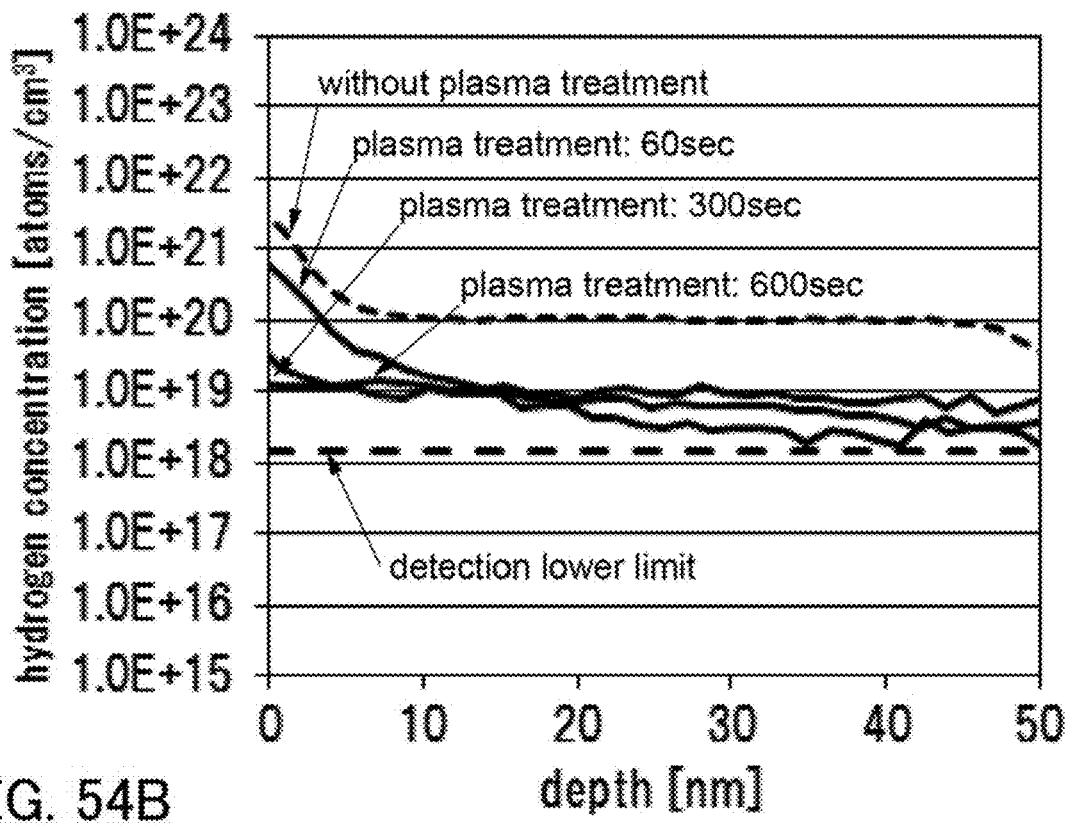
FIGS. 54A and 54B are graphs showing SIMS analysis results of Example 2.
Figure 54B:
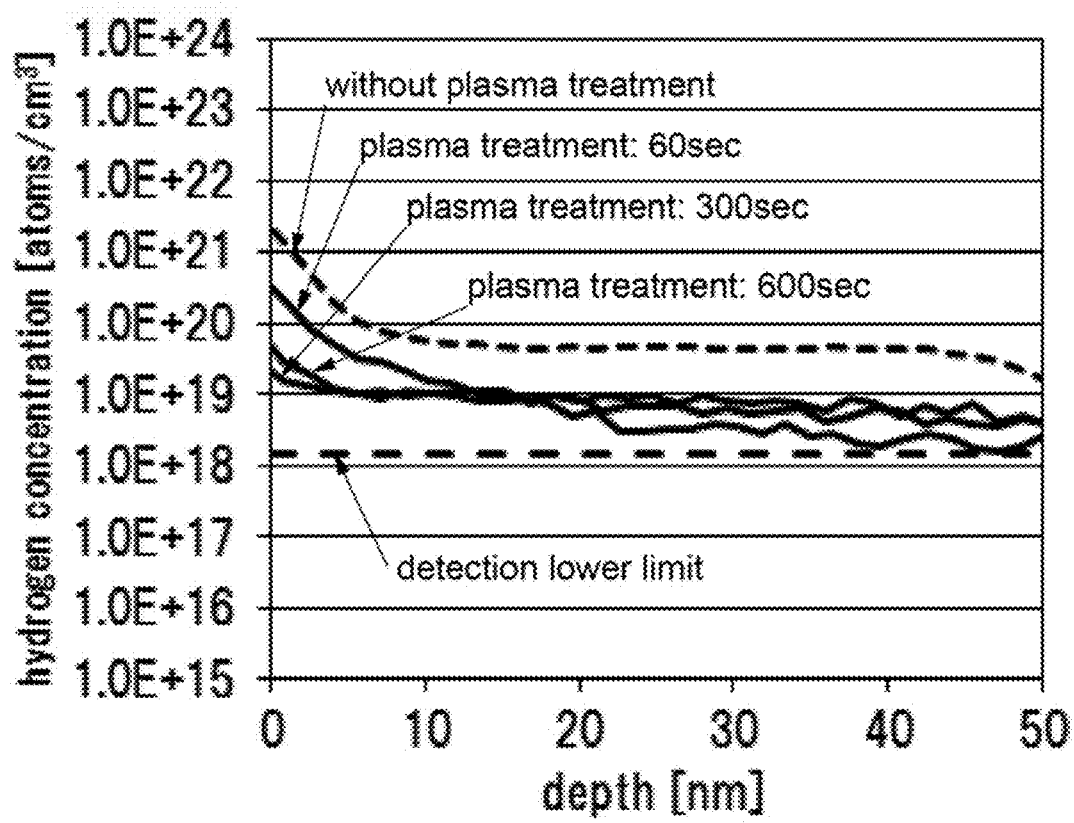
Figure 55A:
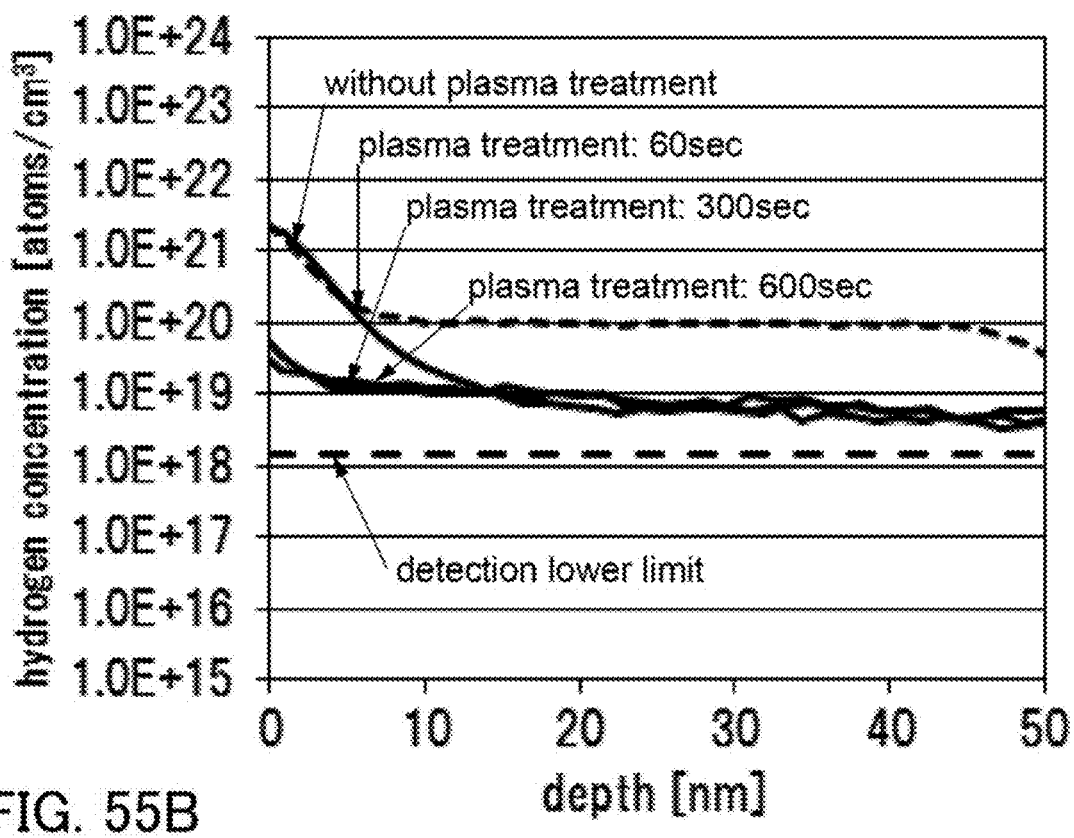
FIGS. 55A and 55B are graphs showing SIMS analysis results of Example 2.
Figure 55B:
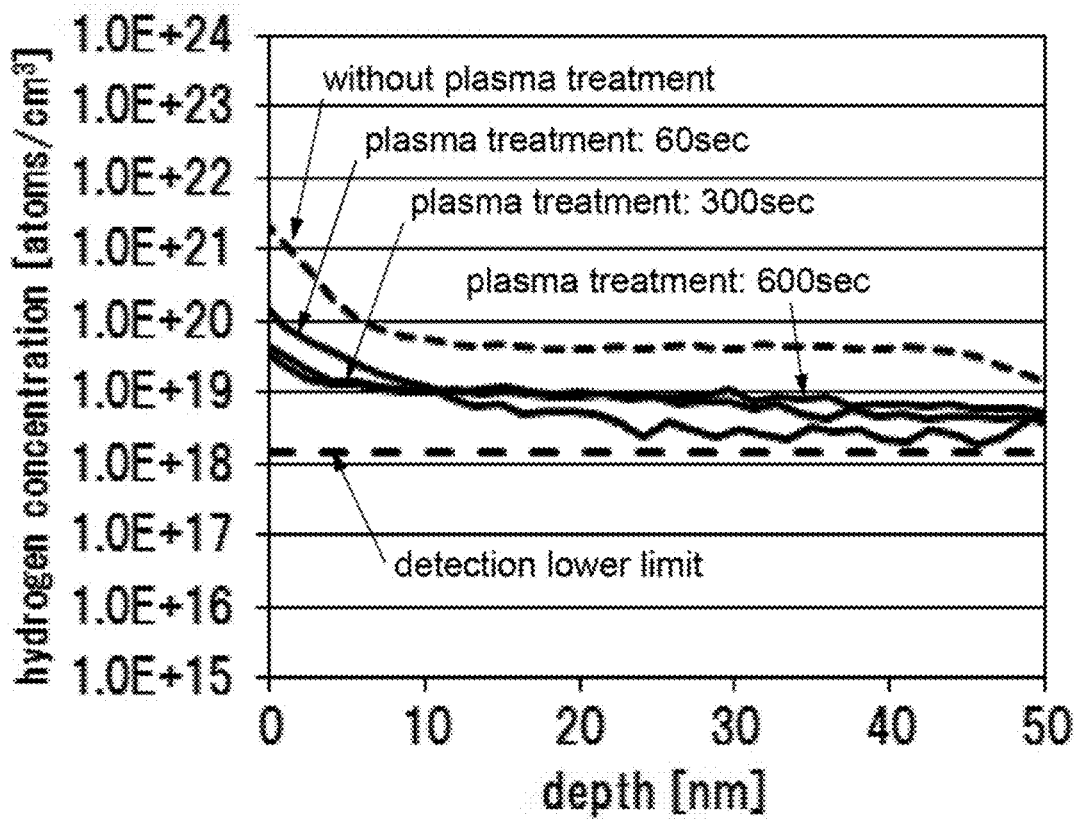

Next, the hydrogen concentrations in the second In—Ga—Zn oxides in Samples A-1 to A-4, B-1 to B-4, C-1 to C-4, and D-1 to D-4 were measured by SIMS analysis. FIG. 54A shows the SIMS analysis results of Samples A-1 to A-4. FIG. 54B shows the SIMS analysis results of Samples B-1 to B-4. FIG. 55A shows the SIMS analysis results of Samples C-1 to C-4. FIG. 55B shows the SIMS analysis results of Samples D-1 to D-4.

The SIMS analysis results of the hydrogen concentrations are summarized as follows. First, a comparison is made between the hydrogen concentrations in the second In—Ga—Zn oxides in Samples A-1, B-1, C-1, and D-1 on which the plasma treatment was not performed. The hydrogen concentrations in Samples A-1 and C-1 where the first film formation condition was used for forming the silicon oxynitride films are higher than those in Samples B-1 and D-1 where the second film formation condition was used for forming the silicon oxynitride films. Furthermore, a difference in the hydrogen concentration in the second In—Ga—Zn oxide depending on the aluminum oxide film thickness is not observed.

Secondly, a comparison is made between the hydrogen concentrations in the second In—Ga—Zn oxides of the samples on which the plasma treatment was performed. In all of the samples, the hydrogen concentrations in the second In—Ga—Zn oxides are reduced. The dependence of the hydrogen concentrations in the second In—Ga—Zn oxides on plasma treatment time is not clearly observed; however, the hydrogen concentrations are low at depths of approximately 20 nm or deeper in the second In—Ga—Zn oxides of the samples subjected to the plasma treatment for 60 seconds, except Sample C-2.

Figure 57A:
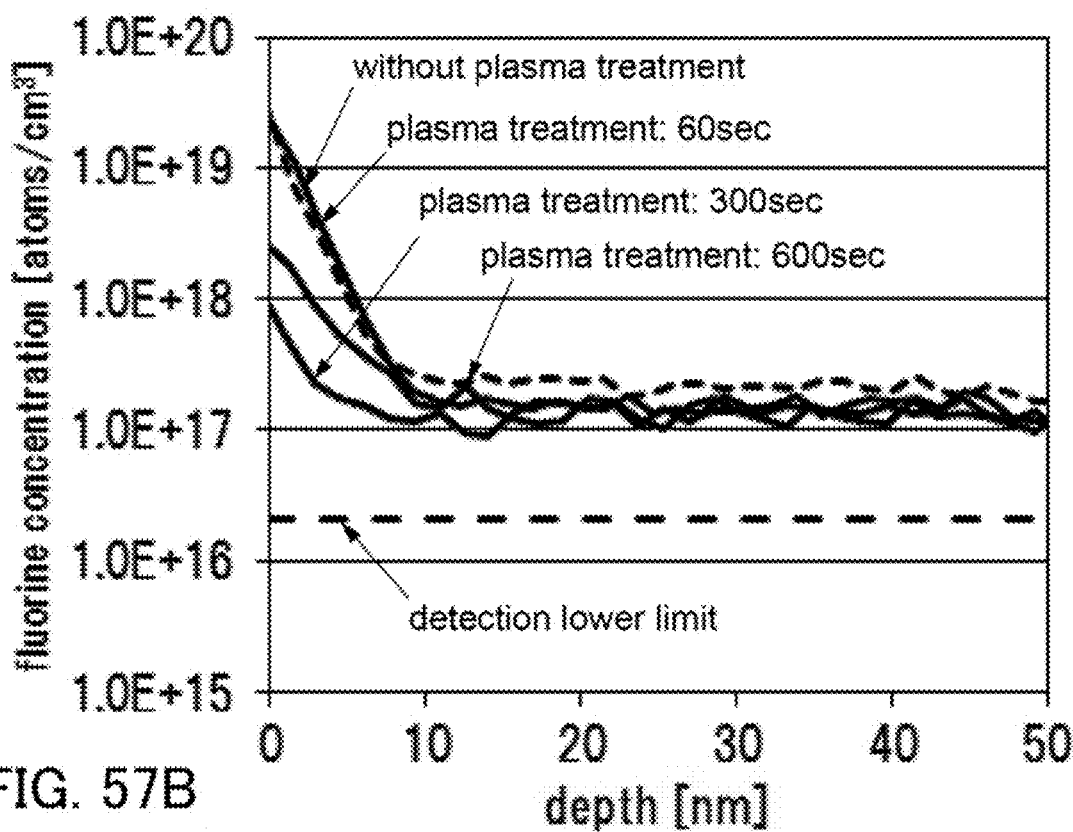
FIGS. 57A and 57B are graphs showing SIMS analysis results of Example 2.
Figure 57B:
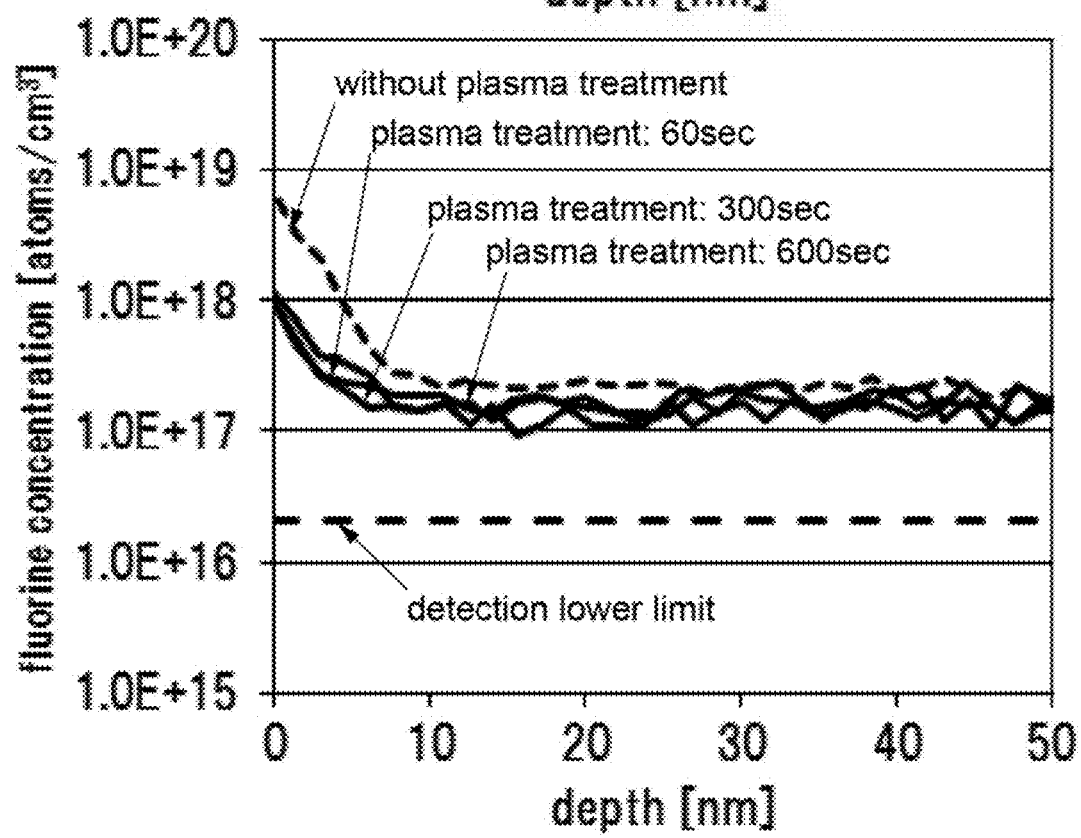

The SIMS analysis results of the fluorine concentrations in the second In—Ga—Zn oxides are summarized. FIG. 56A shows the SIMS analysis results of Samples A-1 to A-4. FIG. 56B shows the SIMS analysis results of Samples B-1 to B-4. FIG. 57A shows the SIMS analysis results of Samples C-1 to C-4. FIG. 57B shows the SIMS analysis results of Samples D-1 to D-4. First, a comparison is made between the fluorine concentrations in the second In—Ga—Zn oxides in Samples A-1, B-1, C-1, and D-1 on which the plasma treatment was not performed. In Sample B-1 where the second film formation condition was used for forming the silicon oxynitride film and the aluminum oxide film thickness was 1 nm, the fluorine concentration is slightly higher than the fluorine concentrations in the other samples.

Secondly, a comparison is made between the fluorine concentrations in the second In—Ga—Zn oxides of the samples on which the plasma treatment was performed. In all of the samples, the fluorine concentrations in the second In—Ga—Zn oxides are slightly reduced. The dependence of the fluorine concentration on the plasma treatment time is not observed.

The above-described SIMS analysis results show that the plasma treatment can reduce the hydrogen concentration and the fluorine concentration in the second In—Ga—Zn oxide.

Next, Samples A-5 to A-8, B-5 to B-8, C-5 to C-8, and D-5 to D-8 were analyzed by an ESR method. A signal at a g-factor of around 1.93 (greater than or equal to 1.89 and less than or equal to 1.96), which corresponds to the amount of hydrogen atoms trapped in oxygen vacancies $V_O$ (such a hydrogen atom is referred to as $V_OH$) in the second In—Ga—Zn oxide, was measured.

For the ESR measurement conditions, the measurement temperature was room temperature, the 9.18-GHz high-frequency power (microwave power) was 20 mW, and the direction of a magnetic field was parallel to a film surface of each sample. Note that the lower measurement limit of the spin density of the signal at a g-factor of around 1.93 is $1.10 \times 10^{17}$ spins/cm$^3$.

Figure 58:
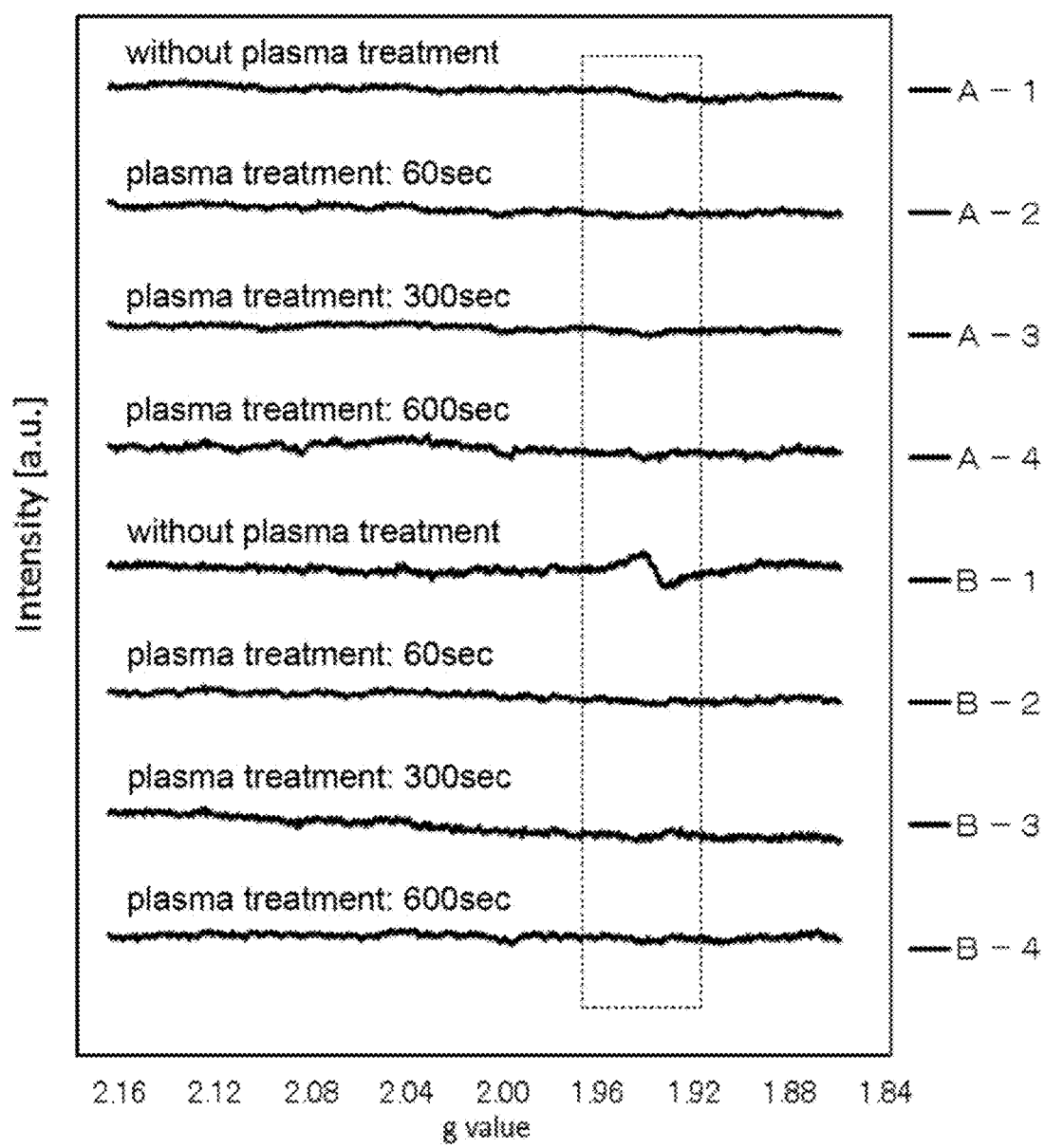
FIG. 58 is a graph showing ESR measurement results of Example 2.
Figure 59:
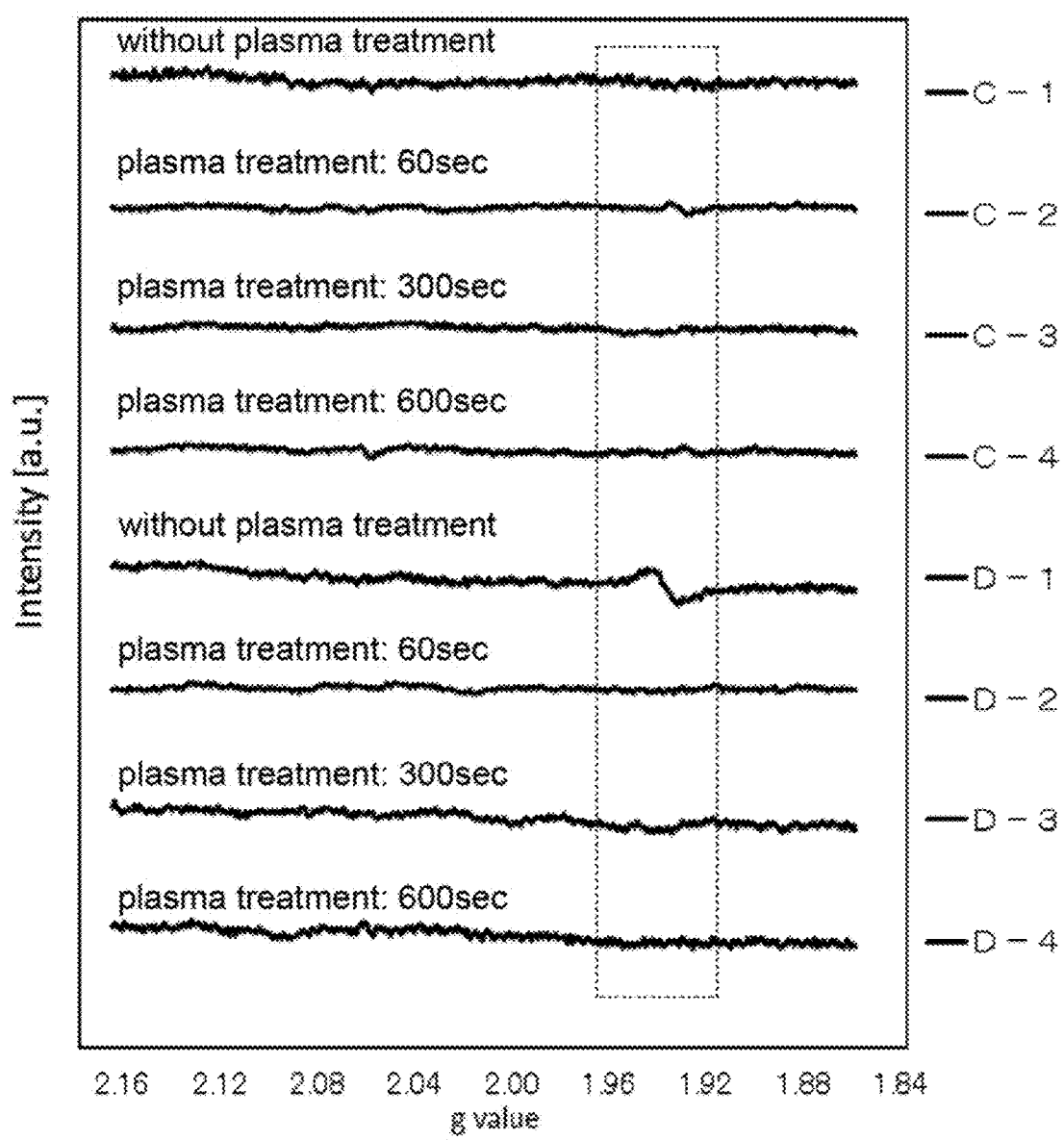
FIG. 59 is a graph showing ESR measurement results of Example 2.

FIG. 58 shows ESR spectra of the samples where the aluminum oxide film thicknesses were 1 nm. FIG. 59 shows ESR spectra of the samples where the aluminum oxide film thicknesses were 3 nm. Note that although the ESR spectra of Samples A-1 and C-1 were broad and the spin density corresponding to a g-factor of around 1.93 was not able to be measured, $V_OH$ is probably present.

Figure 60:
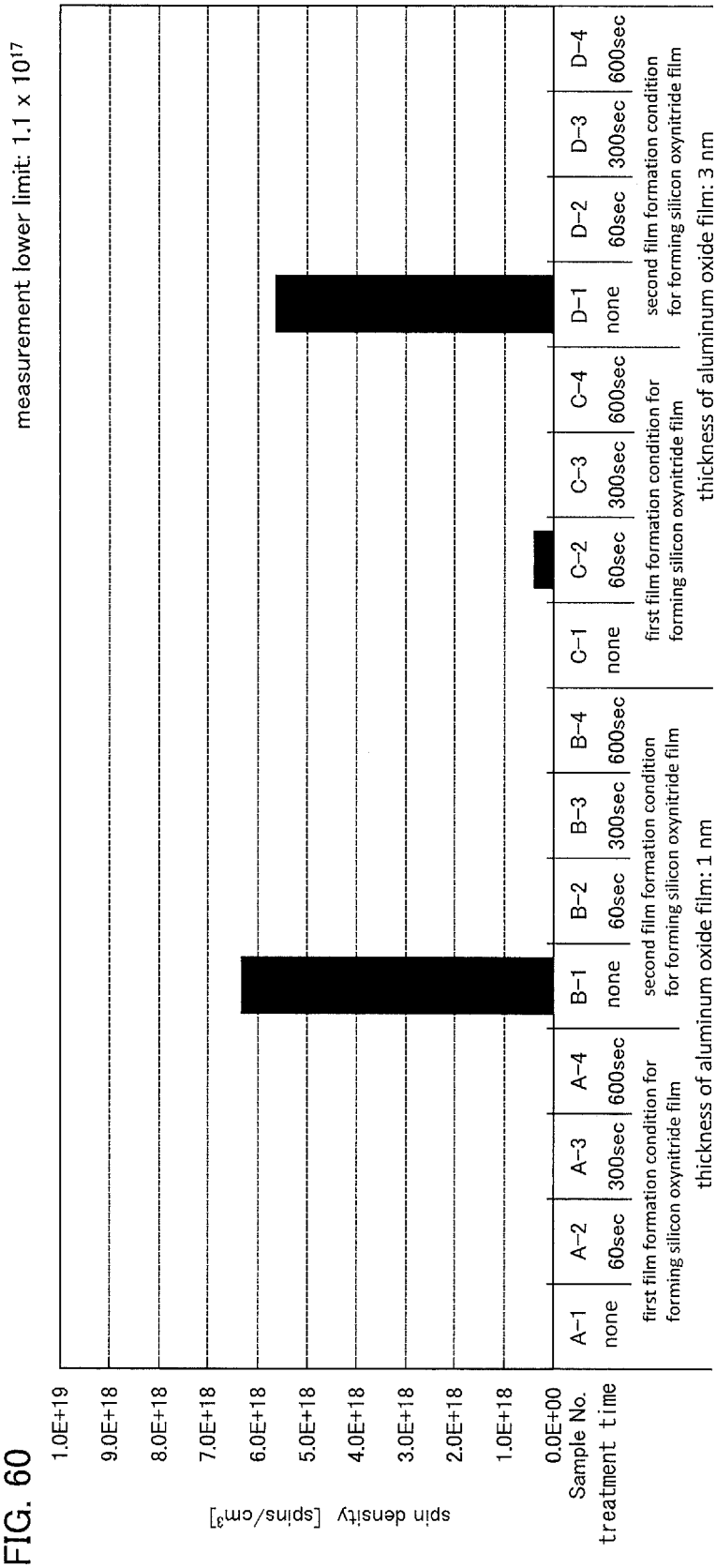
FIG. 60 is a graph showing the summary of ESR measurement results of Example 2.

FIG. 60 is a graph showing the plasma treatment time dependence of the spin density obtained from the ESR spectra. As described above, regarding Samples A-1 and C-1 where the plasma treatment was not performed and the first film formation condition was used for forming the silicon oxynitride films, the ESR spectra were broad and thus the spin density was not measured. In contrast, regarding Samples B-1 and D-1 where the plasma treatment was not performed and the second film formation condition was used for forming the silicon oxynitride films, a spin density of approximately $6 \times 10^{18}$ spins/cm$^3$ was measured. Among the samples subjected to the plasma treatment, the spin density was slightly measured in Sample B-2, but the spin densities of the other samples were below the lower measurement limit. This suggests that the second In—Ga—Zn oxide suffers plasma damage or the like and $V_OH$ is formed in the second In—Ga—Zn oxide by forming the silicon oxynitride film over the second In—Ga—Zn oxide, and furthermore, oxygen is introduced into the second In—Ga—Zn oxide through the silicon oxynitride film and the aluminum oxide film over the silicon oxynitride film and repairs the $V_OH$ by the plasma treatment performed through the aluminum oxide film and the silicon oxynitride film. That is, it is confirmed that the plasma treatment can add oxygen.

Example 3

In Example 3, plasma treatment using an oxygen isotope ($^{18}$O was performed on aluminum oxide films formed by an ALD method and oxygen was introduced into silicon oxide films through the aluminum oxide films to form samples. Furthermore, SIMS analysis was performed on the samples.

In each of the samples, the silicon oxide film was formed on a single crystal silicon wafer to a thickness of 100 nm by a thermal oxidation method. Then, the aluminum oxide film was formed over the oxide film by an ALD method. In Samples E to G, the aluminum oxide film was formed to a thickness of 1 nm. In Samples H to J, the aluminum oxide film was formed to a thickness of 3 nm.

Then, the plasma treatment was performed on each of the samples. The plasma treatment was performed with a plasma oxidation nitridation apparatus including a high-density plasma source. For the plasma treatment conditions, argon (flow rate: 900 sccm) and an oxygen isotope ($^{18}$O (flow rate: 40 sccm) were used, the pressure in a reaction chamber was maintained at 666.65 Pa, a microwave power (4000 W) was applied, and the temperature of a substrate stage for setting the sample was set to 400° C. The plasma treatment time was varied according to the samples. The plasma treatment was not performed on Samples E and H. The plasma treatment was performed on Samples F and I for 60 seconds. The plasma treatment was performed on Samples G and J for 300 seconds.

Figure 61A:
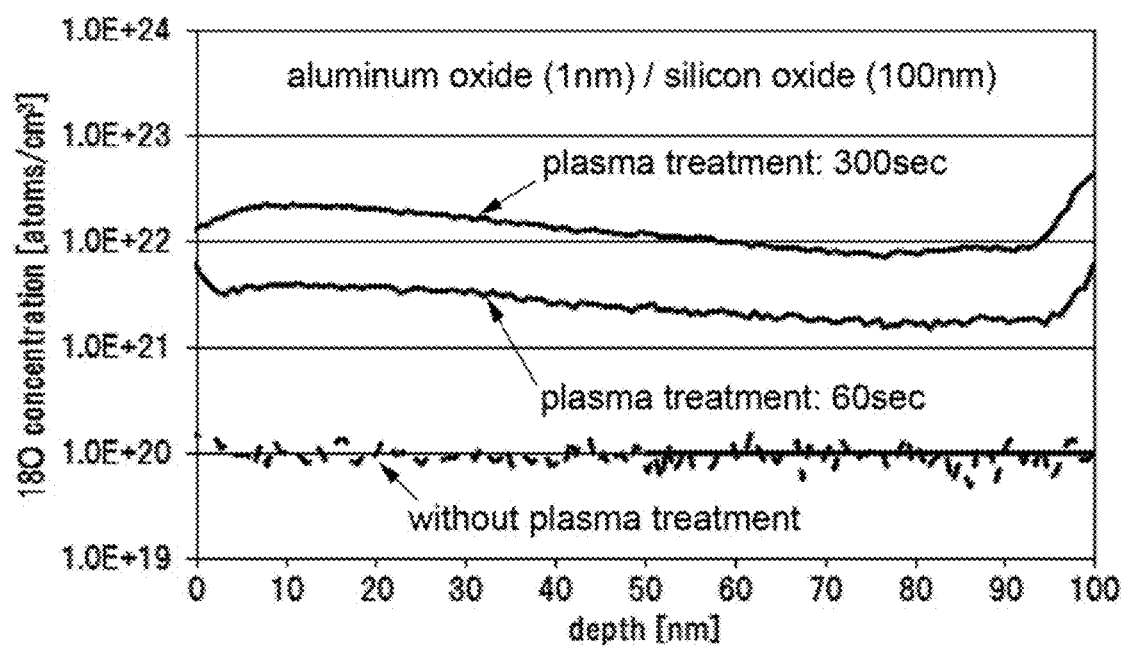
FIGS. 61A and 61B are graphs showing SIMS analysis results of Example 3.
Figure 61B:
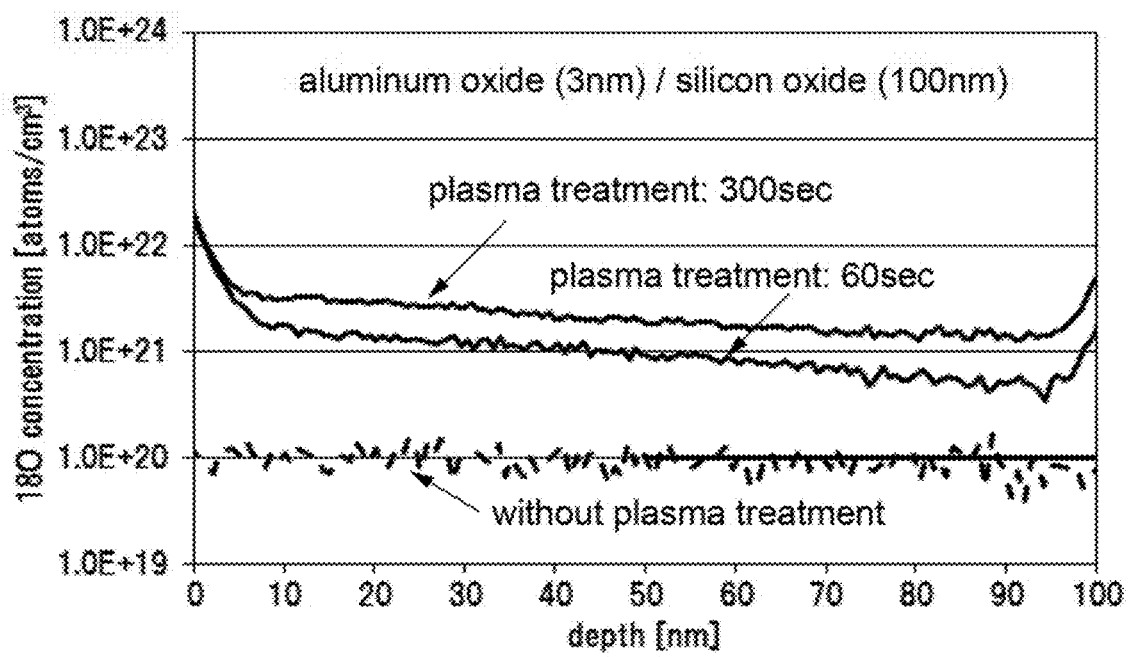

FIG. 61A shows concentration profiles of oxygen isotopes ($^{18}$O in the depth direction of the samples where the aluminum oxide film thicknesses were 1 nm. FIG. 61B shows concentration profiles of oxygen isotopes ($^{18}$O in the depth direction of the samples where the aluminum oxide film thicknesses were 3 nm. These results show that the oxygen isotope $^{18}$O is introduced into the silicon oxide film through the aluminum oxide film by the plasma treatment. The oxygen isotope $^{18}$O concentration depends on the plasma treatment time; the longer plasma treatment time provides the higher concentration. Furthermore, it is confirmed that the oxygen isotope $^{18}$O concentration in the sample where the aluminum oxide film thickness was 1 nm is higher than that in the sample where the aluminum oxide film thickness was 3 nm.

In Example 1, the oxygen introduction by the plasma treatment is confirmed by the TDS analysis. In Example 3, it is confirmed that oxygen is introduced into the silicon oxide film by performing the plasma treatment using the oxygen isotope 180.

This application is based on Japanese Patent Application serial no. 2016-013926 filed with Japan Patent Office on Jan. 28, 2016, the entire contents of which are hereby incorporated by reference.

What is claimed is:

1. A semiconductor device comprising:
a first insulator;
a transistor over the first insulator;
a second insulator over the transistor; and
a third insulator in contact with the second insulator,
wherein the transistor comprises a semiconductor layer including an oxide semiconductor,
wherein the second insulator is in contact with the semiconductor layer in a region excluding a channel formation region,
wherein an amount of oxygen released from the second insulator is larger than or equal to $1 \times 10^{14}$ molecules/cm$^2$ and smaller than $1 \times 10^{16}$ molecules/cm$^2$ in thermal desorption spectroscopy at a surface temperature of a film of the second insulator of higher than or equal to 50° C. and lower than or equal to 500° C.,
wherein the third insulator comprises a metal and oxygen,
wherein the second insulator comprises oxygen, nitrogen, and silicon,
wherein the first insulator comprises a metal and oxygen,
wherein an opening is provided in the second insulator,
wherein the third insulator is provided to cover a side surface of the opening of the second insulator,
wherein the first insulator is in contact with the third insulator in the opening of the second insulator, and
wherein the third insulator includes a portion having a thickness of larger than or equal to 1 nm and smaller than 5 nm.

2. The semiconductor device according to claim 1,
wherein the transistor comprises a gate electrode over the semiconductor layer with a gate insulating layer interposed therebetween.

3. The semiconductor device according to claim 1,
wherein the third insulator is formed by an atomic layer deposition method.

4. A module comprising:
the semiconductor device according to claim 1; and
a printed circuit board.

5. A semiconductor wafer comprising:
a plurality of semiconductor devices according to claim 1; and
a region for dicing.

6. The semiconductor device according to claim 1,
wherein the first insulator comprises an aluminum oxide, and
wherein the third insulator comprises an aluminum oxide.

7. A semiconductor wafer comprising:
a plurality of semiconductor devices according to claim 1; and
a region for dicing formed in an edge of a memory cell including the transistor,
wherein the first insulator comprises an aluminum oxide,
wherein the third insulator comprises an aluminum oxide, and
wherein the first insulator is in contact with the third insulator in the region for dicing.

8. A semiconductor device comprising:
a first transistor;
a first insulator over the first transistor;
a second transistor over the first insulator;
a second insulator over the second transistor; and
a third insulator in contact with the second insulator,
wherein the first transistor comprises a first semiconductor including a silicon substrate,
wherein the second transistor comprises a second semiconductor layer including an oxide semiconductor,
wherein the second insulator is in contact with the second semiconductor layer in a region excluding a channel formation region,
wherein an amount of oxygen released from the second insulator is larger than or equal to $1 \times 10^{14}$ molecules/cm$^2$ and smaller than $1 \times 10^{16}$ molecules/cm$^2$ in thermal desorption spectroscopy at a surface temperature of a film of the second insulator of higher than or equal to 50° C. and lower than or equal to 500° C.,
wherein the third insulator comprises a metal and oxygen,
wherein the second insulator comprises oxygen, nitrogen, and silicon,
wherein the first insulator comprises a metal and oxygen,
wherein an opening is provided in the second insulator,
wherein the third insulator is provided to cover a side surface of the opening of the second insulator,
wherein the first insulator is in contact with the third insulator in the opening of the second insulator, and
wherein the third insulator includes a portion having a thickness of larger than or equal to 1 nm and smaller than 5 nm.

9. The semiconductor device according to claim 8,
wherein the first insulator comprises an aluminum oxide, and
wherein the third insulator comprises an aluminum oxide.

10. A semiconductor wafer comprising:
a plurality of semiconductor devices according to claim 8; and
a region for dicing formed in an edge of a memory cell including the second transistor,
wherein the first insulator comprises an aluminum oxide,
wherein the third insulator comprises an aluminum oxide, and
wherein the first insulator is in contact with the third insulator in the region for dicing.

* * * * *